US009761424B1

(12) United States Patent
Gorokhovsky

(10) Patent No.: US 9,761,424 B1
(45) Date of Patent: Sep. 12, 2017

(54) FILTERED CATHODIC ARC METHOD, APPARATUS AND APPLICATIONS THEREOF

(71) Applicant: Vladimir Gorokhovsky, Lafayette, CO (US)

(72) Inventor: Vladimir Gorokhovsky, Lafayette, CO (US)

(73) Assignee: Nano-Product Engineering, LLC, Lafayette, CO (US)

( * ) Notice: Subject to any disclaimer, the term of this patent is extended or adjusted under 35 U.S.C. 154(b) by 180 days.

(21) Appl. No.: 14/483,093

(22) Filed: Sep. 10, 2014

Related U.S. Application Data

(63) Continuation-in-part of application No. 13/602,316, filed on Sep. 3, 2012, now abandoned.
(Continued)

(51) Int. Cl.

| | |
|---|---|
| ***C23C 14/00*** | (2006.01) |
| ***H01J 37/34*** | (2006.01) |
| *C23C 14/22* | (2006.01) |

(52) U.S. Cl.
CPC ...... *H01J 37/3458* (2013.01); *H01J 37/3405* (2013.01); *H01J 37/3447* (2013.01); *C23C 14/221* (2013.01)

(58) Field of Classification Search
CPC .......................... C23C 14/221; H01J 37/3405
See application file for complete search history.

(56) References Cited

U.S. PATENT DOCUMENTS

| | | | |
|---|---|---|---|
| 636,270 | A | 11/1899 | Loos |
| 4,038,171 | A | 7/1977 | Moss et al. |

(Continued)

FOREIGN PATENT DOCUMENTS

| | | |
|---|---|---|
| EP | 2602354 | 12/2013 |
| RU | 2097868 | 11/1997 |

(Continued)

OTHER PUBLICATIONS

H.S.Shin, D.G.Goodwin, Deposition of diamond coatings on particles in a microwave plasma-emhanced fluidized bed reactor, Material letters 19 (1994) 119-122.

(Continued)

*Primary Examiner* — Timon Wanga
(74) *Attorney, Agent, or Firm* — Lathrop Gage LLP

(57) ABSTRACT

An apparatus for generating energetic particles and application of coatings in a vacuum comprising a plasma duct surrounded by a magnetic deflecting and focusing system communicating with a primary cathodic arc plasma source in a cathode chamber and a distal anode in a coating chamber. A coating chamber comprises a substrate holder off of an optical axis of the plasma source. A set of baffles are installed along the walls of cathode chambers and the plasma duct not occupied with plasma sources and in some embodiments across the plasma stream to trap macroparticles and neutrals. A plasma duct has a deflecting portion with attached cathode chamber and a tunnel portion attached to the coating chamber. The deflecting system comprises a deflecting coil surrounding the cathode chamber having an off-set deflecting conductor spaced from the plasma duct. In one embodiment a magnetron source is magnetically coupled with cathodic arc source.

30 Claims, 61 Drawing Sheets

Related U.S. Application Data

(60) Provisional application No. 61/532,023, filed on Sep. 7, 2011.

(56) References Cited

U.S. PATENT DOCUMENTS

| | | | | |
|---|---|---|---|---|
| 4,111,783 | A | | 9/1978 | Bindell et al. |
| 4,140,943 | A | | 2/1979 | Ehlers |
| 4,404,077 | A | | 9/1983 | Fournier |
| 4,434,038 | A | | 2/1984 | Morrison, Jr. |
| 4,494,043 | A | | 1/1985 | Stallings et al. |
| 4,588,490 | A | | 5/1986 | Cuomo et al. |
| 4,730,334 | A | | 3/1988 | Collins et al. |
| 4,762,756 | A | | 8/1988 | Bergmann et al. |
| 5,087,434 | A | | 2/1992 | Frenklach et al. |
| 5,133,849 | A | | 7/1992 | Kinoshita et al. |
| 5,218,179 | A | * | 6/1993 | Matossian ............... C23C 14/48 204/298.05 |
| 5,262,032 | A | | 11/1993 | Hartig et al. |
| 5,294,322 | A | | 3/1994 | Vetter et al. |
| 5,317,235 | A | | 5/1994 | Treglio |
| 5,435,900 | A | | 7/1995 | Gorokhovsky |
| 5,458,754 | A | | 10/1995 | Sathrum et al. |
| 5,468,363 | A | | 11/1995 | Falabella |
| 5,478,608 | A | | 12/1995 | Gorokhovsky |
| 5,480,527 | A | | 1/1996 | Welty |
| 5,503,725 | A | | 4/1996 | Sablev et al. |
| 5,554,255 | A | | 9/1996 | Karner et al. |
| 5,580,429 | A | | 12/1996 | Chan et al. |
| 5,587,207 | A | | 12/1996 | Gorokhovsky |
| 5,601,654 | A | * | 2/1997 | Springer ............... C23C 14/221 118/723 HC |
| 5,616,373 | A | | 4/1997 | Karner et al. |
| 5,753,045 | A | | 5/1998 | Karner et al. |
| 5,783,335 | A | | 7/1998 | Laia, Jr. et al. |
| 5,902,462 | A | | 5/1999 | Krauss |
| 5,902,649 | A | | 5/1999 | Karner et al. |
| 6,042,900 | A | | 3/2000 | Rakhimov et al. |
| 6,153,067 | A | | 11/2000 | Maishev et al. |
| 6,296,742 | B1 | | 10/2001 | Kouznetsov |
| 6,300,720 | B1 | | 10/2001 | Birx |
| 6,477,216 | B2 | | 11/2002 | Koloc |
| 6,495,002 | B1 | | 12/2002 | Klepper et al. |
| 6,521,104 | B1 | | 2/2003 | Kidd et al. |
| 6,630,799 | B2 | | 10/2003 | Fleming et al. |
| 6,635,156 | B1 | | 10/2003 | Dodonov et al. |
| 6,645,354 | B1 | | 11/2003 | Gorokhovsky |
| 6,663,755 | B2 | | 12/2003 | Gorokhovsky |
| 6,692,617 | B1 | | 2/2004 | Fu et al. |
| 6,703,081 | B2 | | 3/2004 | Karner et al. |
| 6,756,596 | B2 | | 6/2004 | Sathrum |
| 6,758,949 | B2 | | 7/2004 | Wang et al. |
| 6,767,436 | B2 | | 7/2004 | Wei |
| 6,812,164 | B2 | | 11/2004 | Yamaguchi et al. |
| 6,905,582 | B2 | | 6/2005 | Kidd et al. |
| 6,922,455 | B2 | | 7/2005 | Jurczyk et al. |
| 6,923,891 | B2 | | 8/2005 | Cheah et al. |
| 6,926,811 | B2 | | 8/2005 | Morstein et al. |
| 7,014,738 | B2 | | 3/2006 | Shi et al. |
| 7,033,682 | B1 | | 4/2006 | Rai et al. |
| 7,147,759 | B2 | | 12/2006 | Chistyakov |
| 7,229,675 | B1 | | 6/2007 | Paderov et al. |
| 7,252,745 | B2 | | 8/2007 | Gorokhovsky |
| 7,300,559 | B2 | | 11/2007 | Gorokhovsky |
| 7,327,089 | B2 | | 2/2008 | Madocks |
| 7,381,311 | B2 | | 6/2008 | Aksenov et al. |
| 7,459,704 | B2 | | 12/2008 | Olson et al. |
| 7,498,587 | B2 | | 3/2009 | Welty |
| 8,034,459 | B2 | | 10/2011 | Wei et al. |
| 8,157,976 | B2 | | 4/2012 | Druz et al. |
| 8,282,794 | B2 | | 10/2012 | Gorokhovsky |
| 8,500,975 | B2 | | 8/2013 | Le et al. |
| 8,541,069 | B2 | | 9/2013 | Greenberg et al. |
| 8,895,115 | B2 | | 11/2014 | Gorokhovsky |
| 9,257,263 | B2 | | 2/2016 | Gorokhovsky |
| 2002/0007796 | A1 | * | 1/2002 | Gorokhovsky ....... C23C 14/022 118/723 ER |
| 2003/0047444 | A1 | | 3/2003 | Boxman |
| 2003/0085123 | A1 | | 5/2003 | Shi et al. |
| 2003/0089601 | A1 | | 5/2003 | Ding et al. |
| 2004/0055884 | A1 | | 3/2004 | Fujii et al. |
| 2004/0126492 | A1 | | 7/2004 | Weaver et al. |
| 2004/0264044 | A1 | | 12/2004 | Konishi et al. |
| 2005/0092596 | A1 | | 5/2005 | Kouznetsov |
| 2006/0251917 | A1 | | 11/2006 | Chiang et al. |
| 2007/0000770 | A1 | | 1/2007 | Yamamoto |
| 2007/0017804 | A1 | | 1/2007 | Myrtveit et al. |
| 2007/0087185 | A1 | | 4/2007 | Wei et al. |
| 2007/0137566 | A1 | | 6/2007 | Csell et al. |
| 2008/0035470 | A1 | | 2/2008 | Tietema et al. |
| 2008/0298910 | A1 | | 12/2008 | Weber et al. |
| 2009/0065350 | A1 | | 3/2009 | Anders |
| 2009/0078565 | A1 | | 3/2009 | Rodmar et al. |
| 2009/0214787 | A1 | | 8/2009 | Wei et al. |
| 2010/0063344 | A1 | | 3/2010 | Kotschenreuther et al. |
| 2010/0086397 | A1 | | 4/2010 | Varanasi et al. |
| 2010/0264016 | A1 | | 10/2010 | Anders et al. |
| 2010/0314247 | A1 | * | 12/2010 | Takashima .......... C23C 14/0605 204/298.13 |
| 2011/0100800 | A1 | | 5/2011 | Gorokhovsky |
| 2011/0111190 | A1 | | 5/2011 | Wei et al. |
| 2011/0226617 | A1 | | 9/2011 | Hofmann et al. |
| 2012/0008728 | A1 | | 1/2012 | Fleming |
| 2012/0070963 | A1 | | 3/2012 | Martin et al. |
| 2012/0114871 | A1 | | 5/2012 | Gorokhovsky |
| 2012/0148762 | A1 | | 6/2012 | Wei et al. |
| 2012/0199070 | A1 | | 8/2012 | Brondum |
| 2012/0231177 | A1 | | 9/2012 | Wei et al. |
| 2013/0122317 | A1 | | 5/2013 | Cheruvu et al. |
| 2014/0076715 | A1 | | 3/2014 | Gorokhovsky et al. |
| 2014/0076716 | A1 | | 3/2014 | Gorokhovsky et al. |
| 2014/0076718 | A1 | | 3/2014 | Gorokhovsky et al. |

FOREIGN PATENT DOCUMENTS

| | | |
|---|---|---|
| RU | 2364003 | 8/2009 |
| RU | 2430992 | 5/2011 |
| SU | 1297337 | 11/1985 |
| SU | 1240325 | 2/1986 |
| SU | 1324178 | 3/1987 |
| SU | 1356947 | 8/1987 |
| SU | 1396950 | 1/1988 |
| SU | 1398760 | 1/1988 |
| SU | 1400457 | 2/1988 |
| SU | 1519519 | 7/1989 |
| WO | WO 2013038335 | 3/2013 |

OTHER PUBLICATIONS

J. Karner, High current d.c. arc (HCDCA) technique for diamond deposition, Diamond and Related Materials 5 (1996) 217-220.

T.Kojima et al., Development of a plasma jetting fluidized bed reactor, Journal de Physique IV Colloque C2, suppl. au Journal de Physique 11, vol. 1, Sep. 1991, pp. C2-429-C2-436.

A.Feuerstein, A.Kleiman, Ti—N multilayer systems for compressor airfoils and erosion protection, Surface & Coatings Technology 204 (2009) 1092-1096.

H. Mitura, "Haemocompatibility of Non-Functionalized and Plasmachemical Functionalized Detonation Nanodiamond Particles," Archives of Metallurgy and Materials, vol. 60, No. 3, 2180-2189.

Aksenov et al. (2009) "Two-Cathode Filtered Vacuum-Arc Plasma Source," IEEE Transactions on Plasma Science. 37(8):1511-1516.

Aksenov et al. (2010) "Adjustment of the Ti—Al—N coatings deposited on C Two channel vacuum arc filtered plasma source (English Translation)," *Physical Surface Engineering* (English Translation). 8(4):307-313. English Abstract Only.

Aksenov et al. (2011) "Plasma Streams Mixing in Two Channel T-Shaped Magnetic Filter," *Voprosy Atomnoj Nauki i Tekhniki*. 44:116-120.

(56) References Cited

OTHER PUBLICATIONS

Andersson et al. (2008) "Gasless Sputtering: Opportunities for Ultraclean Metallization, Coatings in Space, and Propulsion," *Applied Physics Letters*. 92:221503 pp. 1-3.
Bhat et al. (Nov. 1999) "Development of a Coating for Wear and Cracking Prevention in Die-Casting Dies by the Filtered Cathodic Arc Process," In; Transactions of the North American Die Casting Association, $20^{th}$ International Die Casting Congress and Exposition. Cleveland, OH. pp. 391-399.
Bhattacharya (1999) "Advanced Thermal Barrier Coatings," *Universal Energy Systems, Inc*. Final Report to the Materials and Manufacturing Directorate Air Force Research Laboratory: May 3, 1999 to Feb. 3, 2000. Document No. AFRL-ML-WP-TR-2000-4099.
Degout et al. (1995) "High Current Density Triode Magnetron Sputtering," *Surface and Coating Technology*. 57:105-110.
Ensinger (1999) "Processing of powder surfaces by ion beam techniques," *Nuclear Instruments and Methods in Physics Research B*. 148:17-24.
Gorokhovsky (2005) "Characterization of Cascade Arc Assisted CVD Diamond Coating Technology. Part I. Plasma processing parameters," *Surface and Coatings Technology*. 194:344-362.
Gorokhovsky (2010) "LAFAD-Assisted Plasma Surface Engineering Processes for Wear and Corrosion Protection: A Review," In; *Advanced Ceramic Coatings and Interfaces V: Ceramic Engineering and Science Proceedings*. Eds.: Zhu , D.; Lin, H. p. 104-122.
Gorokhovsky et al. (1993) "Processes in Plasma-Arc Installations for Vacuum Depositions, Part I: Plasma Generation," *Surface and Coatings Technology*. 61:101-107.
Gorokhovsky et al. (1995) "Distributed Arc Sources," In; *Hanbook of Vacuum Arc Science and Technology*. Ed.: Boxman, R.; Martin, P.; Sanders, D. Noyes Publications. pp. 423-444.
Gorokhovsky et al. (1999) "Advantages of Filtered Arc Deposition," Business and Technical News from Balzers Materials. Issue 7.
Gorokhovsky et al. (1999) "Principles and Applications of Vacuum Arc Plasma-assisted Surface Engineering Technologies," In; *Proceedings of the GOI-UNDP International Workshop on Surface Engineering and Coatings*. Eds: Rajagopal, I.; Rajam, K.; Krishnan, R. Allied Publishers Ltd. Mumbai, India. pp. 381-399.
Gorokhovsky et al. (2008) "Deposition and characterization of hybrid filtered arc/magnetron multilayer nanocomposite cermet coatings for advanced tribological applications," *Wear*. 265:741-755.
Gorokhovsky et al. (2009) "Deposition of various metal, ceramic, and cermet coatings by an industrial-scale large area filtered arc deposition process," *J. Vac. Sci. Technol. A*. 27(4):1080-1095.
Gorokhovsky et al. (2009) "LAFAD Hard Ceramic and Cermet Coatings for Erosion Protection of Turbomachinery Components," In; Proceedings of ASME Turbo Expo 2009: Power for Land, Sea and Air. Orlando, Florida, USA. Document No. GT2009-59391.
Gorokhovsky et al. (Jan. 25, 2013) "Ion treatment by low pressure arc plasma immersion surface engineering processes," *Surface & Coatings Technology*. 215:431-439.
Gorokhovsky et al. (2011) "Evaluation of SOFC Interconnects Made of Ferritic Steels with Nano-Structured Oxi-Ceramic Protective Coatings Deposited by the LAFAD Process," *Journal of the Electrochemical Society*. 158(5):B526-B535.
Li et al. (1999) "A description of metal-vapour production in a hollow-cylindrical magnetron sputtering discharge," *J. Phys. D: Appl. Phys*. 32:1039-1043.
Luchaninov (2012) "Coating System Ti—Al—N, Caused by PVD (English Translation)," *Physical Surface Engineering* (English Translation). 10(1):4-21. English Abstract Only.
Miley et al. (Jan. 8, 2014) "Cylindrical and Other IEC Geometries," In; Ch 9. *Inertial Electrostatic Confinement (IEC) Fusion: Fundamentals and Applications*. Springer. pp. 239-243.
Mitura et al. (1991) "The System for Depositing Hard Diamond-Like Films onto Complex-Shaped Machine Elements in an r.f. Arc Plasma," *Surface and Coatings Technology*. 47(1):106-112.
Novikov et al. (1991) "Superhard i-C coatings used in complex processes of surface strengthening of tools and machine parts," *Surface and Coatings Technology*. 47:770-791.
Posadowski (1993) "Discharge Density Increase for High Rate Magnetron Sputtering," In; *Multicomponent and Multilayered Thin Films for Advanced Microtechnologies: Techniques, Fundamentals, and Devices*. Ed.: Jurgen Engemann. Springer. pp. 109-113.
Sagas et al. (2011) "Influence of electromagnetic confinement on the characteristics of a triode magnetron sputtering system," *Vacuum*. 85:705-710.
Sanders (2000) "Review of cathodic arc deposition technology at the start of the new millennium," *Surface & Coatings Technology*. 133-134:78-90.
Shang (2002) "Plasma Injection for Hypersonic Blunt-Body Drag Reduction," *The American Institute of Aeronautics and Astronautics Journal*. 40:1178-1186.
Spatenka et al. (1997) "A comparison of internal plasma parameters in a conventional planar magnetron and a magnetron with additional plasma confinement," *Plasma Source Science and Technology*. 6:46-52.
Tisone et al. (1974) "Low-Voltage Triode Sputtering With a Confined Plasma: Part 1—Geometric Aspects of Deposition," *J. Vac. Sci. Technol*. 11(2):519-527.
VECOR "Dual Arc Evaporator with Plasma Separation," Brochure by VECOR. 101 Duranzo Aisle, Irvine, California 92606 USA.
Wakeham et al. (2009) "Low Temperature Remote Plasma Sputtering of Indium Tin Oxide for Flexible Display Applications," *Thin Solid Films*. pp. 518:1355-518:1358.
Zimmer (2005) "Vacuum arc deposition by using a Venetian blind particle filter," *Surface & Coatings Technology*. 200:440-443.

* cited by examiner 11a
81a
80a
12
12
90
44a
13a
13a
13b
13b
81
80
46a
84a
21
46
44

84a
84
82
83
46b
13b
13a
90
90
44b
12
83a
82a
11b

FILTERED CATHODIC ARC METHOD, APPARATUS AND APPLICATIONS THEREOF

RELATED APPLICATIONS

This application is a continuation-in-part of U.S. patent application Ser. No. 13/602,316 filed Sep. 3, 2012, which claims the benefit of priority from U.S. Provisional Patent Application Ser. No. 61/532,023 filed on Sep. 7, 2011. Both of the aforementioned applications are incorporated herein by reference in their entireties.

FIELD OF THE INVENTION

This invention relates to the application of coatings in a vacuum apparatus. In particular, this invention relates to an apparatus which generates energetic particles and generates a plasma of a vaporized solid material for the application of coatings to surfaces of a substrate by way of condensation of plasma.

BACKGROUND OF THE INVENTION

Many types of vacuum arc coating apparatus utilize a cathodic arc source, in which an electric arc is formed between an anode and a cathode plate in a vacuum chamber. The arc generates a cathode spot on a target surface of the cathode, which evaporates the cathode material into the chamber. The cathodic evaporate disperses as a plasma within the chamber, and upon contact with the exposed surfaces of one or more substrates, coats the substrates with the cathode material, which may be metal, ceramic, etc. An example of such an arc coating apparatus is described in U.S. Pat. No. 3,793,179 issued Feb. 19, 1974 to Sablev, which is incorporated herein by reference.

An undesirable result of vacuum arc coating techniques is the creation of macroparticles, which are formed from molten cathode material vaporized by the arc. These macroparticles are ejected from the surface of the cathode material, and can contaminate the coating as it is deposited on the substrate. The resulting coating may be pitted or irregular, which at best presents an aesthetic disadvantage, but is particularly problematic in the case of coatings on precision instruments.

A number of techniques have been employed to reduce the incidence of macroparticles contacting the substrate. Conventionally a vacuum arc coating apparatus may be constructed with a filtering mechanism that uses electromagnetic fields which direct or deflect the plasma stream. Because macroparticles are neutral, they are not influenced by these electromagnetic fields. Such an apparatus can therefore provide a plasma duct between the cathode chamber and a coating chamber, wherein the substrate holder is installed off of the optical axis of the plasma source. Focusing and deflecting electromagnets around the apparatus thus direct the plasma stream towards the substrate, while the macroparticles, uninfluenced by the electromagnets, would continue to travel in a straight line from the cathode. An example of such an apparatus is described and illustrated in U.S. Pat. No. 5,435,900 issued Jul. 25, 1995 to Gorokhovsky for an "Apparatus for Application of Coatings in Vacuum", which is incorporated herein by reference.

Another such apparatus is described in the article "Properties of Tetrahedral Amorphous Carbon Prepared by Vacuum Arc Deposition", Diamond and Related Materials published in the United States by D. R. McKenzie in 1991 (pages 51 through 59). This apparatus consists of a plasma duct made as a quarter section of a tore surrounded by a magnetic system that directs the plasma stream. The plasma duct communicates with two chambers, one chamber which accommodates a plasma source and a coating chamber which accommodates a substrate holder. The configuration of this apparatus limits the dimensions of the substrate to be coated to 200 mm, which significantly limits the range of its application. Furthermore, there is no provision in the tore-shaped plasma duct for changing the configuration of the magnetic field, other than the magnetic field intensity. Empirically, in such an apparatus the maximum value of the ionic current at the exit of the plasma duct cannot exceed one percent of the arc current. This is related to the turbulence of the plasma stream in the tore, which causes a drastic rise in the diffusion losses of ions on the tore walls.

Another method used to reduce the incidence of macroparticles reaching the substrate is a mechanical filter consisting of a baffle, or set of baffles, interposed between the plasma source and the plasma duct and/or between the plasma duct and the substrate. Filters taught by the prior art consist of simple stationary baffles of fixed dimension, such as is described in U.S. Pat. No. 5,279,723 issued Jan. 18, 1994 to Falabella et al. and in U.S. Pat. No. 5,435,900 to Gorokhovsky, which are incorporated herein by reference. In these filters the baffles are disposed along the plasma duct walls leaving substantial portion of the macroparticles which are crossing the area near the center of the plasma duct, far from the plasma duct walls, not trapped.

SUMMARY

In an embodiment, a filtered cathodic arc deposition apparatus includes (i) at least one cathodic arc source having at least one respective cathode located in at least one respective cathode chamber, (ii) a substrate chamber for holding, non-coincidentally with an optical axis of each cathode, at least one substrate to be coated, (iii) a plasma duct in communication with each cathode chamber and the substrate chamber, and (iv) at least one offset deflecting coil, disposed adjacent to a side of the at least one cathode chamber, respectively, and spaced from the plasma duct, that generates a deflecting magnetic field within the at least one cathode chamber, respectively, for filtering output of each cathodic arc source, respectively, by deflecting a plasma flow from therefrom into the plasma duct.

In an embodiment, a filtered cathodic arc deposition apparatus includes (i) at least one cathodic arc source having at least one respective cathode located in at least one respective cathode chamber, (ii) a substrate chamber for holding, non-coincidentally with an optical axis of each cathode, at least one substrate to be coated, (iii) a plasma duct in communication with each cathode chamber and the substrate chamber, (iv) at least one coil generating a deflecting magnetic field for deflecting the plasma toward the substrate chamber; and (v) a plurality of stream baffles having a positive potential relative to the plasma, installed in the plasma duct generally at an angle to a plane parallel to a direction of plasma flow, at position of the plurality of stream baffles, to enhance filtration of macroparticles.

In an embodiment, a filtered cathodic arc deposition apparatus includes (i) at least one cathodic arc source having at least one respective cathode located in at least one respective cathode chamber, (ii) a substrate chamber for holding, off of an optical axis of each cathode, at least one substrate to be coated, (iii) a plasma duct in communication with each cathode chamber and the substrate chamber, (iv) at least one focusing coil surrounding a focusing tunnel section of the plasma duct for generating a focusing magnetic field, (v) at least one deflecting coil generating a deflecting magnetic field for deflecting the plasma along a path toward the substrate chamber, and (vi) at least one magnetron facing the at least one substrate, the magnetron being positioned such that at least a portion of magnetic force lines of the focusing magnetic field overlap and are substantially parallel with at least a portion of magnetic force lines generated by the magnetron.

BRIEF DESCRIPTION OF THE DRAWINGS

In drawings which illustrate by way of example only preferred embodiments of the invention.

DETAILED DESCRIPTION OF THE INVENTION

Figure 1:
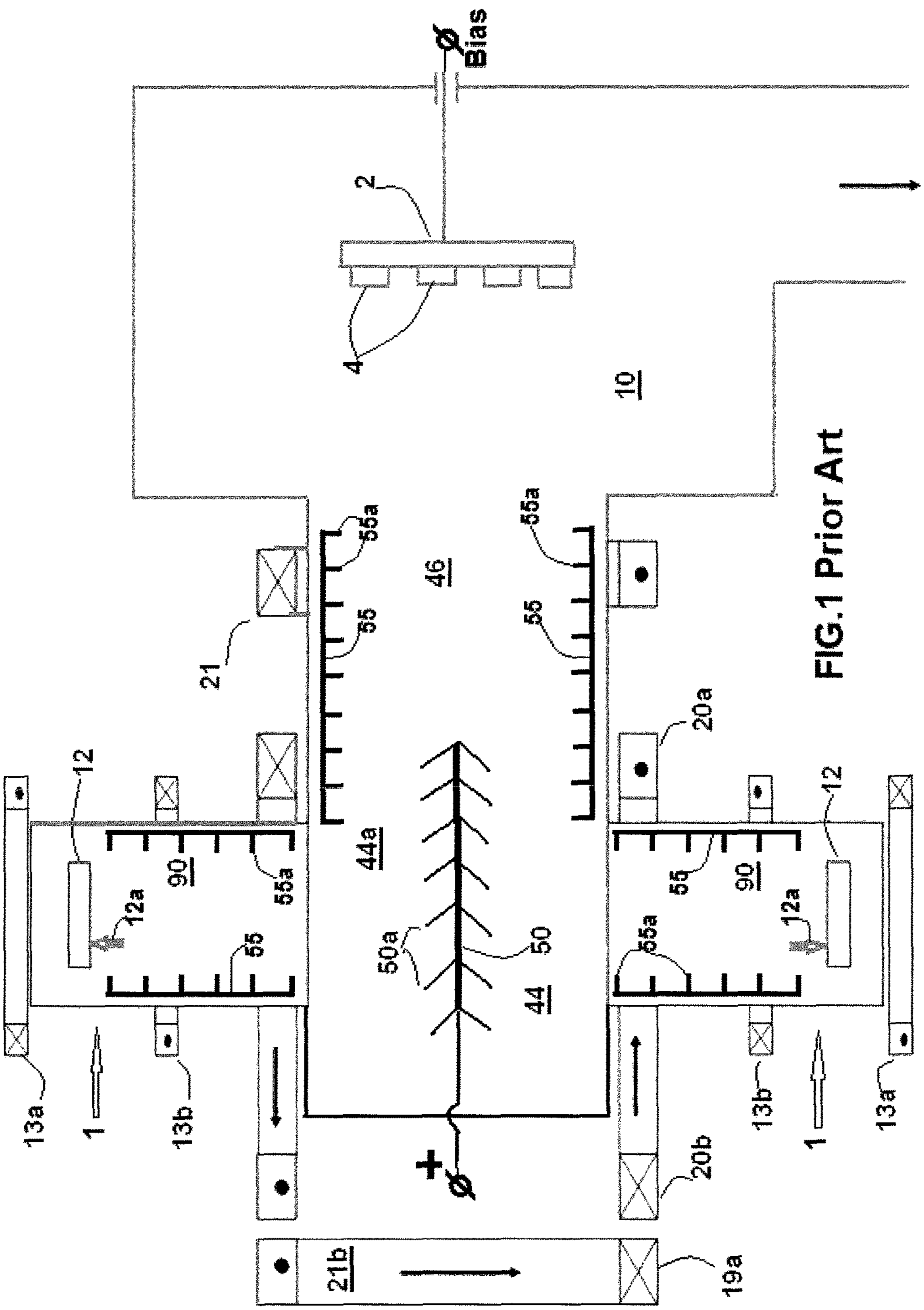
FIG. 1 is a schematic plan view of a prior art vacuum arc coating apparatus.

This invention is an improvement of the apparatus taught by U.S. Pat. No. 5,435,900 issued Jul. 25, 1995 to Gorokhovsky which incorporates a plasma source 1, utilizing the cathodic arc target 12 with arc igniter 12*a* mounted in a cathode chamber 90, a plasma duct 44 surrounded by the deflecting magnetic system, and a substrate holder 2 mounted in the coating chamber 10 off of the optical axis of cathodic arc target 12, where the steering electromagnet 13*a* is surrounded the cathode chamber 90 behind the target 12 and the focusing electromagnet 13*b* is surrounded the cathode chamber 90 in front of the target 12 as illustrated in FIG. 1. Plasma duct 44 is designed in the form of a parallelepiped with coating chamber 10 and cathode chamber 90 mounted on adjacent planes. The magnetic system that forces the plasma stream towards substrates 4 consists of linear conductors arranged along the edges of the parallelepiped. Plasma duct 44 has plates 55 with wall baffles 55*a* connected to the positive pole of the current source (not shown) or grounded and mounted on one or more planes of the plasma duct 44 and/or on the walls of the cathode chambers 90 (not occupied by the plasma source). These plates 55 with baffles 55*a*, which are charged essentially positive in relation to surrounding plasma environment, serve as deflecting electrodes to establish an electric field in a direction transverse to the magnetic field lines, to duct plasma flow toward the substrate to be coated. FIG. 1 illustrates one deflecting electrode 50 with baffles 50*a* for capturing macroparticles from the vapor plasma flow generating by the primary plasma sources 1. The advantages provided by U.S. Pat. No. 5,435,900 to Gorokhovsky include increasing the range of dimensions of articles (substrates) which can be coated, and providing the user with the option of changing the configuration of the magnetic field in order to increase ionic current at the exit of the plasma duct to 2 to 3 percent of the arc current. This design is also incorporates the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference.

If the potential of the deflecting electrode ($V_d$) located opposite the plasma source is greater than the potential of the plasma source wall ($V_w$), an electric field occurs between them. The intensity of the electric field is given by:

$$E \propto \frac{V_d - V_w}{d} \propto \sigma[1 + (\omega_e \tau_e)^2] I_d \quad (1)$$

d is the distance between the plate and the plasma duct wall,
$\omega_e$ is the gyro frequency of magnetized plasma electrons,
$\tau_e$ is the characteristic time between electron collisions,
$\sigma$ is the specific resistivity of the plasma in the absence of a magnetic field, and
$I_d$ is the current of the deflecting electrode.

Because $\omega_e$ is proportional to the plasma-guiding magnetic field B, (i.e. $\omega_e \propto B$), the transversal electric field $E_t$ as determined by formula (1) will be proportional to $B^2$, as shown by the following equation:

$$E_i \propto \sigma[1+(\omega_e\tau_e)^2]I_d \propto B_t^2 I_d \quad (2)$$

where $B_t$ is the component of the magnetic field which is tangential to the surface of the deflecting electrode.

An ion is influenced by the force:

$$F_i = Q_i \times E_i \quad (3)$$

where $Q_i$ is the ion charge. Combining formulae (2) and (3) yields:

$$F_i \propto Q_i B_t^2 I_d \quad (4)$$

This force causes an ion to turn away from the wall opposite the plasma source and directs it towards the substrate to be coated.

Another method used to reduce the incidence of macroparticles reaching the substrate is a mechanical filter consisting of a baffle, or set of baffles, interposed between the plasma source and the plasma duct and/or between the plasma duct and the substrate. Filters taught by the prior art consist of simple stationary baffles of fixed dimension, such as is described in U.S. Pat. No. 5,279,723 issued Jan. 18, 1994 to Falabella et al. and in U.S. Pat. No. 5,435,900 to Gorokhovsky, which are incorporated herein by reference. In these filters the baffles are disposed along the plasma duct walls leaving substantial portion of the macroparticles which are crossing the area near the center of the plasma duct, far from the plasma duct walls, not trapped.

Another disadvantage of U.S. Pat. No. 5,435,900 to Gorokhovsky is that the focusing coils of the primary cathodic arc sources which are installed in the cathode chambers focus the cathodic arc metal vapor plasma, having a large kinetic energy ranging from 40 eV to 200 eV, toward the center of the plasma duct chamber. The deflecting magnetic field takes this high velocity metal ion stream and starts to rotate it around the edges of the plasma duct chamber adjacent to the main chamber too late, which results in excessive losses of metal vapor plasma on the walls of the plasma duct chamber.

The present invention overcomes some or all of the above primary art disadvantages by providing mechanisms for the effective deflection of a plasma flow, simultaneously providing both high metal vapor plasma transport efficiency and high efficiency of trapping the neutral metal atoms, clusters and macroparticles.

In one embodiment the invention provides a coating chamber disposed off of the optical axis of a filtered cathodic arc source consisting of a rectangular plasma duct chamber with deflection portion of the plasma duct chamber having at least one cathode chamber attached to its side wall and an exit tunnel portion connected to the coating chamber. Baffles for trapping the macroparticles are positioned along the walls of cathode chamber and plasma duct chamber not occupied by vapor deposition sources. The tunnel portion of the plasma duct chamber is surrounded by a focusing coil, and two rectangular main deflecting coils are attached to the opposite sides of the deflecting portion of the plasma duct while an offset deflecting coil surrounds the cathode chamber upstream of the entrance into the plasma duct, allowing the deflection of the vapor plasma flow to commence prior to its entering into the plasma duct area, which effectively reduces the losses of filtered metal vapor plasma.

In a further embodiment of the invention at least two cathode chambers are attached to the opposite walls of the plasma duct of rectangular plasma duct chamber. The offset deflecting conductors are attached to the front face of the cathode chambers in the offset position in relation to the plasma duct chamber, which allows for the deflection of metal vapor plasma before it enters into the plasma duct area, substantially reducing plasma losses and increases deposition and target utilization rates.

The deflection portion of the plasma duct may have a shape of rectangular or triangular prism or a prism of other cross section having the same plane of symmetry with the exit tunnel portion of the plasma duct. The main deflecting coils may form a frame aligned along the rectangular or triangular prism or a prism of other cross-section having the same plane of symmetry with the plasma duct.

In a further embodiment the plasma duct chamber is cylindrical and cathode chambers are attached to the plasma duct portion of the plasma duct around the axis of the exit of the cathode chamber and/or at the entrance of the tunnel portion of the plasma duct chamber. The offset deflection coil is attached to the front faces of the cathode chambers on side of coating chamber.

In a further embodiment the array of thin wire anode electrodes are provided within the cylindrical plasma duct. The remote arc plasma is established within the plasma duct between the primary cathode in cathode chamber and remote anode in anode chamber. The high voltage positive voltage pulses are applied to the plasma duct and wire electrodes to increase plasma potential in the area adjacent to the plasma duct wall thereby accelerating the ions toward axes of the plasma duct, where high energy ions collide and generate high energetic particles by nuclear reaction.

In a further embodiment stream baffles are positioned at the exit of the cathode chamber and/or at the entrance to the tunnel portion of the plasma duct chamber, disposed across the metal vapor plasma flow. The stream baffles may have independent position control or, alternatively, at least a portion of them may be made of magnetic materials so they will self-align along either deflecting or focusing magnetic streamlines, which allows for an even further increase in macroparticle filtration.

The invention also provides a multiple-cathode apparatus suitable for use in plasma-immersed processes as ion implantation, ionitriding, ion cleaning and the like. In these embodiments a first filtered cathodic arc source containing one or more cathodes generates cathodic evaporate for coating the substrate, while the deflecting and focusing magnetic fields positioned to affect a second filtered cathodic arc source are deactivated so that cathodic evaporate does not flow toward the substrates. The second filtered cathodic arc source thus functions as a powerful electron emitter for plasma immersed treatment of the substrates.

Optionally in these embodiments a load lock shutter comprising a metallic grid is disposed between the plasma duct and the coating chamber, to control communication between the plasma source and the coating chamber. Where particularly contaminant-free conditions are required the load lock shutter can be closed to contain macroparticles and metal vapor within the cathode chamber(s) and plasma duct, but permit the passage of electrons into the coating chamber to thus increase the ionization level of the gaseous component within the coating chamber. The load lock shutter can further be charged with a negative potential, to thus serve as an electron accelerator and ion extractor. Optionally load lock shutters may also be provided between the filtered cathodic arc source and the plasma duct, and/or between the cathodes and the deflecting electrode within a filtered cathodic arc source.

The invention further provides an apparatus for the application of coatings in a vacuum comprising at least one filtered cathodic arc source, the apparatus comprising at least one cathode with at least one igniter contained within at least one cathode chamber, at least one anode associated with the cathode for generating an arc discharge, and a plasma duct in communication with the cathode chamber and with a substrate chamber containing a substrate holder for mounting at least one substrate to be coated, the substrate holder being positioned off of an optical axis of the cathode, the plasma duct comprising a deflection section in communication with the at least one cathode chamber, and a plurality of stream baffles disposed or movable to an orientation generally transverse to a plane parallel to a direction of plasma flow in the deflection section of the plasma duct, each stream baffle having a generally positive potential in relation to the plasma potential, whereby target ions pass through the spaces between the stream baffles while ions having a different weight or charge than the target ions follow a trajectory into the faces of the baffles, such that at least some of the ions having a different weight or charge than the target ions are blocked from reaching the substrates.

The invention further provides a filtered cathodic arc apparatus including (a) a cathodic arc source including (i) at least one cathode and at least one igniter contained within at least one cathode chamber, respectively, (ii) at least one anode associated with the cathode for generating arc discharge, and (iii) at least one stabilizing coil, disposed behind or surrounding a respective cathode, for controlling position of the arc discharge; (b) a substrate chamber containing a substrate holder for mounting at least one substrate to be coated, the substrate holder being positioned non-coincidental with an optical axis of the at least one cathode; (c) a plasma duct, in communication with each cathode chamber and the substrate chamber and comprising (i) at least one focusing coil surrounding a focusing tunnel section of the plasma duct for generating a focusing magnetic field and (ii) at least one deflecting coil generating a deflecting magnetic field for deflecting the plasma along a path toward the substrate chamber; and (d) at least one magnetron facing the substrate holder, the magnetron being positioned such that at least a portion of magnetic force lines of the focusing magnetic field overlap and are substantially parallel with at least a portion of magnetic force lines generated by the magnetron, wherein each arc source couples with a magnetron source, and any combination thereof, to increase an ionization rate of a magnetron sputtering flow.

The invention further provides a method of coating a substrate in an apparatus for the application of coatings in a vacuum comprising at least one filtered cathodic arc source, the apparatus comprising at least one cathode contained within at least one cathode chamber, at least one anode associated with the cathode, and a plasma duct in communication with the cathode chamber and with a substrate chamber containing a substrate holder for mounting at least one substrate to be coated, the substrate holder being positioned off of an optical axis of the cathode, the method comprising: a. generating an arc discharge, and b. generating a deflecting magnetic field in the cathode chamber for deflecting a plasma flow from the arc source into the plasma duct, the deflecting magnetic field deflecting plasma toward the substrate chamber before the plasma has exited the cathode chamber.

The invention further provides a method of coating a substrate in an apparatus for the application of coatings in a vacuum comprising at least one filtered cathodic arc source, the apparatus comprising at least one cathode contained within at least one cathode chamber, at least one anode associated with the cathode, and a plasma duct in communication with the cathode chamber and with a substrate chamber containing a substrate holder for mounting at least one substrate to be coated, the substrate holder being positioned off of an optical axis of the cathode, the method comprising, in any order:

a. generating an arc discharge, b. applying to a plurality of stream baffles a generally positive potential in relation to the plasma potential, and c. orienting the plurality of stream baffles in an orientation generally transverse to a plane parallel to a direction of plasma flow in the deflection section of the plasma duct, whereby target ions pass through the spaces between the stream baffles while ions having a different weight or charge than the target ions follow a trajectory into the faces of the baffles, such that at least some of the ions having a different weight or charge than the target ions are blocked from reaching the substrates.

The invention further provides a filtered cathodic arc method of generation of energetic particles comprising the apparatus comprising at least one cathode contained within at least one cathode chamber at least one proximal anode associated with the cathode for generating a primary arc discharge, at least one primary arc power supply having negative output connected to the cathode and positive output connected to the primary proximal anode or grounded generating a voltage drop between the cathode and the primary anode, at least one distal anode contained within distal anode chamber associated with the cathode for generating a remote arc discharge, a tubular plasma duct disposed between the cathode chamber and the distal anode, at least one remote arc power supply having negative output connected to the cathode and positive output connected to the distal anode for generating remote arc discharge along the plasma duct, an array of wire electrodes disposed coaxially within the plasma duct and electrically connected to the plasma duct, at least one low voltage high current plasma duct power supply having negative output connected to the cathode and positive output connected to the plasma duct, at least one unipolar power supply having positive output connected to the plasma duct and negative output connected to the cathode, at least one solenoid surrounding the plasma duct, the method comprising:

a. injecting the plasma creating gas into the apparatus, the gas pressure is ranging from 1E-6 to 100 torr;

b. generating a primary arc discharge in a cathode chamber, the primary arc current and voltage are ranging from 50 A to 500 A and from 20 V to 50V respectively;

c. generating the remote arc discharge plasma between the cathode in cathode chamber and the distal anode in distal anode chamber;

d. generating a remote arc discharge within the plasma duct between the cathode and the plasma duct, the remote arc plasma is filling the space within the array of wire electrodes, the discharge current and voltage are ranging from 50 A to 10,000 A and from 30V to 500V respectively;

e. generating longitudinal magnetic field along the plasma duct for confinement of the remote arc plasma and accelerated ions, the magnetic field ranges from 0.01 T to 20 T;

f. applying positive pulse voltage to the plasma duct, the voltage amplitude is ranging from 0.1 kV to 10,000 kV, for generating high positive potential within array of wire electrodes wherein ions generated by the remote arc discharge are accelerating from the high positive potential area occupied by wire electrodes toward axes of the plasma duct where energetic particles are produced by collision of ions.

FIG. 1 illustrates a prior art apparatus for the application of coatings in a vacuum as shown in U.S. Pat. No. 5,435,900 to Gorokhovsky. The apparatus comprises two cathode chambers 90 disposed opposite to each other and symmetrical in relationship to the plane of symmetry of the rectangular plasma duct 44. The cathodic arc plasma sources 1 are positioned at the entrance of the cathode chambers 90. Each of the plasma sources comprises a cathode target 12 with arc igniter 12*a* disposed in a cathode chamber 90 in communication with a plasma duct 44 in the form of a parallelepiped. The cathode target 12 is surrounded by a steering coil 13*a* located upstream of (i.e. behind) or surrounding the cathode target and a focusing coil 13*b* located downstream (i.e. in front) of the cathode, and the anodes (not shown) are positioned on planes of the cathode chamber adjacent to the cathode 12 to create an electric arc discharge when an arc current power supply (not shown) is activated. The plasma duct 44 is in communication with a substrate chamber 10, in which a substrate holder 2 supporting the substrates 4 is positioned. The substrate holder 2 is thus located off of the optical axis of the cathode 12, preferably at approximately a right angle, to minimize the exposure of the substrates 4 to the flow of neutral particles.

In FIG. 1 a deflecting magnetic system comprises four rectangular deflecting coils: two deflecting coils 20 are positioned at the side walls of the rectangular plasma duct chamber 44 opposite to each other, a third deflecting coil 21*b* is positioned around the back wall of the plasma duct chamber 44, and a fourth coil, a focusing coil 21, is positioned around the exit tunnel portion 46 of the plasma duct 44 adjacent to the substrate chamber 10. A deflecting magnetic field is generated by deflecting conductors 20*a* of the deflecting coils, which are positioned perpendicular to the plane of rotation of the vapor plasma flow emitted from the cathode targets 12, so that the deflecting magnetic field has the general shape of circles concentric to the deflecting conductors 20*a*. The deflecting magnetic fields created by linear conductors 20*a* of the side deflecting coils located along the edges of the plasma duct adjacent to the substrate chamber are of unidirectional magnetic field cusp geometry. The back coil 21*b* allows for the control of the deflecting magnetic field by changing the magnetic field generated by closing conductors 20*b* of the side coils parallel to the deflecting conductors 20*a*. The magnetic field created by the back coil 21*b* can be used to reduce or completely eliminate the magnetic field created by the closing conductors 20*b* of the two side deflecting coils 20 parallel to the front focusing conductors of the focusing coil 21. The preferable direction of electric current in the side coils 20 and back coil 21*b* arrangement is shown by the arrows in FIG. 1. The front focusing coil 21 focuses the metal vapor plasma toward the substrates to be coated 10.

On the walls of plasma duct 44 are mounted plate electrodes 55 provided with diaphragm filters or baffles 55*a*, spaced from the walls of the plasma duct and optionally electrically insulated therefrom, for deflecting the flow of plasma away from the optical axis of the cathode 12 and through the plasma duct 44. In the embodiment shown a positively charged deflecting and dividing electrode 50 with attached baffles 50*a* is located along a plane of symmetry of the plasma duct. This dividing electrode effectively separates two opposite parts of the plasma duct 44. The deflecting electrodes 50 may be located on any wall adjoining the wall on which the cathode target 12 is positioned. In these positions, the deflecting electrodes 50 with baffles 50*a* serve both as baffles which trap macroparticles and as a deflecting element which redirects the plasma stream toward the substrates by repelling the positively charged ions. The deflecting electrodes may be at floating potential, which is positive relative to the surrounding magnetically insulated plasma or positively biased by connecting it to the positive pole of an auxiliary current source (not shown). In any case they are biased positively in relation to the cathodes 12. It can be seen from the schematic illustration of plasma flows in this prior art apparatus shown in FIG. 2 that in this case a substantial amount of metal vapor plasma will flow in a direction along the axis of the cathode chamber 90, and will eventually be lost to the walls of the plasma duct 44. The reason for this is that the metal vapor plasma generated on the evaporating surface of the cathode targets 12 has a large kinetic energy (ranging from 40 eV to 200 eV) and continues its propagation along the axis of the cathode chamber by inertia. The deflection of this plasma flow toward the substrate chamber 10 by the deflecting coils 20 positioned around the plasma duct is occurring too late, so only small fraction of the metal plasma is deflected toward the substrate chamber 10 and used in a coating deposition process.

Although the magnetic field does not influence ions directly, a strong tangential magnetic field confines electron clouds, which in turn creates an electric field that repels ions. Thus, in the deflecting region the electric field generated by deflecting electrodes has little influence on ions entrained in the plasma stream, so ions tend to accumulate on the deflecting electrode 50 disposed along the plane of symmetry of the plasma duct 44 or on surrounding walls of the plasma duct 44 and its exit tunnel section 46 because the residual component of their momentum along the optical axis of the cathode 12 exceeds the deflecting force of the deflecting field generated by deflecting linear conductor 20*a* of the deflecting coil 20 which is positioned adjacent to the cathode chamber 90 and the exit tunnel section 46 of the plasma duct 44.

Figure 2:
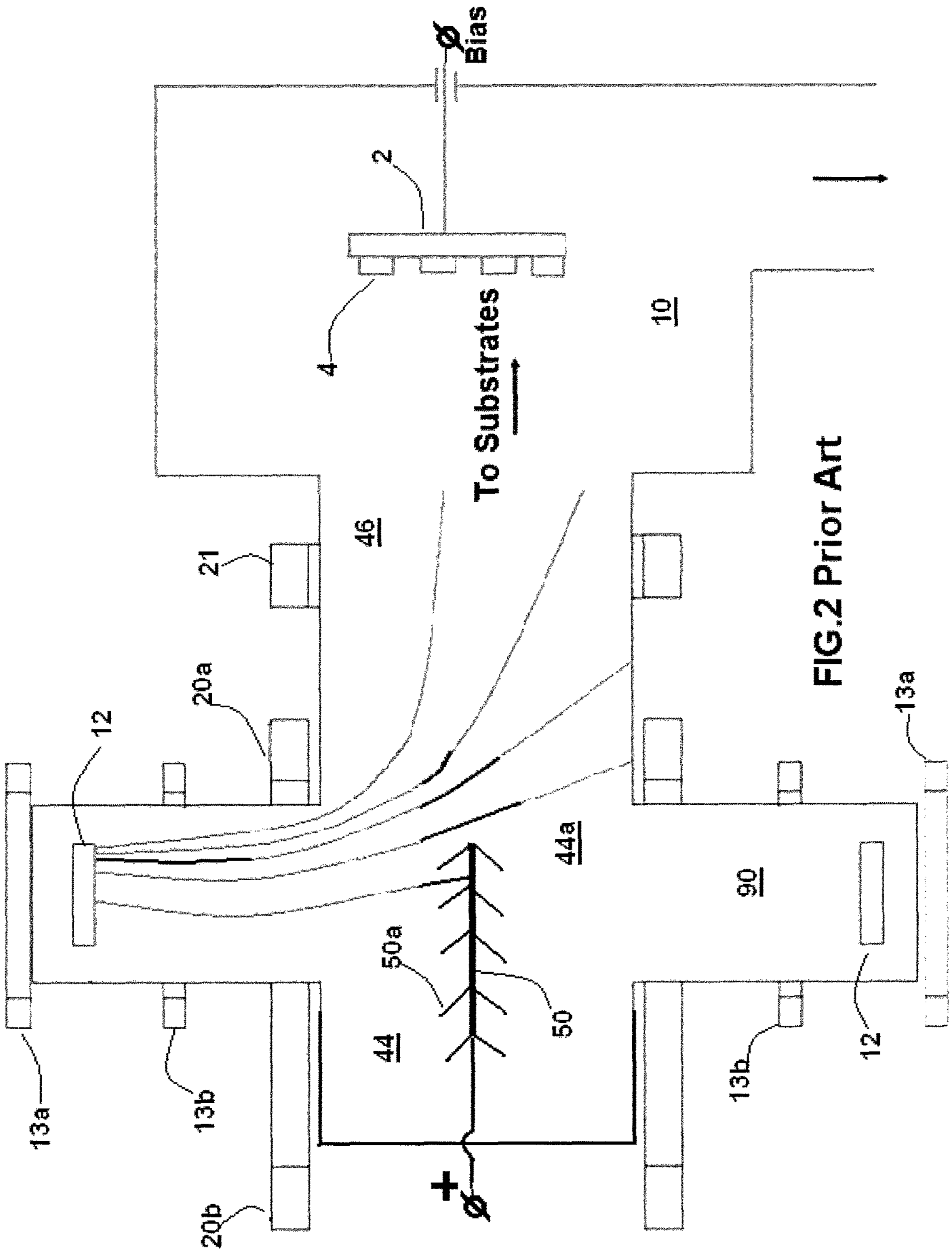
FIG. 2 is a schematic plan view of a prior art dual-cathode filtered arc source illustrating the flow of plasma resulting in metal vapor plasma losses.

The main disadvantage of the prior art apparatus shown in FIG. 1 is that the deflection of the focused vapor plasma generated by the primary cathodic arc sources only begins when the focused plasma flow enters the plasma duct. Since metal ions of the cathodic arc vapor plasma have a large kinetic energy, this late start of the deflection leads to large metal ion losses from the large portion of the metal vapor ion flow which proceeds along the axis of the cathode chamber by inertia and is largely unaffected by the deflecting magnetic field in the plasma duct 44. This is illustrated in FIG. 2 which shows the distribution of the vapor plasma flow lines within the cathode chamber 90 and within the deflection portion of the plasma duct 44*a*. It can be seen that substantial deflection from the direction along the cathode chamber 90 axes toward the substrate holder 2 in the coating chamber 10 occurs well beyond the exit of the cathode chamber 90. This results in insufficient time to deflect the metal vapor plasma stream generated by the cathodes 12 in the cathode chambers 90 to avoid large losses against the walls of the plasma duct chamber 44. Where the metal vapor plasma stream is not deflected 90° toward substrate chamber 10, a large portion of the metal vapor plasma will be lost to the walls of the plasma duct chamber 44 or dividing baffle 50 even before entering into the focusing exit tunnel section 46, while large amount of vapor plasma will be also lost to the walls of the exit tunnel section 46 of the plasma duct 44.

Figure 3A:
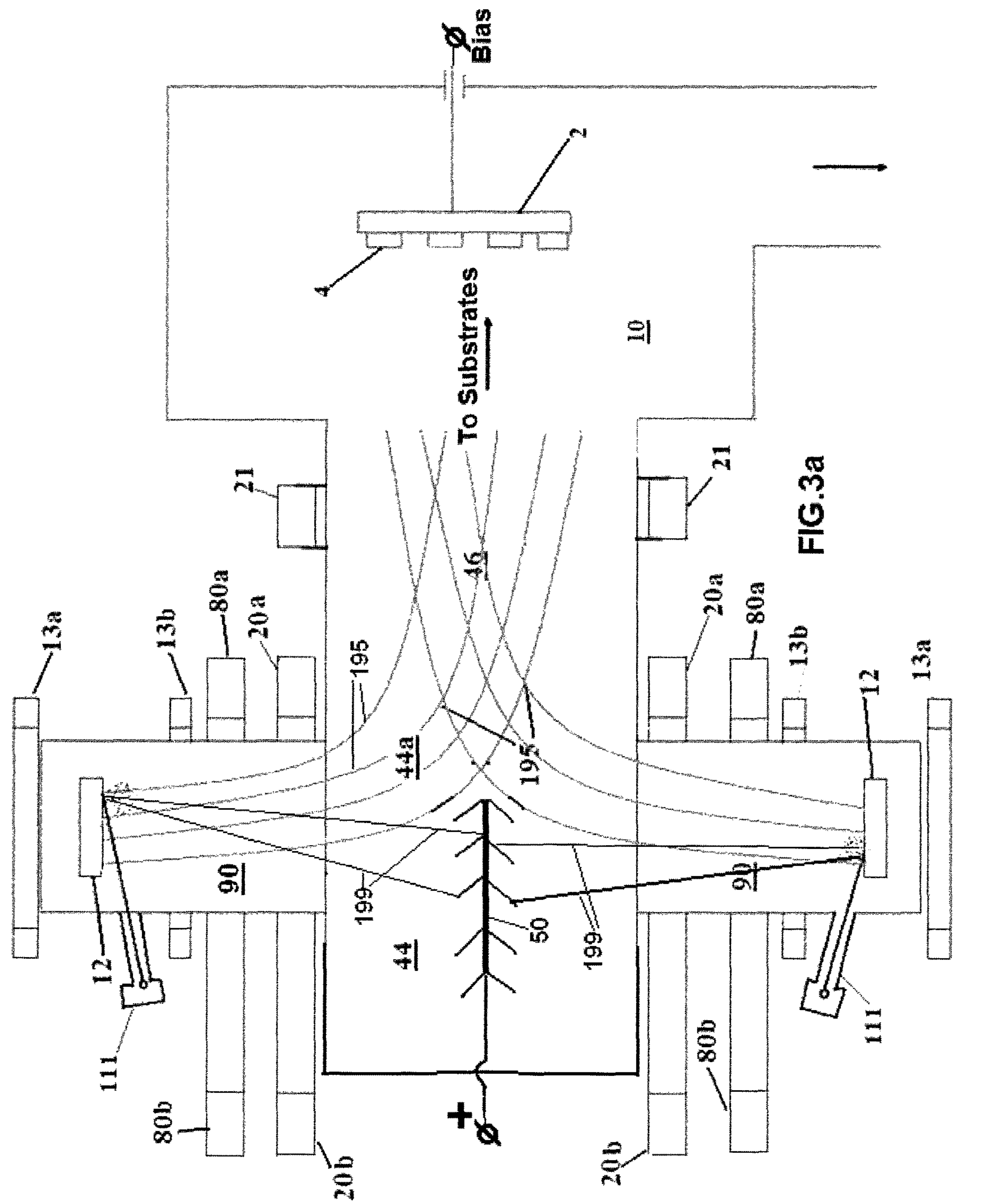
FIG. 3*a* is a partial schematic plan view of one filtered cathodic arc deposition apparatus in an embodiment of the invention.

According to the invention the filtered cathodic arc apparatus is provided with an electromagnetic system for beginning the deflection of the metal vapor plasma stream generated by a vacuum arc cathode in the cathode chamber, before it enters into plasma duct. This is accomplished by deflecting the magnetic field streamlines in the exit portion of the cathode chamber before it enters the plasma duct 44 as illustrated in FIG. 3*a* which shows an embodiment of a filtered cathodic arc deposition method and apparatus of present invention. In this embodiment of the invention the cathode target 12 is positioned at the top of cathode chamber 90 between a steering coil 13*a* and a focusing coil 13*b*. A pair of main deflecting coils 20 and focusing coil 21 can be positioned along the edges of the rectangular plasma duct 44 and its tunnel portion 46 as shown in FIG. 2 and described in a prior art U.S. Pat. No. 5,435,900 issued Jul. 25, 1995 to Gorokhovsky, which is incorporated herein by reference. This design is also incorporates the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference. Optionally, additional deflecting coil is positioned around the back wall of the plasma duct chamber 44 (not shown). A laser arc ignition 111 is used to initiate the arc discharge at the face surface of the target 12. The additional offset deflecting coils 80 surrounding the cathode chamber comprise the proximate offset front deflecting conductors 80*a* facing the substrate chamber 10 and positioned next to the cathode chamber wall, and distal offset closing conductors 80*b* positioned remote from the cathode chamber. The offset deflecting coil 80 allows for the deflection of the cathodic arc plasma flow to start at an earlier stage, inside the cathode chamber 90, which results in a dramatic increase of the filtered vapor plasma 195 which passes the plasma duct 44 and the tunnel exit portion of the plasma duct chamber 46 without striking its walls. At the same time the macroparticles having straight trajectories 199 not affected by electrical and/or magnetic field are trapped on walls of the cathode chambers 90, plasma duct 40 and baffles. This design has demonstrated substantial increase in vapor plasma transport efficiency of the macroparticle filter.

Figure 3B:
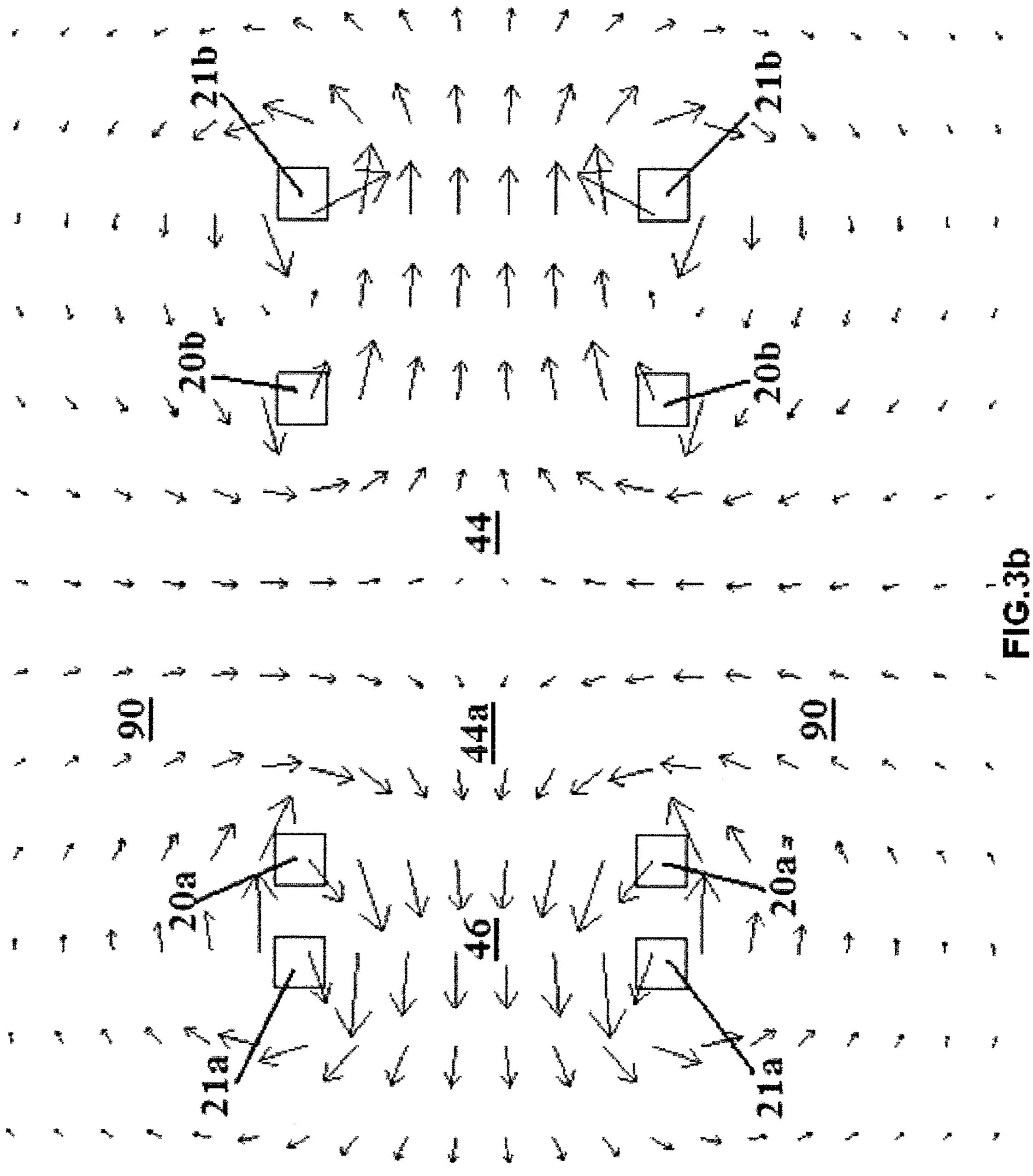
FIG. 3*b* is a magnetic vector diagram representing distribution of magnetic force lines generated by deflecting coils installed along the plasma duct as in FIG. 3*a,*
Figure 3C:
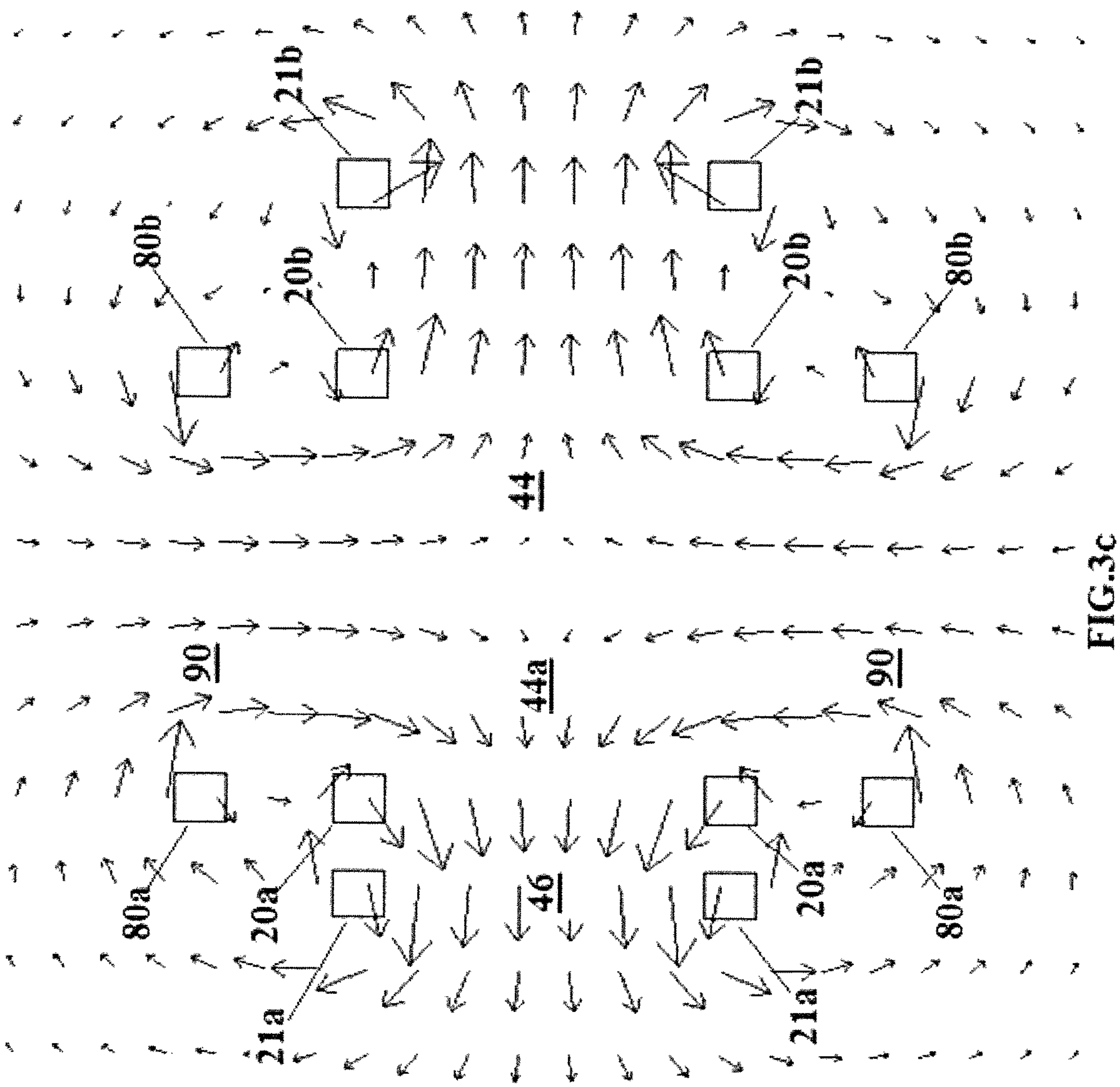
FIG. 3*c* is an exemplary magnetic vector diagram representing distribution of magnetic force lines generated by the deflecting coils in conjunction with a pair of deflection offset coils.
Figure 3D:
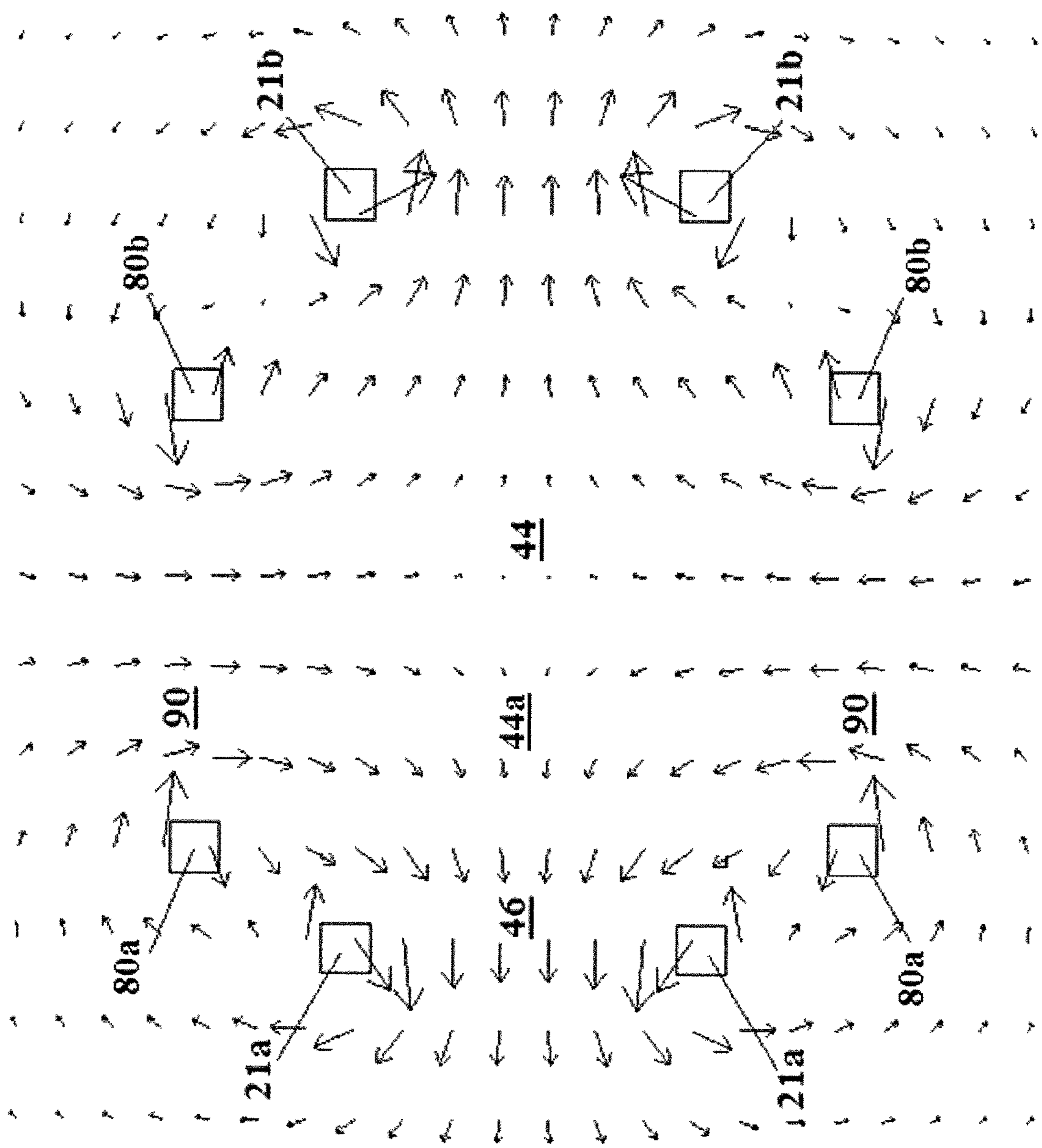
FIG. 3*d* is an exemplary magnetic vector diagram representing distribution of magnetic force lines in a configuration of magnetic coils, with the inner plasma duct deflecting coils removed.

FIGS. 3*b* through 3*d* illustrate the magnetic field distribution in the apparatus shown in FIG. 3*a*, which was prepared by 2D finite element calculation. In FIG. 3*b* both the main deflecting conductors 20 and focusing conductors 21 had a current of 2400 amperes, while the offset conductors 80 were turned OFF. It can be seen that in this case the magnetic field starts turning toward the coating chamber (not shown) only downstream of deflecting conductors 20 adjacent to the plasma duct 40.

When the offset deflecting conductors 80 are turned ON with the offset coil current of 1800 amperes, the turning of the magnetic force lines starts near the offset deflecting conductors 80*a* adjacent to the cathode chambers 90 as illustrated in FIG. 3*c*. The early turning of the magnetic force lines is can be seen even when the deflecting conductors 20*a* are turned OFF, but offset proximate deflecting conductors 80*a* are turned ON with current of 1800 amperes as shown in FIG. 3*d*.

Figure 3E:
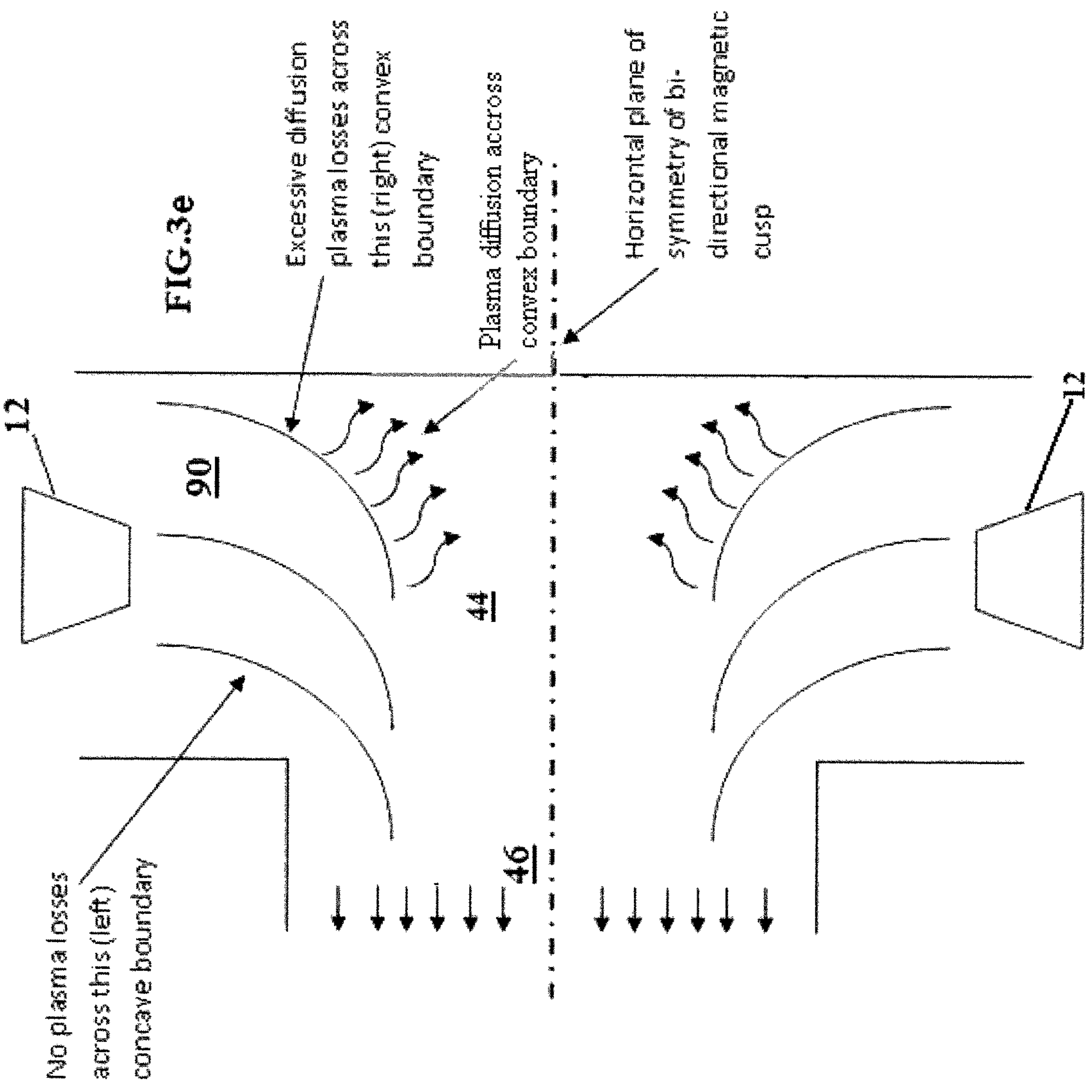
FIG. 3*e* is an exemplary schematic diagram showing plasma transport in a unidirectional magnetic field cusp.
Figure 3F:
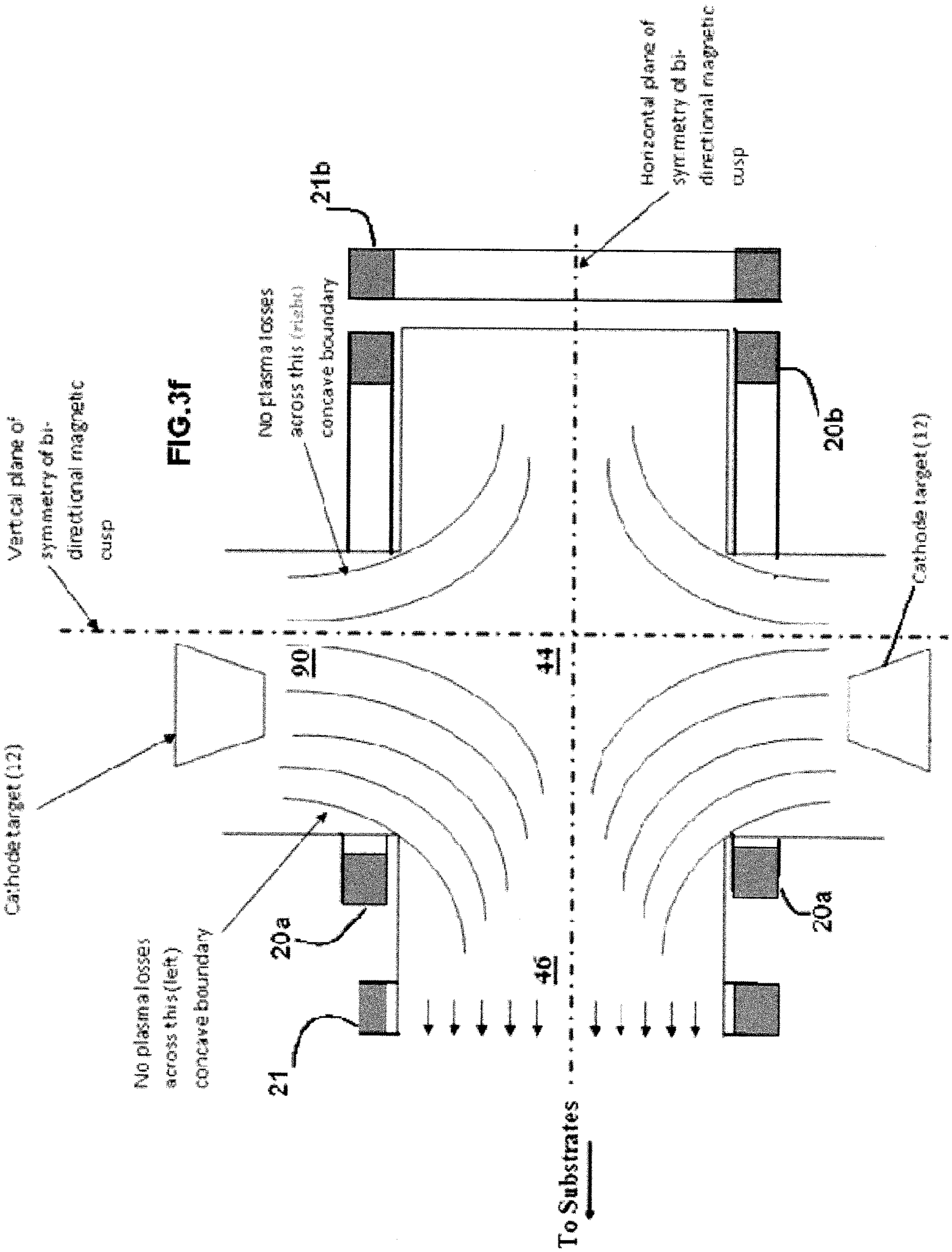
FIG. 3*f* is an exemplary schematic diagram showing plasma transport in a bi-directional magnetic field cusp.
Figure 3G:
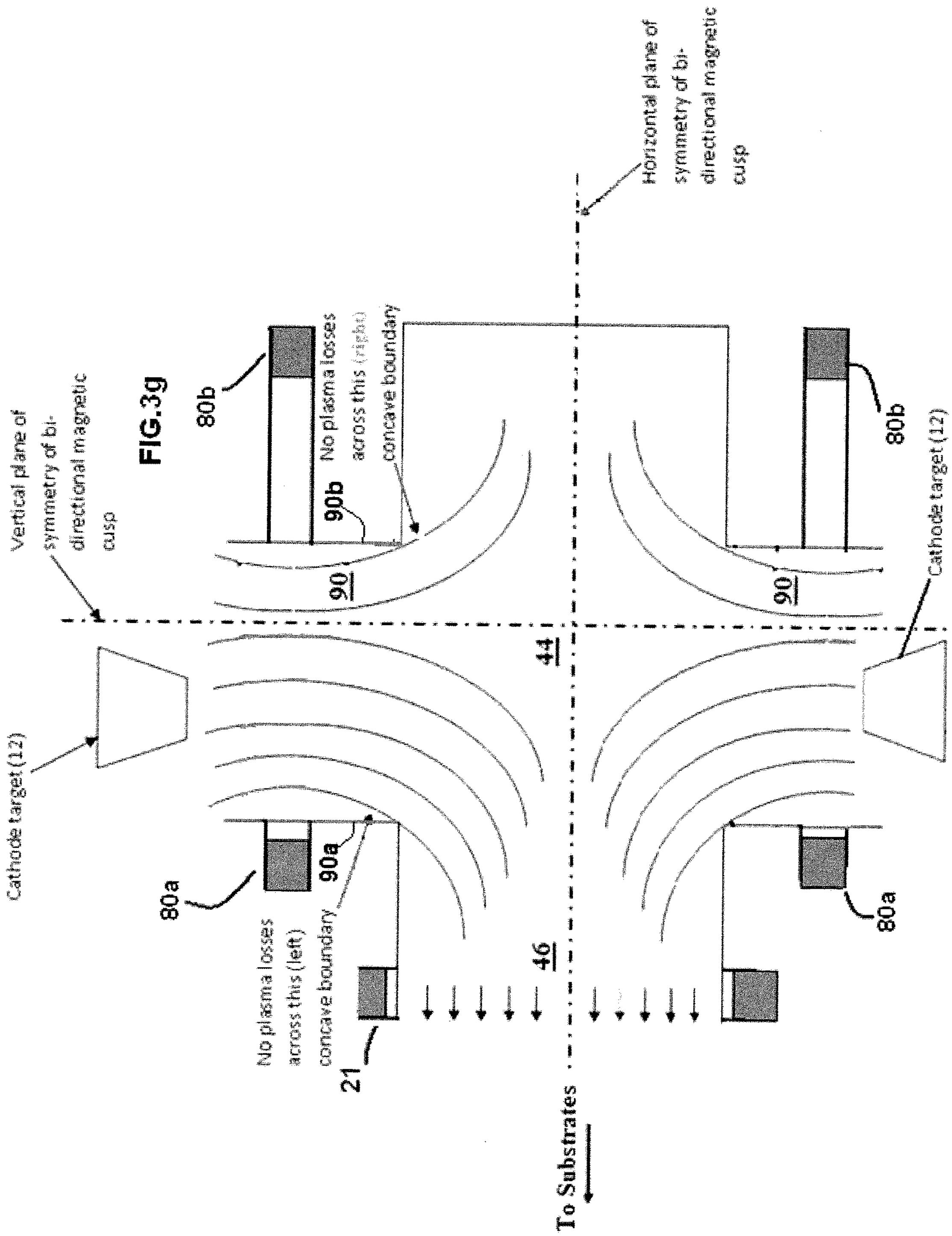
FIG. 3*g* is a variation of schematic diagram of FIG. 3*f* showing plasma transport in a bi-directional magnetic field cusp in which deflection coils are disposed in offset position in relation to the plasma duct.

FIGS. 3*e* through 3*g* illustrate the plasma transport efficiency in unidirectional vs. bidirectional plasma duct. The convex plasma boundary in an unidirectional plasma duct shown in FIG. 3*e* results in excessive plasma losses by diffusion across the convex plasma boundary toward back walls of the cathode chamber 90 and plasma duct 44. The plasma losses across the concave plasma boundaries forming in bi-directional cusp configuration shown in FIG. 3*f* are substantially reduced. The efficiency of plasma transport can be further improved by creating the concave boundaries of the vapor plasma stream and bending the plasma stream already in a cathode chamber 90 as illustrated in FIG. 3*g*. To keep the concave shape of both downstream and upstream magnetic force lines both in the cathode chamber 90 and within the plasma duct 44 the midpoint between the offset proximate deflecting conductor 80*a* and the offset distal closing deflecting conductor 80*b* of the offset deflecting coil 80 must be disposed within the cathode chamber 90. In case if the proximate and distal deflecting conductors belong to different deflecting coils their respective currents can be adjusted independently from each other hence they can provide concave magnetic field topology on both sides 90*a* nearest to the substrate chamber and 90*b* farthest from the substrate chamber of the cathode chamber 90 even when the distance between these conductors greater than two times the width of the cathode chamber 90. For example, the distance between closing linear conductors 80*b* and the center of the cathode target 12 may be chosen to be between 1.2 and 10 times the distance between the center of the cathode target 12 and the back walls 90*b* of the cathode chamber 90. When the distance between the closing linear conductors 80*b* and the center of the cathode target 12 is outside of the range defined from 1.2 to 10 times the effect of concave deflecting magnetic field within cathode chamber 90 for suppressing plasma diffusion losses is nearly disappearing.

Figure 6A:
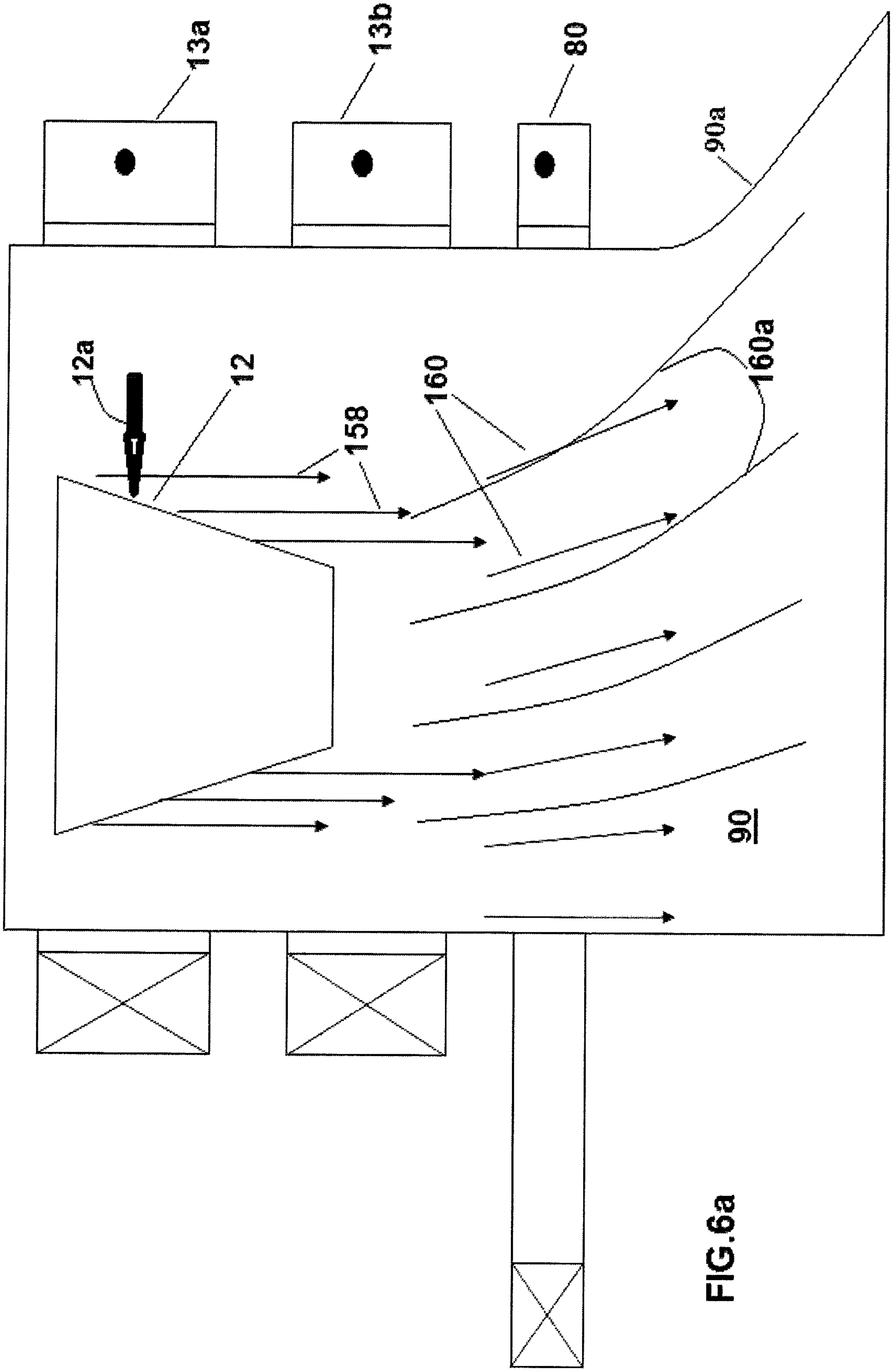
FIG. 6*a* is an exemplary schematic plan view of a cathode chamber utilizing a frustoconical primary cathode target.

The critical issue for improving the efficiency of vapor plasma transport in curvilinear magnetic field is a necessity to avoid the magnetic field crossing the walls of cathode chambers and plasma duct. The vapor plasma stream generated at the evaporating surface of the primary cathode targets 12 is transported largely along the magnetic field lines. Any vapor plasma flow which is confined to the portion of the magnetic field lines that are crossing the walls at the turning point between cathode chambers 90 and the plasma duct 44 is condensing on the walls and contributing to the losses of the plasma vapor from the useful coating deposition process. According to the present invention, the walls 90*a* of the cathode chambers 90 adjacent to the plasma duct on the side facing the substrate chamber where the plasma flow is turning toward the substrate chamber may be either moved forward (downstream toward the substrate chamber), as shown for example in FIGS. 6*b*, 7*a* and 7*b*, or bent to follow the peripheral magnetic force lines as shown in FIG. 6*a* so the magnetic force lines 160 will not cross the walls of the cathode chambers. The cathode target 12 can be positioned eccentrically in substrate chamber to leave more space for plasma to turn toward substrate holder in the substrate chamber without crossing the cathode chamber 90 walls as illustrated in FIG. 6*a*. This design of the cathode chambers 90 is especially favorable for the present invention since it forms a starting point for deflection of the magnetic force lines already in the cathode chamber 90 prior to entering the plasma duct 44.

Figure 4A:
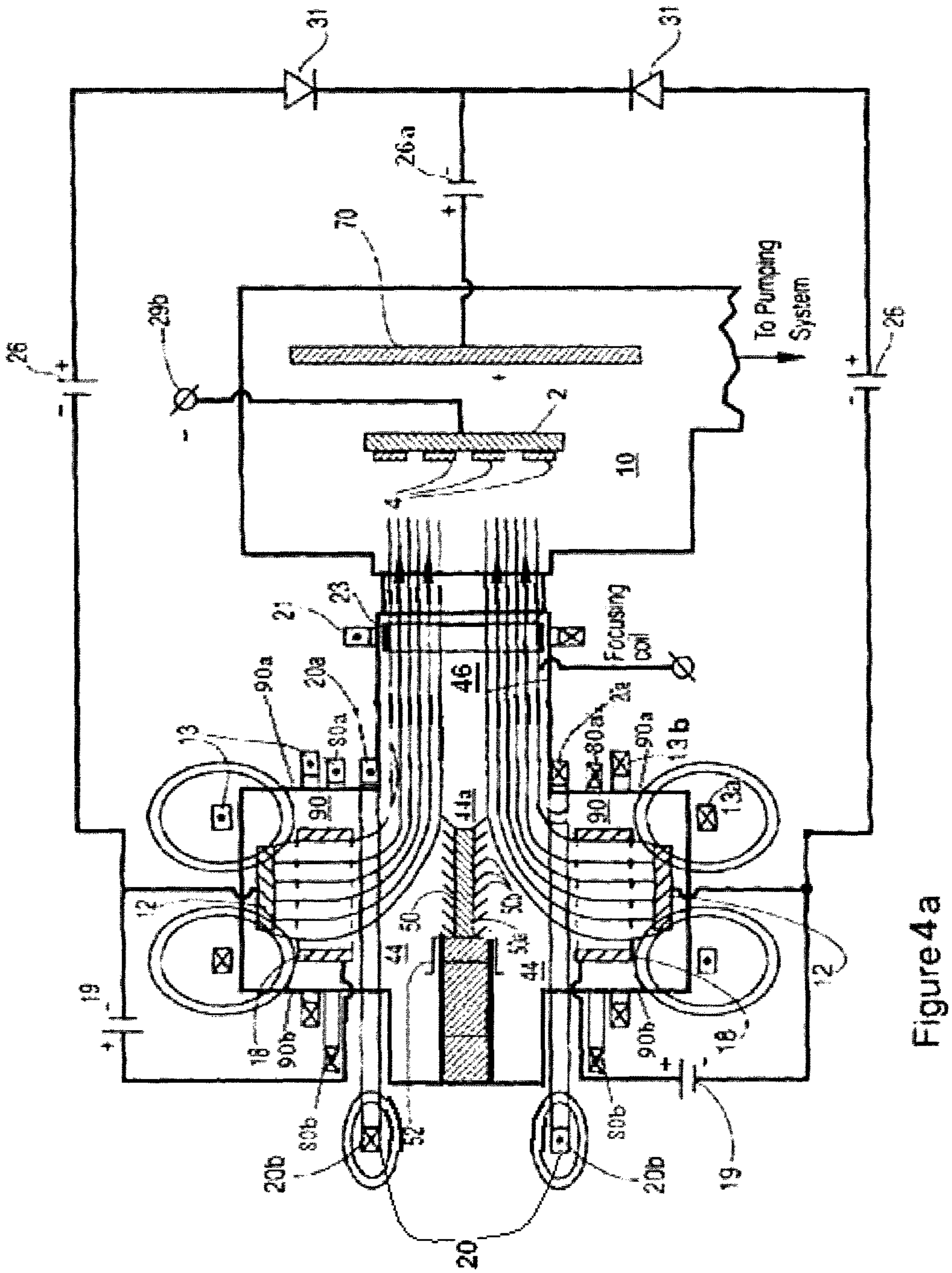
FIG. 4*a* is a schematic plan view of one filtered cathodic arc deposition apparatus providing a pair of deflection offset coils surrounding the cathode chambers downstream of a pair of focusing coils, in an embodiment.

FIG. 4*a* illustrates an embodiment of filtered cathodic arc deposition method and apparatus of present invention embodying a filtered cathodic arc source containing two primary cathodic arc sources with cathode targets 12 disposed in two opposite cathode chambers 90 in communication with a plasma duct 44, which has a form of parallelepiped. The cathode chambers 90 are surrounded by focusing and stabilizing coils 13. Anodes 18, optionally provided with baffles to trap macroparticles, may be disposed on planes of the cathode chambers 90 adjacent to the cathodes 12 and either connected to DC power source 19 or grounded, as in the prior art.

In the preferred embodiment the deflecting magnetic system comprises a pair of rectangular coils 20 surrounding opposite side walls along the edges of the deflection section 44*a* of the plasma duct 44, and a focusing coil 21 surrounding the focusing exit tunnel portion 46 of the plasma duct connected to the substrate chamber 10 downstream of the deflecting coil 20. As in the prior art the deflection portion of the plasma duct 44 is in communication with a substrate chamber 10 via its focusing exit tunnel portion 46. The substrate chamber 10 contains the substrate holder 2 with substrates to be coated 4, positioned off of the optical axis of the cathodes 12 of the primary cathodic arc sources positioned at the entrance of the cathode chambers 90 on both opposite sides of the deflection section of the plasma duct 44. The baffles to trap macroparticles are optionally provided on walls of the plasma duct 44 and its focusing exit tunnel portion 46 as in the prior art (as shown in FIG. 1). Dividing electrode 50, connected to the positive pole of the arc powder supply, grounded or insulated from the plasma duct, having a positive in respect to plasma floating potential can be optionally provided along the plane of symmetry of the plasma duct separating its two sides with two opposite cathode chambers 90. The dividing electrode 50 is provided with baffle plates 50*b* to trap the macroparticles. If used, the dividing baffle 50 is installed in the deflection portion 44*a* of the plasma duct 44 between two cathode chambers 90.

According to the invention, the filtered cathodic arc apparatus is additionally provided with offset deflecting coils 80 installed around the exit portions of the cathode chambers 90 in an offset position with respect to the plasma duct. For example, in the embodiment shown in FIG. 4*a* the offset proximate front linear conductors 80*a* of offset deflecting coils 80 are positioned next to the walls of the cathode chambers 90 on the side of the substrate chamber 10, while their respective offset distal closing linear conductors 80*b* are positioned at a substantial distance behind the back walls of the cathode chambers 90 so as to have a lesser magnetic influence on the plasma stream within the cathode chamber 90 than their associated deflecting conductors 80*a*. For example, the distance between closing linear conductors 80*b* and the center of the cathode target 12 may be chosen to be between 1.25 and 10 times the distance between the center of the cathode target 12 and the back wall of the cathode chamber 90*b*. If this distance is less than 1.25 times the distance from the center of the cathode target 12 and the back wall 90*b* of the cathode chamber 90 the asymmetry of the magnetic field is not enough to create a necessary high driving force for bending the plasma flow toward deflection portion 44*a* of the plasma duct 44. If this distance is more than 10 times the distance from the center of the cathode target 12 and the back wall of the cathode chamber 90*b* the influence of the distal offset conductor 80*b* on deflecting field in cathode chamber 90 becomes negligible. This creates a substantial increase of the magnetic field intensity near the side 90*a* of cathode chamber 90 nearest to the substrate chamber 10. The increase of the magnetic field on the side 90*a* of cathode chamber 90 nearest to the substrate chamber 10 results in deflecting the magnetic field streamlines generated by the deflecting coils 80 in a direction toward substrate chamber 10. In addition, this increases the magnetic pressure $p_B=B^2/8\pi$ on side 90*a* of the cathode chamber 90 nearest to the substrate chamber 10, which in turn leads to an increase of the electron pressure $p_e$ and accordingly the electron density in the plasma stream on side 90*a* of the cathode chamber 90 nearest to the substrate chamber 10 according to the well-known relationship:

$$p_e \propto B^2/8\pi \qquad (5)$$

This increase in electron density leads to increase in metal vapor ion density to satisfy the quasineutrality of the plasma. Both of these factors—deflecting the magnetic field streamlines toward substrate chamber and the increase in metal vapor ion density on side 90*a* of the cathode chamber 90 nearest to the substrate chamber 10—contribute to the earlier deflection of the metal vapor plasma flow toward the substrate chamber 10 because deflection of the plasma begins in the cathode chamber 90 prior to the plasma entering the plasma duct 44. This results in dramatic increase of the deflected metal ion flow which can be used in the coating deposition process as illustrated in FIG. 3*a*. To suppress the losses of vapor plasma by diffusion in transversal direction toward walls of the cathode chambers 90 the concave magnetic force lines should be maintained both on side 90*a* of the cathode chamber 90 nearest to the substrate chamber 10 and on side 90*b* of the cathode chamber 90 farthest from the substrate chamber 10. This can be accomplished by maintaining the position of the midpoint between the offset proximate front linear conductor 80*a* and offset distal closing linear conductor 80*b* of the offset deflecting coil 80 within the coating chamber 90.

The offset deflecting coils 80 can also serve as focusing coils when the focusing coil 21 is turned OFF. In this case the deflection capability of the offset deflecting coils 80 alone is not enough to deflect the metal vapor plasma flow toward substrate chamber 10. Although the offset deflecting coils 80 can shift the plasma stream generated by the primary cathodic arc sources toward substrate chamber 10, most of the plasma flow will end on the opposite walls of the plasma duct 44 and its exit tunnel section 46. In this mode the power supplies 26 can be turned ON to establish an auxiliary arc discharge between the primary cathodic arc sources in the cathode chambers 90 and an auxiliary arc anode 70 in the substrate chamber 10. This discharge typically provides more than 3% ionized gaseous plasma assisting in ion cleaning, ion etching, ion implantation, ionitriding and low pressure CVD processes.

Figure 4:
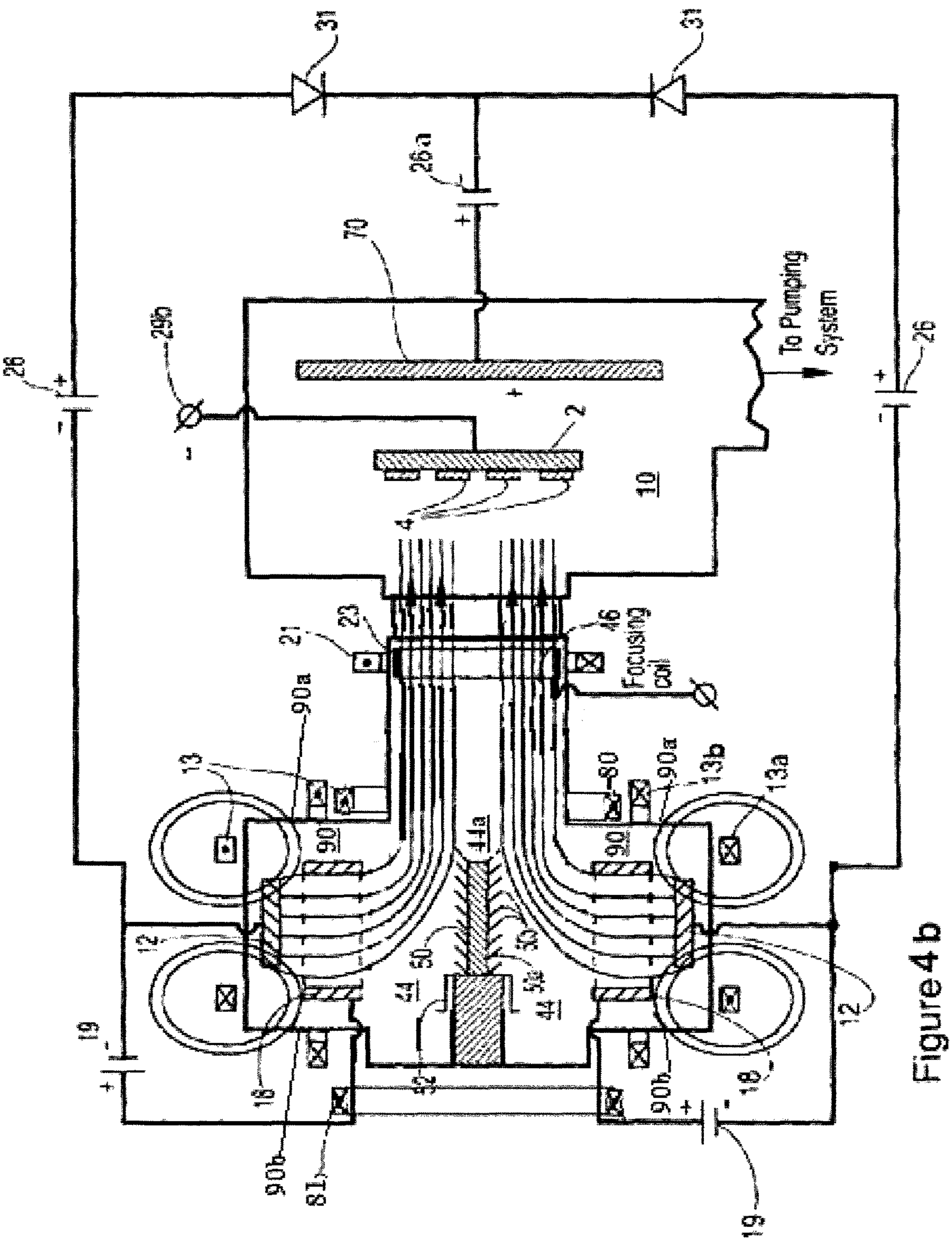
FIG. 4*b* is a schematic plan view of one filtered cathodic arc deposition apparatus providing a pair of deflection offset coils positioned in front of and behind the cathode chambers, in an embodiment.
FIG. 4*c* is a schematic plan view of one filtered cathodic arc deposition apparatus providing a pair of deflection offset coils surrounding the cathode chambers, in an embodiment.
FIG. 4*d* is a schematic plan view of one filtered cathodic arc deposition apparatus providing a pair of deflection offset coils surrounding the cathode chambers overlapping a pair of focusing coils, in an embodiment.
FIG. 4*e* is a schematic plan view of one filtered cathodic arc deposition apparatus providing various baffle arrangements, in an embodiment.
FIG. 4*f* is an schematic plan view of an exemplary filtered cathodic arc deposition apparatus having two unidirectional dual filtered cathodic arc sources in connection with a coating chamber.
FIG. 4*g* is a schematic view of one filtered cathodic arc deposition apparatus providing a single saddle-shaped deflecting coil, in an embodiment.
FIG. 4*h* is a schematic view of one filtered cathodic arc deposition apparatus providing a saddle-shaped deflecting double-coil arrangement, in an embodiment.
FIG. 4*i* is a schematic view of one filtered cathodic arc deposition apparatus providing a rectangular coil with offset deflecting conductors parallel to the focusing coil, in an embodiment.
FIG. 4*j* is a schematic plan view of one filtered cathodic arc deposition apparatus providing a deflection portion of a plasma duct having a triangular prism shape and a frustoconical primary cathode target, in an embodiment.
FIG. 4*k* is a schematic plan view of one filtered cathodic arc deposition apparatus utilizing two magnetrons installed at the exit of the plasma duct magnetically coupled to the filtered-arc source, in an embodiment.
FIG. 4L is schematic plan view of one filtered cathodic arc deposition apparatus utilizing two magnetrons installed at the exit of the plasma duct magnetically coupled to the filtered-arc source, wherein the magnetrons have rotating tubular targets, in an embodiment.
Figure 4C:
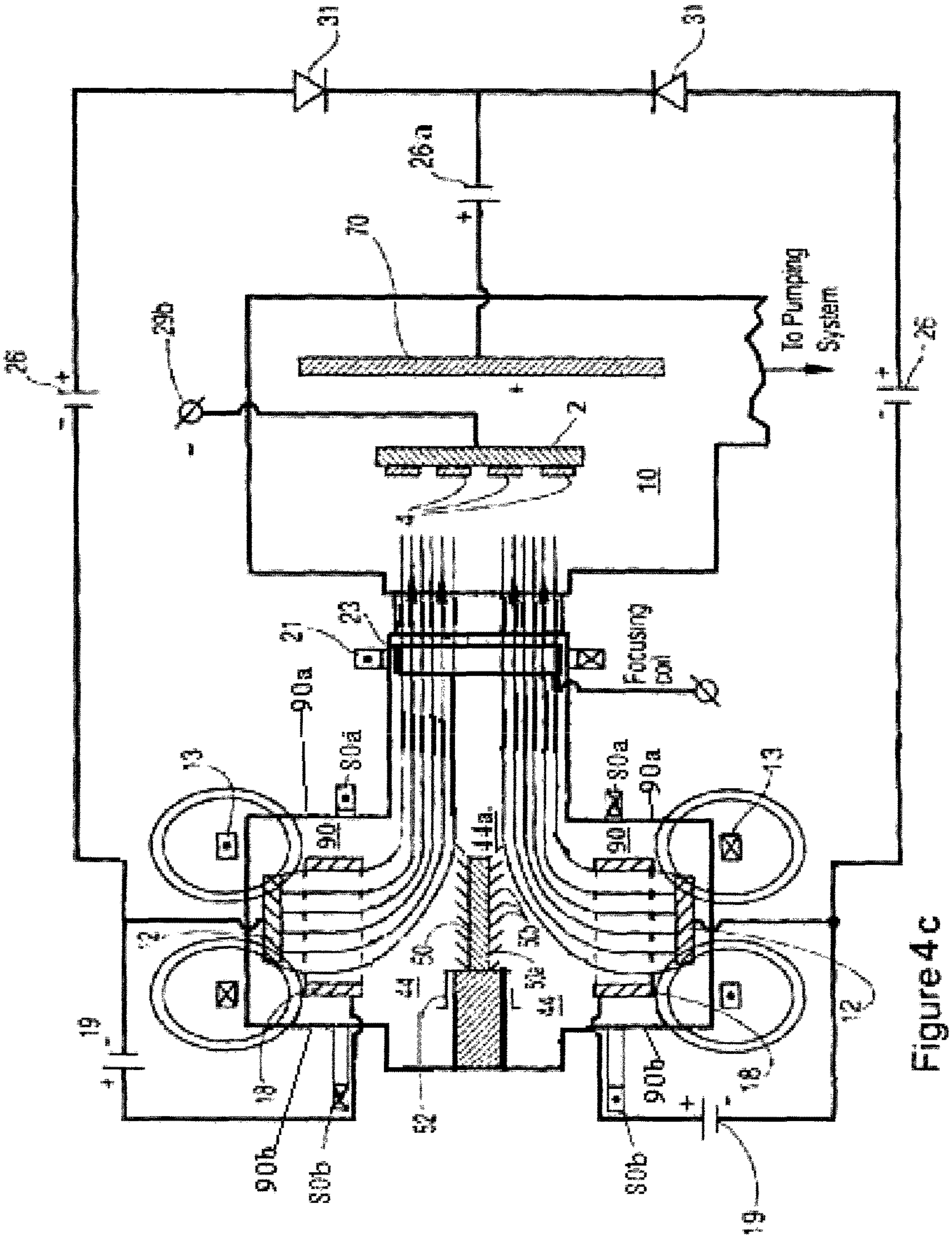

The offset deflecting coils 80 can be used as the only deflecting coils of the unidirectional dual filtered cathodic arc apparatus without deflecting coils 20 as illustrated in FIG. 4*c*. In this case the deflection field produced by offset deflecting coils 80 is coupled with the focusing field produced by focusing coil 21 surrounding the exit portion of the plasma duct tunnel 46. The distribution of the magnetic field lines in plasma duct in a case presented in FIG. 4*c* is similar to that shown in FIG. 3*d*. It can be seen that using the offset deflecting coils 80 surrounding the cathode chambers 90 instead of deflection coils 20 allows to move the turning point of the magnetic field streamlines upstream which results in a turning of the vapor plasma flow at earlier stage than in a prior art apparatus shown in FIG. 2.

In a further embodiment of the invention shown in FIG. 4*b* at least two offset deflecting coils 80 and 81 are installed around the cathode chambers 90. A proximal offset deflecting coil 80 is installed next to the cathode chambers 90 on the side 90*a* nearest to the substrate chamber 10. The proximal offset deflecting conductors of the proximal offset deflecting coil 80 are positioned between the focusing coils 13*b* and the entrance to the plasma duct 44. A distal offset deflecting coil 81 is positioned behind the plasma duct 44, at a larger distance from the back side of the cathode chambers 90, which distance exceeds the distance between the coil 80 and the side 90*a* of the cathode chambers 90 nearest to the substrate chamber 10. The polarity of the proximal offset deflecting coil 80 is the same as that of the focusing coil 21, while the polarity of the distal offset deflecting coil 81 is opposite to the coil 80.

In the operation of these embodiments, the substrates 4 are mounted on the substrate holder 2 in the substrate chamber 10. The apparatus is evacuated to the desired pressure using conventional techniques and vacuum pumping apparatus well known to those skilled in the art. The primary current source 19 is activated, creating an arc discharge between the cathode 12 and anodes 18 which begins to evaporate the cathodic material into the cathode chamber 90. At the same time, or after a selected time interval as desired, the auxiliary current source (not shown) is energized to bias the optional focusing electrode 23, creating a focusing electric field in the exit tunnel portion 46 of the plasma duct 44. The substrates 4 to be coated are connected to the negative terminal 29*b* of the bias power supply (not shown), while the positive pole of the bias power supply is either grounded or connected to the cathode target 12 of the primary cathodic arc source installed in the cathode chamber 90. In a magnetized filtered arc metal vapor plasma propagating along magnetic force lines of the deflecting and focusing magnetic fields of the filtered cathodic arc apparatus of the present invention, the potential of the substrates 4 to be coated is typically defined by reference to the primary cathode targets 12 emitting the electrons and generating a metal vapor plasma stream.

One of the problems that appear during deposition of coating in dense strongly ionized plasma is micro-arcing on substrates 4. When the substrate bias voltage exceeds the voltage drop associated with the vacuum arc discharge, arc breakdown can result in creating arc spots that damage the surface of the substrates 4 to be coated. To eliminate this problem, the direction of the current conveyed by the plasma environment to the substrate surface may be reversed with repetition frequency exceeding the characteristic frequency of vacuum arc breakdown. To perform this bi-pulse bias operation a DC bias power supply having positive and negative poles (not shown) can be connected to the substrate holder 2 via a switching arrangement utilizing fast switching solid state elements such as IGBTs or the like. The switching cycle is controlled by a low voltage control device (not shown). This connects the substrate holder 2 alternately to the positive and negative poles of the bias power supply while a primary cathode target remains as a permanent reference electrode.

Cathodic evaporate is ejected from cathode 12 in an ionized plasma containing both ionized coating particles and neutral contaminate or macroparticles. The plasma is focused by the magnetic focusing coils 13 and flows past the anodes 18. The plasma stream, with entrained macroparticles vaporized from the evaporation surface of the cathode 12, is thus ejected toward the optional deflecting electrode 50. The pair of offset deflecting coils 80 (or proximate offset deflecting coil 80 and distal offset deflecting 81 in FIG. 4*b*) generates a concave deflecting magnetic field already within the cathode chamber 90 which directs the plasma stream along with ions of coating material suspended therein through the exit portion of the coating chamber 90 following by the deflecting portion 44*a* of the plasma duct 44 and the tunneling exit section 46 of the plasma duct 44 toward the substrate chamber 10, as shown by the arrows in FIGS. 4*a* to 4*d*. Neutral macroparticles remain unaffected by the deflecting magnetic field and the electric fields generated around deflecting electrode 50 are trapped by the sets of baffles 50*a*, 50*b* which may be installed along the deflecting electrode 50, or the baffles which may be installed along the walls of cathode chambers 90 and plasma duct 44 (as shown in FIG. 1). Neutral particles continue their movement in a path generally along the optical axis of the cathode 12, striking the deflecting electrode 50 and walls of the cathode chambers and plasma duct and either adhering to the electrode 50 and the walls and baffles or falling to the bottom of the apparatus.

In the embodiment of FIG. 4*b*, which illustrates a variation of an embodiment of filtered cathodic arc deposition method and apparatus shown in FIG. 4*a*, since the polarity of the proximate offset deflecting coil 80 is the same as that of the focusing coil 21, while the polarity of the distal offset deflecting coil 81 is opposite to the proximate offset deflecting coil 80, a bidirectional magnetic cusp configuration is created with an upstream cusp directed away from the substrate chamber 10 and a downstream cusp directed toward the substrate chamber 10. The upstream cusp covers the part of the exit portion of the cathode chamber 90*b* farthest from the substrate chamber 10, while the downstream cusp covers the part of the exit portion of the cathode chamber 90*a* nearest to the substrate chamber 10. The proximate offset deflecting coil 80 creates the concave deflecting magnetic field within the part of the exit portion of the cathode chamber 90*a* nearest to the substrate chamber 10, while the distal offset deflecting coil 81 creates the concave deflecting magnetic field within the part of the exit portion of the cathode chamber 90*b* farthest from the substrate chamber 10. The metal vapor plasma flow generated by cathodes 12 is deflected toward the substrate chamber 10 starting from the area within the cathode chambers 90 where the deflection of the magnetic streamlines toward substrate chamber 10 starts, followed by the deflection section 44*a* of the plasma duct 44 and continuing into the exit tunnel section 46 of the plasma duct 44. The currents of the offset deflecting coils 80 and 81 should be adjusted to keep concave shape of the deflecting magnetic force lines on both sides of the coating chamber 90: on the side 90*a* nearest to the substrate chamber 10 and on opposite side 90*b* farthest from the substrate chamber 10. If the total currents in the offset coils 80 and 81 are equal to each other, the coils are parallel to each other and perpendicular to the plane of symmetry of the plasma duct 44 and the distance between their offset deflecting linear conductors and the plane of symmetry of the plasma duct 44 are also equal then the midpoints between their respective deflecting conductors should be disposed within the corresponding cathode chambers 90. This condition will secure the concave shape of the deflecting magnetic field within the cathode chambers 90. During the process stages which do not require metal vapor deposition process such as ion cleaning, ionitriding, ion implantation and low pressure plasma assisted CVD, the offset deflecting coils 80, 81 are not activated while the stabilizing and focusing coils are turned ON, supporting the continued operation of the primary cathodic arc sources 12. The power supplies 26 are turned ON and an auxiliary arc discharge is established between the cathode targets 12 of the primary cathodic arc sources and the auxiliary anode 70 positioned in the substrate chamber 10. In this case the highly ionized (more than 3% ionization rate) gaseous plasma fills the substrate chamber 10 to support all plasma immersion surface treatment processes excluding filtered arc metal vapor deposition.

Figure 4D:
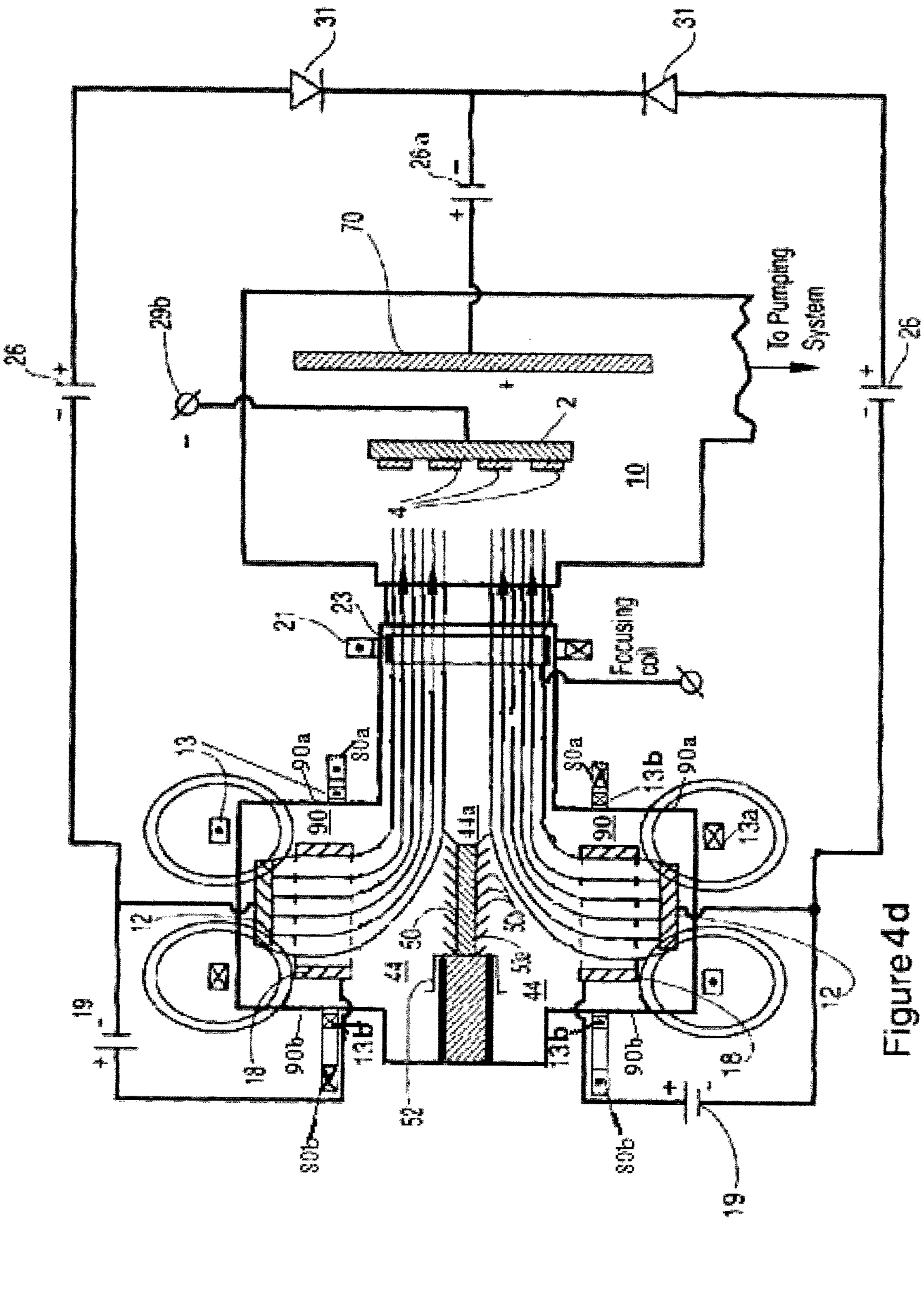

In the further embodiment of the filtered cathodic arc deposition method and apparatus of present invention shown in FIG. 4*d* a pair of offset deflecting coils 80 overlap the focusing coils 13*b*. The deflecting conductors 80*a* of the offset deflecting coils 80 are positioned over top of the conductors of the focusing coils 13*b* on a side 90*a* of the cathode chamber 90 nearest to the substrate chamber 10. In this embodiment the focusing coils 13*b* can be activated independently from the deflection coils 80 to support the primary cathodic arcs generated by the cathodes 12 in a cathode chambers 90 during a plasma immersion process stages which do not involve filtered cathodic arc coating deposition, such as ion cleaning, ionitriding, ion implantation and low pressure plasma assisted CVD. When the coils 80 are turned ON, with or without focusing coils 13*b*, but with plasma duct tunnel focusing coil 21 ON, the filtered cathodic arc coating deposition process will start and a large amount of metal vapor plasma generated by the primary cathodic arc targets 12 will be deflected toward the substrate chamber 10.

Figure 4E:
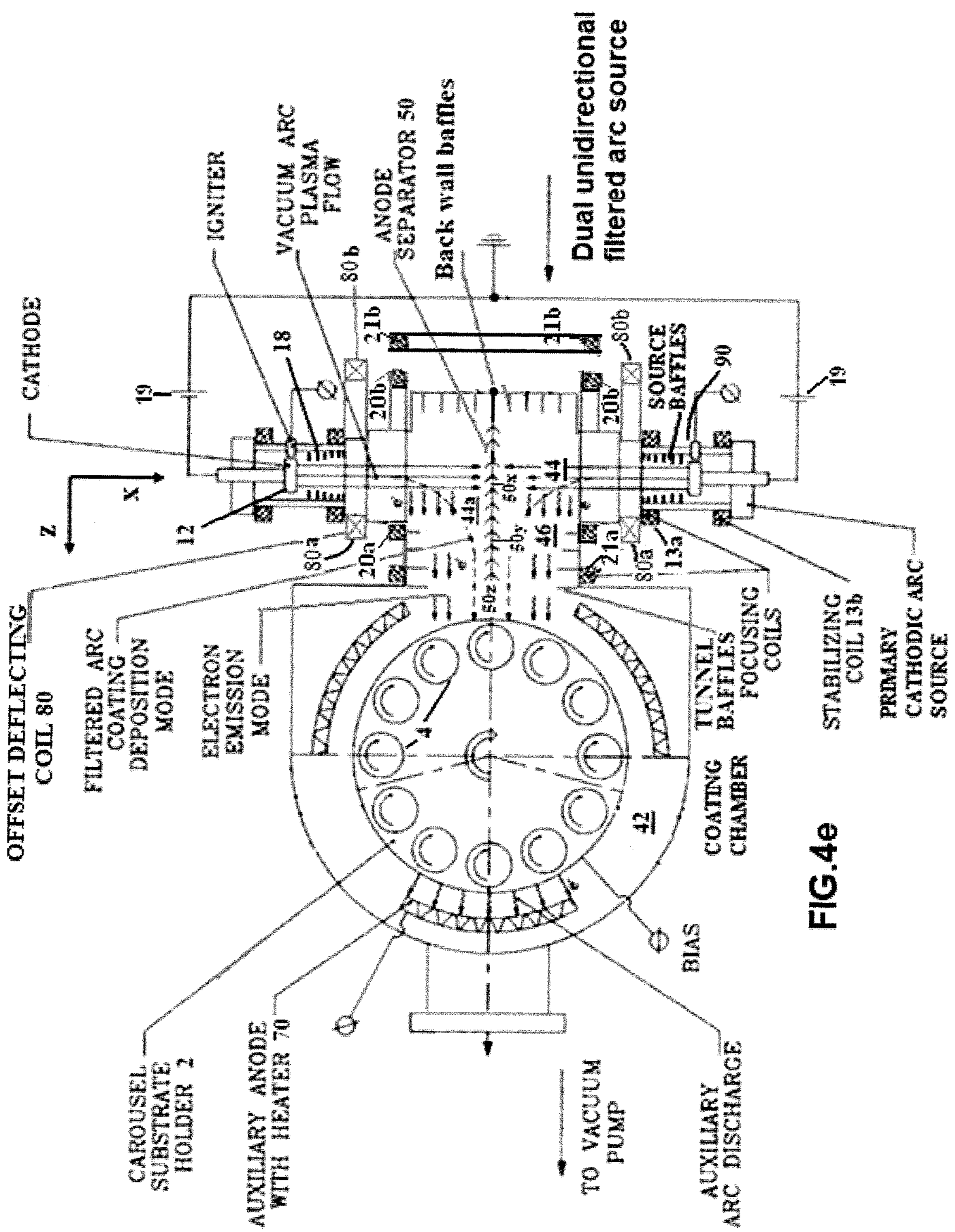

FIG. 4*e* illustrates an embodiment of filtered cathodic arc deposition method and apparatus of present invention which shows the batch coating system layout utilizing a vacuum plasma processing chamber 42, equipped with a unidirectional dual filtered cathodic arc plasma source 1 of present invention. The rotatable substrate turntable 2, is installed in the center of the coating chamber 42 and allows for single or double rotation of the substrates 4 to be coated. The coating chamber 42 is equipped with an array of radiant heaters and with diagnostic equipment including optical pyrometers and thermocouples to measure substrate temperature (not shown). The unidirectional dual filtered cathodic arc plasma source 1 consists of the plasma duct chamber 44 with baffles installed along its walls and the exit tunnel 46. A pair of deflecting coils 20 is located on the opposite walls of the plasma duct chamber along the edges of the plasma duct. A pair of offset deflecting coils 80 is located around the cathode chambers 90 along the opposite walls of the plasma duct chamber 44 in off-set position in relation to the plasma duct chamber 44. The midpoint of the distance between the offset proximal deflecting linear conductors and offset distal closing deflecting conductors of the offset deflecting coils 80 should be positioned with the cathode chamber 90 to maintain the concave saddle-shape magnetic field within both parts of the cathode chamber 90: the part nearest to the coating chamber 42 and the opposite part, farthest from the coating chamber 42. A focusing coil 21 is surrounding the exit tunnel portion 46 of the plasma duct while the additional deflecting coil 21*b* is positioned around the back wall of the plasma duct chamber. The primary direct cathodic arc deposition sources, consisting of the cathode target 12, surrounded by tubular anodes 18 with steering and focusing coils 13*a*,13*b*, are positioned on top of the cathode chambers 90 attached to opposite walls of the plasma duct chamber 44 adjacent to the exit tunnel portion 46. In addition, two vertical rastering coils (shown in FIG. 9*a*) can be optionally positioned on the top and bottom flanges of the plasma duct chamber for rastering the filtered arc flow (not shown). This provides high uniformity of the coating thickness distribution over large deposition areas.

In operation, when the deflecting coils 20, offset deflecting coils 80 and focusing coil 21 of the filter chamber are turned on, the vapor plasma generated by the primary cathodic arc sources flows into the plasma duct chamber from opposite directions and turns around the corner of the plasma duct exit tunnel 46 toward the coating chamber 42. The optional deflecting coil 21*b* can be also activated to tune the direction of the metal vapor plasma flow. When the deflecting coils 20 and focusing coil 21 of the filter chamber are turned off, an auxiliary arc discharge can be established between the primary arc cathodes 12 of the cathode arc source and the auxiliary arc anode 70 located in a coating chamber behind the turntable 2 as illustrated in FIG. 4*e*. This discharge provides ionization and activation of the gaseous atmosphere in the main chamber, producing highly ionized gaseous plasma during such technological stages as plasma immersion ion cleaning/etching, gaseous ion implantation, ionitriding/oxynitriding/carburizing and low pressure plasma assisted CVD.

The deflecting electrode-baffle 50 dividing two opposite vapor plasma flow generating by primary cathodic arc sources 12 can optionally be installed into the plasma duct 44 to separate the two vapor plasma flows generated by the two primary cathodic arc sources. The deflecting electrode 50 can be either connected to the positive end of the arc power supply, or grounded, or set up at floating potential which would be also positive with respect to the arc cathodes due to the higher mobility of the positive ions across the magnetized plasma confined in a longitudinal magnetic field. Three types of baffle 50 with different lengths can be used depending on processing requirements: a short baffle 50*x*, a medium length baffle 50*y* and a long baffle 50*z*. The short baffle 50*x* can be installed between the back wall of the plasma duct chamber and a point between the center of plasma duct 44 and the entrance of the tunnel section. The medium length baffle 50*y* ends within the tunnel section of the plasma duct chamber. The long baffle 50*z* ends flush with the exit window of the tunnel portion 46 of the filtered cathodic arc source 1. A separation of the opposite vapor plasma flows generated by the two primary cathodic arc sources of the unidirectional dual filtered cathodic arc plasma source allows the production of nanolaminated coatings by exposing the rotating substrates 4 in turn to the plasma flows generated by opposite primary cathodic arc sources equipped with different targets 12 (e.g. Ti and Cr, Ti and Al etc.). When the dividing baffles 50 are removed, the two opposite plasma flows generated by the primary DCAD sources with cathode targets of the same or different composition are mixed in the exit tunnel area, forming a uniform unidirectional plasma stream for deposition of a wide variety of single component or multi-elemental nanocomposite coatings.

The embodiment of FIG. 4*e*, which provides the unidirectional dual filtered cathodic arc source 1 installed at the coating chamber 42, thus provides a chain of anodes: proximal anodes 18 local to the cathodes 12; medial anodes such as anode separators 50*x*, 50*y*, or 50*z*; a focusing electrode 23 (shown in FIGS. 4*a*-4*d*) contained within the exit tunnel portion 46 of the plasma duct; and distal anodes such as the anode 70, which may be disposed anywhere within the coating chamber 42. These anodes combine to create a desired dispersion of electrons and a uniform plasma cloud in the vicinity of the substrates 4. The anodes could be connected to independent power supplies; however this would result in high power consumption. The chain of anodes can alternatively be connected to the same power supply and rastered. Ionization of the plasma is maximized in the vicinity of an active anode, and rastering through the chain of anodes in this fashion allows for considerable conservation of power while maintaining a high plasma ionization level and mixing the plasma throughout the apparatus to create uniform plasma immersed environment.

In filtered cathodic arc apparatus shown in FIG. 4*e* the pair of rectangular deflecting coils 20 are mounted on opposite sides of the rectangular plasma duct, each of the coils 20 is positioned in front of the cathode chambers 90, while the focusing coil 21*a* surrounds the exit portion of the plasma duct adjacent to the coating chamber 42. Optionally additional deflecting coil 21*b* is mounted behind the plasma duct. The current conductors of the deflecting coils 20 are aligned along the edges of the rectangular plasma duct. It can be seen that the pair of offset deflecting coils 80 are installed around the cathode chambers 90 in off-set position in relation to the plasma duct chamber 44. The deflecting magnetic field created by offset deflecting conductors 80 is coupled with the deflecting magnetic field created by the deflecting coils 20 and focusing magnetic field created by focusing coil 21*a* surrounding the exit tunnel portion 46 of the plasma duct chamber, which can advantageously work together to deflect the metal vapor plasma flow from the primary cathode targets 12 toward substrates 4 to be coated installed on carousel substrate holder 2 in a coating chamber 42 with minimal vapor plasma transport losses. The additional deflecting coil 21*b* can be also used to tune the deflecting magnetic field lines and increase the outcome of the vapor plasma flow toward substrates to be coated 4 installed in a coating chamber 42.

Figure 4F:
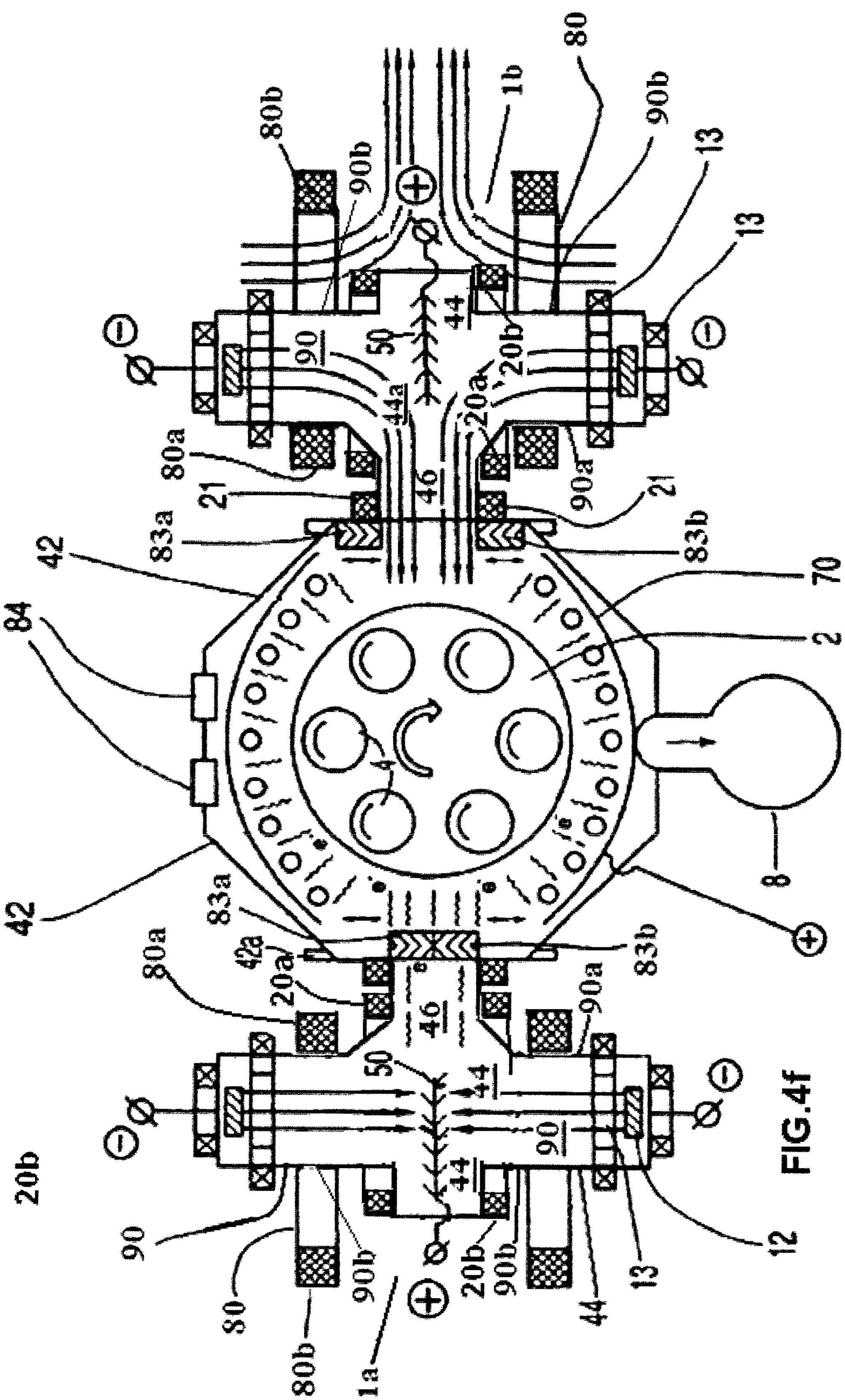

FIG. 4*f* illustrates a variation of the embodiment of FIG. 4*e*, in which two filtered cathodic arc sources, each containing a pair of cathodes 12, positioned at the entrance of the opposite cathode chambers 90, are provided on both sides of the coating chamber 42. This embodiment can be used for plasma immersed treatment of substrates 4, by selectively deactivating the deflecting coils 20, the offset deflecting coils 80, and focusing coil 21 of the filtered cathodic arc source 1*a* on one side of the coating chamber 42. When all plasma sources 12 are active, plasma streams are generated in both filtered cathodic arc sources 1*a* and 1*b*. However, while the vapor plasma stream generated on the side of active coils 80, 20, and 21 of the filtered cathodic arc source 1*b* is directed into the coating chamber 42 by the deflecting and focusing magnetic fields generated by the deflecting coils 20, offset deflecting coils 80, and focusing coils 21, the particulate (metal vapor plasma) component of the plasma stream on the side of the inactive deflective coils 20, offset deflecting and focusing coils 80, 21 of the other filtered cathodic arc source 1*a* remains largely confined within the cathode chambers 90 optionally using load lock shutters 83 to close off the other filtered cathodic arc source 1*a* from the coating chamber 42, there being no magnetic driving influence for metal vapor plasma on that side of the coating chamber 42. The load lock shutters can be provided with openings which are impermeable for the heavy particles such as ions and neutrals to enter into plasma coating chamber 42, but permit electrons to flow into coating chamber 42. The cathodes 12 on the side of the inactive coils 20, 80, and 21 thus serve as powerful electron emitters, improving ionization of the gaseous component of the plasma flowing past shutter 83 and into the coating chamber 42, and significantly improving the properties of the resulting coating. The offset positions of the offset deflecting coils 80 of the filtered cathodic arc source 1 allow for minimization of the plasma transport losses and securing the maximum deposition rates of the filtered cathodic arc coating deposition process.

Figure 4G:
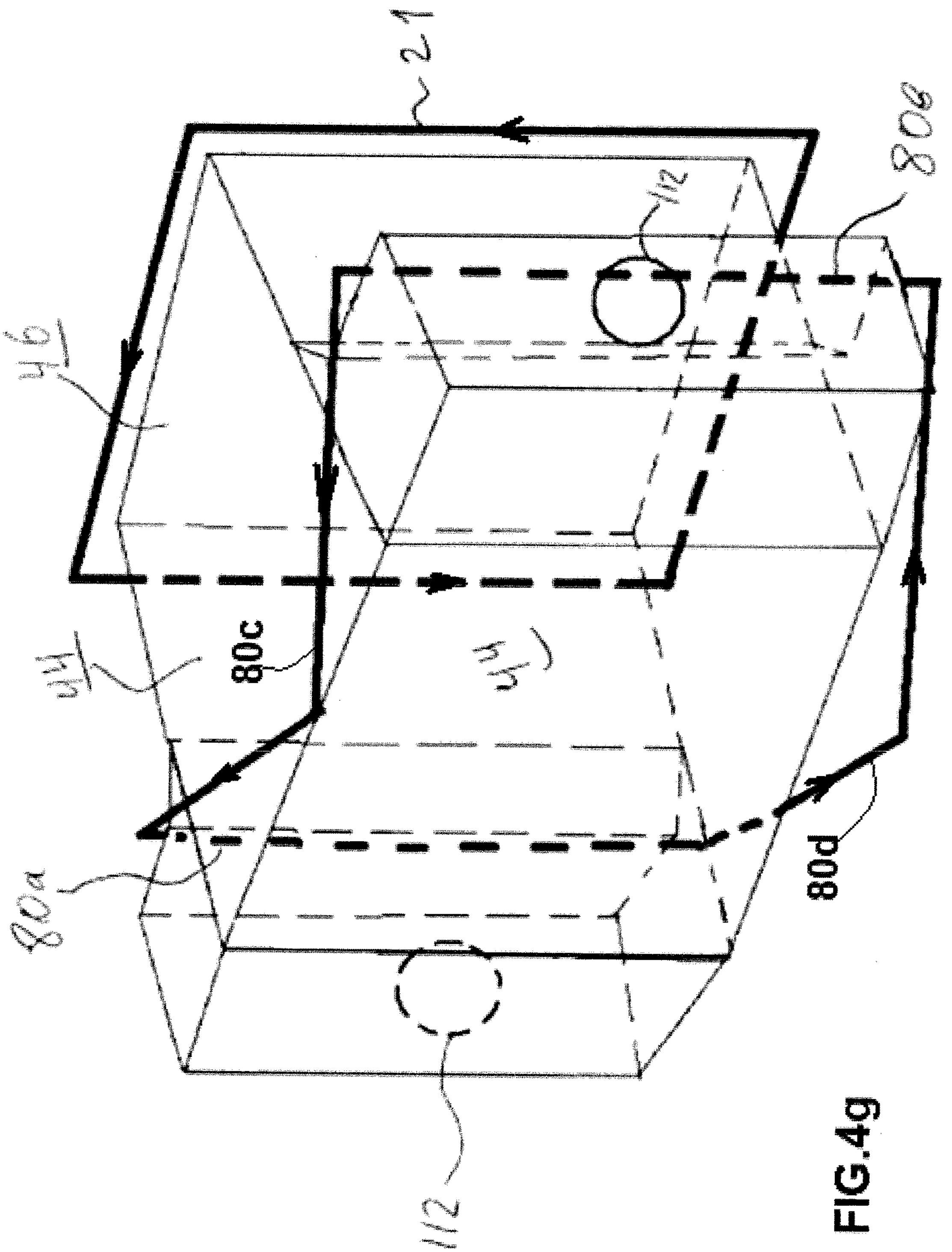
Figure 4H:
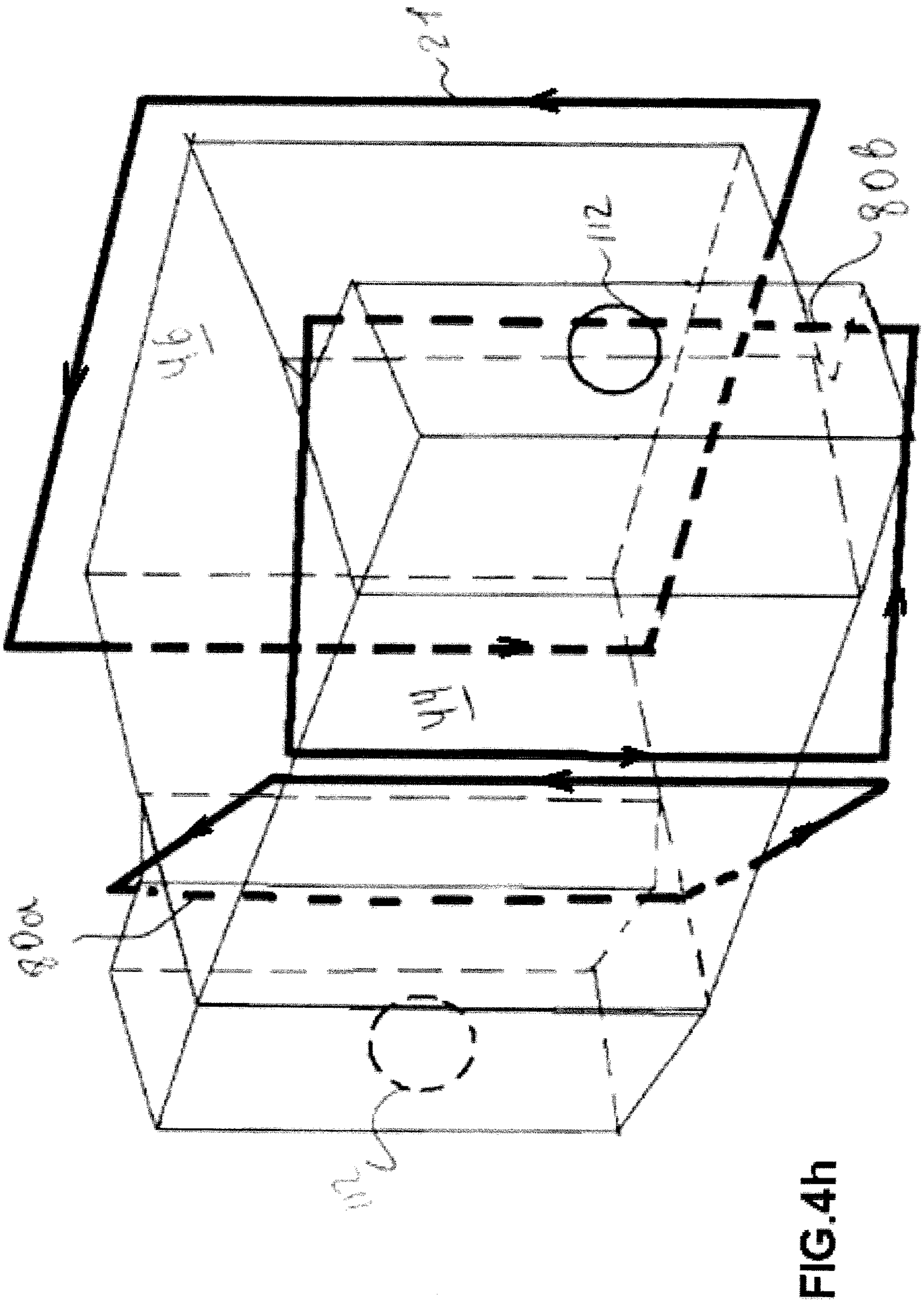
Figure 4I:
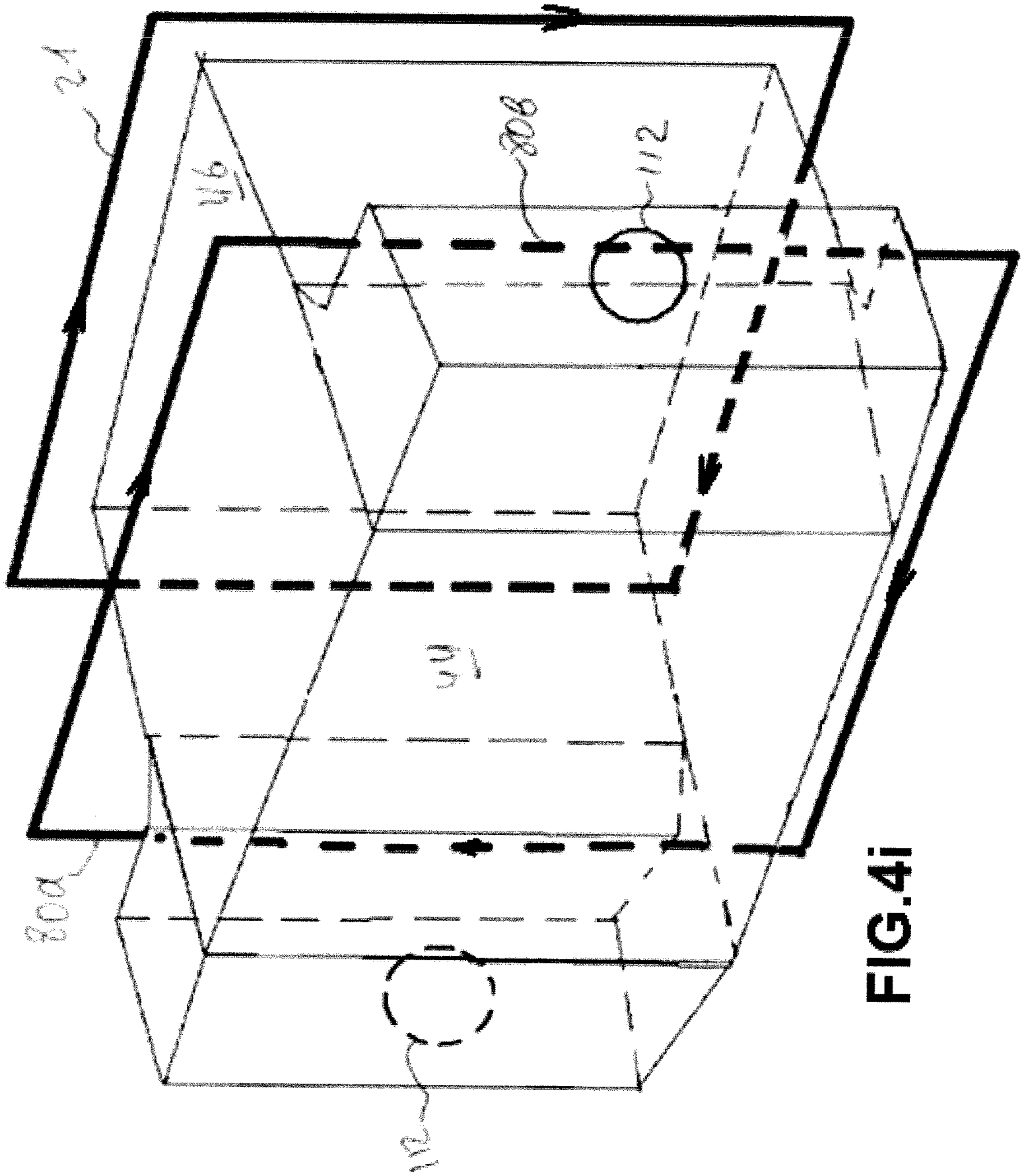

FIG. 4*g* illustrates another variation of the embodiment of filtered cathodic arc deposition method and apparatus of present invention shown in FIG. 4*e*, utilizing a single 3D saddle-shaped deflecting coil 80 embracing the deflecting section of the plasma duct 44 of the filtered cathodic arc source assembly, generally having a shape of symmetrical rectangular prism, having two opposite sides, a back side farthest from the substrate chamber and a front side nearest to the substrate chamber, a top and a bottom sides parallel to the plane of rotation of the plasma flow, the tunnel section 46 being rectangular and attached to the front side of the plasma duct along a plane of symmetry of the plasma duct, and at least one cathode chamber 90 being attached to one of the opposite sides of the plasma duct 44. In this case the deflecting conductors 80*a* and 80*b* are parallel to the edges of the deflecting section of the plasma duct 44 adjacent to the cathode chambers 90 and the tunneling section 46 of the plasma duct 44. In one variation of the embodiment of the invention shown in FIG. 4*g*, the deflecting conductors 80*a* and 80*b* are align along the front walls of the cathode chambers 90 facing the deposition chamber (not shown) adjacent to the cathode sources flanges 112 where the cathode arc sources are attached (not shown) in off-set position relative to the plasma duct chamber 44. Alternatively, the deflecting conductors 80*a* and 80*b* can be aligned generally along the edges of the deflecting section of the plasma duct 44 adjacent to the cathode chambers 90 and the tunnel section 46 of the plasma duct 44. The closing conductors 80*c* and 80*d* are align generally parallel to the top and the bottom flanges of the deflection section of the plasma duct 44 which are parallel to the plane of rotation of the plasma flow generating in cathode chambers 90. The saddle-shape deflecting coil, similar to one which was previously described in (former) Soviet Union invention SU1240325 issued Nov. 30, 1984 to Gorokhovsky et al., which is incorporated herein by reference, generate both a toroidal and a poloidal deflecting magnetic fields which can further reduce the diffusional plasma losses in the direction transversal to the direction of the plasma flow and increase the efficiency of plasma transport toward substrates to be coated in a substrate chamber (not shown). The toroidal magnetic field is generating by the deflecting conductors 80*a* and 80*b* to direct the plasma flow from the cathode chambers 90 into the plasma duct 44 whilst the closing conductors 80*c* and 80*d* are generating the poloidal magnetic field to suppress the diffusional plasma losses in the direction transversal to the plane of rotation of the plasma flow. The focusing coil 21 is positioned around the tunnel portion 46 facing the substrate chamber (not shown). The preferable directions of electric current in the offset saddle-shaped deflecting coil 80 and the focusing coil 21 are shown by the arrows in FIG. 4*g*. FIG. 4*h* illustrates a variation of the embodiment shown in FIG. 4*g* in which the 3D saddle-shape offset deflection magnetic system is formed by a double-coil arrangement 80 comprising the proximate deflecting linear conductors 80*a* aligned in off-set position along the front walls of the cathode chambers 90 facing the substrate chamber (not shown). The offset distal closing linear conductors 80*b* of the offset deflecting coils 80 are disposed behind the plasma duct chamber 44 close to each other so that the magnetic fields generating by the linear conductors 80*b* are annihilating and the topology of the resulting deflecting magnetic field generating by the pair of the offset deflecting coils 80 in the filtered cathodic arc source of FIG. 4*h* is almost identical to the deflecting field generating by the single 3D offset deflecting coil of FIG. 3*g*. FIG. 4*i* illustrates another variation of the embodiment of filtered cathodic arc deposition method and apparatus of present invention shown in FIG. 4*g* comprising of rectangular proximate offset deflecting coil 80 disposed in front of the cathode chambers 90 parallel to the focusing coil 21. In this arrangement the proximate deflecting linear conductors 80*a* and 80*b* are aligned in off-set position in relation to the plasma duct 44 along the front walls of the cathode chambers 90 facing the substrate chamber (not shown). Optionally, a distal offset deflecting coil (not shown) can be provided behind the plasma duct 44 parallel to the proximate deflecting coil 80. The distal deflecting coil should be disposed at a larger distance from the back side of the cathode chambers 90, which distance exceeds the distance between the coil 80 and the side 90*a* of the cathode chambers 90 nearest to the substrate chamber 10. The polarity of the proximal offset deflecting coil 80 is the same as that of the focusing coil 21, while the polarity of the distal offset deflecting coil is opposite to the coil 80.

Figure 4J:
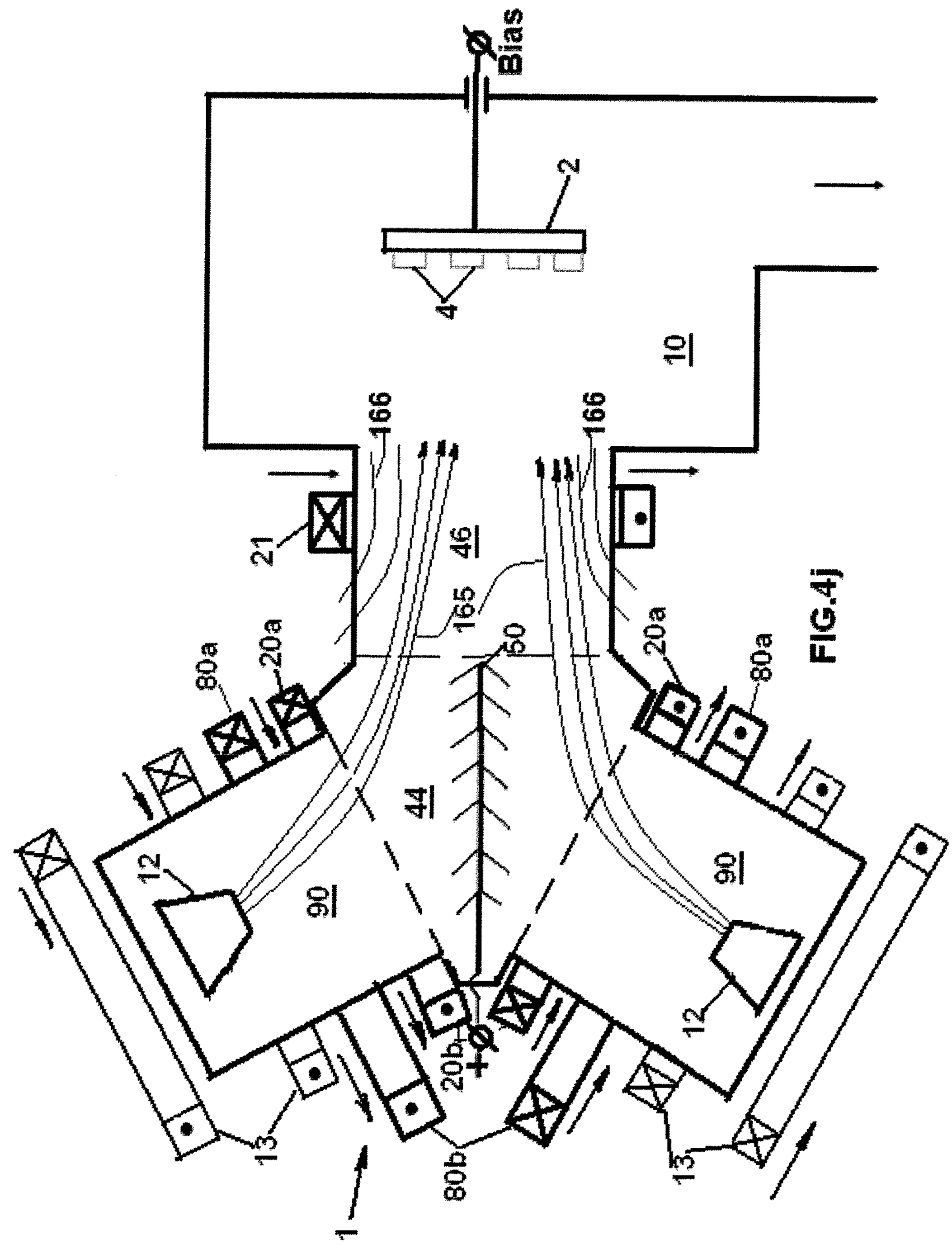

In the further preferred embodiment of the filtered cathodic arc deposition method and apparatus of present invention shown in FIG. 4*j* the deflection portion 44*a* of the plasma duct 44 may have a shape of a symmetrical rectangular prism. FIG. 4*j* illustrates a variation of the embodiment shown in FIG. 4*h* comprising a pair of deflecting coils 20 which linear conductors are aligned along the ribs of the prism-shaped deflection portion 44*a* of the plasma duct 44 forming a 3D saddle-shape deflecting magnetic system generally geometrically similar to the form of the prism-shaped deflection portion of the plasma duct 44*a*. In addition, there is a pair of offset deflecting coils 80 surrounding the exit portions of the cathode chambers 90, with a proximate deflecting linear conductors 80*a* adjacent to the side of the cathode chamber 90 nearest to the substrate chamber (not shown) and the distal closing deflecting conductors 80*b* adjacent to the side of the cathode chamber 90 farthest from the substrate chamber (not shown), which allow to start bending the vapor plasma flow generating by the cathodes 12 within the cathode chambers 90 yet contributing to suppressing the diffusional plasma losses in a transversal direction to the plasma flow toward walls of the cathode chambers 90 and plasma duct 44. The proximate deflecting linear conductors 80*a* are aligned in off-set position along the front walls of the cathode chambers facing the substrate chamber 10, parallel to the deflecting conductors 20*a* and to the focusing coil 21, while their respective offset distal closing linear conductors 80*b* are positioned at a substantial distance behind the back walls of the cathode chambers 90 farthest from the substrate chamber 10 so as to have a lesser magnetic influence on the plasma stream within the cathode chamber 90 than their associated deflecting conductors 80*a*. To maximize the suppression of the transversal diffusional losses of plasma the distance between the offset proximate deflecting conductor 80*a* and offset distal closing deflecting conductor 80*b* should be chosen from the condition that the midpoint between linear conductors 80*a* and 80*b* is disposed within the cathode chamber 90. In this case a saddle-shaped concave magnetic field will be generated both in the downstream portion 90*a* of the cathode chamber 90 nearest to the substrate chamber 10 and in the upstream portion 90*b* of the cathode chamber 90 farthest from the substrate chamber 10. The frustoconical targets 12 are surrounded by magnetic steering and focusing coils 13. The deflection section 44*a* having a triangular prism shape is positioned between the dashed lines within the plasma duct 44. In this embodiment the cathode chambers 90 are attached to the side walls of the deflecting section 44*a* of the plasma duct 44; the axes of the cathode chambers 90 are forming an acute angle with the plane of symmetry of the plasma duct 44. The said angle is typically ranging from 20 to 90 deg, but most likely from 30 to 90 deg and even more precisely from 45 to 90 deg. When the angle between axes of the cathode chambers 90 and the plane of symmetry of the plasma duct 44 is reducing the closing conductors 20*b* and 80*b* are becoming close to each other which results in a reduction of the closing deflecting magnetic field generating by the distal closing linear conductors 20*b* and 80*b*.

In the embodiments of the invention utilizing the rectangular filtered cathodic arc source, the deflecting portion 44*a* of the plasma duct 44 has a shape of a rectangular prism. The prism can be of rectangular cross-section as a parallelepiped or having a trapezoidal cross-section. The deflecting portion 44*a* of the plasma duct with prismatic geometry may have different cross-sections, but they should be symmetrical in relation to the plane of symmetry of the plasma duct. The deflection coils 20 have their linear conductors aligned generally parallel to the edges of the prism-shaped volume of the deflecting section 44*a* of the plasma duct 44 surrounding the deflection portion of the plasma duct 44*a* creating a 3D frame generally geometrically similar to the shape of the prism-shape deflection portion of the plasma duct 44*a* while the focusing coil 21 is surrounding the exit tunnel portion 46 of the plasma duct adjacent to the substrate chamber 10 produces the focusing magnetic field 166. The linear current conductors of the deflecting coils 20 are forming a 3D saddle-shape frame with a shape of a rectangular prism or a prism having different cross-sections geometrically similar to the shape of a prism-shaped deflection portion 44*a* of the plasma duct 44, retaining a mutual plane of symmetry with the plasma duct 44. Therefore, the prism-shape 3D frame defined by the linear current conductors of deflecting coils 20 is generally geometrically similar to the shape of the deflecting portion 44 of the plasma duct. Up to 50% deviation of the geometrical similarity between the 3D frame shape formed by the linear conductors of the deflecting coils 20 and the shape formed by the edges of the deflecting portion 44*a* of the plasma duct 44 is still acceptable, but it is preferable that this deviation does not exceed 30%. The proximate linear deflecting conductors 80*a* of the saddle-shape deflecting coil are adjacent to the front side of the cathode chambers 90 facing the substrate chamber or they are adjacent to the cathode chamber 90 and plasma duct 44, whilst the distal linear deflecting conductors 80*b* are aligned either adjacent to the back sides of the cathode chambers farthest from the substrate chamber or adjacent to the back side of the plasma duct. The distance between the distal linear deflecting conductors 80*b* and the back sides of the cathode chambers 90 or the back side of the plasma duct 44 is greater than the distance from the proximate deflecting conductors 80*a* and the front side of the cathode chamber 90.

Figure 4K:
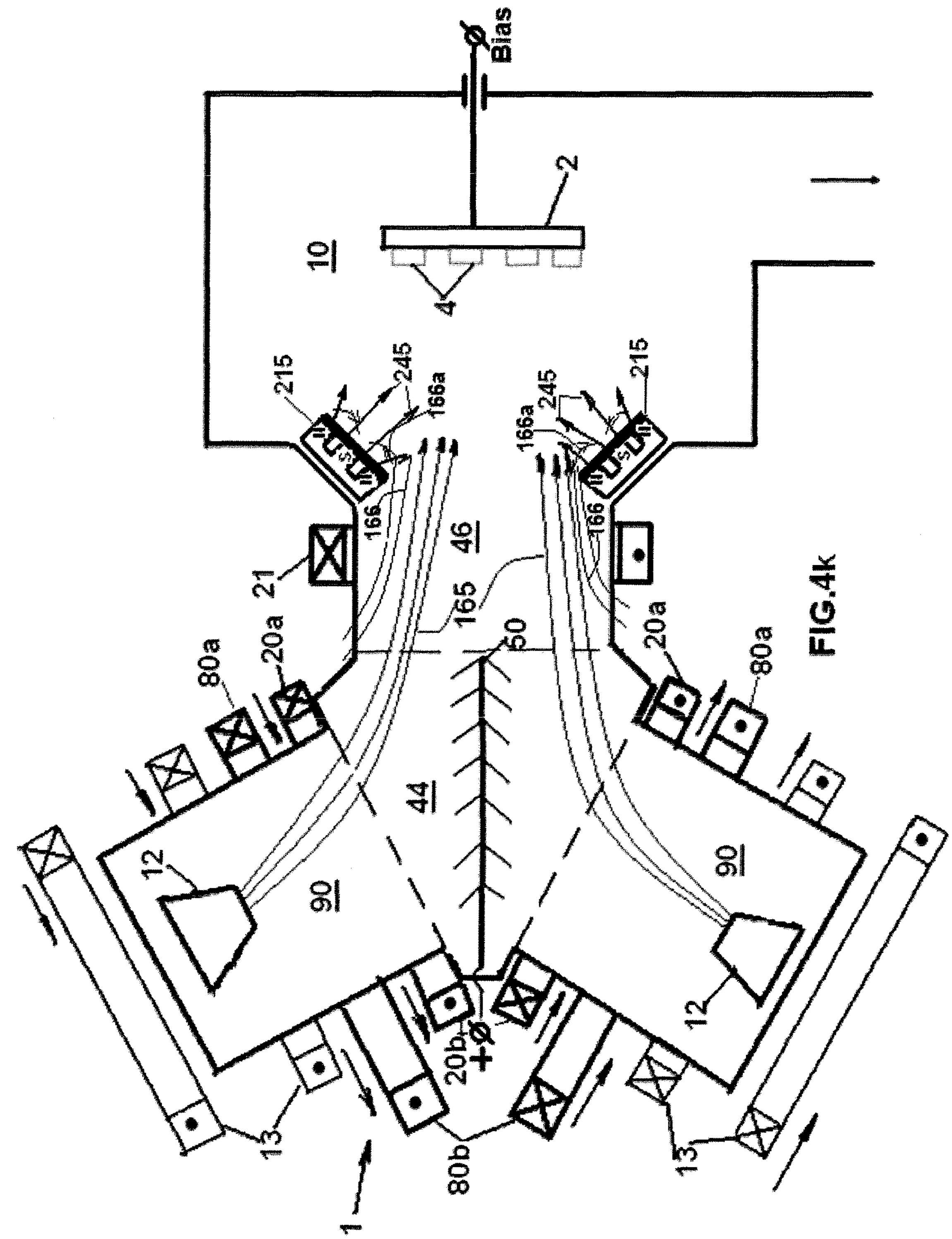

FIG. 4*k* illustrates a further variation of the embodiment of filtered cathodic arc deposition method and apparatus of present invention of FIG. 4*j*, in which magnetron sputtering sources 215 are magnetically coupled with dual filtered cathodic arc source are disposed at the exit of the tunnel portion 46 of the plasma duct 44 adjacent to the substrate chamber 10 and to the plasma duct 44. The design of this variation incorporates the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference. The sputtering cathode targets of the magnetrons

Figure 4L:
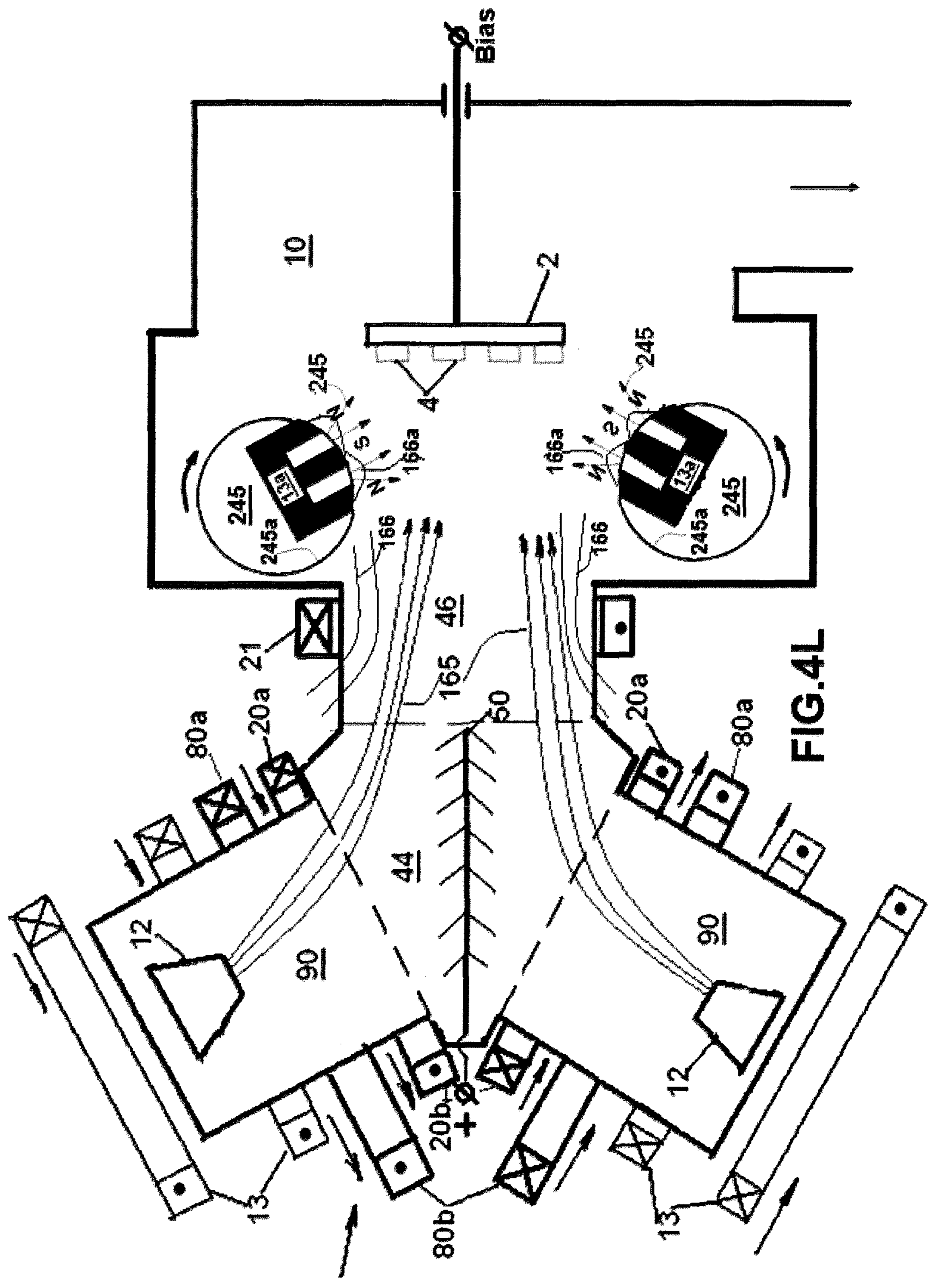

215 are facing the substrates to be coated 4 such that the metal sputtering flow 245 generated by the magnetrons 215 is directed toward substrates to be coated 4 in a substrate chamber 10. The focusing magnetic field force lines 166 generated by the focusing coil 21 overlap a portion of the magnetron magnetic field 166*a* nearest to the focusing coil 21 and direction of these force lines coincide. At the same time, the vapor plasma flow 165 generated by the cathodes 12 of the filtered cathodic arc source overlap the sputtering metal atomic flow 245 thereby providing a controlled ionization of the sputtering metal flow. The ionization rate of the metal sputtering atoms in the conventional DC magnetron sputtering flow is very low, generally below 0.1% of the sputtering atoms. The mixed filtered cathodic arc/magnetron sputtering flow generated by the source shown in FIG. 4*k* overcomes this drawback of the conventional magnetron sputtering by providing a controllable ionization rate ranging from 1% to 100%. This can be accomplished by operating the deflecting system of the filtered cathodic arc source in a pulse mode with duty cycle ranging from 1% to 100%. This can be accomplished either by balancing the ion current output of the filtered cathodic arc source by changing the cathodic arc currents or by operating the deflecting system of the filtered cathodic arc source in a pulse mode with duty cycle ranging from 1% to 100%. At the same time the power applied to the magnetron source can be varied to control the output of the mostly neutral sputtering atoms flow. The same goal of controlling the magnetron sputtering rate can be achieved by optionally using mechanical shutters (not shown) to periodically close off the sputtering targets of the magnetrons 215. The target's mechanical shutters can be also used to protect the magnetron target for coatings deposited from the filtered arc vapor plasma flow when the cathode 12 and targets of the magnetron sources 215 are made of different materials. The ionized metal vapor flow is known to be beneficial for the coating quality by increasing the density of the coatings, adhesion of the coatings to the substrates, reducing the roughness of the coatings and reducing the density of the coating defects via intense ion bombardment of the substrate surface during coating deposition process. FIG. 4L shows the variation of the schematic plan view of filtered cathodic arc deposition method and apparatus of present invention shown in FIG. 4*k* utilizing the magnetrons with rotating tubular target 245. In this design the rotating cylindrical magnetron targets 245*a* envelop the stationary magnetic yoke 13*a* oriented toward substrates to be coated 4 in the coating chamber 10. The direction of rotation of cylindrical targets 245*a* is shown by arrows. Tubular magnetrons with rotating cylindrical targets have substantially greater utilization rate than that of the planar magnetron targets.

Figure 5:
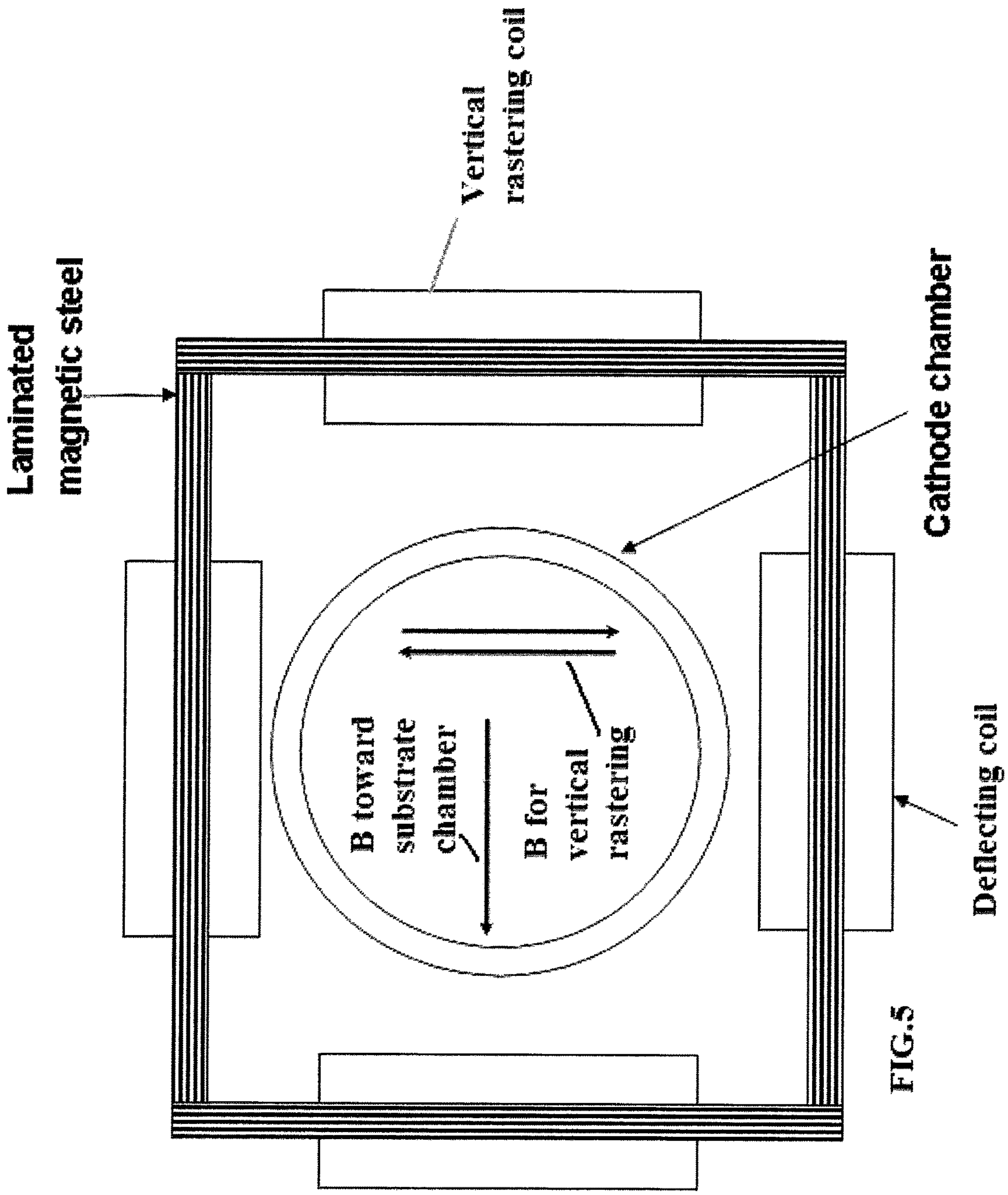
FIG. 5 is an exemplary schematic plan view of an electromagnet suitable for deflection of the magnetic field lines in a cathode chamber.

The deflection of the magnetic force lines inside of the cathode chamber 90 can be also achieved, for example, by using the offset deflecting electromagnet shown in FIG. 5 as an offset deflecting coil 80 (or 81). In this case the ferromagnetic core made of laminated magnetic steel surrounds the tubular cathode chamber 90 downstream of the cathode 12. The magnetic coils 80 (or 80 and 81) provide a magnetic field directed toward the substrate chamber 10 inside of the cathode chamber 90. This magnetic field, together with the focusing magnetic field generating by the focusing coil 13*b* of the primary cathodic arc source, provide a resultant magnetic field which directs the metal vapor plasma stream toward substrate chamber 10 even before it leaves the cathode chamber 90. In addition, this electromagnet surrounding the exit portion of the cathode chamber can provide magnetic rastering of the filtered arc vapor plasma flow by superimposing an alternating magnetic field transversal to the deflecting magnetic field. This can be accomplished by applying an alternating current to the rastering magnetic coils as shown in FIG. 5.

The primary cathodic arc source installed in the cathode chamber 90 may be similar to the plasma source described in U.S. Pat. No. 3,793,179 issued Feb. 19, 1974 to Sablev, which is incorporated herein by reference. This plasma source utilizes a circular cylinder or frustoconical target 12. To cover a large area coating zone, several cathodic arc chambers 90 which are enveloping cylindrical or conical targets 12 may be installed in opposing walls of the plasma duct 44 as shown schematically in FIG. 9*a*. In a preferable embodiment of this design the primary cathodic arc source target 12 is frustoconical as illustrated in embodiment of filtered cathodic arc deposition method and apparatus of present invention shown in FIG. 6*a*. In this case the stabilizing or steering coil 13*a* is installed surrounding the conical cathode target 12 and has the same polarity as the focusing coil 13*b* and the offset deflecting coil 80 surrounding the cathode chamber 90. The magnetic field streamlines 158 in the vicinity of the cathode target 12 have an acute angle relative to the side surface of the primary cathode target 12, which results in a moving of cathodic arc spots along helical trajectories from the back side of the frustoconical target 12, where an igniter 12*a* is striking the cathode target 12 to ignite the arc toward the front evaporation surface of the target 12. The vapor plasma stream 160 generating at the butt-end surface of the conical target 12 is deflecting by the magnetic field streamlines 160*a* generating by the offset deflecting coil 80 toward substrate chamber (not shown).

Figure 9A:
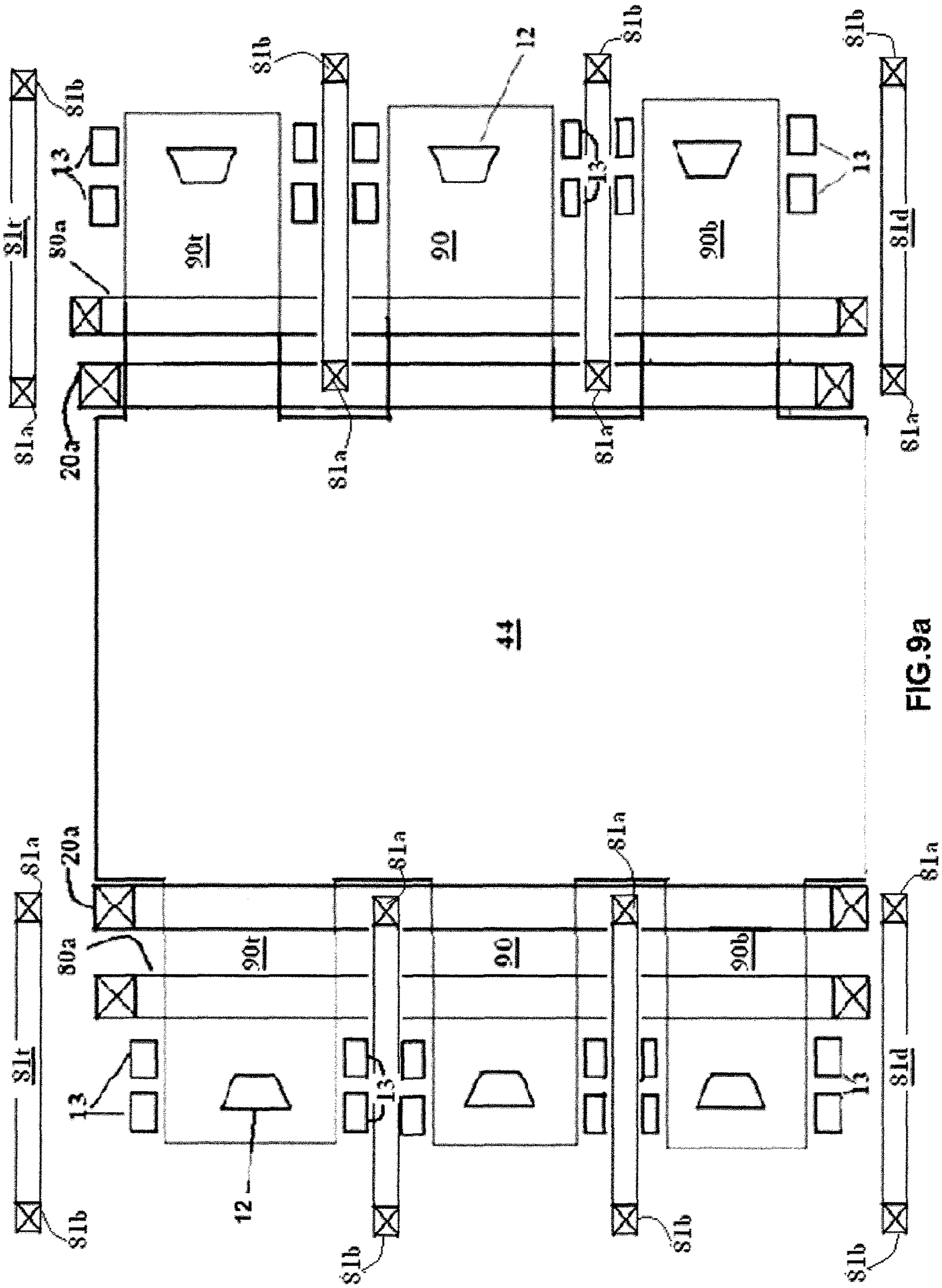
FIG. 9*a* is a schematic cross-section of the filtered cathodic arc source shown in FIG. 3*b* having three cathode chambers disposed at each of the opposite walls of the deflection section of the plasma duct, in an embodiment.
Figure 9B:
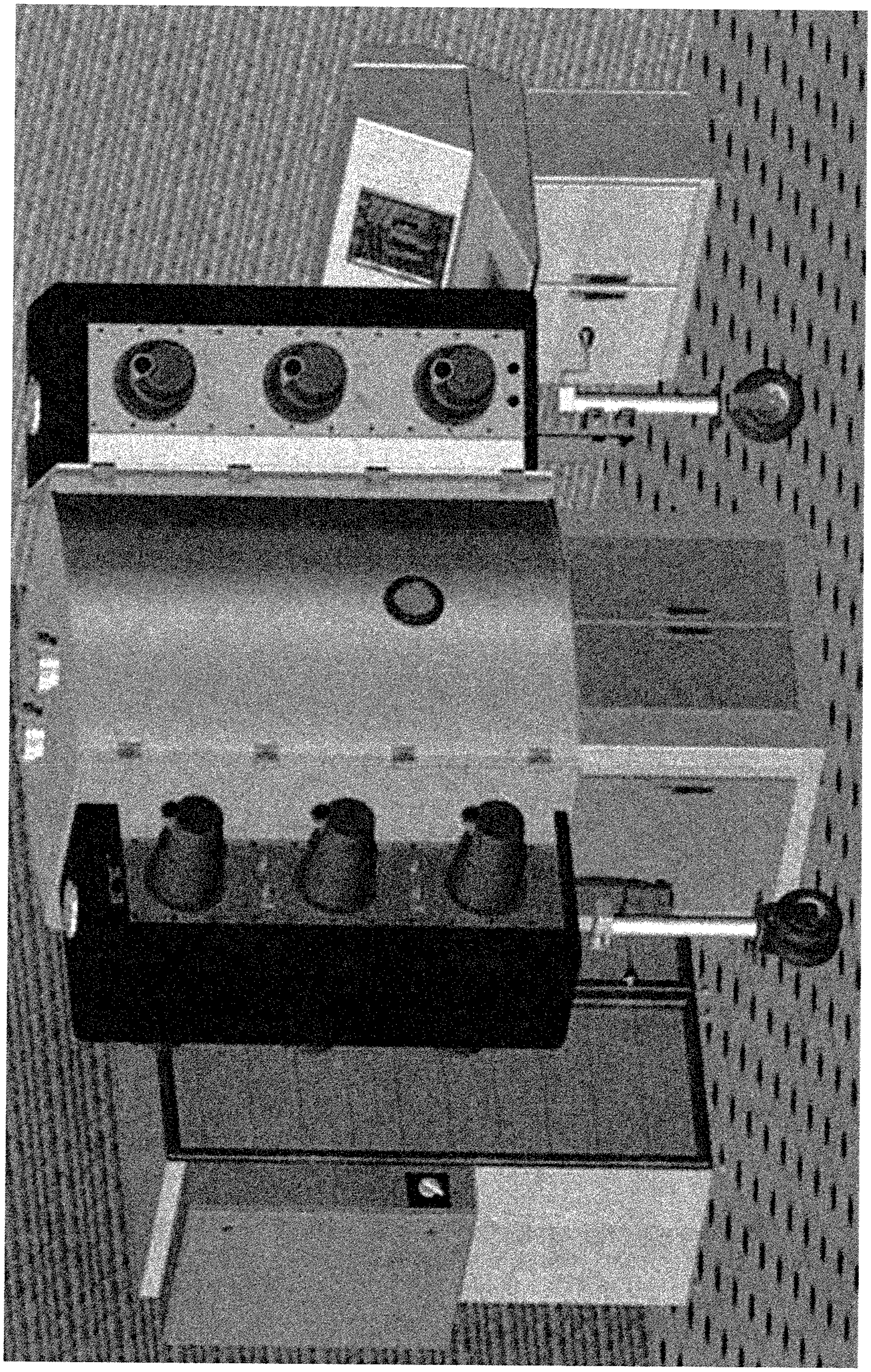
FIG. 9*b* is a perspective view of a coating apparatus utilizing two unidirectional rectangular dual filtered cathodic arc sources having three cathode chambers with attached primary cathodic arc sources disposed at each of two opposing walls of the deflection section of the plasma duct, in an embodiment.

FIG. 9*a* illustrates a perspective view of embodiment of filtered cathodic arc deposition method and apparatus of present invention utilizing several pairs of primary cathodic arc sources with cylindrical or conical cathode targets 12 and steering and focusing coils 13, which are installed in the several cathode chambers 90 in the opposing side walls of the deflecting portion of the plasma duct chamber 44. The deflecting portion 44*a* of the plasma duct chamber 44 may have a shape of parallelepiped, rectangular or triangular prism or a prism of a different cross-section, symmetrical in relation to the plane of symmetry of the plasma duct 44. A pair of offset deflection coils 80 adjacent to the cathode chambers 90 along or in combination with deflection coils 20 surrounding the deflection portion of the plasma duct 44 (not shown) can be used for deflecting the metal vapor plasma flow generated by multiple primary cathodic arc cathodes 12 surrounded by steering and focusing coils 13. The resulting plasma flow will be deflected in a deflecting portion of the plasma duct 44 and continue flow toward substrate chamber (not shown) throughout the exit tunnelling section of the plasma duct (not shown), where it will focus toward substrates to be coated (not shown) by the focusing coil 21 (not shown). The positions of the cathode targets 12 disposed at the opposite walls of the deflection section 44*a* of the plasma guide 44 can be displaced to each other by the distance between the center of the corresponding cathode targets 12 ranging from 50 mm to 200 mm in the direction transversal to the plane of rotation of the plasma flow in deflection section 44*a* of the plasma duct 44 to compensate for the centrifugal drift of the vacuum arc plasma jets in a curvilinear magnetic field. The optional rastering coils can be also attached to each of the cathode chamber 90 to raster a vapor plasma flow in a direction transversal to the plane of rotation of the vapor plasma flow, which allows to improve the uniformity of plasma distribution across the plasma duct 44 when plurality of cathode chambers with relatively small frustoconical or disc-shaped cathode targets 12 are used as a primary sources of metal vapor plasma. The electromagnetic rastering coils similar to one shown in FIG. 5 can be installed near the end of the cathode chambers 90 for rastering the vapor plasma flow. Alternatively, a chain of rastering coils 81 can be installed, which include a top rastering coil 81*t* disposed above the top cathode chamber 90*t* and a bottom rastering coil 81*d* disposed under the bottom cathode chamber 90*b* as well as a number of intermediate coils 81 positioned between the neighbor cathode chambers 90 parallel to the plane of rotation of the plasma flow, wherein the front rastering conductors 81*a* are positioned near the end of the cathode chamber 90 adjacent to the plasma duct and the closing conductors 81*b* are positioned away from the plasma duct, and preferably behind the cathode target 12, such that the magnetic field generated by closing conductor 81*b* will not disrupt the magnetic steering of the cathodic arc spots on evaporating surface of the cathode targets 12, as shown schematically in FIG. 9*a*. When the coils 81 are activated in sequence, one after another, a neighbor one, the rastering magnetic field directed transversal to the plane of rotation of the metal vapor plasma flows will be created in cathode chambers 90 for rastering the multi-jet plasma flows in the plasma duct 44. The global view of the large area coating deposition system which incorporates the design of embodiment of filtered cathodic arc deposition method and apparatus of present invention shown in FIG. 9*a* is presented illustratively as an example in FIG. 9*b*.

The primary cathodic arc source can be of rectangular design, as was described in U.S. Pat. No. 4,724,058 issued Feb. 9, 1988 to Morrison, which is incorporated herein by reference. In this case the cathode target can be rectangular plate or disc covering the coating zone, in part or entirely. A stabilizing coil 13*a* is positioned behind the cathode target plate, while a focusing coil 13*b* is positioned in front of the cathode target plate 12 as presented in embodiment of filtered cathodic arc deposition method and apparatus of present invention shown in FIG. 6*b*. The polarity of the stabilizing coil 13*a* is opposite to the polarity of the focusing coil 13*b* which is the same as the polarity of the offset deflecting coil 80 surrounding the cathode chamber 90. Under influence of the magnetic field which has streamlines 158 forming an acute angle at the periphery of the target plate 12, the cathodic arc spots move from the periphery of the target plate 12 toward its central area while at the same time moving along the border of the plate due to retrograde movement effect of the cathodic arc spots in a cross j×B field, where current density j has a direction of the vacuum arc current, which is perpendicular to the surface of the target 12. The vapor plasma stream 160 generating at the evaporating surface of the planar target 12 is further deflected by the magnetic field streamlines 160*a* generated by the offset deflecting coil 80 toward substrate chamber (not shown). Optionally, a plurality of a generally coaxial stabilizing and steering coils 13*a* can be installed behind the planar cathode target 12, each of these coils is activated in turn providing a sweeping move of an arch-like steering and stabilizing magnetic field at the evaporating surface of the cathode target 12 widening the erosion corridor and increasing the cathode target utilization rate. The planar cathode targets 12 used in rectangular primary cathodic arc sources can be of segmented design utilizing a bar segments of different elemental metals and/or alloys as shown schematically in FIG. 6*c*. The passive board may be used to restrict the area of magnetically steered cathodic arc spot movement. This design allows for a flow of multi-elemental metal vapor plasma created from a set of segments made from many different elemental metals or from alloys having a fewer number of elemental metals The multi-elemental metal vapor plasma produced by evaporation of segmented multielemental targets will enter the plasma duct 44 turning into the tunnel portion 46 along the curvilinear magnetic force lines and will be mixed at the exit of the tunnel 46 forming a uniform multi-elemental metal vapor plasma flow at the entrance into the coating chamber 10.

Installing the cathode targets 12 in an offset position in relation to the exit portion of the cathode chamber 90 is beneficial for achieving a higher output of the metal vapor ion flow after the metal ions are past the offset deflection coil 80 surrounding the exit portion of the cathode chambers 90. This alignment of the cathode targets 12 is shown in FIG. 6*a*. In this setup the vapor plasma flow starts rotating toward coating chamber already in a cathode chamber which is illustrated by the distribution of the plasma flow lines 160.

Figure 6B:
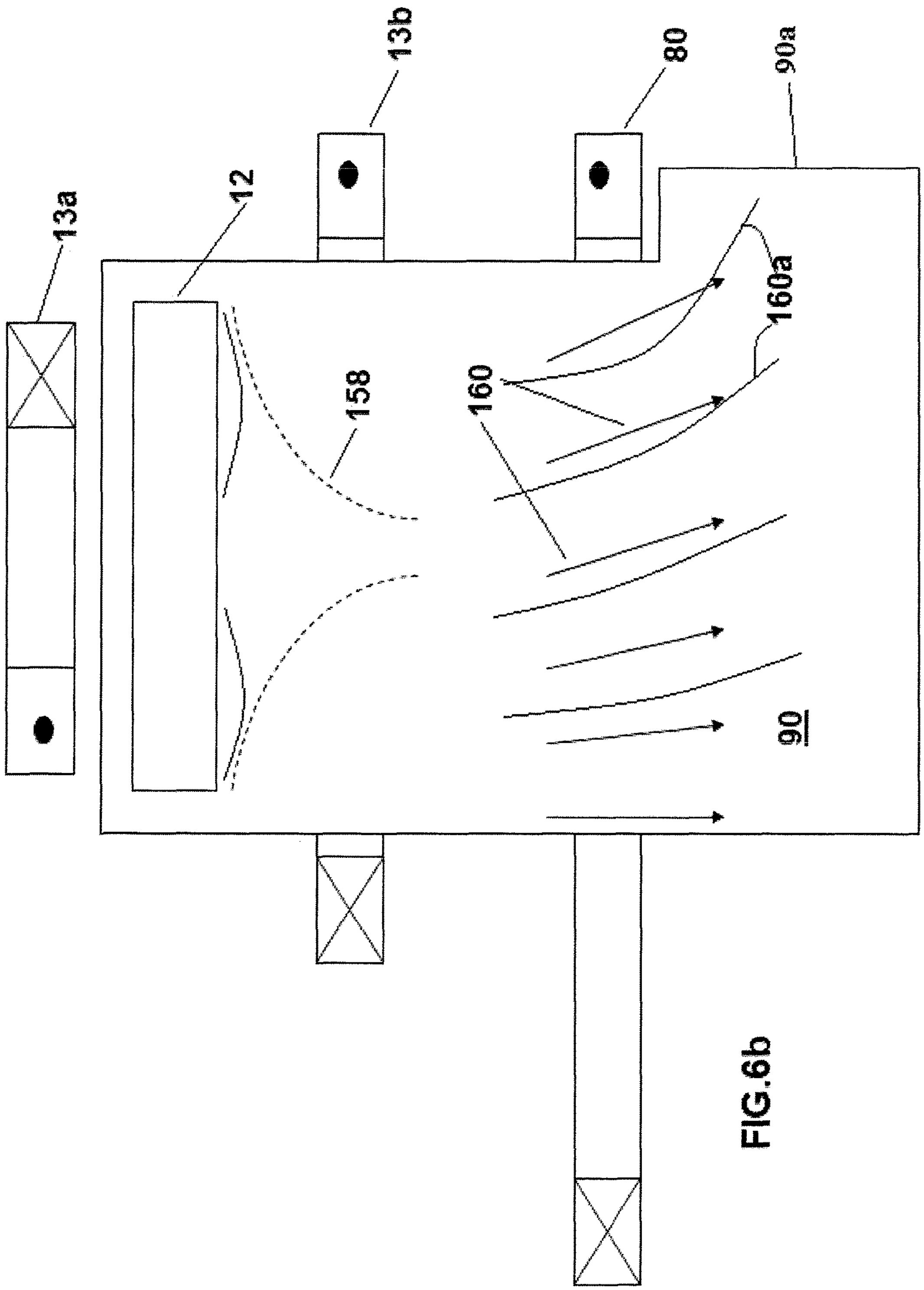
FIG. 6*b* is an exemplary schematic plan view of the cathode chamber of FIG. 6*a* utilizing a planar primary cathode target.
Figure 6C:
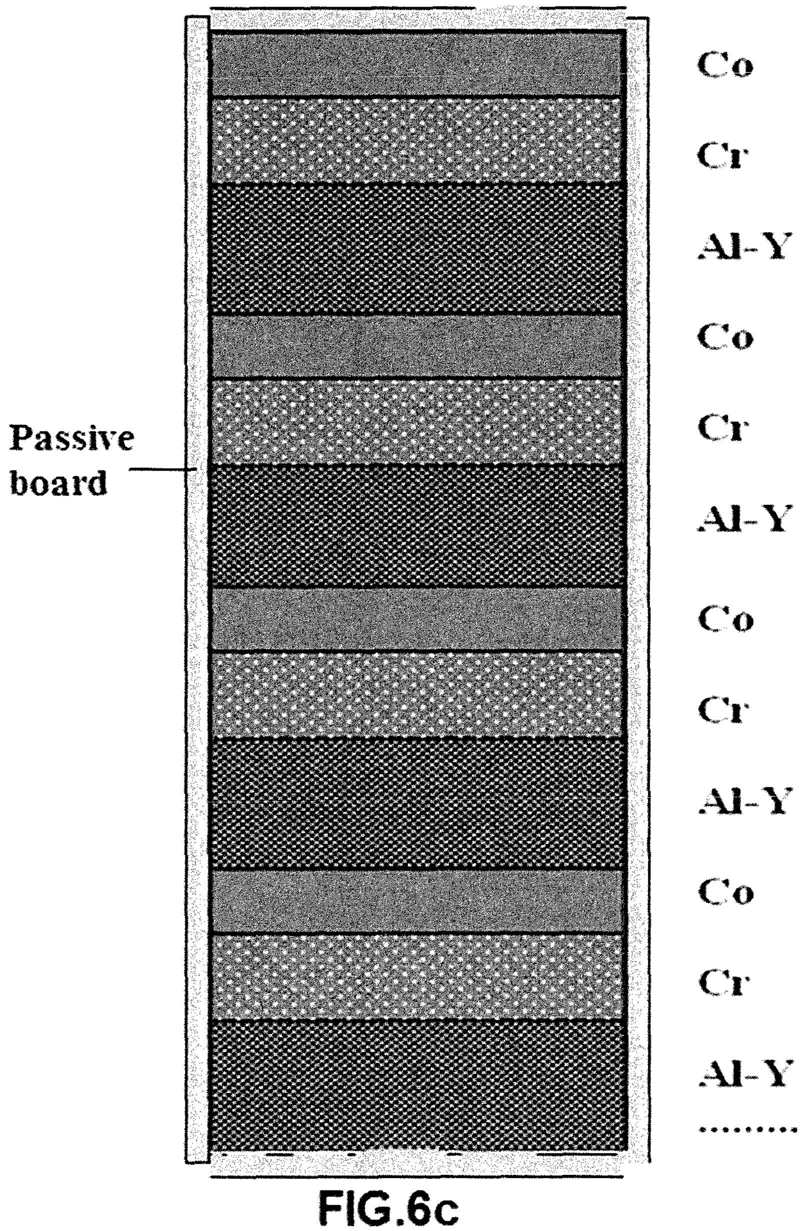
FIG. 6*c* is an exemplary schematic plan view of a segmented planar primary cathode target.
Figure 6D:
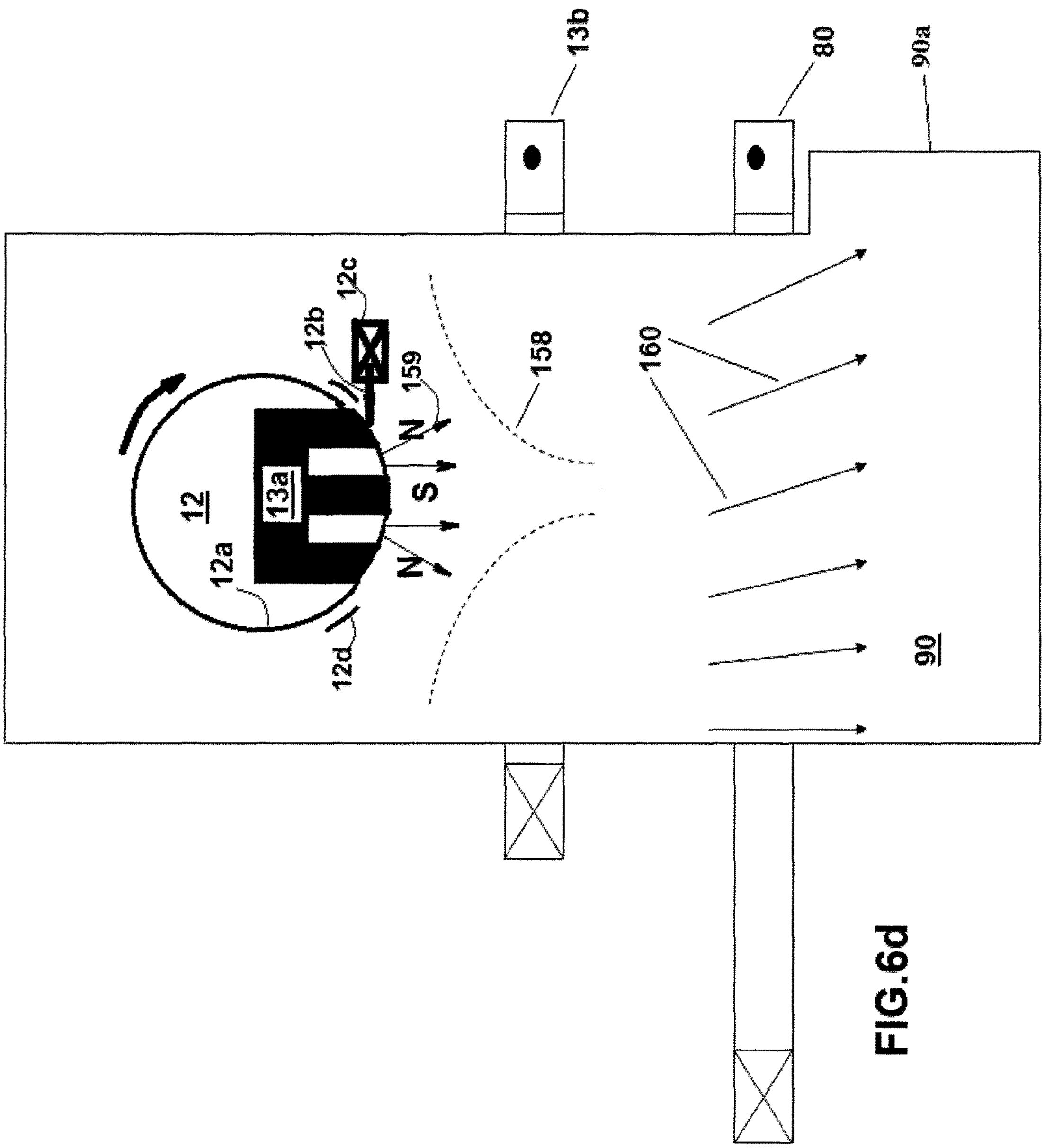
FIG. 6*d* is a schematic plan view of a variation of the apparatus of FIG. 6*b* utilizing the primary cathodic arc source with rotating tubular target, in an embodiment.
Figure 6E:
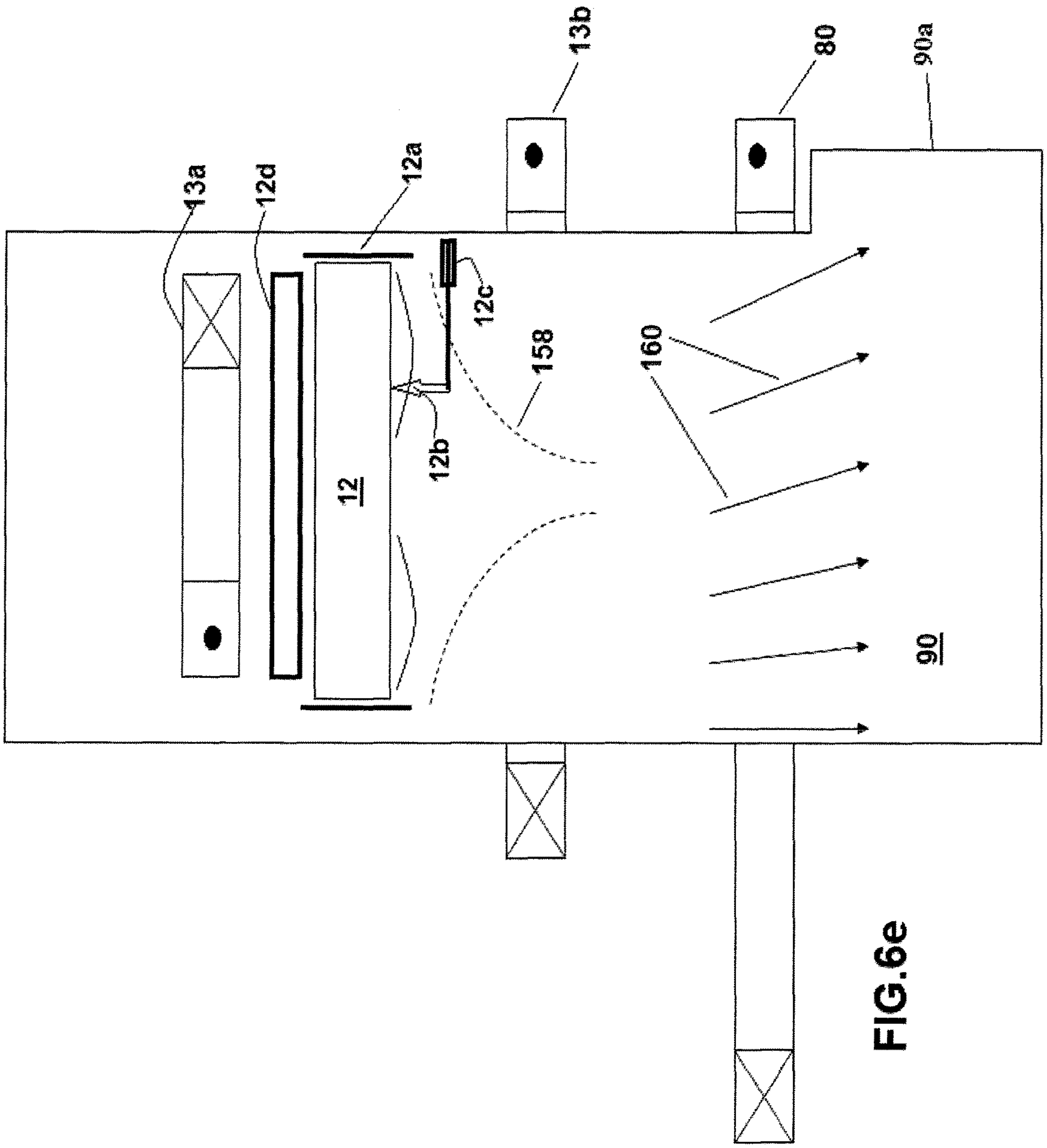
FIG. 6*e* is a schematic plan view of another variation of the apparatus of FIG. 6*b* utilizing the primary cathodic arc source with heated target, in an embodiment.

In a variation of the embodiment shown in FIG. 6*b* the primary cathodic arc source 12 can utilize the rotating cylindrical target 12*a* with magnetic steering system 13*a* enveloped within the evaporating cylindrical tube 12*a*. In reference to FIG. 6*d* this embodiment comprises the rotating cylindrical cathode source 12 comprises the evaporating tubular cylindrical target 12*a* positioned in the coating chamber 90 upstream of the focusing coil 13*b*, while the stationary magnetic steering system in a form of magnetic yoke 13*a* is positioned immediately behind evaporation area of the cathode target 12*a*. The evaporating target-tube is rotating around its axes as shown by the arrow in FIG. 6*d*. The arc escape preventing shield can be optionally installed surrounding the non-evaporating portion of the rotating target 12*a* (not shown). The cathodic arc discharge can be ignited by means of mechanical striker 12*b* driving by a spring coil 12*c* or by laser igniter (as shown in FIG. 3*a*). The shields 12*d* can be optionally provided to protect against arc spots escape from the evaporating area in front of the magnetic yoke. This design has an advantage of the increased target utilization rate. In another variation of the embodiment shown in FIG. 6*b*, the cathode target 12 is providing with the heater which allows heating the cathode target up to 1000° C. The heating of cathode targets is beneficial in case when the cathode target material has high resistance at low temperature, but the resistance is decreasing when target temperature is increasing. Examples of such a cathode target materials include boron and silicon having electrical conductivity near the level of metallic conductivity necessary for running the vacuum arc discharge when their temperature is exceeding 900° C. In reference to the FIG. 6*e*, the cathode heater 12*d* is positioned immediately behind the cathode target 12 between the cathode target 12 and the steering coil 13*a*. The cathodic arc discharge can be ignited by striking the evaporating surface of the cathode target 12 by means of mechanical striker 12*b* driving by a spring coil 12*c* or by laser igniter (as shown in FIG. 3*a*). An optional cathode shield 12*a* may be also provided as a barrier to prevent escaping of the cathodic arc spots from the evaporating surface of the cathode target 12. Alternatively, the cathode heater can be smaller than the cathode target providing a heated area smaller than evaporating area of the target 12. The area which has a lower temperature has much higher electrical resistance serving as a barrier confining the cathodic arc spots within the hot evaporating area of the cathode target 12.

Figure 7A:
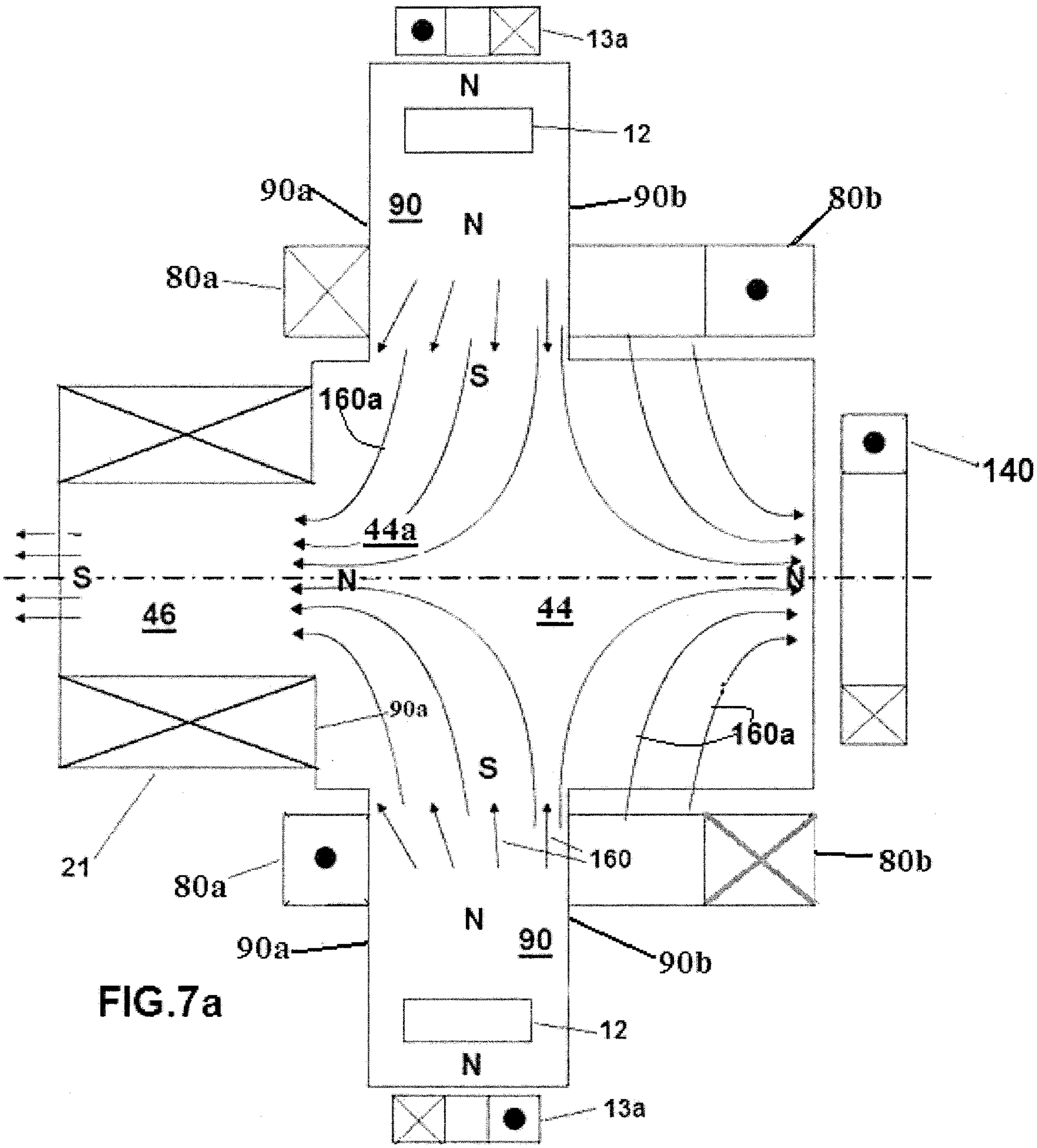
FIG. 7*a* is a schematic plan view of one tubular filtered multi-cathode arc source utilizing deflecting magnetic coils surrounding each cathode chamber, in an embodiment.

In a further embodiment of the filtered cathodic arc deposition method and apparatus of present invention illustrated in FIG. 7*a*, the plasma duct chamber 44 is tubular. It comprises a plasma deflection portion 44*a* of the plasma duct chamber 44 and a focusing tunnel section 46 with primary cathode chambers 90 attached radially around the periphery of the deflection portion 44*a* of the plasma duct 44. The tunnel section 46 preferably has a smaller diameter than that of the plasma deflection section 44*a*. A focusing coil 21 surrounds the exit tunnel section 46 of the plasma duct chamber 44 to focus the deflected plasma stream toward substrate chamber (not shown). The offset deflecting coils 80 surround the exit portion of each of the cathode chambers 90. The offset deflecting coils 80 have the same polarity as the focusing coil 21 creating a magnetically confined plasma corridor all the way from the target 12 throughout the cathode chamber 90 and the deflecting portion 44*a* of the plasma guide 44, and further along the tunnel focusing portion 46 of the plasma guide 44 toward substrates to be coated in a substrate chamber (not shown); the direction of the magnetic field streamlines 160*a* are on the same of side of the plasma guide facing the substrate chamber with a downstream portion of a bidirectional magnetic cusp directed toward the substrate chamber. An additional correctional coil 140 having opposite polarity to the focusing coil 21 may be optionally installed behind the plasma duct chamber 44, to deflect the magnetic streamlines directed toward substrate chamber. Baffles to trap macroparticles (not shown) can be optionally installed both along the walls of the cathode chambers 90 downstream of the cathode targets 12 and along the walls of the plasma duct chamber 44.

Figure 7B:
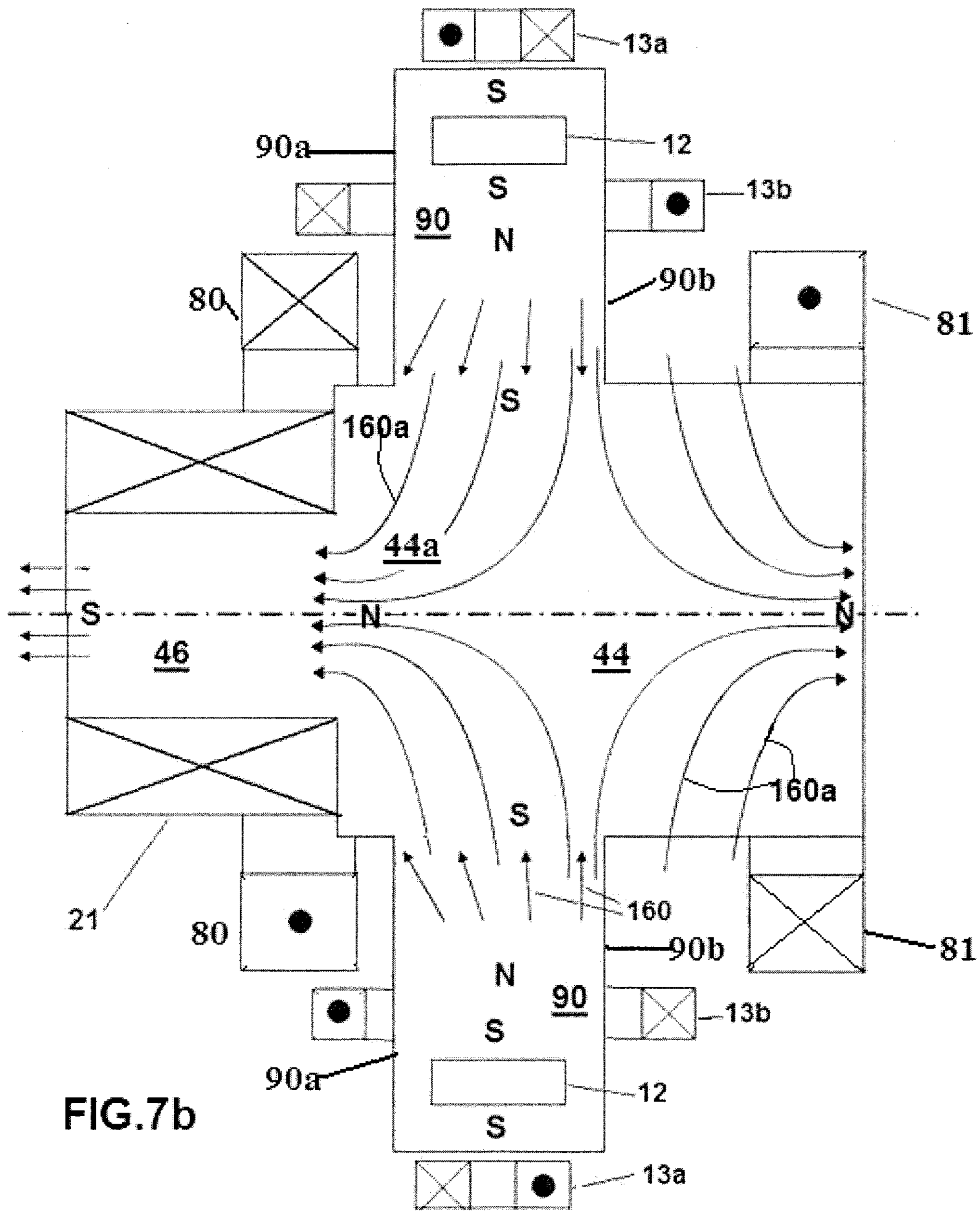
FIG. 7*b* is a schematic plan view of another tubular filtered multi-cathode arc source utilizing a pair of deflecting coils surrounding each cathode chamber, in an embodiment.
Figure 7C:
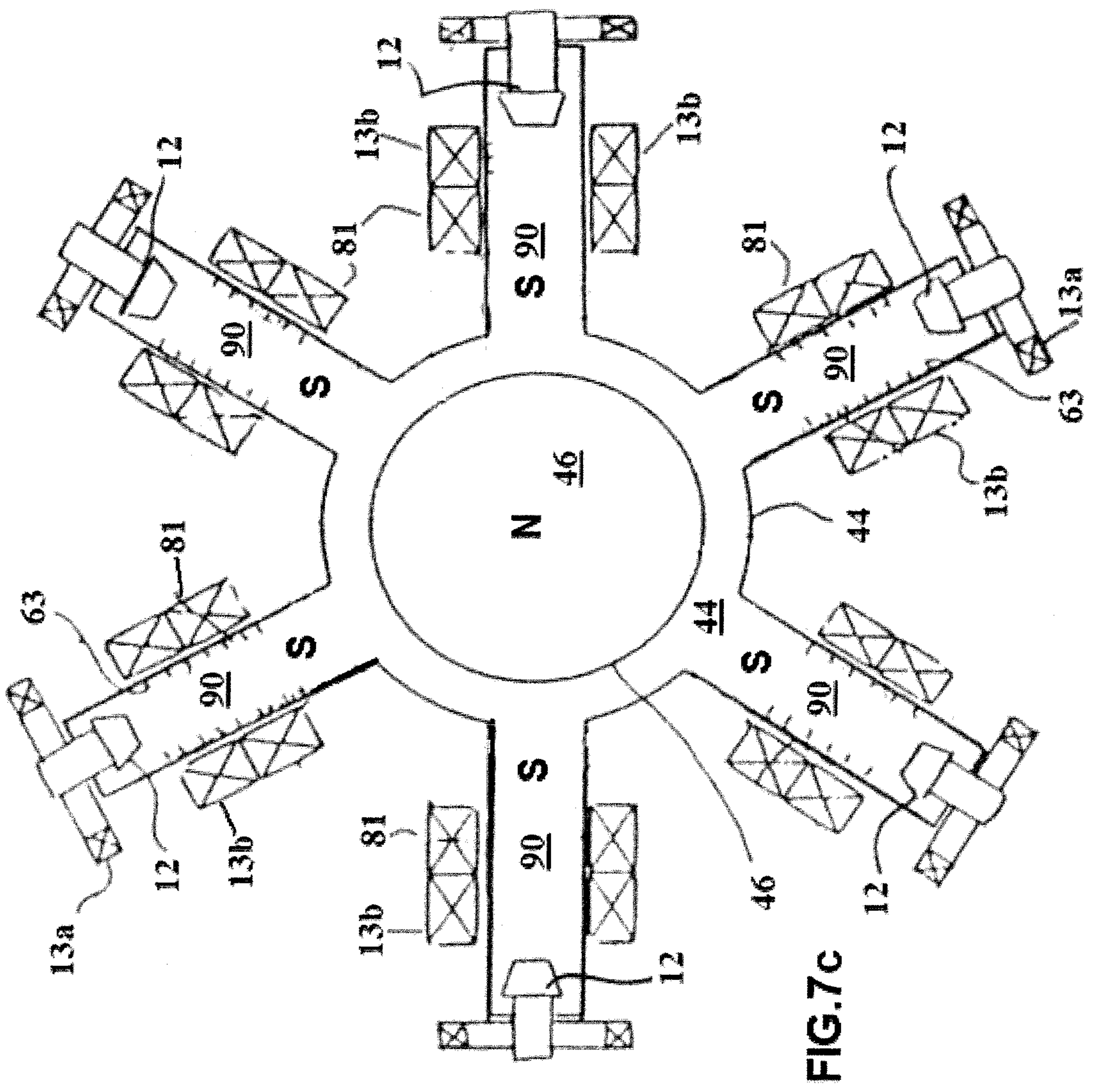
FIG. 7*c* is a transverse cross-section of one tubular filtered multi-cathode arc source utilizing deflecting magnetic coils surrounding each cathode chamber, in an embodiment.

FIG. 7*b* illustrates a still further variation of the embodiment of filtered cathodic arc deposition method and apparatus of present invention shown in FIG. 7*a* in which the metal vapor plasma deflection system comprises a pair of offset deflecting coils 80 and 81 surrounding the deflection portion 44*a* of the plasma duct chamber 44 on opposite sides of all cathode chambers 90. The proximal offset deflecting coil 80 is attached to the side of the cathode chambers 90 facing the substrate chamber (not shown), while the distal offset deflecting coil 81 is positioned behind the cathode chambers 90 distant from the cathode chambers' walls. The bidirectional cusp created by the coils 80 and 81 has a downstream portion directed toward the substrate chamber and upstream portion directed away from the substrate chamber. The distance between the distal offset deflecting coil 81 and the cathode chambers 90 is chosen to have a plane of symmetry of the cusp parallel to the axes of the cathode chambers 90 positioned within the cathode chambers 90 preferably within the portion of the cathode chamber 90*b* farthest from the substrate chamber (not shown). The preferred variation of the embodiment of the present invention shown in FIG. 7*a* utilizes a multiple channel cylindrical filtered cathodic arc source design as illustrated in a plan view of embodiment of filtered cathodic arc deposition method and apparatus of present invention shown in FIG. 7*c*. It is appreciated that filtered cathodic arc plasma sources shown in FIGS. 7*a* and 7*b* can be of rectangular design with primary cathode chambers 90 attached to the opposite walls of the deflection portion 44*s* of the plasma duct chamber 44 and focusing coil 21 surrounding the entire tunnel portion 46 of the plasma duct chamber 44. In this case the axes of the axial symmetry will be replaced with the plane of symmetry dividing two opposite sides of the plasma duct chamber 44.

Figure 7D:
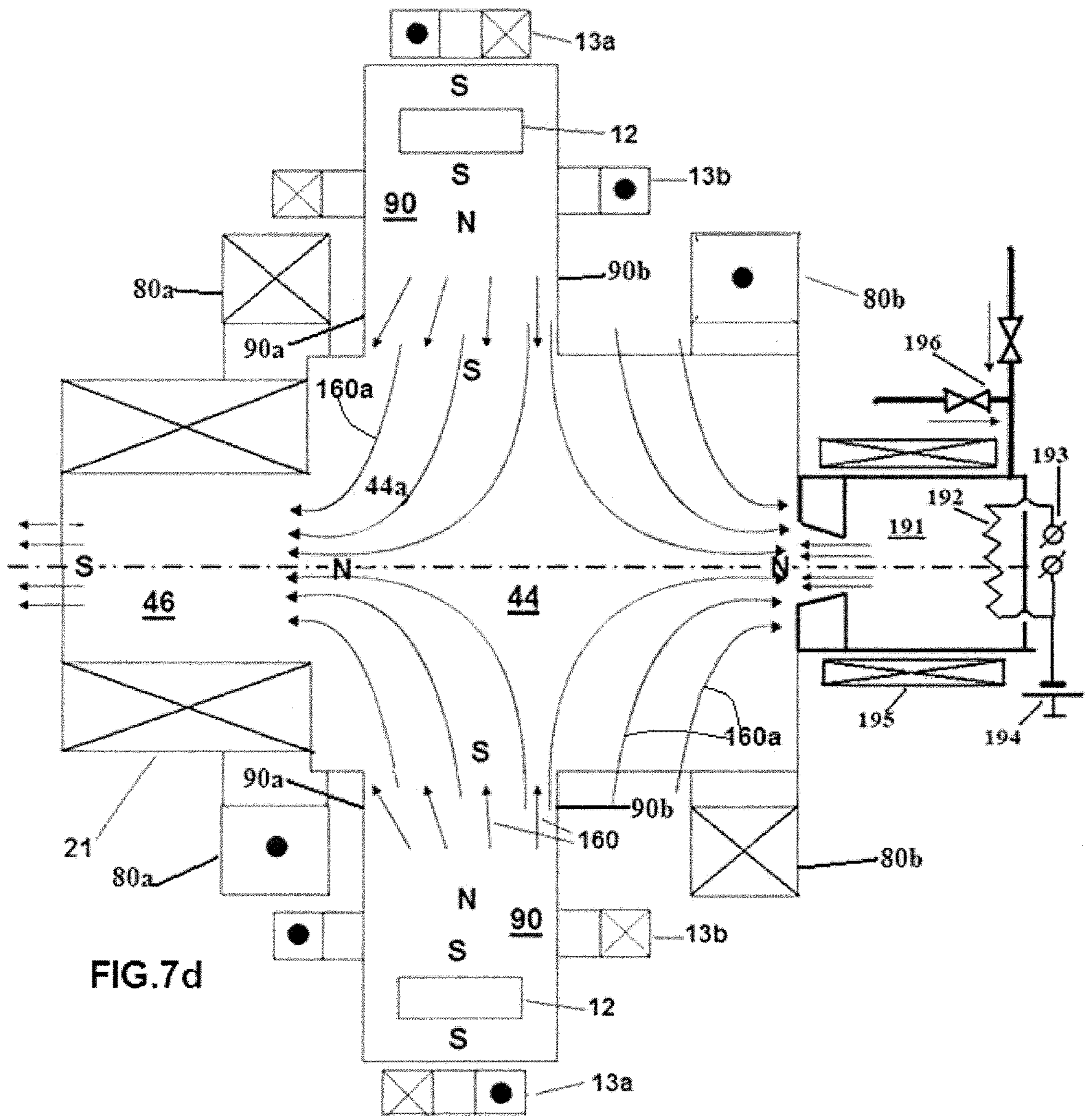
FIG. 7*d* is a schematic plan view of a tubular filtered multi-cathode tubular arc source utilizing an additional coaxial gaseous plasma source, in an embodiment.

The unidirectional dual or multicathode filtered arc source can also serve as a powerful generator of reactive gaseous plasma used in a low pressure plasma assisted CVD (LPPACVD) process. One way to accomplish this process stage is to use the primary cathodes 12 as electron emitters when the main and offset deflecting coils 20, 80, 81 are turned off and an auxiliary arc discharge is established between the primary cathode targets 12 and distant auxiliary anodes 70 as shown schematically in an embodiment of filtered cathodic arc deposition method and apparatus of present invention in FIG. 4*f*. Optionally the mechanically shutters (not shown) can be used to periodically close off the openings of the cathode chambers 90 interfacing the plasma duct 44. The shutters can be provided with openings which permit electrons to flow from the cathode chamber 90 into plasma duct 44, while completely blocking the heavy atomic particles such as ions, atoms, and other neutral particles from entering the plasma duct 44. Alternatively, additional gaseous plasma source can be attached to the back wall of the multi-cathode filtered arc source generally coaxial with the plasma duct 44 as shown in FIG. 7*d*. This gaseous plasma source has a discharge chamber 191 surrounded by coil 195 with thermionic cathode (or, alternatively, the hollow cathode) 192 heated by the heating power supply 193. The power supply 194 provides a negative potential of the cathode 192 in a reference to the ground which allows an arc discharge to be established in a chamber 191. A plasma carrier gas such as argon and a precursor metal-organic or halides reactive gases are supplied via gas supply lines 196. The stream of strongly ionized reactive gaseous plasma prepared in a chamber 191 enters the plasma duct 44 along its axes and merges the filtered vapor plasma incoming from the cathode chambers 90. This design provides a hybrid PVD+CVD deposition of multi-elemental multiphase coatings from the vapor flow consisting of metal vapor plasma in addition to reactive gaseous plasma. Instead of additional gaseous plasma source the hollow cathode or a set of hot cathodic filaments for generation of thermionic discharge can be positioned at the back side of the plasma duct chamber 44. It is appreciated that the vacuum arc cathode same as cathode 12 can be also used as an electron emitting source in the discharge chamber 191. The vacuum arc cathode can operate in almost any reactive gas atmosphere without degradation in a wide range of electron emitting arc currents from approximately 40 amperes up to 500 amperes. The cathodic arc source utilizing vacuum arc evaporating cathode can operate for a long time until the evaporating cathode target is consumed. The exit openings of the discharge chamber 191 can be also provided with mechanical shutter similar to that shown in FIG. 4*f*. This mechanical shutter (shown in FIG. 4*f*) should be impermeable for heavy particles such as ions and neutral particles generating by the electron emitting vacuum arc plasma source, but it should have openings, which permit electrons to flow via plasma duct 44 toward at least one distal anode 70 (shown in FIG. 4*f*) installed anywhere within the substrate chamber 42 (shown in FIG. 4*f*). To energize this remote arc discharge, the negative pole of the at least one power supply (not shown) should be connected to the cathode in the discharge chamber 191, while its positive pole is connected to the at least one distal anode 70 (shown in FIG. 4*f*) installed in the substrate chamber 42 (shown in FIG. 4*f*).

Figure 7E:
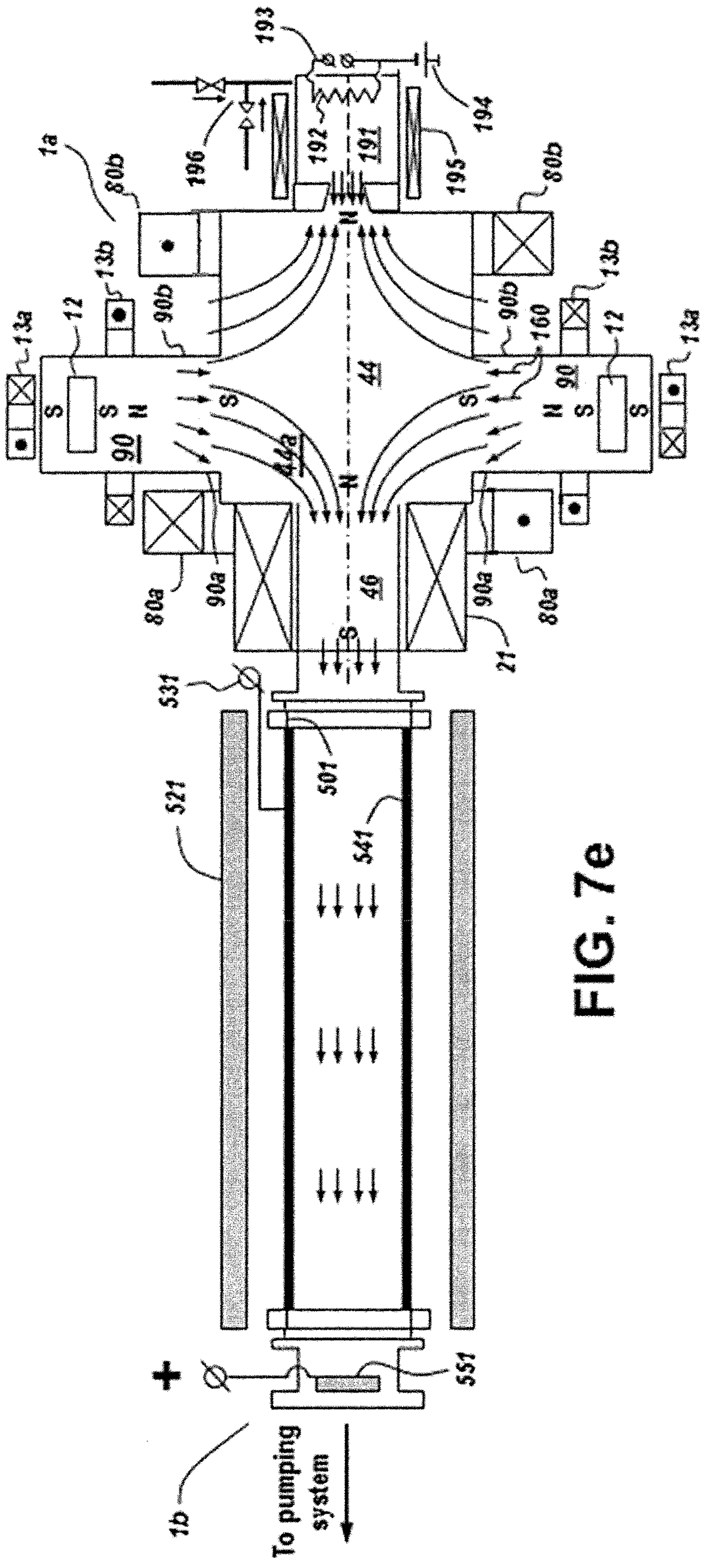
FIGS. 7*e*, 7*f* and 7*g* are schematic plan views of further embodiments of filtered cathodic arc apparatuses for coating and plasma treatment of internal surfaces of long tubular objects.

A still further variation of the embodiment of the filtered cathodic arc deposition method and apparatus of present invention dedicated for coating of internal surface of long tubular objects such as long metal tubes is shown in FIG. 7*e*. In this embodiment the substrate such as a long metal tube 541 is installed between the tubular plasma generator, such as the one shown in FIG. 7*d* comprising one or more vacuum arc cathodes 12 in cathode chamber 90 or thermionic filament cathodes (or hollow cathodes) 192 installed in cathode chamber 1*a* on one side of the tube, and distal anode

551 installed in anode chamber 1*b* on the other side of the tube 541. The tube 541 is separated from the cathode chamber 1*a* and anode chamber 1*b* by insulation spacers 501. The tubular solenoid 521 is optionally provided to generate a longitudinal magnetic field along the tube 541. The high negative voltage, in reference to the primary cathodes in the cathode chambers 90 and 1*a*, is provided to the tube 541 via terminal 531 connected to the negative pole of the high voltage power supply (not shown). In operation of the system shown in FIG. 7*e* the arc plasma is generated along the tube 541 between the cathodes installed in cathode chamber 1*a* and the anode 551 installed in anode chamber 1*b*. The reactive gas such as methane, silane, borazine, metalorganic precursors or the mixture of reactive gases with argon is provided into the tube and high voltage pulses are applied to the tube via negative pole 531. The longitudinal magnetic field can be applied by solenoid 521 to increase the density and activity of the arc plasma environment inside the tube 541. The amplitude of high voltage pulses are ranging from 100 volts to 100,000 volts. Alternatively the pulse arc discharge can be used to generate pulse arc plasma inside of the tube while negative high DC voltage is applied to the tube via terminal 531. In both cases the reactive species are decomposed and ionized in arc discharge plasma followed by deposition of different coatings such as diamond like carbon (DLC) coatings. Silicon coatings or ceramic coatings such as for example nitrides, oxides or carbides depending on reactive gas composition can be deposited on electrically biased internal surface of the tube.

Figure 7F:
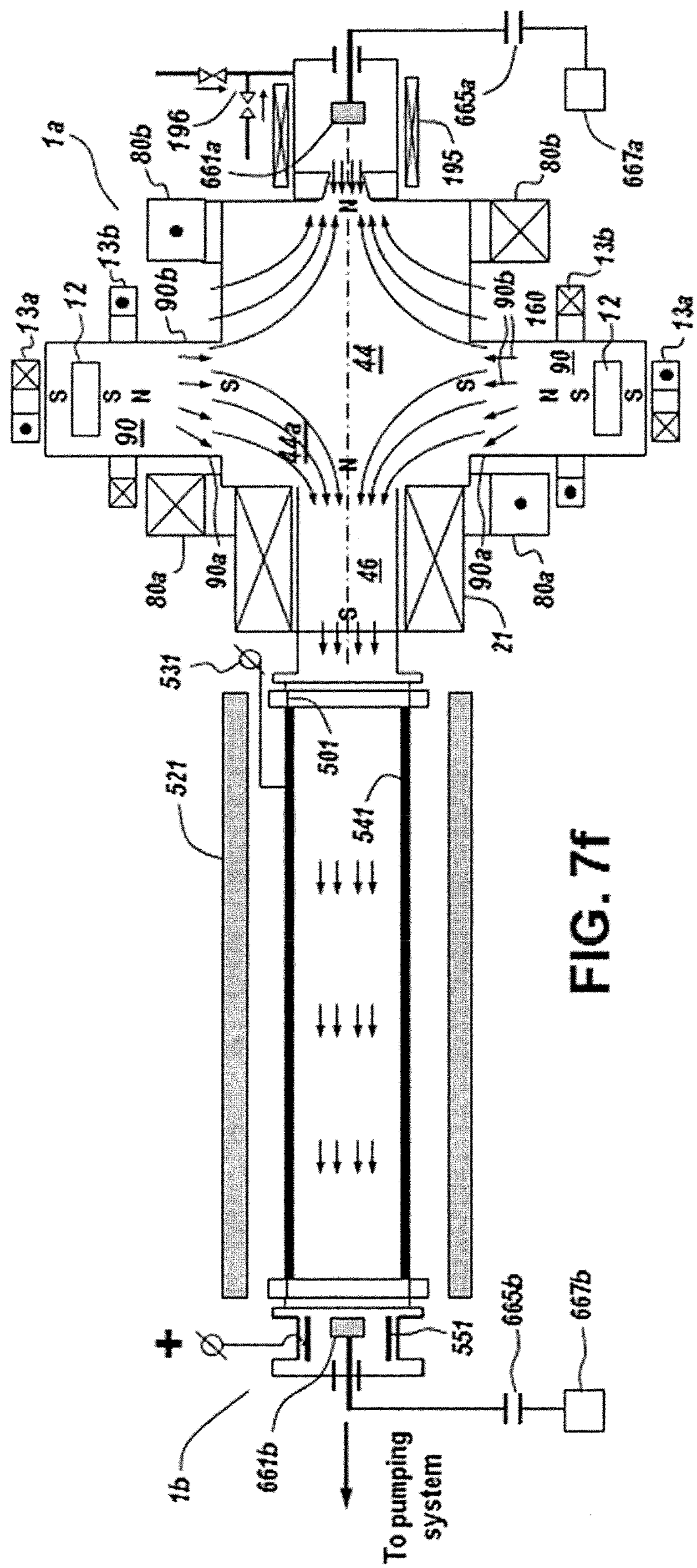

FIG. 7*f* illustrates a variation of the embodiment of filtered cathodic arc deposition method and apparatus of present invention shown in FIG. 7*e* in which the arc plasma generator is replaced with high frequency (HF) plasma generator. Two HF electrodes 661*a* and 661*b* are installed at two ends, 1*a* and 1*b*, of the tubular object 541 which internal surface is subjected to the coating deposition process. The HF electrodes are connected to HF generators 667 via dividing capacitors 665. In this embodiment of the invention the filtered cathodic arc plasma generator including a cathode source 1*a* on one side of the tube and the anode 551 installed in a plasma generator chamber 1*b* on the other side of the tube are used to generate an arc plasma column inside of the tube. The pulsed HF discharge with frequency ranging from 100 kHz to 10 GHz and preferably from 1 MHz to 3 GHz, is used for enhancing the plasma density inside the long tube 541. The HF generators 667 can be synchronized by using a common modulator which allows controlling the pulses of HF power generated by the generators 667 from 1 μs to 10 ms. The HF generators can generate a plasma column inside the long tube even without arc plasma discharge as illustrated in FIG. 7*g*.

Figure 7G:
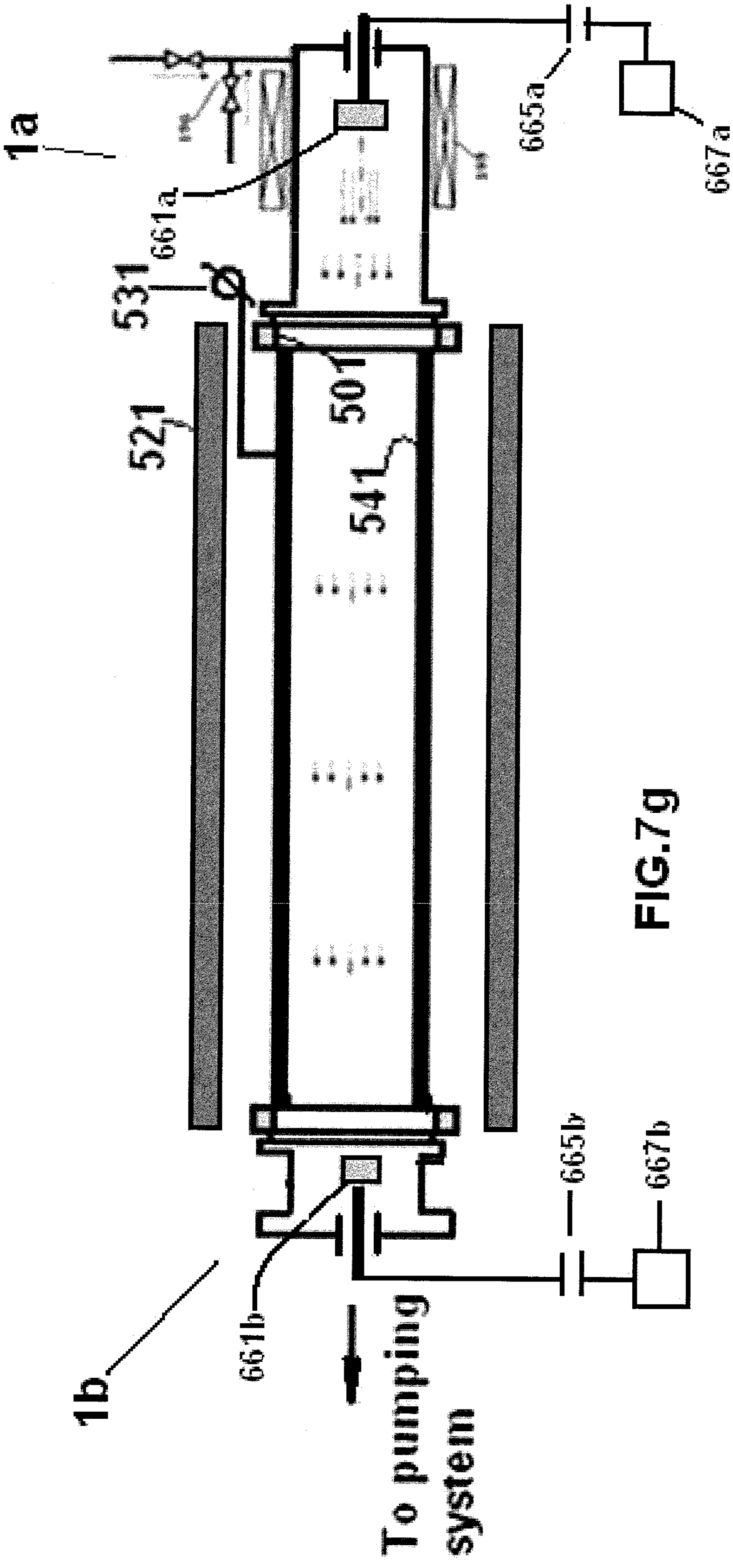

In operation of the embodiment of filtered cathodic arc deposition method and apparatus of present invention shown in FIG. 7*g* for deposition of diamond-like carbon (DLC) coating, during the first, ion cleaning step, the argon as a plasma creating gas is injected along the tube to reach the operating pressure ranging from 0.1 mtorr to 100 mtorr. The high voltage high frequency pulses generated by the HF generators 667 are applied to HF electrodes 661 to generate the plasma column along the tube 541. The DC voltage ranging from 100 volts to 5000 volts is applied to the tube 541 by DC bias power supply (not shown), to accelerate argon ions and provide ion sputtering cleaning and conditioning of the internal surface the tube 541. This stage can last from 10 minutes to 2 hrs. During the second step the silane $SiH_4$ reactive gas-precursor is added to the argon with the partial pressure ranging from 0.001 to 0.5 of the total gas pressure. Silicon bondcoat is depositing on internal surface of the tube by attracting ionized fragments of silane molecules to the surface with ion energy ranging from 100 volts to 5000 volts. At the end of this stage the methane $CH_4$ gas-precursor can be added to the silane to for a gradient silicon carbide coating which is favorable to improve adhesion of the DLC topcoat layer. During the third step the mixture of argon with methane is used as a reactive gas atmosphere for deposition of DLC coating on internal surface of the tube 541.

Figure 7H:
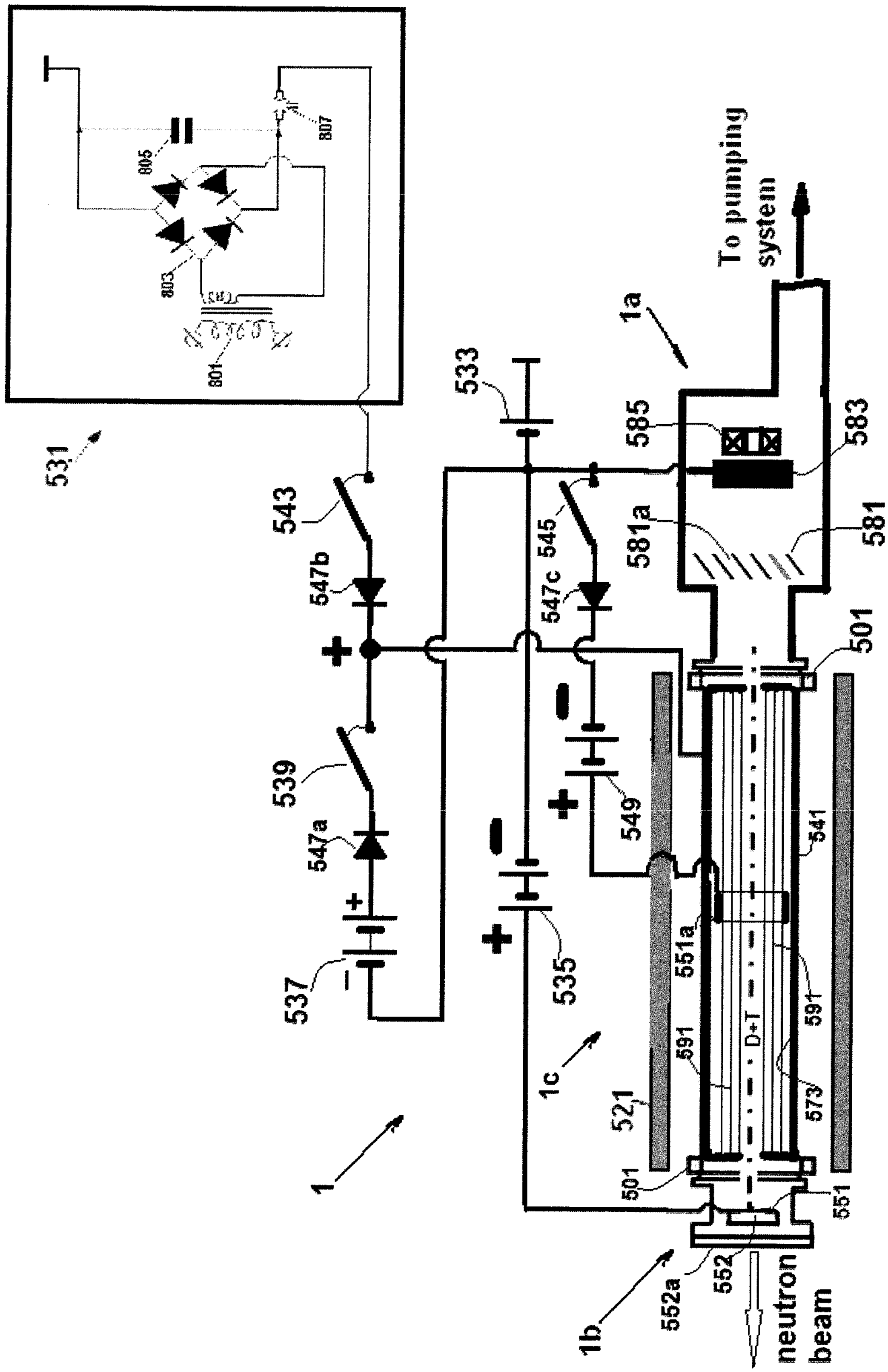
FIG. 7*h* is schematic plan view of one filtered cathodic arc apparatus for generation of energetic particles, utilizing an array of wire electrodes, in an embodiment.

FIG. 7*h* illustrates a variation of the embodiments of filtered cathodic arc method and apparatus of present invention shown in of FIGS. 7*e*-7*g* dedicated for generation of energetic particles with energies ranging from 100 eV to 10 MeV. In reference to FIG. 7*h*, the tubular plasma generator 1 comprises a cathode chamber 1*a*, a remote anode chamber 1*b* and a tubular plasma duct 1*c*, surrounded by magnetic solenoid 521. The shielded cathodic arc source is installed within the cathode chamber 1*a* which can also serve as a primary anode to sustain the primary arc discharge between the cathode 583 and the walls of the cathode chamber 1*a* serving as a primary anode. It is appreciated that the primary anode can be installed within the cathode chamber 1*a* isolated from the walls of the cathode chamber 1*a*. The primary anode can be grounded or connected to the positive pole of the primary arc power supply 533. The cathodic arc source positioned in a cathode chamber 1*a* comprises a cathode target 583 and a steering coil 585 disposed immediately behind the target 583 for steering the cathodic arc spots on the front side of the target 583. It is appreciated that the primary cathodic arc source in the cathode chamber can be also chosen from thermionic cathode source, hollow cathode source or other high current low voltage cathodic arc sources. The shield 581 is optionally installed in front of the cathode 583 to isolate the cathode from the plasma duct 1*c*. The shield 581 in front of the cathode 583 should be impermeable for heavy particles such as ions and neutral particles, generated from the cathodic arc spots on the front evaporating surface of the cathode target 583, but it has openings 581*a*, which permit electrons, emitted from the cathodic arc spots to flow into the tubular plasma duct 1*c* and continue its way further toward distal anode 551 installed within the anode chamber 1*b* which is vacuum sealed by the flange 552*a* to sustain the remote arc discharge along the tubular plasma duct 1*c*. The shield 581 in a cathode chamber 1*a* can have a shape of chevron or simply have an array of holes about ½ inch to 2 inches diameter as shown illustratively in FIG. 10*e*. The voltage of the primary arc discharge in cathode chamber 1*a* is typically ranging from 20 to 50 volts, while primary arc current is ranging from 50 amperes to 500 amperes. The primary cathodic arc discharge is unstable when its voltage is less than 20 volts and typically does not exceed 50 V. The primary arc is typically getting unstable when the arc current is less than 50 amperes, while primary arc current exceeding 500 amperes will require unnecessary high consuming rate of the target which is not necessary for sustaining the primary cathodic arc discharge. It is appreciated that instead of the cathodic arc discharge with metal evaporating target the thermionic or hollow cathode arc discharge can be used. The remote arc discharge in the tubular plasma duct 1*c* is sustained by the electron current emitted from the primary arc discharge in the cathode chamber similar to one shown above in FIGS. 4*e,f* and 7*e*. The remote arc current and voltage are typically ranging from 50 to 10,000 amperes and from 30 to 500 volts respectively. The remote arc discharge current less than 50 amperes is not producing dense enough plasma for generating energetic particles while remote arc current exceeding 10000 amperes may trigger formation of anode spots within the plasma duct 1*c*, anode chamber 1*b* and cathode chamber 1*a* which will result in damage of reactor's components and extinguishing the discharge. The remote arc discharge is unstable when the discharge voltage is outside of the range within 30V<V(remote arc discharge)<500V.

The tubular plasma duct 1*c* comprises the discharge tube 541 surrounded by magnetic solenoid 521. The discharge tube 541 is electrically insulated both from the cathode chamber 1*a* and from the anode chamber 1*b* by the insulators 501. In this embodiment of the invention, the discharge tube 541 is charged positively in reference to the primary cathode 583 in the cathode chamber 1*a* by connecting discharge tube 541 either to the positive terminal of the DC power supply 537 or to the unipolar pulse power supply 531 or both, while the negative terminals of the DC power supplies 537 and the pulse power supply 531 are connected to the primary cathode 583 in the cathode chamber 1*a*. The unipolar pulse power supply 531, which is shown schematically in FIG. 7*h*, has an example, comprises the transformer 801, the rectifier 803 and the capacitor 805. When the switch 543 is closed the trigger 807 discharges the capacitor 805, generating the unipolar positive voltage pulses applied to the discharge tube 541 and the pulse arc current is conducting via remote arc discharge between the discharge tube 541 and the primary cathode 583. In a DC arc discharge mode, when the switch 543 is open and switch 539 is closed the secondary arc discharge is powered by the DC power supply 537 between the discharge tube 541 as a secondary anode and the primary cathode 583 in the cathode chamber 1*a*.

Optionally, at least an additional intermediate anode 551*a* may be installed within the discharge tube 541 of the tubular plasma duct 1*c*, which may help extend the remote arc discharge in longer embodiments of tubular plasma duct 1*c* by effectively increasing the length of the remote arc discharge along the discharge tube 541 between the cathode 583 in the cathode chamber 1*a* and the remote anode 551 in the anode chamber 1*b*. In a refinement, the igniting RF electrodes (not shown) may be also provided along the discharge tube 541 for triggering the remote arc discharge within long discharge tube 541. The blocking diodes 547 prevent the interference between power supplies 537, 531 and 549 in the discharge mode when all of these power supplies are operating simultaneously and switches 539, 543 and 545 are closed.

In a refinement, an array of thin wire anodes 591 is installed along the discharge tube 541 of the tubular plasma duct 1*c*. The wire anodes 591 can be a straight wires parallel to the axes of the plasma duct 1*c* or have different shape such as helical or mesh cylinder coaxial to the plasma duct 1*c*. The wire anode array 591 can be connected to the discharge tube 541 as shown in FIG. 7*h* or, optionally, to the positive terminal of additional power supply. The wire anode array may be also connected to the unipolar pulse power supply 531 as illustrated in FIG. 7*h*. As shown illustratively in the cross-sectional view in FIG. 7*i*, the wire anode array 591 is disposed within the area 595 adjacent to the wall of the discharge tube 541 coaxially to the discharge tube 541 between the inner circle of the diameter d and the discharge tube of the diameter D, leaving the inner area 597 of the diameter d surrounding the axes of the discharge tube 541 unoccupied.

In operation, the primary arc discharge is established within the cathode chamber 1*a* between the primary cathode 583 and the grounded walls of the cathode chamber 1*a* powered by the primary arc power supply 533. Then the remote arc discharge is ignited along the discharge tube 541 of the tubular plasma duct 1*c* between the primary cathode 583 in the cathode chamber 1*a* and the remote anode 551 in the anode chamber 1*b*, powered by the remote arc power supply 535. Initially, the switch 543 is opened, the switch 539 is closed and the walls of the discharge tube 541 together with attached array of the wire electrodes 591 are energized by the DC power supply 537 serving as intermediate remote anode. Optionally, the additional intermediate remote anode 551*a* is also energized by the additional DC power supply 549, when the switch 545 is closed. During this stationary remote arc discharge mode the plasma potential within the discharge tube is defined by the positive voltage applied to the discharge tube by the DC power supply 535, typically ranging from 30 to 500 volts. When the switch 543 is closed and high positive voltage pulses are applied to the discharge tube 541 together with the array of wire anodes 591, the plasma potential within the area 595, occupied by the array of the wire anodes 591, increases up to the amplitude of the positive pulses supplied by the pulse power supply 531. At the same time, within the inner zone 597, the plasma potential remains low as defined by the remote arc plasma column. This distribution of the plasma potential across the discharge tube 541 is illustrated graphically in FIG. 7*j*. In the example shown in FIG. 7*j* the plasma potential within the high voltage zone 595 reaches 1.5 kV as applied by the pulse power supply 531, while the plasma potential within the low voltage inner zone 597 remains approximately +100 V as defined by the plasma potential of the remote arc discharge plasma. The voltage amplitude of the positive high voltage pulses generated by the pulse power supply 531 typically ranges from 0.1 kV to 10 MV. The pulse voltage amplitude below 0.1 kV does not produce ions with necessary high energy while producing unipolar pulses with voltage amplitude exceeding 10 MV is impractical due to complexity of pulse power generator and insulation of the reactor's components. In a refinement the remote arc low voltage high current potential can be applied to the discharge tube 541 only while the high voltage pulses are applied to both discharge tube 541 and wire electrodes array 591 which may protect the wire electrodes against overheating during the remote arc discharge mode. The current of the remote arc discharge is typically ranging from 50 A to 500 A, but may be increased up to 10 kA.

Figure 7I:
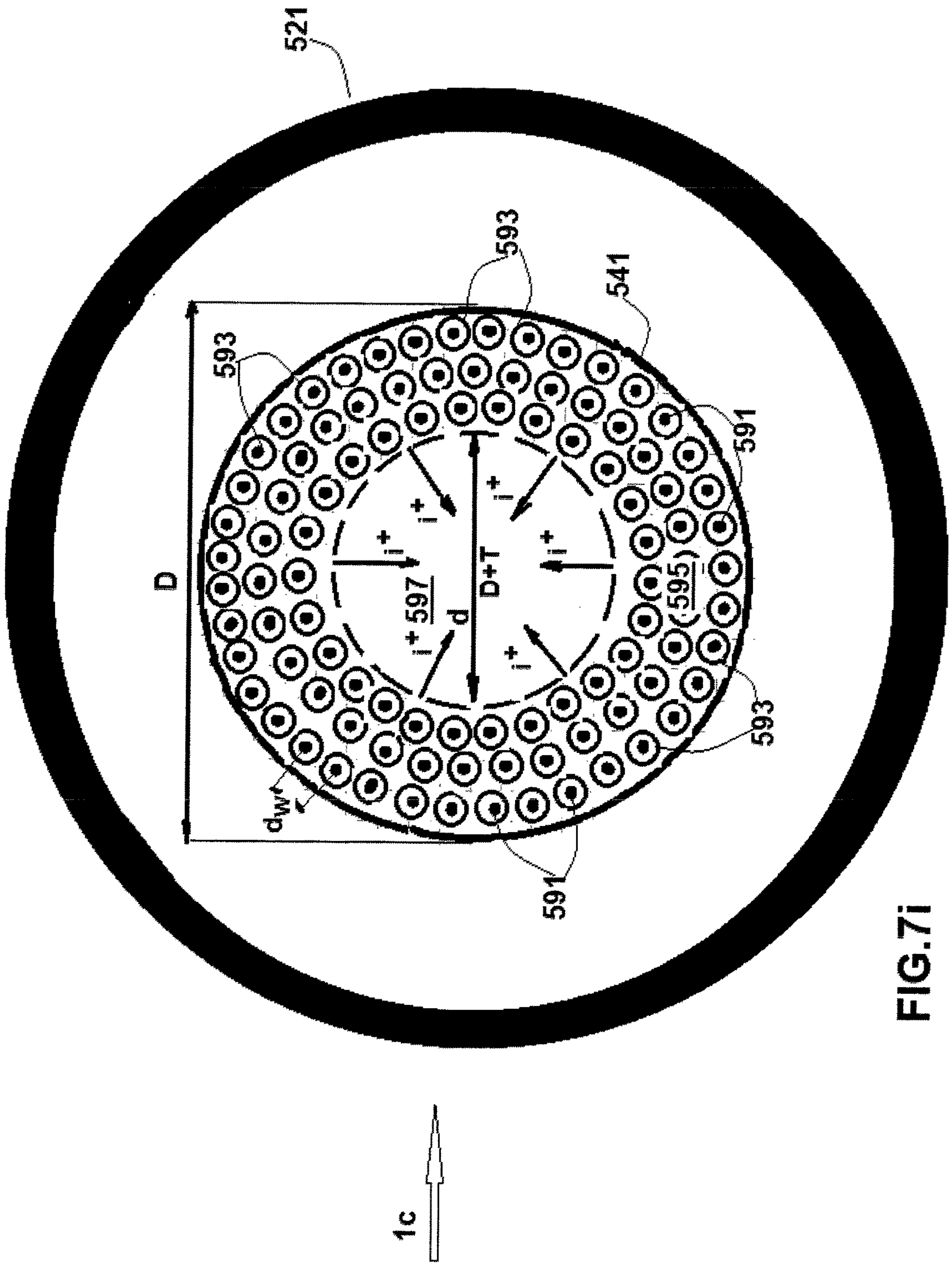
FIGS. 7*i* and 7*j* show cross sectional view of the apparatus of FIG. 7*h* and distribution of plasma potential across the discharge tube.
Figure 7J:
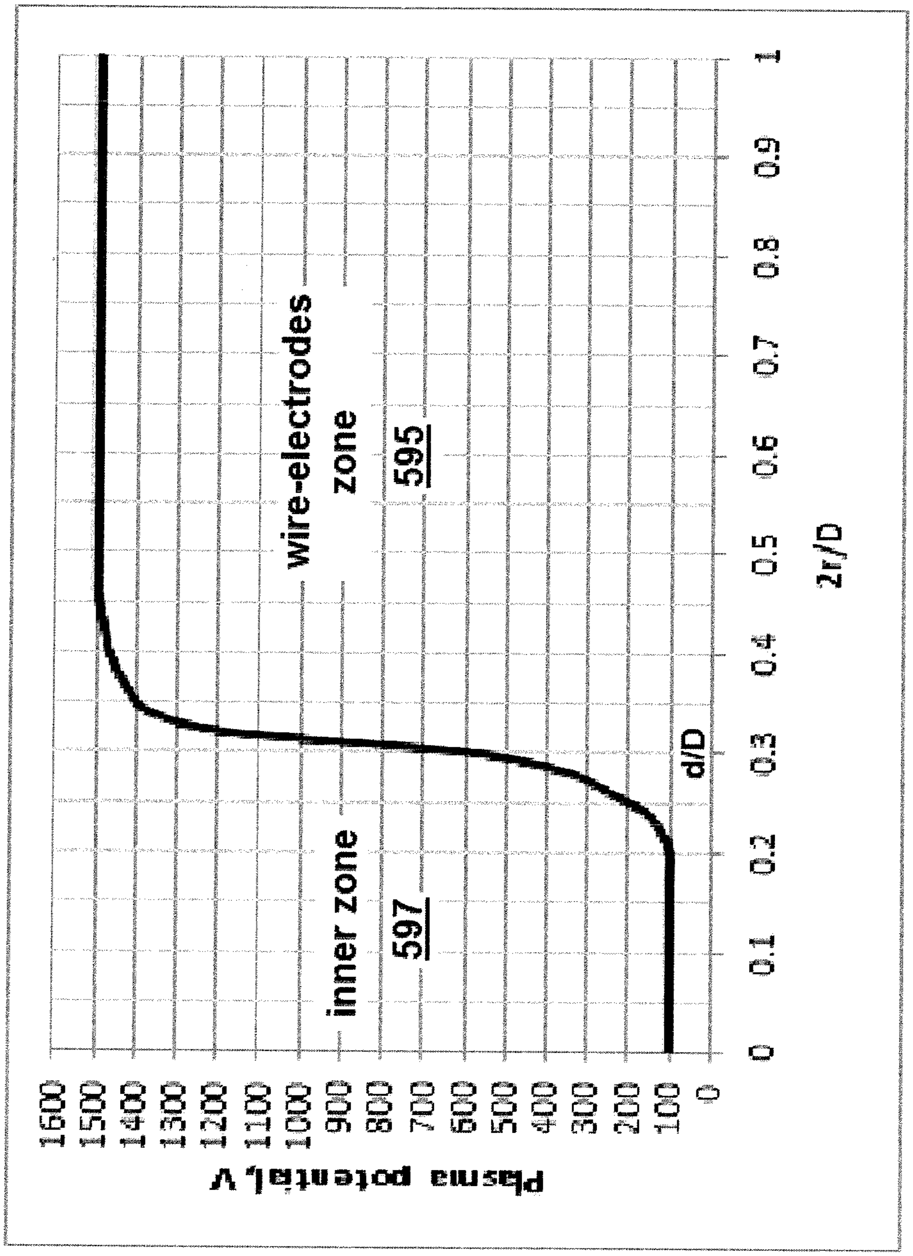

When the high voltage positive pulses are applied to the wire electrodes 591 immersed in the remote arc plasma, the plasma sheaths are created around each of the wire electrodes as illustrated by the circles surrounding the wire electrodes 591 in FIG. 7*i*. The value of the plasma potential within the plasma sheath areas surrounding the wire electrodes 591 is almost equal to the high voltage potential applied to the wire electrode by the pulse power supply 531. When the distance between neighboring wire electrodes 591 in a wire electrode array is decreasing to the length comparable to the plasma sheath thickness, the plasma sheath areas surrounding the wire electrodes 591 overlap providing continuous uniform distribution of the high positive plasma potential within high voltage zone 595 adjacent to the discharge tube 541 as illustrated graphically in FIG. 7*j*. The diameter of the wire electrodes 591 is typically ranging from 0.01 mm to 1 mm. A wire electrode 591 diameter less than 0.01 mm may not be practical due to mechanical strength, wilst the wire electrodes 591 having diameters greater than 1 mm may capture high fluxes of electrons influencing plasma properties in the wire electrodes array zone 595. The distance $d_w$ between the neighboring wire electrodes 591 in the wire electrode array is typically ranging from 0.1 mm to 5 cm while the operating pressures of the remote arc discharge plasma are ranging from 0.001 mtorr to 100 torr. Distances between the wire electrodes less than 0.1 mm are not practical and will inflict large ion losses due to collisions of high energy ions with wire electrodes. When the distances between the neighboring wire electrodes exceed 5 cm it will require to apply more than 1 MV voltage for overlapping the plasma sheaths between the neighboring wire electrodes, which in most cases will be impractical. The preferable range of the distances between the wire electrodes 591 is from 1 mm to 1 cm. Keeping such distances between the neighboring wire electrodes 591 allows overlapping the plasma sheath areas between the wire electrodes 591 overlap at high voltage discharge mode providing uniform distribution of high positive plasma potential in the area 595 occupied by the wire electrode array 591. At the same time, distances between the neighboring wire electrodes 591 exceeding 0.1 mm are greater than the plasma sheath length surrounding the positively charged wire electrodes 591 during the remote arc discharge plasma mode. This allows the remote arc discharge plasma to expand from the central area 597 toward the walls of the discharge tube 541 providing uniform distribution of the plasma density across the discharge tube 541 during the period of time between high voltage impulses generating by the high voltage power supply 531 when the discharge tube 541 and wire electrodes 591 serve as an intermediate anode for the remote arc discharge. When the high plasma potential is established within the area occupied by the array of wire anodes 591, the positive ions from the high voltage zone 595 are accelerating toward the low voltage inner zone 597 surrounding the axes of the discharge tube 541, reaching the high kinetic energy at the level of the plasma potential within the high voltage zone 595, defined by the high positive voltage pulses generating by the pulse power supply 531. High energy ions are colliding within the low potential inner zone 597 releasing their kinetic energy in the collisions.

When the discharge gas is deuterium (D) or deuterium-tritium (D-T) mixture the fusion reactions occur by collisions of energetic ions within the inner zone 597 of the discharge tube 541, generating the high flux of energetic neutrons. 14.1 MeV neutrons are generating by D-T fusion reactions. In this case the plasma generator of this invention can serve as a thermonuclear fusion reactor to produce energy.

The gas pressure within plasma discharge tube 541 in operation is typically ranging from 0.001 mtorr to 100 torr, but more preferably within the range from 0.01 mtorr to 30 torr. When the pressure is less than 0.001 mtorr the process is ineffective due to low density of the reactive species in the reactor. When the pressure exceeds 100 torr it creates too high energy losses of high energy ions by collisions of high energy ions generated within high voltage zone 595 with gas molecules, which reduces the energies of high energy ions reaching the central zone 597 of the reactor. To improve confinement of the remote arc plasma and accelerated ions, the external longitudinal magnetic field generated by the solenoid 521 is applied along the axes of the discharge tube 541, the magnitude of said magnetic field can be chosen to satisfy the following condition: $r_{ge}<d_w<r_{gi}$, where $r_{ge}$ and $r_{gi}$ are gyroradiuses of electrons and ions respectively. The plasma confining magnetic field is typically ranging from 0.01 T to 20 T. Magnetic field less than 0.01 T is inefficient for plasma confinement while magnetic field exceeding 20 T is impractical due to complexity of magnetic system and weight of the coil 521.

In a FIG. 7*h* the plasma generator is configured as a neutron generator proving the neutron reflecting cladding covering the inner side of the plasma discharge tube 541 walls 573 and the hollow remote anode 551 with the opening 552 for release of the neutron beam. The neutron reflecting cladding can be made of light materials such as graphite or beryllium or, alternatively, from heavy materials such as tungsten. The plasma generator shown in FIG. 7*h* can be also used as an ion laser discharge tube. In this case the laser mirrors are installed at the opposite ends of the plasma duct 1*c* along the axes of the discharge tube 541. The powerful laser beam may be generated in Ar or Kr plasma utilizing the energy of ion collisions within low potential central discharge zone 597. Other applications of this plasma generator can be in the field of plasma chemical synthesis of nanomaterials and in aerospace propulsion. In this case the high energy particles generator shown in FIG. 7*h* can be used as plasma thruster utilizing heavy ions such as Kr or Xe accelerated to high speed within the central core area 597 and escaping throughout the hole or, optionally a nozzle-like structure replacing the vacuum seal flange 552*a* at the end of the anode chamber 1*b*. It is appreciated that other primary plasma sources can be used to provide a primary plasma environment within discharge tube 541 prior to applying high voltage positive pulses the tube's wall 541 and to the wire electrodes 591. For instance, Electron Cyclotron Resonance (ECR) source, inductively coupled plasma (ICP) source or helicon wave source can be also used instead of arc plasma source in the cathode chamber 1*a*.

In another preferred embodiment of the invention the neutron generator shown in FIGS. 7*h, i* can be also used as a source of neutrons for the hybrid fusion-fission reactors with improved nuclear fuel cycles. The example of the hybrid reactor utilizing cylindrical neutron generator of the present invention is shown schematically in cross-section in FIG. 7*m*. In this design the neutron generator consisting of the vacuum-sealed plasma duct and optional coaxial magnetic confinement coil 521 is position within the graphite block 641 serving as neutron moderator with fission nuclear fuel rods, containing, for example $U^{235}O_2$, inserted within nuclear fuel channels 651. The neutrons generating by the neutron generator are propagating from the central area 597 of the fusion neutron generator toward the graphite block 641 (shown by radial arrows in FIG. 7*m*) where their speed is slowing down to the thermal neutron energy level required for activation the fission nuclear fuel.

Figure 7K:
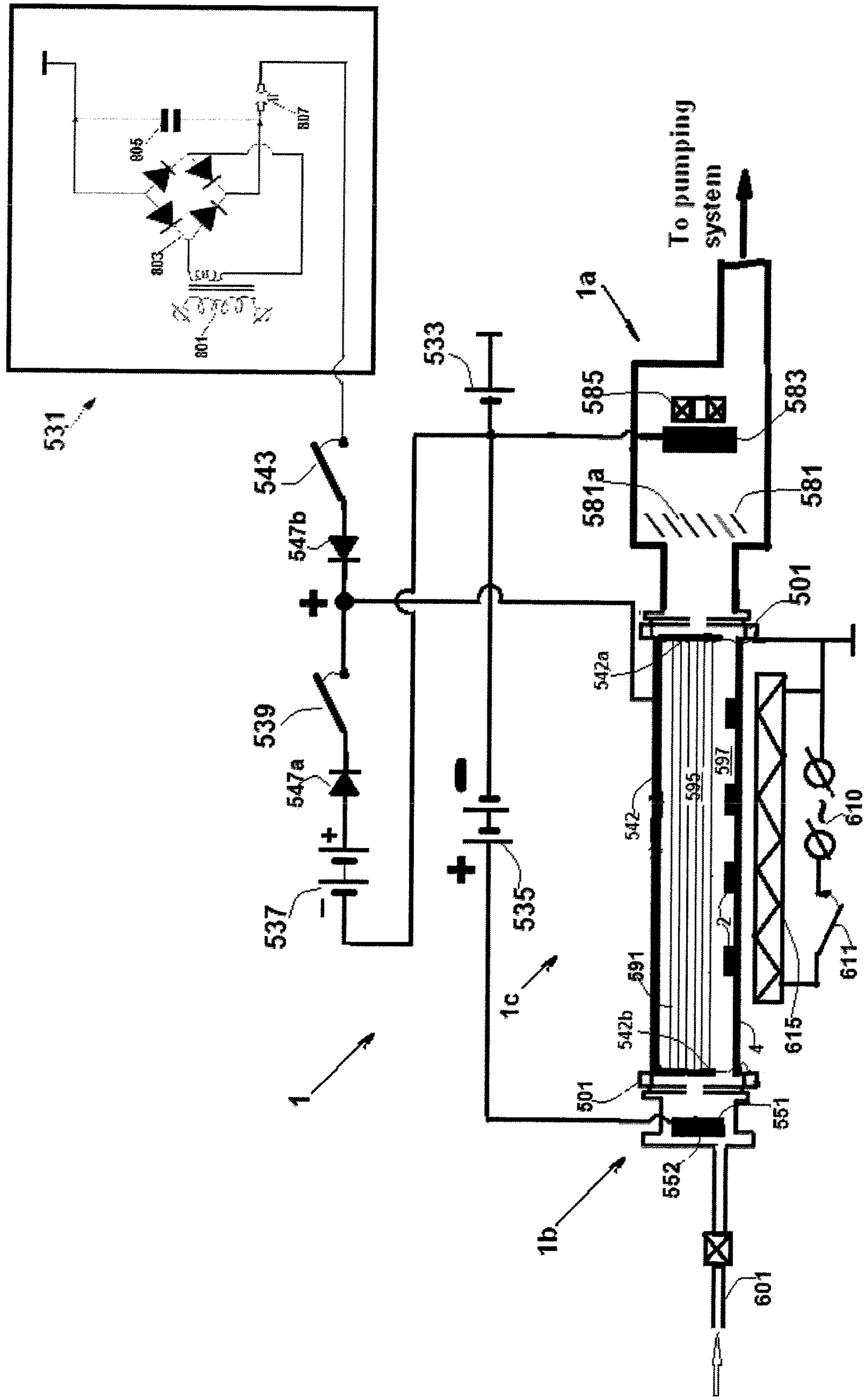
FIG. 7*k* shows cross-sectional view of an apparatus for generation of energetic particles in coating deposition reactor, utilizing an array of wire electrodes, in an embodiment.
Figure 7L:
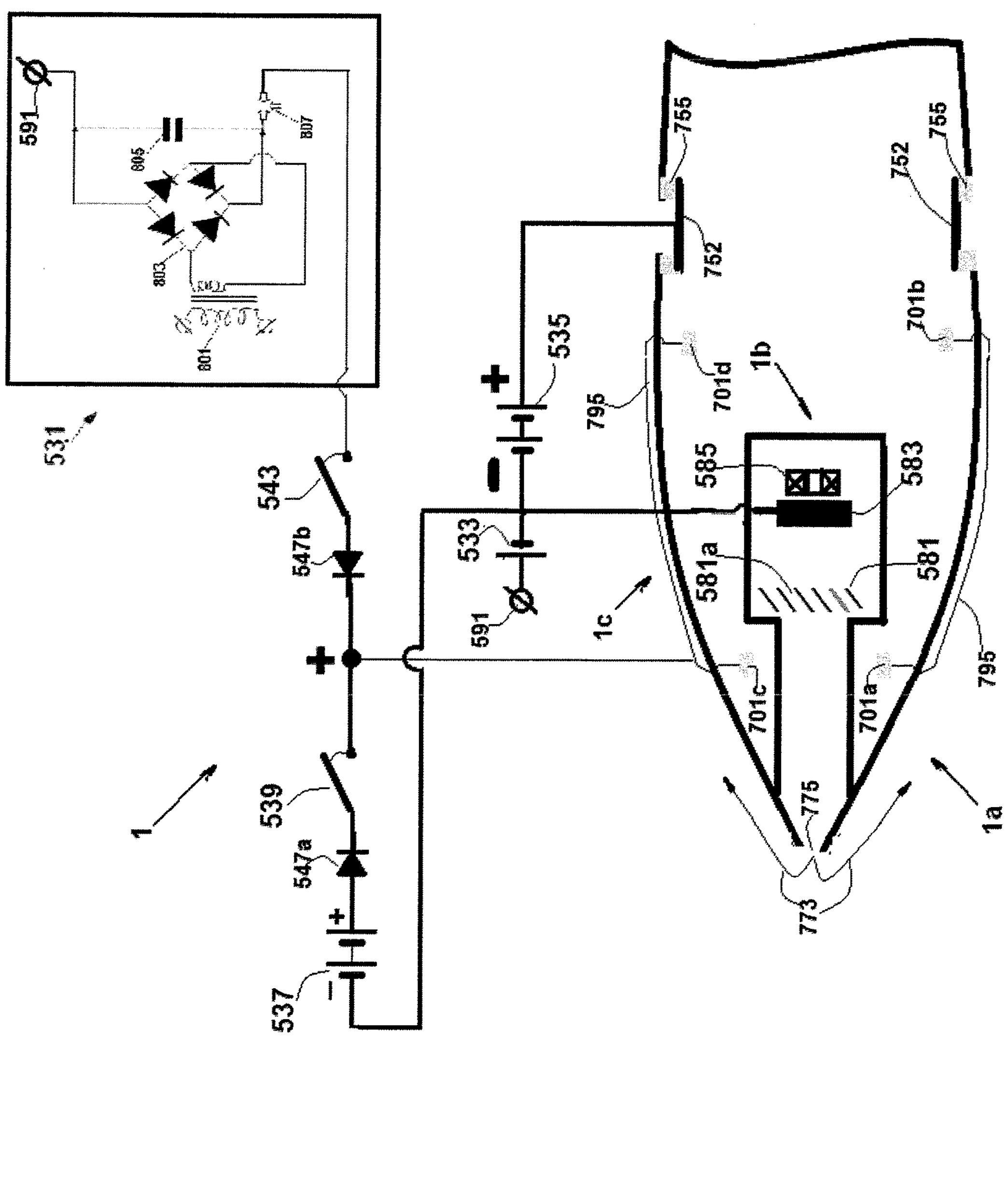
FIG. 7L shows cross-sectional view of an apparatus for generation of energetic particles for drug reduction of hypersonic vehicle, in an embodiment.
Figure 7M:
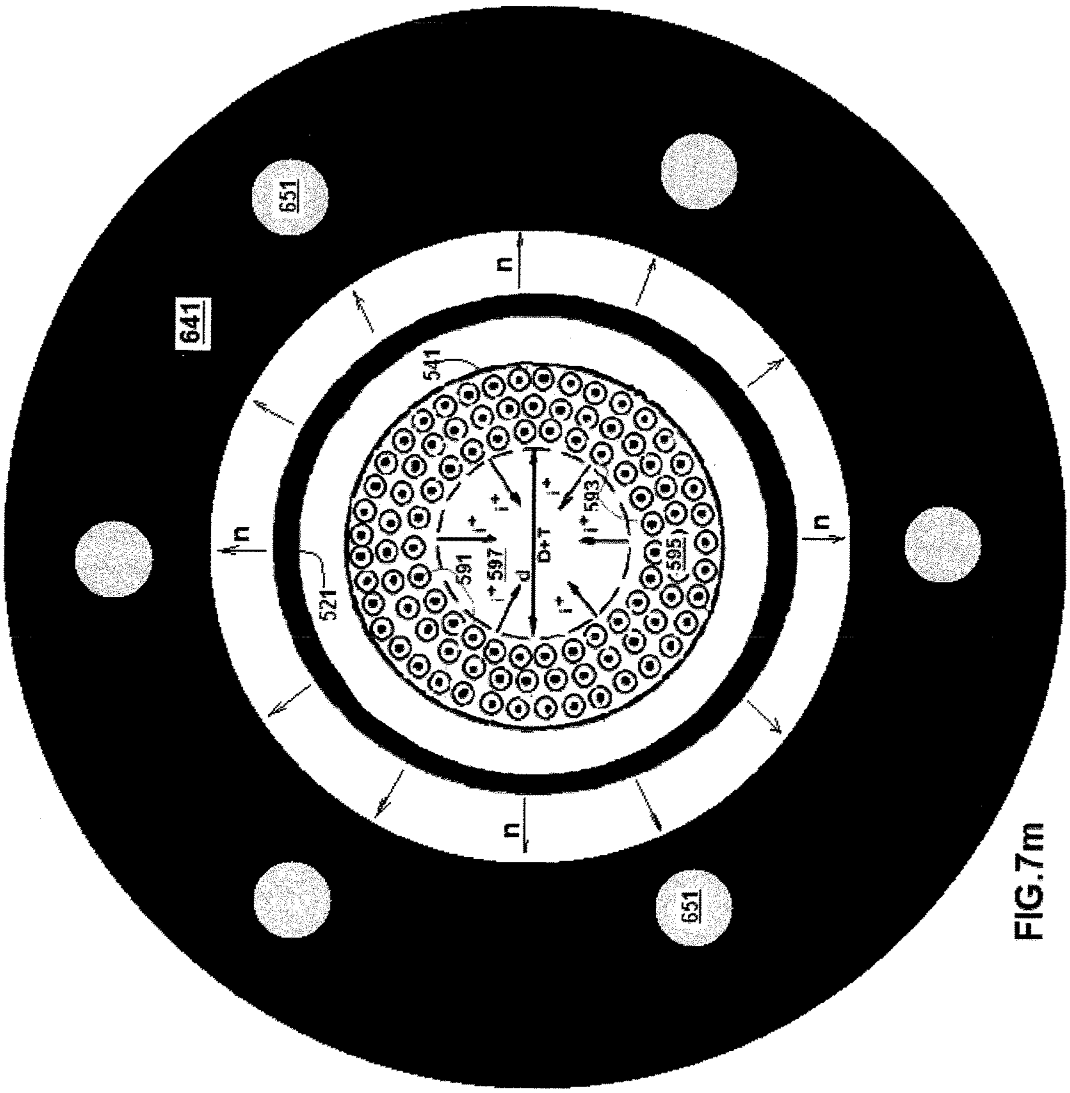
FIG. 7*m* shows cross-sectional view of an apparatus for generation of energetic particles for the hybrid fusion-fission reactor, in an embodiment.

The process of generating high energy particles, as discussed above in reference to FIGS. 7*h*-7*j*, may be applied for deposition of various coatings and production of nanopowder by means of plasma-chemical synthesis activated by the energetic particles. FIG. 7*k* shows cross-sectional view of the embodiment of filtered cathodic arc method and apparatus for generation of energetic particles in coating deposition reactor for deposition of diamond coatings. In reference to FIG. 7*k*, the plasma-chemical reactor 1*c* comprises the rectangular substrate chamber with substrates 2 to be coated positioned at the grounded bottom wall 4 of the reactor chamber 1*c* while the top wall 542 is connected to the secondary arc power supply 537 and the unipolar pulse power supply 531. The array of wire anodes 591 is installed along the reactor chamber connected to the top wall 542 by the side walls 542*a*, on side of the cathode chamber 1*a*, and 542*b* on side of the remote anode chamber 1*b*. The array of wire anodes 591 occupies the high voltage upper area 595 of the reactor chamber adjacent to the top wall 542, while the remote arc discharge is established within the low voltage area 597 between the array of the wire anodes 591 and the bottom wall 4 of the reactor 1_c_. For the synthesis of diamond coatings from the argon-methane-hydrogen reactive gas mixture, the bottom wall 4 of the reactor 1_c_ may be heated by the heater 615. Heater 615 is powered by AC current connected via terminals 610, when the switch 611 is closed, to maintain a necessary temperature for synthesis of diamond coatings, which is typically ranging from 300 to 1050 deg C. When substrate temperature Ts<300 degC the non-diamond phase will be predominantly nucleating. Substrate temperature exceeding 1050 degC overheat and destroy both substrate and diamond coating. Ion bombardment of the substrates 2 to be coated by the energetic ions generated in the high plasma potential area 595 during the process of synthesis of diamond coating may improve coating structure and morphology and allow deposition of nanocrystalline films at reduced reaction pressures and substrate temperatures.

Another application of the remote arc discharge plasma as shown by example in FIG. 7_h_ include generation of plasma cloud surrounding outer surfaces of aerospace vehicles. FIG. 7L shows cross-sectional view of the embodiment of filtered cathodic arc method and apparatus of present invention for application of the process of generation of energetic particles for drag reduction of hypersonic vehicle. In reference to FIG. 7L, the cathode chamber 1_b_ is positioned immediately behind the opening 775 in the stagnation area at the front end of the body of the hypersonic vehicle. The remote arc plasma is generated between the cathode 583, in the cathode chamber 1_b_, and the remote anode 752 installed downstream of the opening 775. The remote anode 752 is insulated from the vehicle body by insulation spacers 755. The remote arc discharge plasma stream 773 is propagating from the cathode 583 in the cathode chamber 1_b_ to the remote anode 752 via opening 775 effectively enveloping the front portion of the vehicle body resulting in drag reduction of hypersonic vehicle flying in the area where the atmospheric pressure is ranging from 1 torr to 1 atm. The plasma cloud surrounding the body of the plane can also reduce the radar cross-section of the vehicle. In case of a high altitude spacecraft, the remote plasma cloud generating by the remote arc discharge may be used to control charging and suppression of arcing on the outer surface of the high altitude spacecraft by neutralizing the surface charge. To enhance this effect, the array of wire anodes 795, which are positioned between the opening 775 and the remote anode 752 and isolated from the spacecraft body by the isolation spacers 701, may be also used to generate high energetic particles for neutralizing the charge of the spacecraft body.

The fact that macroparticles follow straight trajectories after being emitted from the target surface while the vapor plasma is deflected toward the turning direction of the deflecting and focusing magnetic force lines allows for the use of a "stream baffles" which can be installed in the plasma duct 44 across the vapor plasma flow to further enhance the filtration of macroparticles. As illustrated in an embodiment of filtered cathodic arc deposition method and apparatus of present invention shown in FIG. 8_a_, a preferred embodiment of the invention provides a vacuum chamber generally designated to house all components in a vacuum environment having a cathodic arc source with a steering coil 15 disposed upstream of a cathode chamber 90, a plasma duct 44, and a substrate holder 2 bearing substrates 4 to be coated mounted in a main chamber 10 downstream of the plasma duct 44. The cathode chamber 90 is surrounded by a focusing electromagnet 21_a_ while the plasma duct chamber 22 is surrounding by a focusing electromagnet 21_b_. Optionally, focusing electromagnet 21_b_ may be used for focusing plasma flow at the exit of the plasma duct 44.

The plasma duct 44 and cathode chamber 90 are provided with a series of wall baffles 30. The wall baffles 30 may be mounted on any walls not occupied by a plasma source 12, and are disposed along the periphery of the plasma stream. The cathodic arc plasma source includes a cathode 12 which is connected to the negative pole of the current source (not shown), while positive pole of the arc power supply is grounded making the chamber walls with the baffles 30 positive in relation to the plasma potential. This helps to attract and effectively remove the macroparticles from the vapor plasma stream since they are generally charged negative due to more than 1000 times larger mobility of the negative light particles, the electrons, comparing to the heavy positive ions in a metal vapor plasma stream. When baffles have a positive potential in relation to the metal vapor plasma it is repelling the positively charged metal ions effectively reducing the losses of metal ions and increasing the metal ion transport efficiency of the filter resulting in higher deposition rates.

FIG. 8_b_ illustrates a variation of the embodiment of filtered cathodic arc deposition method and apparatus of present invention shown in FIG. 8_a_ in which the substrate holder 2 is mounted in the main chamber 10 offset from the optical axis of the cathodic arc source, so that the substrates 4 and the cathode target 12 of the arc source are not in optical alignment. The arc source consists of the target 12 connected to the negative pole of the arc power supply 16, a steering coil 15 and focusing coil 21. A deflecting magnetic system, which forces the plasma stream toward the substrates 4, is made up of linear conductors arranged in a coil 20_a_ along the line of intersection 44_a_-44_b_ of the cathode chamber 90 and the plasma duct 44 coupled with the focusing coil 20_b_ surrounding the exit portion of the plasma duct 44.

According to the further embodiment of the invention shown in FIG. 8_b_, a series of stream baffles 41 may be disposed generally transverse to a plane parallel to the direction of plasma flow as represented by plasma stream lines 27 (and therefore also generally transverse to the magnetic force lines 25) within the plasma duct 44. In one embodiment each stream baffle 41 is formed from a thin conductive (for example metal) strip to which is applied a potential which has to be generally positive in relation to the plasma potential. The macroparticles are mostly charged negative by absorbing a larger number of negatively charged electrons, which have much greater mobility than positively charged heavy metal ions. The faces of each of the stream baffle 41 are oriented to lie between the plane which is tangential to the magnetic field lines 25 (shown in solid lines in FIG. 8_b_) and a plane which is tangential to the plasma stream lines 27 (shown in phantom lines in FIG. 8_b_).

The radius of deflection of vacuum arc plasma ions in a curvilinear magnetic field is always slightly greater than the radius of curvature of the magnetic force lines 25. The degree to which deflection of particles and ions in the plasma stream "lag" behind the curvature of the magnetic force lines 25 is dependent upon the strength of the magnetic field, and the mass and charge of the ion or particle. The radius of deflection decreases as the strength of the deflecting magnetic field increases, and increases in direct proportion to the ion mass/charge ratio of the ion or particle. Thus, in a constant magnetic field, for ions having the same charge less massive ions will follow the curvature of the magnetic force lines 25 more closely, and for ions having the same mass, those with a higher charge will follow the curvature of the magnetic force lines 25 more closely. The present invention takes advantage of this effect, by a technique termed herein "plasma optical filtering", to separate macroparticles and unwanted ions from the plasma stream 27, and even to separate isotopes.

Figure 8A:
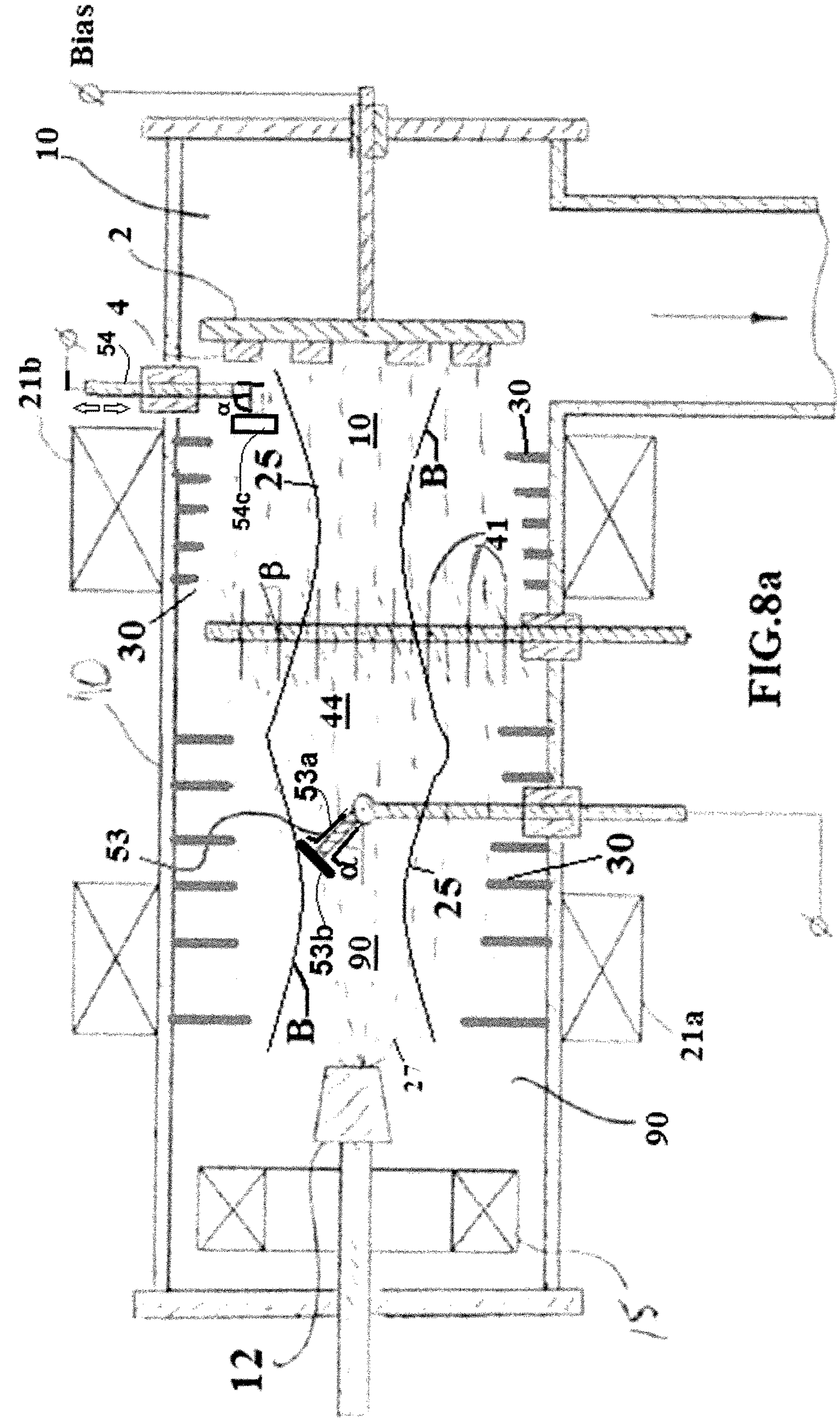
FIG. 8*a* is a schematic view of one filtered cathodic arc apparatus having a cathode and substrate holder in optical alignment, providing a Langmuir probe, a quartz microbalance mass flux probe and a set of stream baffles disposed in the plasma stream, in an embodiment.
Figure 8B:
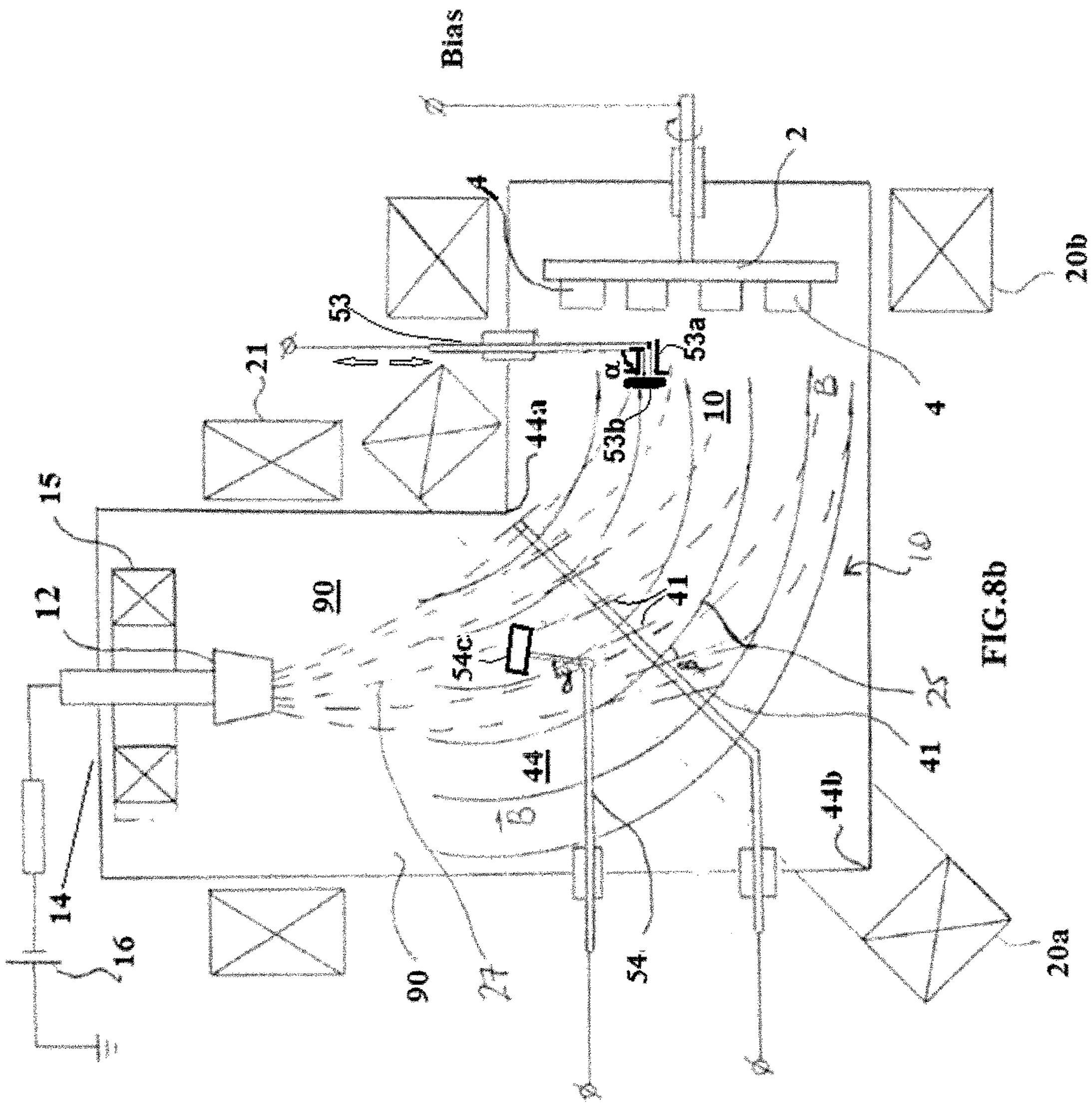
FIG. 8*b* is a schematic view of a variation of the filtered cathodic arc apparatus of FIG. 8*a* in which the substrate holder is offset from the optical axis of the cathodic arc source, in an embodiment.

In the embodiment shown in the FIG. 8*b*, with the magnetic field strength constant the degree of ion deflection at any particular point in the plasma stream is determined by the direction of the magnetic force lines 25 at that given point and the mass/charge ratio of the ion. It can be seen from the FIG. 8*b* that the radius of curvature of the magnetic force lines 25 is smallest adjacent to the inside corner 44*a* of the plasma duct 44 and steadily increases toward the outside corner 44*b* of the plasma duct 44. Thus, the radius of deflection of any particular ion will depend in part upon where it is disposed in the plasma stream 27. The stream baffles 41 are accordingly preferably individually adjustable, so that each can be rotated such that its faces lie in a plane tangential to the direction of motion of the target ions at that point in the plasma duct 44. It can thus be seen that the stream baffles 41 closest to the inside corner 10*a* are oriented more obliquely relative to the optical axis of the cathode 14*a* than the baffles 41 which are closer to the outer corner 44*b*.

The target ions pass through the spaces between the stream baffles 41, because their trajectory is such that only the thin edge of the stream baffles 41 is in the path of travel of the target ions and presents a very low probability of being struck by the target ions. Heavier and lighter ions, and those having a different charge than the target ions, have a different trajectory which follows a path obliquely into the faces of the baffles 41, and as such most are physically blocked by the baffles.

The stream baffles 41 serve the purpose of optically isolating the substrates 4 from macroparticles and neutral atoms and molecules as well as unwanted ions entrained in the plasma stream 27. The number and width of the stream baffles 41 should therefore be sufficient to optically isolate the substrates 4 from the operating surface of the arc cathode 12 for the vast majority of macroparticle trajectories in the plasma stream, as is schematically illustrated in FIGS. 8*a* and 8*b*. In FIG. 8*a* the stream baffles are disposed near the exit of the plasma duct 44 where vapor plasma streamlines converge following the focusing magnetic field lines created by the focusing coil 20*b*. In FIG. 8*b* the stream baffles 41 are disposed across the entrance to the plasma duct 44, at a point where the plasma stream 27 has just begun to deflect under the influence of the deflecting magnetic field. Stream baffles 41 can be employed in any apparatus in which a plasma is being deflected, however starting the deflection of the plasma stream at earlier stage (for example in a cathode chamber rather than in plasma duct as in the above embodiments) can enhance effectiveness of the stream baffles 41 and allow stream baffles 41 to be disposed in a cathode chamber 90 or at the intersection between the cathode chamber 90 and the plasma duct 44.

In general, the potential of the stream baffles 41 should be maintained positive in relation to the plasma potential, while the potential between the stream baffles and the cathode 12 in cathode chamber 90 may range from −150V to +150V. The baffle potential less than −150V may result in intense sputtering and contaminate the plasma flow. The baffle potential above +150V may overheat and melt the baffles. The positively charged stream baffles are better suited to attract and remove the negatively charged macroparticles from the vapor plasma stream while at the same time repelling the positively charge ions and reducing a metal vapor plasma losses effectively improving metal ion transport efficiency of the filter.

In the embodiment of FIG. 8*a*, in which the substrates 4 are in optical alignment with the cathodic arc source, the stream baffles 41 must be disposed across the plasma stream 27 as it is dispersing toward the walls of the plasma duct 44. This is an "inertial plasma filter", which relies entirely on the inertia of particles in the plasma stream 27, which in the dispersive phase (near the cathode 12) determines the trajectory of ions and other particles; macroparticles typically disperse from the cathode at an average angle of about 70° from the optical axis of the plasma stream lines 27 or 20° to the evaporating surface of cathode target 12, while a small portion of charged nano sized clusters and macroparticles can have trajectories nearly coaxial to the filtered arc metal vapor plasma flow. In contrast, the apparatus of FIG. 8*b* is an "optical plasma filter" system because the substrates 4 are offset from the optical axis of the plasma stream 27 and the plasma stream must therefore be deflected, by the deflecting magnetic coil 20*a*, toward the substrates 4.

The maximum ion current density for the target ions downstream of the stream baffles 41 is reached when the angle between the stream baffles 41 and the axis of the plasma duct 44 is approximately equal to the angle between the plasma stream 27 and axis of the plasma duct 44 at any given point of its cross-section. If the stream baffles 41 are disposed across the transverse cross-section of the plasma duct 44, as shown in FIG. 8*a*, the optimum inclination of each baffle 41 to the magnetic force lines 25 is the direction of the dispersing plasma flow.

To find the optimum orientation of the stream baffles 41 at any particular point within the arc plasma stream one need to determine the direction of the plasma flow at the given point of the plasma stream where the baffle 41 is disposed.

As shown in FIG. 8*a*, a planar disc-shaped Langmuir probe 53 can be placed at the selected point. The ion collecting Langmuir probe is charged negatively in reference to the nearby plasma potential to collect ions from the plasma stream. The probe 53 consists of the disc-electrode 53*b* which serves as ion collector. The ions from the plasma stream are collecting by the front ion collecting surface of the disc 53*b*, while the rest of the probe is shielded by insulated shield 53*a* to exclude ion collection by other sides of the probe than its front ion collecting surface 53*b*. The maximum ion saturation current will be collected when the axis of the probe 53 is parallel to the path of the arc plasma ion flow 27 or, the plane of the ion collecting disc surface 53*b* is perpendicular to the arc plasma ion flow 27. Alternatively, the mass flow collector such as quartz crystal microbalance (QCM) based probe as for example Inficon XTC/C thin film deposition controller, can be used to measure the mass flow of metal vapor ions within arc plasma ion flow 27. The QCM probe 54 is shown schematically in FIGS. 8*a* and 8*b*. In this design the probe position can be adjusted both by reciprocal movement and by rotation which allows changing the angular position of the quartz crystal in relation to the ion flow streamlines. The maximum metal ion flux will be collected by the QCM sensor when the quartz crystal plane 54*c* is oriented perpendicular to the arc plasma ion flow 27.

Orienting the stream baffle 41 to the direction generally perpendicular to the plane of the ion collecting area measuring maximum ion flux value, i.e. to minimize an angle between the plasma stream lines 27 and the faces of the baffles 41, will minimize target ion losses on the stream baffles 41, maximize the total ion current downstream of the stream baffles 41, and consequently the rate of deposition, will be at its maximum. Each stream baffle 41 may thus be provided with an adjusting means such as a knob or lever (not shown), to independently orient each stream baffle 41 tangentially relative to the plasma stream lines 27 traversing the stream baffle 41 at that point. Each stream baffle 41 can optionally also be provided with a means for the measurement the ion current collected by the baffle 41. In this case, via a feedback system the stream baffle's positioning drive will orient the baffles 41 in a way to minimize the ion current collecting by the baffle therefore minimizing the metal vapor plasma losses. Alternatively, the stream baffle orientation can be optimized by measuring the total ion current collecting by the substrate holder 2. The optimal orientation of the stream baffles 41 will be achieved when this output ion current reaches its maximum value.

It will thus be apparent that the stream baffles 41 can also be disposed across a portion of the plasma stream 27 which does not curve, in which case they are still working fairly effective for filtering macroparticles out of the plasma stream 27. Since ions in the arc plasma have (in general) trajectories that are parallel to the magnetic force lines 25 within the plasma duct 44, so long as the stream baffles 41 are oriented at a tangent to the magnetic force lines 25 a large portion of macroparticles entrained in the plasma stream 27 will be filtered out, while most ions of the selected charge will traverse the stream baffles 41 without difficulty. FIG. 8*a* illustrates an example of this embodiment, in which rough filtration of macroparticles takes place before the plasma stream 27 starts to deflect. In this case a single adjusting means can be used to adjust all baffles 41 simultaneously, since in the straight portion of the plasma stream all stream lines 27 are roughly parallel to one another. This preliminary macroparticle filtration allows a reduction both in the distance between the deflecting region of the plasma stream 27 and the substrates 4 and in the degree of curvature of the plasma duct 44, and results in an increase in productivity. Additional stream baffles 41 may be disposed across the deflecting portion of the plasma stream 27 for more precise filtration. In general a set of stream baffles 41 can be disposed across the plasma vapor stream in any place between the cathode target and the exit flange of the exit tunnel portion 46 of the plasma duct, preferably aligned along the direction of the local magnetic field lines on site of their position, in which the baffles are oriented generally tangential to magnetic field force lines at the point of each of the respective locations of the baffles.

It will also be apparent that the stream baffles 41 can be used for both element and isotope separation. Ideally the stream baffles 41 are disposed where the arc plasma stream 27 has the smallest radius of deflection in the magnetic field, where ions with different ion mass/charge ratios have significantly different trajectories. In this case if the gaps or channels formed between adjacent stream baffles 41 are parallel to the trajectory of one given kind of ion with a specific mass/charge ratio, the stream baffles 41 will be virtually transparent to the selected ions. Other ions with different mass/charge ratios will have different trajectories and will largely run into the faces of the baffles 41 and be trapped, an effect which may be called "inertial plasma-optical separation." In comparison with a conventional mass spectrometer, which separates ion flows in a single path, the inertial plasma-optical separator separates ions in a high current plasma flow, which results in much greater productivity.

Figure 8C:
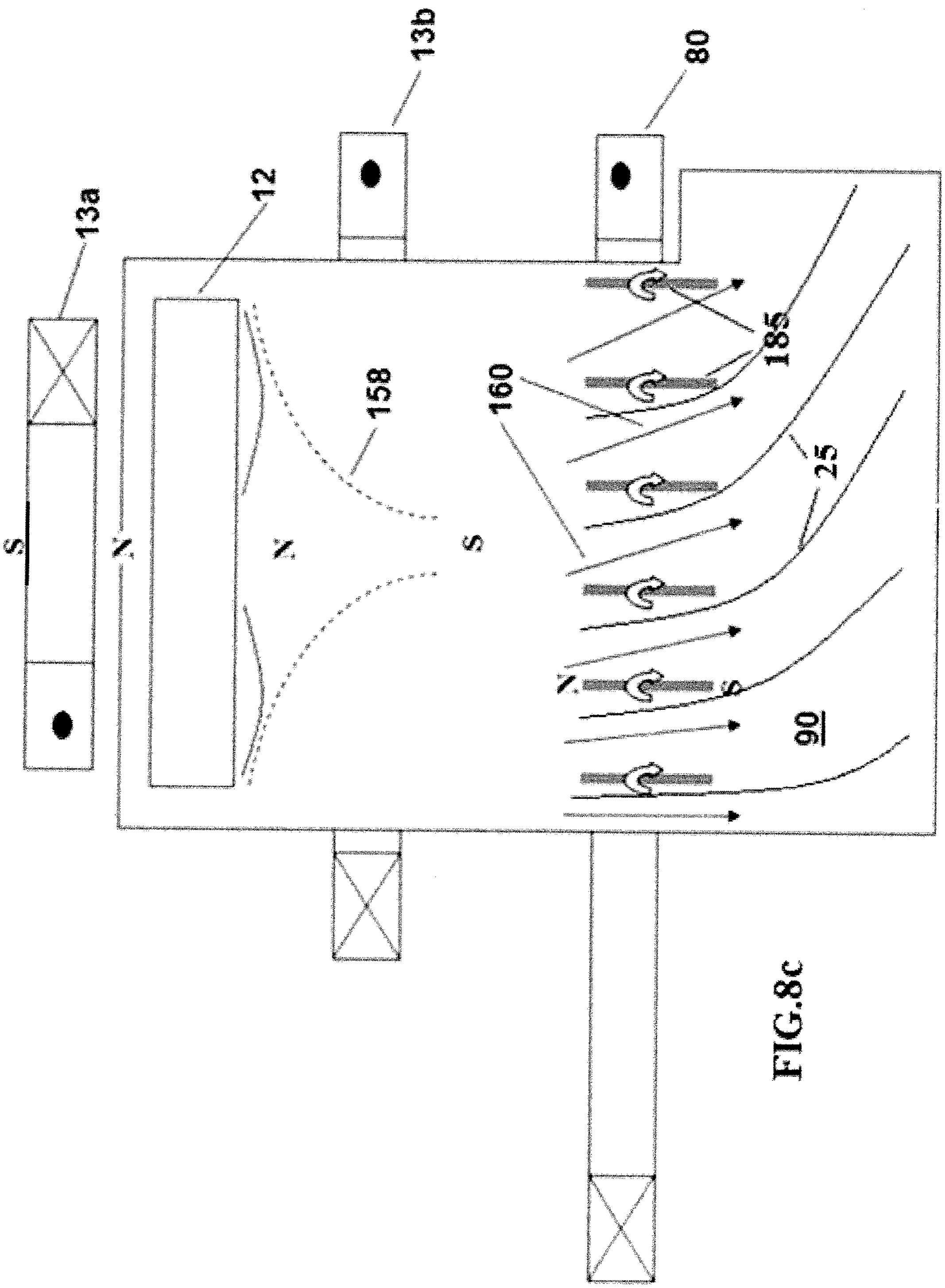
FIG. 8*c* is a schematic view of a cathode chamber of the filtered cathodic arc source shown in FIG. 3*b* utilizing a set of stream baffles installed near the entrance to the plasma duct chamber, in an embodiment.

The axes of the stream baffles 41 can be aligned either parallel or transversal to the direction of the plasma flow, but the surface of the stream baffles 41 has to be aligned as close as possible to the direction parallel (tangential) to the direction of the plasma flow at the site of location of the stream baffles 41 so that the plasma flow streamlines will not cross the surface of the stream baffles 41. The best orientation of the stream baffles is tangential to the direction of the plasma flow at the location of the stream baffles 41. The closest approximation to this ideal orientation is to align the steam baffles 41 parallel (tangential) to the external magnetic deflecting and/or focusing force lines at the location of the stream baffles 41. In this case the axes of the stream baffles can be aligned either parallel or perpendicular to the external deflecting and/or focusing magnetic force lines. The easiest way to setup the orientation of the stream baffles 41 is to align them parallel (tangential) to the direction of the magnetic force lines 25 at the location of the stream baffles 41, in which the baffles 41 are oriented generally tangential to magnetic field force lines 25 at the point of each of the respective locations of the baffles 41. If stream baffles 41 made of metal strips are parallel (tangential) to the direction of the magnetic force lines 25 and electrically isolated, they will be charged positively due to the much larger mobility of heavy ions across the magnetic force lines 25 compared to magnetized electrons. The orientation of the stream baffles 41 in a direction tangential to the magnetic force lines 25 can be achieved by individual control of the position of each stream baffle 41 by suitable mechanical means. Alternatively, the stream baffles 41 or at least a portion of them can be made of magnetic materials which will result in their orientation along the magnetic force lines 25 automatically as illustrated in FIG. 8*c*. In this embodiment of the invention stream baffles 185 are positioned at the exit of the cathode chamber 90 and made of ferro-magnetic alloy such as iron or Sm—Co which make them capable of automatically adjusting their orientation along the magnetic force lines 25 providing maximum transparency for the metal vapor plasma stream 160. The baffles made of magnetic material can be magnetized providing that the direction of the magnetic force lines between the neighbor baffles coincides with the direction of the external deflection and/or focusing magnetic field at the location of the given pair of the neighbor baffles. It is appreciated that only top and/or bottom of the baffles 41 are made of magnetic materials while the main portion of the baffles 41 can be made of stainless steel, titanium or other non-magnetic metal alloy or non-metal materials such as ceramics or glass.

Generally, the stream baffles 41 can be positioned anywhere between the cathode 12 in a cathode chamber 90 and the exit of the tunnel portion 46 of the plasma duct 44. For instance, the stream baffles 41 can be installed in front of the cathode 12 in cathode chamber 90, as illustrated in FIG. 8*a*, typically spaced from the cathode target surface at the distance of 1 cm to 10 cm where they can also serve as additional anode to improve the stability of cathodic arc spots on cathode target 12 and therefore reduce the probability of extinguishing the vacuum arc discharge. The baffles 41 installed in front of the cathode target 12 may have a positive potential in reference to the cathode 12 or be insulated and have a floating potential. When the baffles are installed too close to the cathode target 12 surface (e.g. less than 1 cm) it can result in extinguishing of the arc spots and overheating the baffles. When the baffles are installed at the distance greater than 10 cm from the cathode target 12 surface, their influence on arc spot steering and sustainability of the vacuum arc process is found to be negligible. The preferable position of the stream baffles will be in locations where the magnetic field force lines are bending. In this case the stream baffles will be declined in relation to the axes and walls of the cathode chamber 90 and/or plasma duct 44 and will trap the macroparticles, neutral particles and heavy ions more effectively. For instance the stream baffles 41 can be positioned at the entrance of the plasma duct 44 adjacent to the cathode chamber 90 and the declining portion 44*a* of the plasma duct 44. Alternatively, the stream baffles 185 can be positioned at the entrance to the tunnel portion 46 of the plasma duct 44 as shown in an embodiment of filtered cathodic arc deposition method and apparatus of present invention shown in FIG. 8*d*. In this embodiment of the invention the stream baffles 185 made of magnetic alloy are positioned across the entrance of the tunnel portion 46 of the plasma duct 44. The stream baffles 185 are aligned along the magnetic force lines 25 providing optimized conditions for metal ion transport through the series of stream baffles 185 while at the same time dramatically increasing the efficiency of removing the macroparticles from the metal vapor plasma stream. Wall baffles (not shown) may also be installed on all walls not occupied by arc sources both in cathode chamber 90 and in plasma duct chamber 44.

Figure 8D:
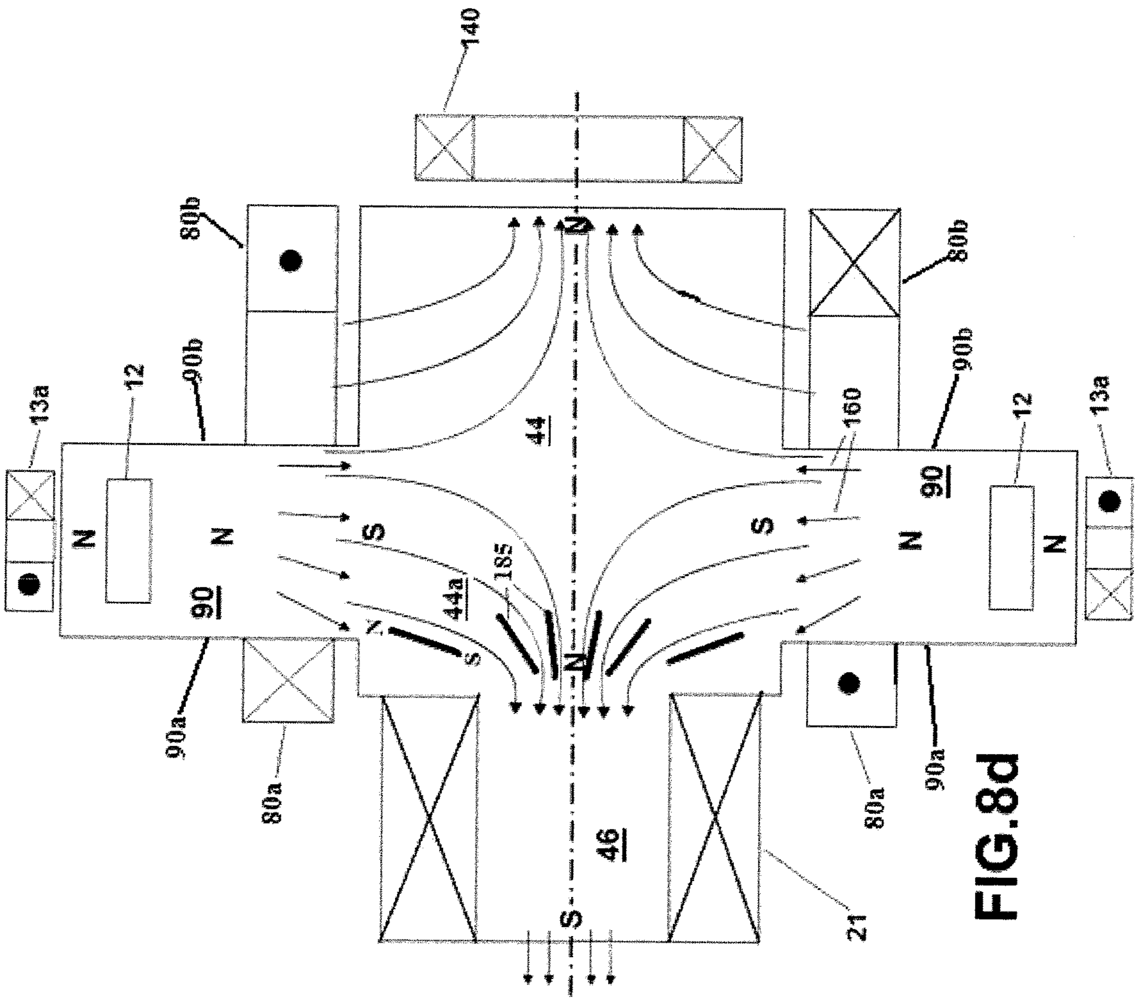
FIG. 8*d* is a schematic view of a further embodiment of the filtered multi-cathode arc source shown in FIG. 7*a* utilizing a set of stream baffles installed at the entrance into the tunnel portion of the plasma duct chamber, in an embodiment.
Figure 8E:
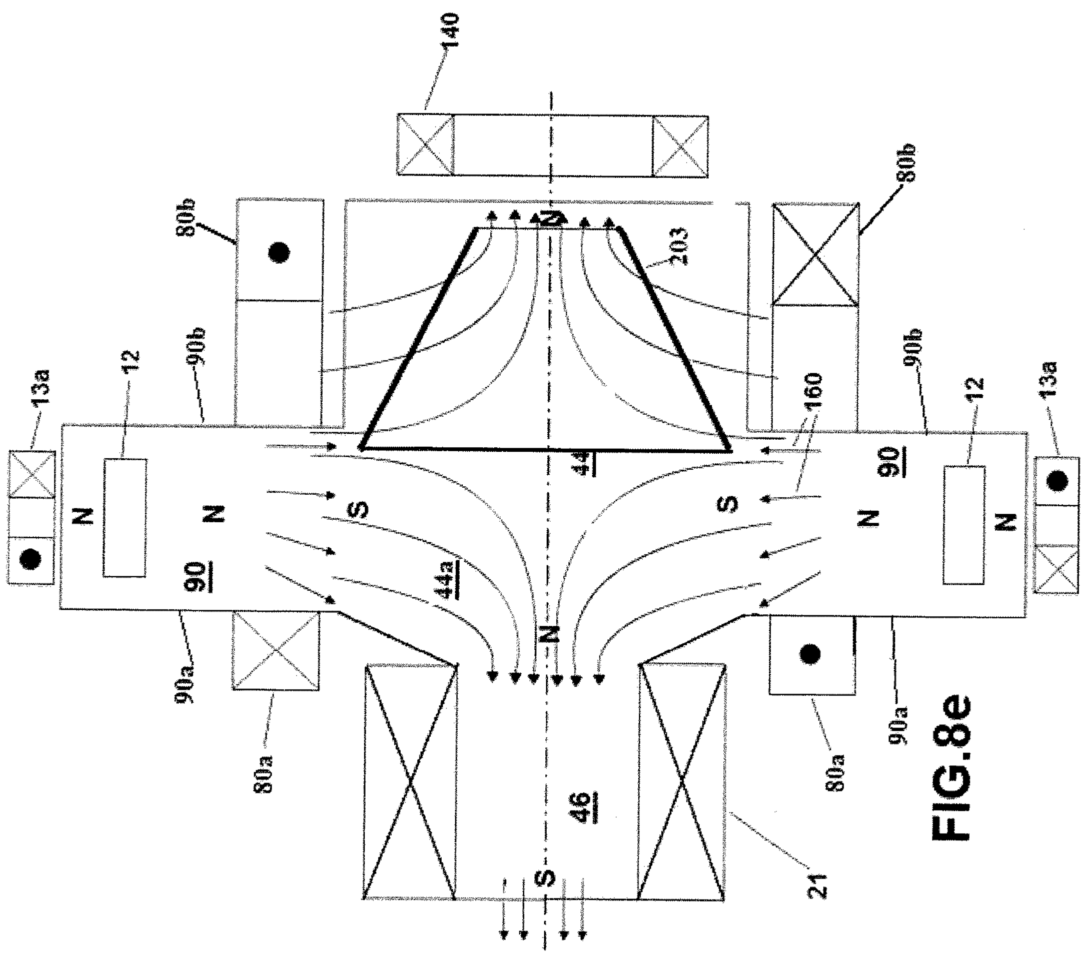
FIG. 8*e* is a schematic view of a further embodiment of the filtered multi-cathode arc source shown in FIG. 7*a* utilizing a cone macroparticle trap attached to the back wall of the deflecting portion of the plasma duct, in an embodiment.
Figure 8F:
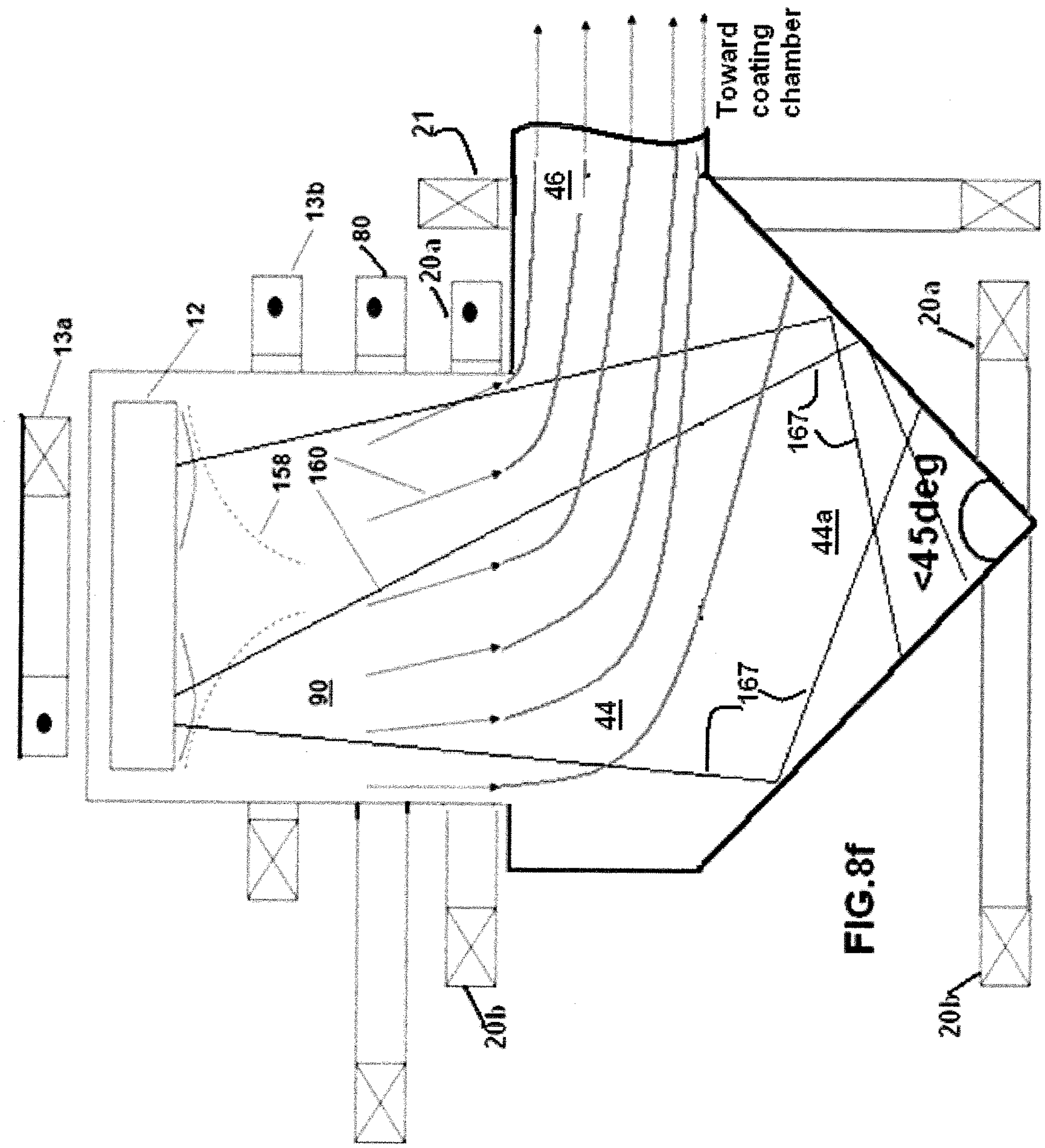
FIG. 8*f* is a schematic view of a further embodiment of the unidirectional filtered cathodic arc source shown in FIG. 8*e* utilizing a cone macroparticle trap attached to the wall of the deflecting portion of the plasma duct opposite to the cathode chamber, in an embodiment.

Additionally, a cone macroparticle trap 203 can be installed at the back side of the plasma duct 44 as illustrated in an embodiment of filtered cathodic arc deposition method and apparatus of present invention shown in FIG. 8*e*. In the case of a circular plasma duct 44 this conical trap 203 can be made as a cone with cone angle preferably less than 45° which will allow effective trapping of any macroparticles that can impact the internal surface of the trap 203. In the case of a rectangular plasma duct 44 a back trap can be formed from two metal sheets declined to each other creating an opening as a planar angle of preferably less than 45° as illustrated in FIG. 8*f*. In this case the metal vapor plasma will be transported through the deflecting portion 44 of the plasma duct by a pair of offset declining coil 80 and (optionally) a pair of declining coils 20 followed by focusing at the exit tunnel portion 46 of the plasma duct 44 by the focusing coil 21, while the macroparticles will be effectively trapped inside of the flat angle trapping portion 44*a* of the plasma duct 44.

Figure 8G:
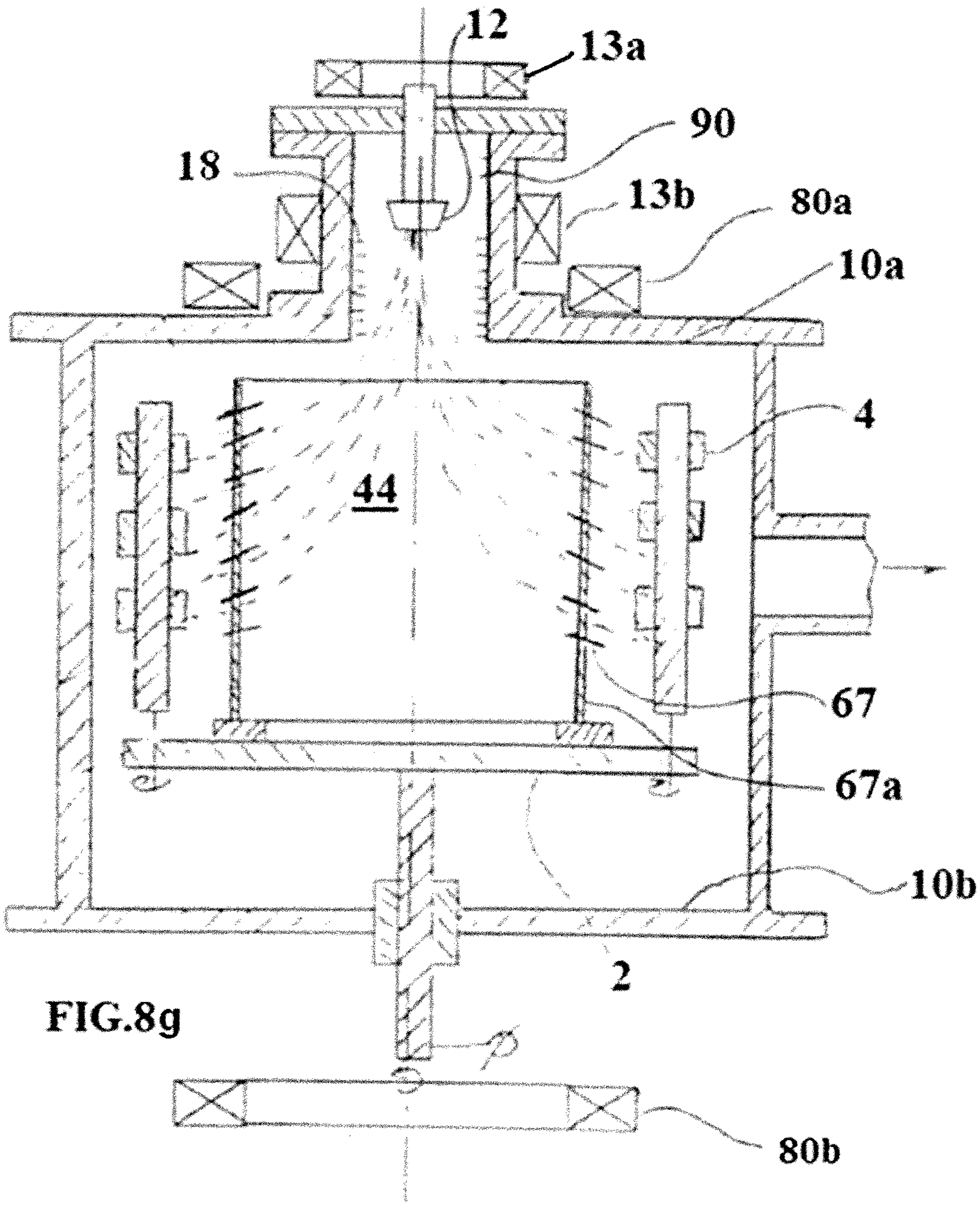
FIG. 8*g* is a cross-sectional plan view of a further embodiment of the apparatus of FIG. 8*a* utilizing a stream baffles with a main chamber acting as a plasma duct, in an embodiment.
Figure 8H:
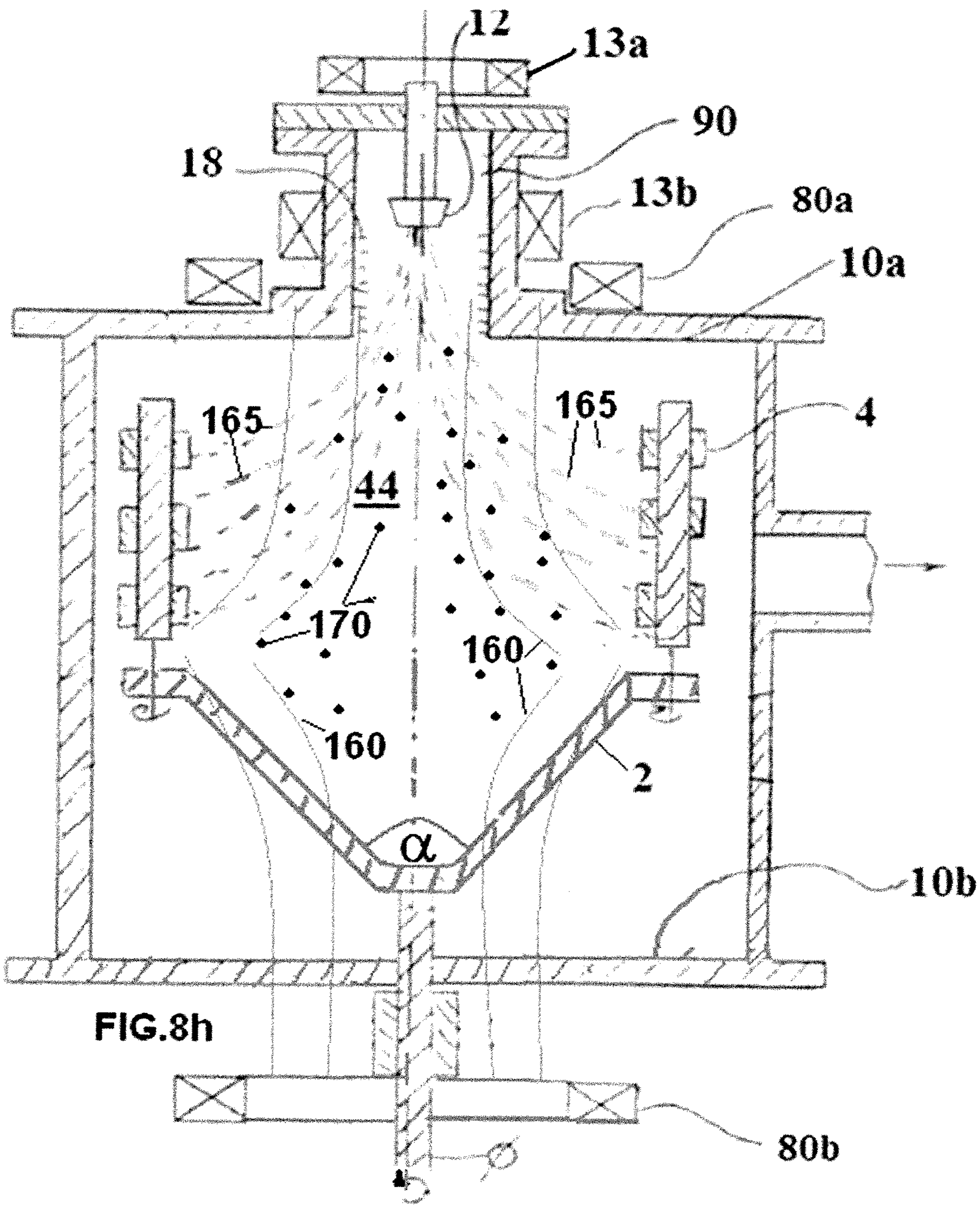
FIG. 8*h* is a cross-sectional plan view of a further embodiment of the apparatus of FIG. 8*g* utilizing a cone macroparticle trap opposite to the cathode chamber, in an embodiment.

In a further variation of this embodiment, illustrated in FIG. 8*g*, the plasma stream radiates outwardly from the center and contacts all substrates 4 simultaneously. In this case a pair of coaxial deflecting coils 80 surrounds the main chamber 10. One coil 80*b* is positioned underneath the bottom flange 10*b* of the main chamber 10 and other 80*a* above the carousel substrate turntable 2. The cathode chamber 90 is connected to the top flange 10*a* of the main chamber 10. The cathode chamber 90 has a cathode assembly 12 with steering and focusing coils 13 and preferably wall baffles 18. The plasma duct 44 is effectively created by the substrates 4, the substrate turntable 2 and the wall 10*a* of the main chamber 10 adjacent to the plasma source. Stream baffles 67 may be installed on baffle holders 67*a* in front of the substrates 4, which makes this filtered cathodic arc source fully integrated into the main chamber 10 layout. Alternatively, the conical macroparticle trap with cone angle preferably less than 45°, integrated within the substrate holding platform 2, can be installed opposite to the cathode target 12 as illustrated in FIG. 8*h*.

Figure 10A:
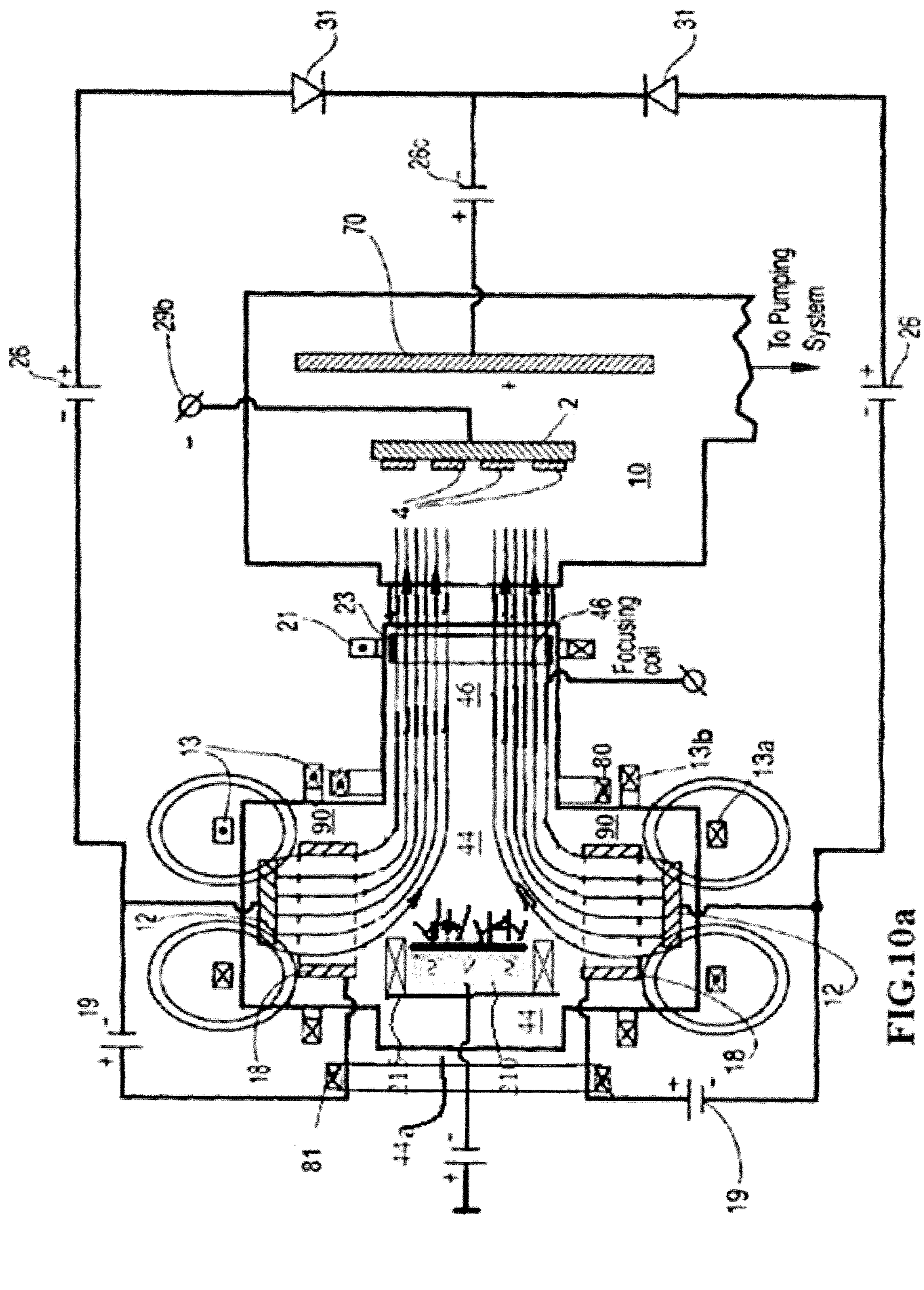
FIGS. 10*a*, 10*b* and 10*c* are schematic plan view embodiments of filtered cathodic arc deposition apparatus providing a hybrid layout of the filtered cathodic arc source shown FIG. 4*b* in combination with the magnetron sputtering source installed in the plasma duct chamber.

The embodiments of the filtered cathodic arc coating deposition method and apparatus of present invention provide a hybrid layout of the filtered cathodic arc source coupled with magnetron sputtering sources or gaseous plasma sources to increase mass flow rate and ionization of the metal-gaseous vapor plasma are shown schematically in FIGS. 10*a, b, c, d* and *e*. FIG. 10*a* illustrates an apparatus embodying a preferred embodiment of the invention utilizing a filtered cathodic arc source containing two primary cathodic arc sources with cathode targets 12 disposed in two opposite cathode chambers 90 in communication with a plasma duct 44 and having a magnetron sputtering source 210 disposed (generally symmetrical in relation to the plane of symmetry of the rectangular plasma duct 44 or coaxial to the tubular plasma duct 44), magnetically coupled with filtered cathodic arc source. The magnetron 210 is installed in the plasma duct 44 along the plane of symmetry of the plasma duct 44. An optional coil 215 creates a magnetic field which overlaps the magnetron magnetic field in front of the magnetron target and has the same direction both as magnetron magnetic field in front of the magnetron target and the deflecting magnetic field produced by offset deflecting coils 80 and 81. The earlier deflection of the magnetic force line by offset deflection coils 80 and 81 allows the cathodic arc vapor plasma stream to flow past the magnetron without substantial losses on surface of the magnetron. This advantageous feature of the present invention is also allows the magnetron to be positioned further from the back wall 44*a* of the plasma duct 44 and closer to the entrance into the exit tunnel portion 46 of the plasma duct 44, which effectively increases the deposition rate of the magnetron sputtering source while providing a concurrent filtered cathodic arc-magnetron hybrid deposition process. The magnetron 215 can be optionally provided with mechanical shutter (as shown in FIG. 4*f*) which can be used to protect the magnetron target for poisoning by coatings deposited from the filtered cathodic arc vapor plasma flow coming from the adjacent cathode chambers 90 when the cathode targets 12 and sputtering target of the magnetron 215 are made of different materials. Alternatively the exit openings of the cathode chambers 90 can be also provided with mechanical shutters similar to that shown in FIG. 4*f*. In this case the cathode chamber mechanical shutters should be impermeable for heavy particles such as ions and neutral particles, but they should have openings, which allow electrons freely passing throughout the shutters toward plasma duct 44 and continue its way further toward distal anode 70 installed within the substrate chamber 10. In this case the primary cathodic arc discharge will be extended from the cathode chamber 90 toward substrate chamber 10 by the power supply 26 in which the negative pole is connected to the cathode target 12 in cathode chamber 90 and the positive pole is connected to the distal anode 70 in the substrate chamber 10. This unidirectional hybrid filtered cathodic arc-magnetron vapor plasma source merges filtered cathodic arc plasma generated by the primary cathodic arc sources 12 of the filtered cathodic arc plasma source with a sputtering flow generated by the magnetron source 215 into one integrated vapor plasma stream having controlled concentration of metal ions directed toward the substrates 4 to be coated in the substrate chamber 10.

The cathodic arc targets 12 and magnetron target 210 can be made of the same material or different materials. In this design the magnetron can be a conventional DC, DC pulse or RF magnetron or a high pulse powered magnetron. This design allows for the simultaneous operation of all evaporation sources, providing a high sputtering rate of the planar magnetron source 215 concurrent with 100% ionized metal vapor flows coming from the cathode chamber 90 and overlapping the magnetron sputtering flow.

Figure 10B:
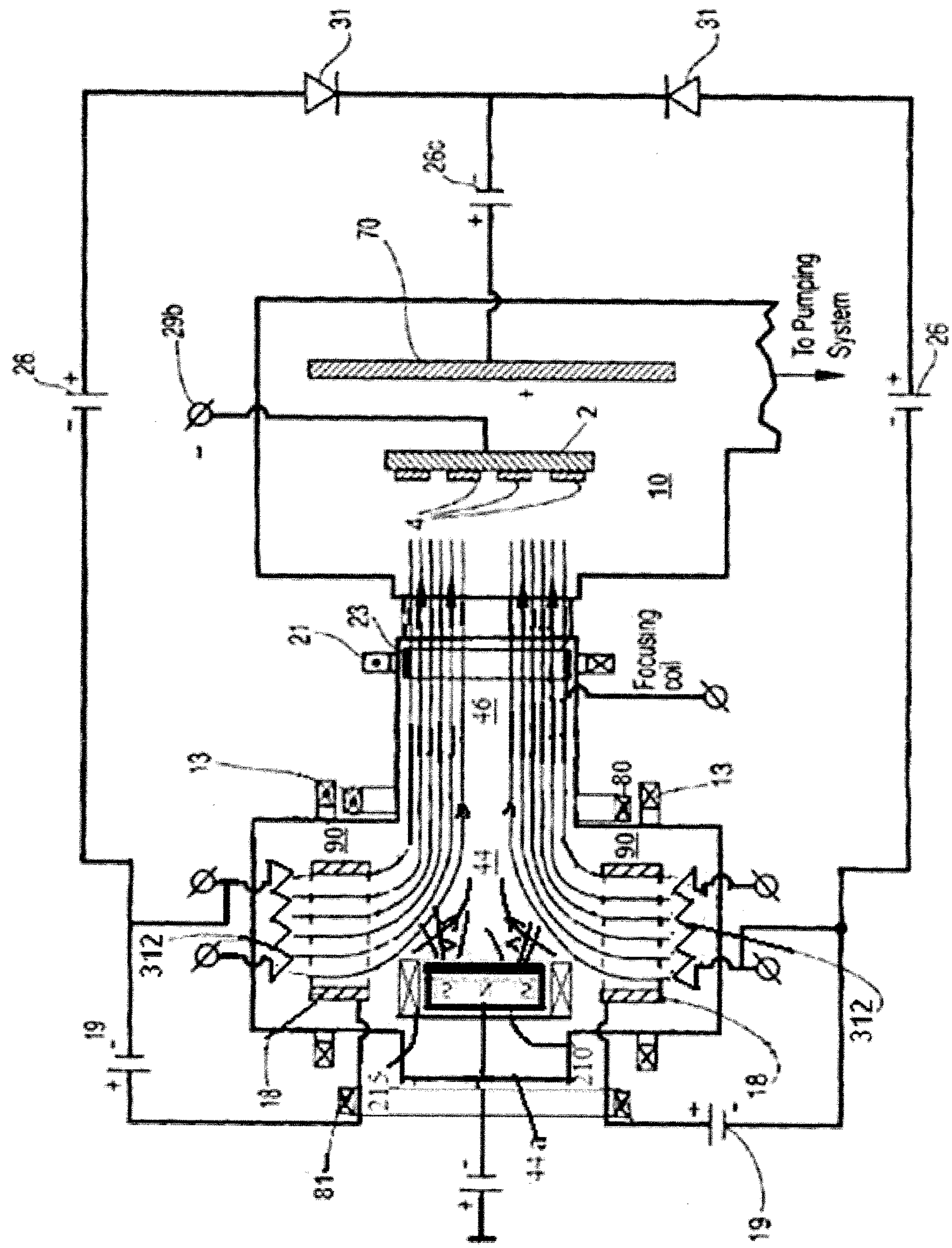

In the further variation of this embodiment illustrated schematically in FIG. 10*b*, the thermionic arc sources with thermionic filaments 312 and thermionic heating power supply (not shown) are be installed in a cathode chambers 90 instead of cathodic arc evaporators based on vacuum arc discharge. The thermionic filament 312 may be biased to the negative potential ranging from −10 volts to −25,000 volts by power supply 19. The filament bias less than −10V does not emit electrons with high enough energy for excitation and ionization of the plasma environment whilst filament bias exceeding −25,000 V may result in damage of filaments by intense sputtering and breakdowns. This primary plasma discharge may be extended from the cathode chamber 90 toward substrate chamber 10 by the power supply 26 in which the negative pole is connected to the filaments 312 and the positive pole is connected to the distal anode 70 in the substrate chamber 10. In this case, a powerful flow of energetic electrons will be generated toward the magnetron sputtering plasma discharge area, crossing the sputtering metal atomic flow generated by the magnetron. It will allow increasing the ionization rate of the metal sputtering flow generated by magnetron source by orders of magnitude due to ionizing collisions between electrons generated by thermionic filaments 312 and metal atoms sputtered by the magnetron 210. Alternatively, the hollow cathode or plasma cathode can be used in cathode chamber 90 instead of thermionic filament cathode. In this case the plasma generating high voltage glow discharge or low pressure gaseous arc discharge is established between the cathode in the cathode chamber 90 and the anode positioned downstream the cathode near the exit opening of the cathode chamber 90. The electrons may be extracted from this discharge and accelerated by additional positive electrodes. The resulting high energy electron beam may be directed toward magnetron plasma discharge area resulting in increase of ionization of the magnetron sputtering atoms. For instance an anode grid 18 can be installed between the thermionic cathode and the exit of the cathode chamber 90. The high positive voltage ranging from 50 volts to 10,000 volts can be applied to the anode grid for forming and focusing a powerful electron beam directed toward the magnetron sputtering plasma area. The anode grid bias less than +50V does not generate electron beam with high enough energy for excitation and ionization of the magnetron sputtering plasma environment whilst anode bias exceeding +10,000 V may result in damage of anode or insulators by overheating and breakdowns. Optional focusing electrodes (not shown) can be installed in downstream to the cathode in a cathode chamber 90 to further increase the density of electron beams emitted toward magnetron discharge plasma area. Increase of the ionization rate of the metal sputtering atoms results in densification and improvement of structure and morphology of deposited coatings. At the same time by keeping the thermionic cathode filaments 312 within the cathode chambers 90 allows avoiding contamination of the magnetron target and the coating by metal atoms evaporated from the thermionic filaments. The exit openings of the cathode chambers 90 can be also provided with mechanical shutters (not shown) having the openings, which prevent the heavy particles such as ions and neutral particles from penetrating into the plasma duct, while at the same time allow electrons freely passing throughout the shutters toward the plasma duct 44 and continue its way further toward distal anode 70 installed within the substrate chamber 10.

Figure 10C:
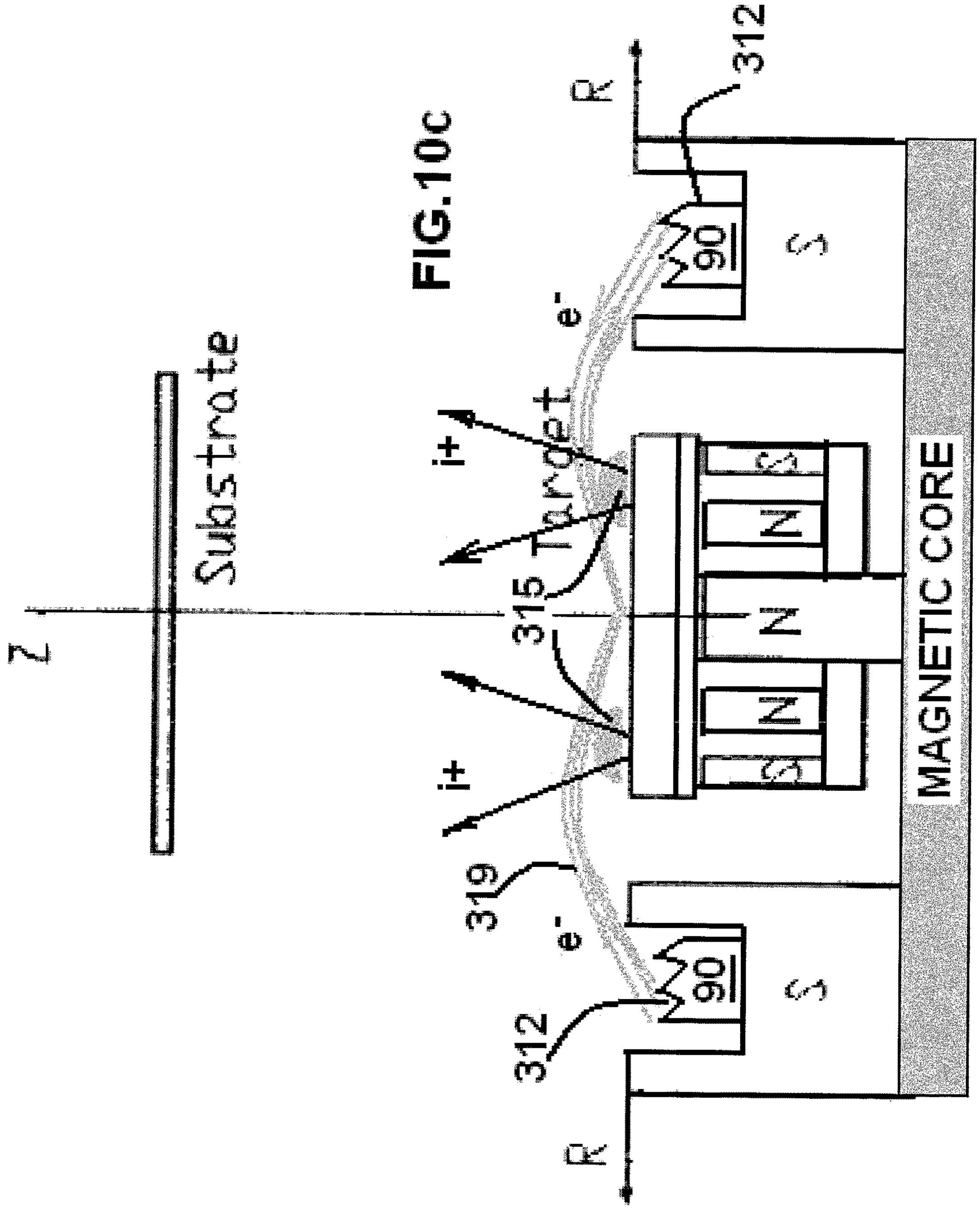

FIG. 10*c* illustrates a variation of the embodiment shown in FIG. 10*b* in which the thermionic arc filaments 312 are positioned within the cathode chambers 90 which are installed on the common magnetic core with the magnetron target. The electrons emitted by thermionic filaments 312 are propagating along the magnetic field lines 319 toward the center of the magnetron target overlapping the magnetron plasma discharge 315. The energy of the electron beams as determined by the negative bias voltage applied to the thermionic filaments in reference to the ground and/or to the distal anode 70 in the substrate chamber 10 ranges from −10 volts to −25000 volts. The filament bias less than −10V does not emit electrons with high enough energy for excitation and ionization of the plasma environment whilst filament bias exceeding −25,000 V may result in damage of filaments by intense sputtering and breakdowns. In this embodiment the thermionic filaments can be also replaced with an array of hollow cathodes.

Figure 10D:
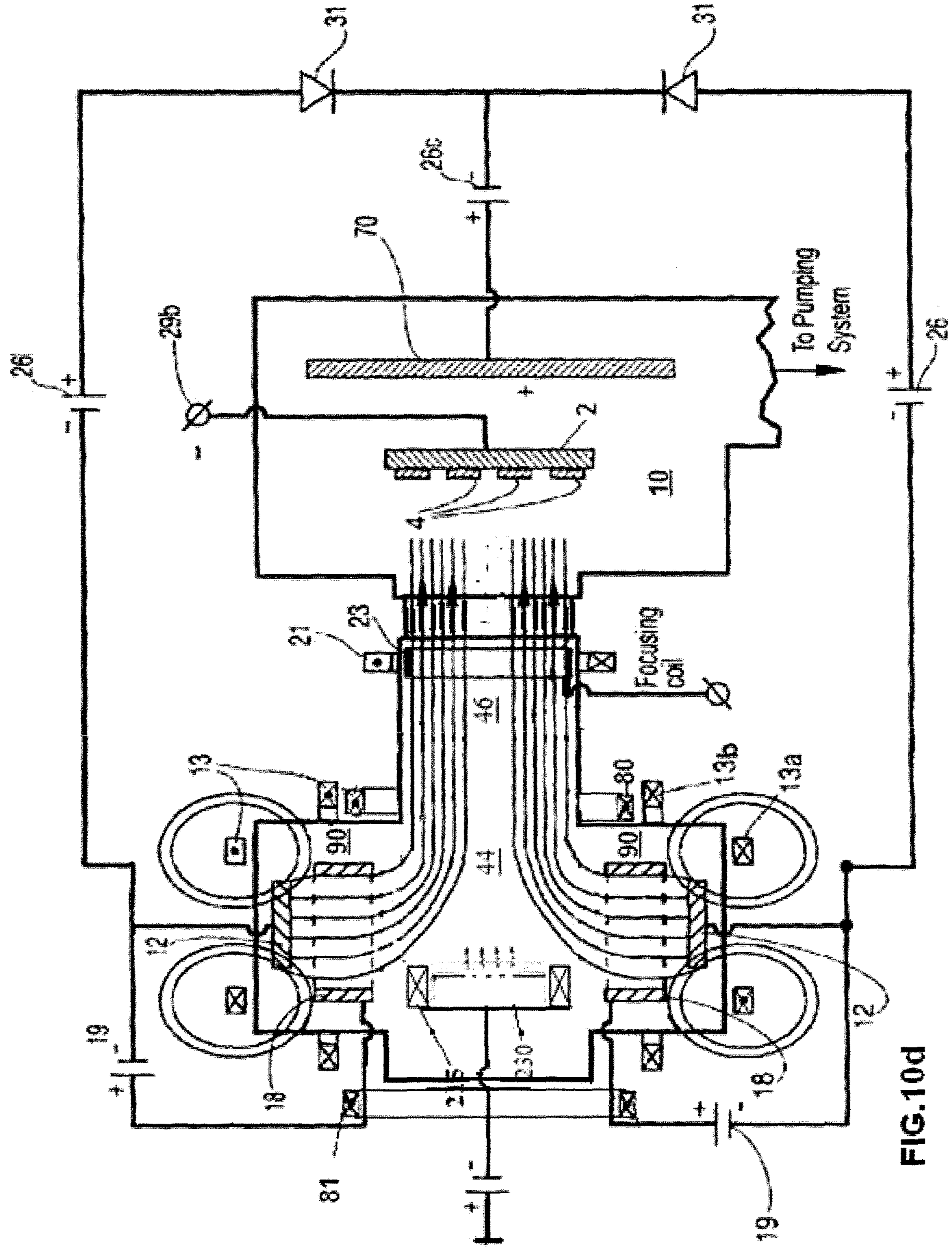
FIG. 10*d* is schematic plan view of one filtered cathodic arc deposition apparatus providing a hybrid layout of the filtered cathodic arc source shown FIG. 4*b* utilizing an ion source installed in the plasma duct chamber, in an embodiment.

The magnetron sputtering source 210 may be replaced with an ion beam source 230, either with an accelerating grid or griddles as illustrated in FIG. 10*d*. The ion beam source 230 is also disposed generally symmetrical in relation to the plane of symmetry of the rectangular plasma duct 44 or coaxial to the tubular plasma duct 44. In this embodiment of the invention the optional magnetic coil 215 can be installed surrounding the ion beam source 230 providing additional isolating magnetic field around the side surface and the front face of the ion beam source in the same direction as the deflecting field produced by the offset deflecting coils 80 and 81. This embodiment of the invention is capable of performing an ion beam-assisted filtered cathodic arc deposition process enable to deposit coatings with ultra-fine structure and superior functional properties such as TiSiNC nanocomposite coating. Alternatively, the shielded vacuum arc cathode source can be used as a source of ionizing electron current instead of ion beam source. In this variation the cathode chamber 90 has a shield similar to one shown in FIG. 4*f*, positioned in front of the cathode target 12*a*, which is impermeable for the heavy particles such as ions and neutral particles, but has an openings, which permit electrons to flow along the plasma duct 44 toward the distal anode 70 in the substrate chamber 10, when a secondary arc power supply (not shown) is turned on and a secondary arc is established between the cathode 12*a* in a shielded cathode chamber and the distal anode 70. The shielded cathode chamber 90 can also serve as a primary anode to sustain a primary arc discharge in a shielded cathode chamber 90.

Figure 10E:
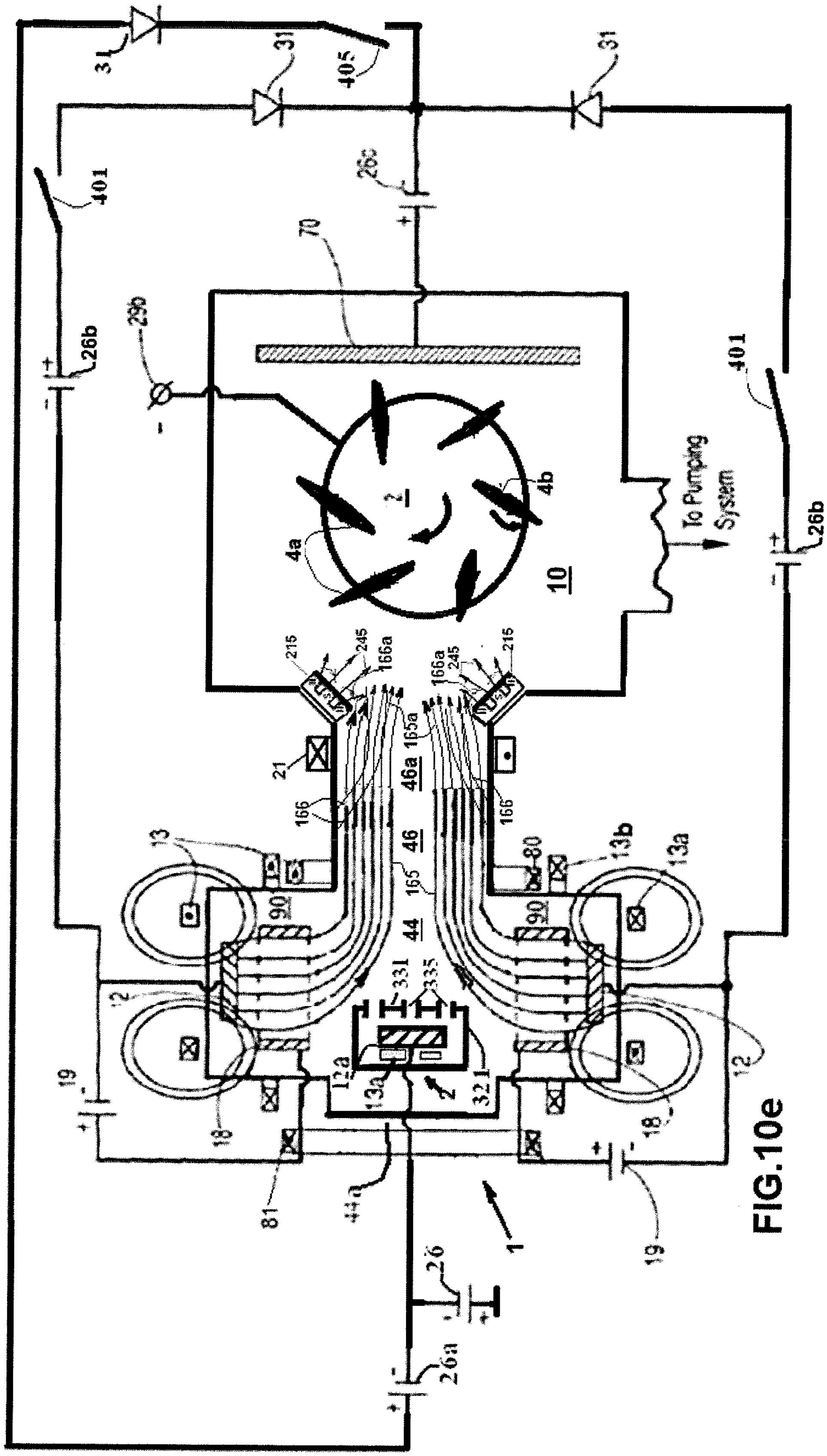
FIG. 10*e* is a variation of a hybrid of the filtered cathodic arc source shown in FIG. 10*d* utilizing a shielded cathodic arc source installed near the back wall of the plasma duct and two magnetron sputtering sources installed at the exit of the plasma duct magnetically coupled to the filtered-arc source, in an embodiment.

FIG. 10*e* illustrates a further preferred variation of a hybrid filtered cathodic arc-magnetron source 1, utilizing a shielded cathodic arc source disposed generally symmetrical in relation to the plane of symmetry of the rectangular plasma duct 44 or coaxial to the tubular plasma duct 44, near the back wall 44*a* of the plasma duct 44 and two magnetron sputtering sources 215 magnetically coupled with the dual filtered cathodic arc source 1. The design of this variation incorporates the advanced coating and surface treatment system described in D. G. Bhat, V. I. Gorokhovsky, R. Bhattacharya, R. Shivpuri, K. Kulkarni, "Development of a Coating for Wear and Cracking Prevention in Die-Casting Dies by the Filtered Cathodic Arc Process," in Transactions of the North American Die Casting Association, 20th International Die Casting Congress and Exposition, Cleveland, Ohio, November 1999, pp. 391-399, the entire disclosures of which are hereby incorporated by reference. The shielded cathodic arc source 2 consists of the cathode chamber 321 which can also serve as a primary anode to sustain the primary arc discharge between the cathode 12*a* and the cathode chamber 321 as a primary anode. It is appreciated that the primary anode can be installed within the cathode chamber 321 isolated from the cathode chamber 321. The primary anode can be grounded or connected to the positive pole of the primary arc power supply (not shown). The shield 331 has to be installed in front of the cathode 12*a* to isolate the cathode from the plasma duct 44. The shield 331 in front of the cathode 12*a* should be impermeable for heavy particles such as ions and neutral particles, but it should have openings 335, which permit electrons to flow into the plasma duct 44 and continue its way further toward distal anode 70 installed within the substrate chamber 10. The power supplies 26*a* and 26*c* are installed (in series) between the distal anode 70 in a substrate chamber 10 and the cathode 12*a* in the shielded cathode chamber 321 to establish a secondary arc discharge between the cathode 12*a* of the shielded cathodic arc source 2 disposed inside of the plasma duct 44 of the hybrid filtered cathodic arc-magnetron source 1 and the distal anode 70. Alternatively the shielded cathodic arc source 2 can be positioned elsewhere in the coating chamber 10 and distal anode 70 can be positioned within the plasma duct 44 of the hybrid filtered cathodic arc-magnetron source 1. In this case the secondary arc discharge can be established between the cathode 12*a* of the shielded cathodic arc source 2 disposed in the coating chamber 10 and the distal anode 70 positioned within the plasma duct 44 of the hybrid filtered cathodic arc-magnetron source 1, preferably adjacent to the back wall of the plasma duct 44. The secondary arc discharge improves ionization in the substrate chamber and is particularly useful for ion cleaning and plasma conditioning of the substrates prior to coating deposition process, for ion implantation, ionitriding and low pressure CVD coating deposition processes. The secondary arc discharge can be also used to improve ionization of the magnetron sputtering plasma when magnetron sputtering sources 215, magnetically coupled with filtered cathodic arc source 1, are installed adjacent to the plasma duct 44 and the substrate chamber 10. In the variation of the invention illustrated in FIG. 10*e* the magnetron sources 215, magnetically coupled with filtered cathodic arc source, are positioned at the exit 46*a* of the tunnel portion 46 of the plasma duct 44 adjacent to the substrate chamber 10 and to the tunnel portion 46 of the plasma duct 44. The sputtering cathode targets of the magnetrons 215 are facing the substrates to be coated 4 such that the metal sputtering flow 245 generated by the magnetrons 215 is directed toward the substrates to be coated 4 in the substrate chamber 10. The focusing magnetic field force lines 166 generated by the focusing coil 21 at the exit 46*a* of the tunnel section 46 of the plasma duct 44 overlap a portion of the magnetron magnetic field 166*a* adjacent to the focusing coil 21 and directions of these force lines coincide. At the same time, the vapor plasma flow 165 generated by the cathodes 12 of the filtered cathodic arc source overlap the sputtering metal atomic flow 245 thereby providing a controlled ionization of the sputtering metal flow. The ionization rate of the metal sputtering atoms in the conventional DC magnetron sputtering flow is very low, generally below 0.1% of the sputtering atoms. The mixed filtered cathodic arc plasma/magnetron sputtering flow generated by the hybrid magnetron-filtered cathodic arc source shown in FIG. 10*e* overcomes this drawback of the conventional magnetron sputtering by providing a controllable ionization rate ranging from 1% to 100%. This can be accomplished either by balancing the ion current output of the filtered cathodic arc source by changing the cathodic arc currents or by operating the deflecting system of the filtered cathodic arc source in a pulse mode with duty cycle ranging from 1% to 100%. At the same time the power applied to the magnetron source can be varied to control the output of the mostly neutral sputtering atoms flow. The same goal of controlling the magnetron sputtering rate can be achieved by optionally using mechanical shutters (not shown) to periodically close off the sputtering targets of the magnetrons 215. The target's mechanical shutters can be also used to protect the magnetron target from the coatings deposited from the filtered cathodic arc vapor plasma flow 165 when the cathodes 12 in the cathode chamber 90 and targets of the magnetron sources 215 are made of different materials. The ionized metal vapor flow is known to be beneficial for the coating quality by increasing the density of the coatings, adhesion of the coatings to the substrates, reducing the roughness of the coatings and reducing the density of the coating defects via intense ion bombardment of the substrate surface during coating deposition process. The unidirectional hybrid magnetron-filtered cathodic arc source of FIG. 10*e* is also provided with switches 401 and 405 in the electrical circuit connecting cathodes 12 in a cathode chamber 90 to the distal anode 70 or connecting the cathode 12*a* in the cathode chamber 321 to the distal anode 70. When switches 401 are closed and switch 405 is open the secondary arc discharge can be established between the cathodes 12 in the cathode chambers 90 and the distal anode 70. When switches 401 are open and switch 405 is closed the secondary arc discharge can be established between the cathode 12*a* in cathode chamber 321 and the distal anode 70.

Figure 11:
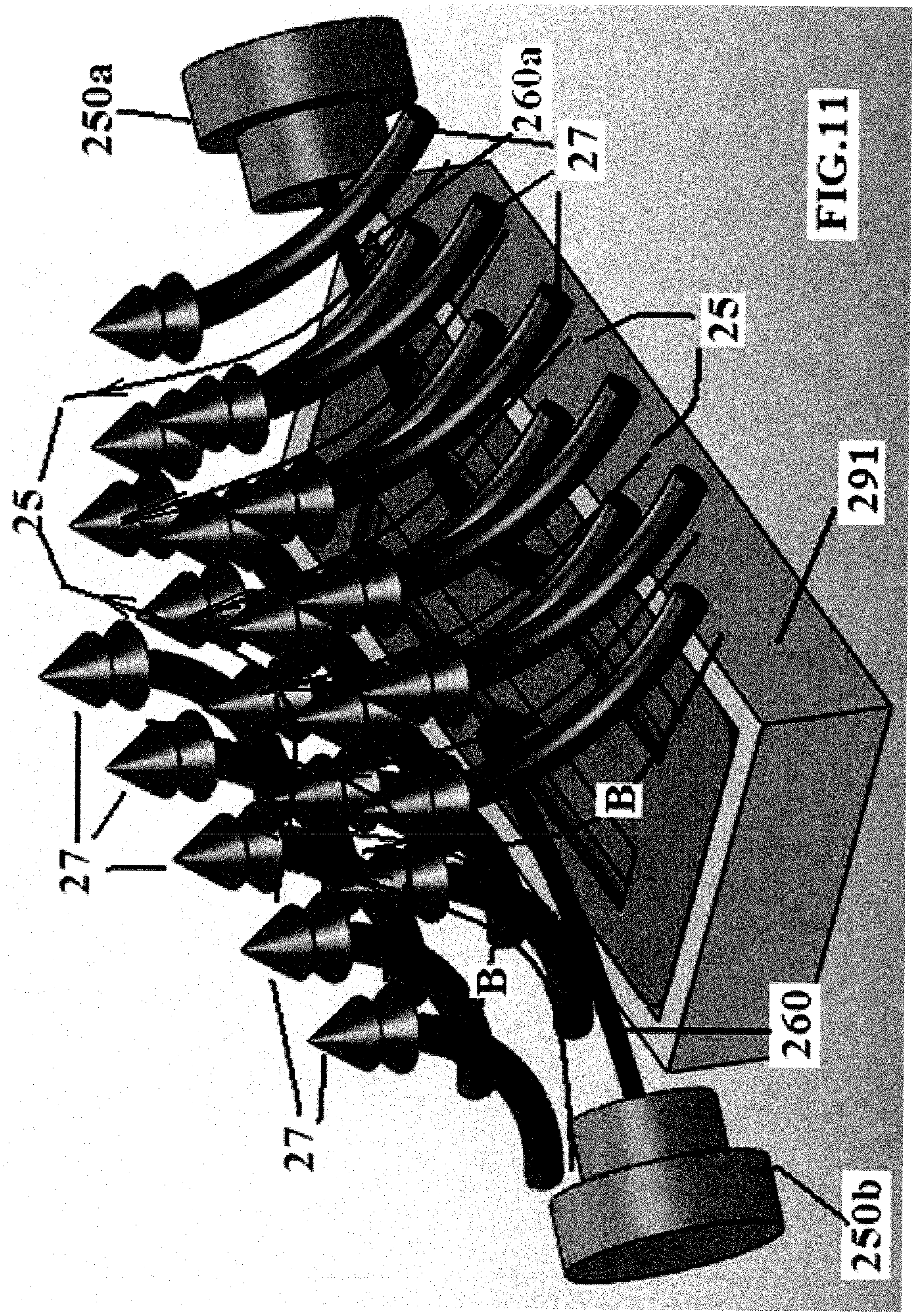
FIG. 11 is a schematic illustration of a hybrid dual filtered cathodic arc source utilizing an electron beam evaporator with two electron beam guns installed adjacent to the cathode chambers, in an embodiment.

The embodiment of filtered cathodic arc deposition method and apparatus of present invention shown in FIG. 11 illustrates a hybrid filtered cathodic arc-EBPVD source, utilizing the EBPVD evaporator integrated in the plasma duct of the unidirectional dual filtered cathodic arc source, providing a concurrent filtered cathodic arc assisted electron beam evaporation capability which combines the high evaporation rate of an EB-PVD process with the high ionization rate of filtered cathodic arc plasma. In this design the crucible 291 with evaporate is installed in the plasma duct on the side of the converging magnetic cusp directed toward the main chamber 10 with substrates to be coated (not shown). Two arc plasma streams 27 generated by primary cathodic arc sources (not shown) flow from the opposite direction forming a converging streamline following the deflecting magnetic force lines 25. Two electron beam guns 250 and 250*a* are installed on flanges of the plasma duct chamber adjacent to the cathode chambers (not shown). The electron beam guns 250 and 250*a* generate two electron beams 260 and 260*a* which enter the plasma duct area from opposite directions, crossing the deflecting magnetic field lines 25 and arc plasma streamlines 27. Under the influence of deflecting field magnetic force lines 25 the electron beams 260 and 260*a* shift toward the center of the plasma duct and at the same time toward back side of the plasma duct opposite to the main chamber, which ultimately move the electron beams 260 and 260*a* toward the surface of evaporate in the crucible 291. The crucible 291 can be connected to the positive pole of the arc power supply while the negative pole is connected to one or more primary arc cathodes installed in a cathode chambers. This effectively makes the crucible 291 serve as a second distant anode coupled with one or more primary arc cathodes. In this case a dense metal vapor plasma will be generated in the plasma duct by hot evaporated anode (HEA) having distributed diffused anode spot created on the surface of evaporate by e-beam heating combined with intense ionization as described in [R. L. Boxman, D. M. Sanders, and P. J. Martin, "Handbook of Vacuum Arc Science and Technology", Park Ridge, N.J.: Noyes Publications, 1995], which is incorporated herein by reference. The HEA plasma adds to ionization and activation ability of the filtered cathodic arc plasma stream.

Alternatively, the crucible 291 can be connected to the negative pole of additional arc power supply (not shown), while the positive pole can be grounded, which will make it serving as a cathode with distributed diffused cathode spots created in the area heated by electron beams 260. In this case a dense and strongly ionized metal vapor plasma will be generated in the plasma duct by hot evaporated cathode discharge (HEC), creating distributed diffused cathode spots on the surface of evaporate by e-beam heating combined with intense ionization, adding to ionization and activation ability of the filtered cathodic arc plasma stream as described in [R. L. Boxman, D. M. Sanders, and P. J. Martin, "Handbook of Vacuum Arc Science and Technology", Park Ridge, N.J.: Noyes Publications, 1995], which is incorporated herein by reference.

It will be appreciated that any type of PVD vapor plasma sources can be installed in a deflection area of the plasma duct 44 including, but not limited to, cathodic arc evaporator, magnetron sputtering sources, electron beam evaporator and thermal evaporator sources magnetically and/or electrically coupled with filtered cathodic arc source. This arrangement is useful for hybrid coating deposition processes comprising different types of vapor plasma sources installed in a deflection area of the plasma duct 44 facing the substrate holder 2 and generating the metal vapor plasma along the plasma duct in combination with filtered cathodic arc sources installed in a cathode chamber 90 off of the optical axis of the substrate holder 2, and generating the 100% ionized filtered cathodic arc vapor plasma stream concurrent with direct vapor generated by vapor sources installed in the deflection area of the plasma duct 44.

Figure 12A:
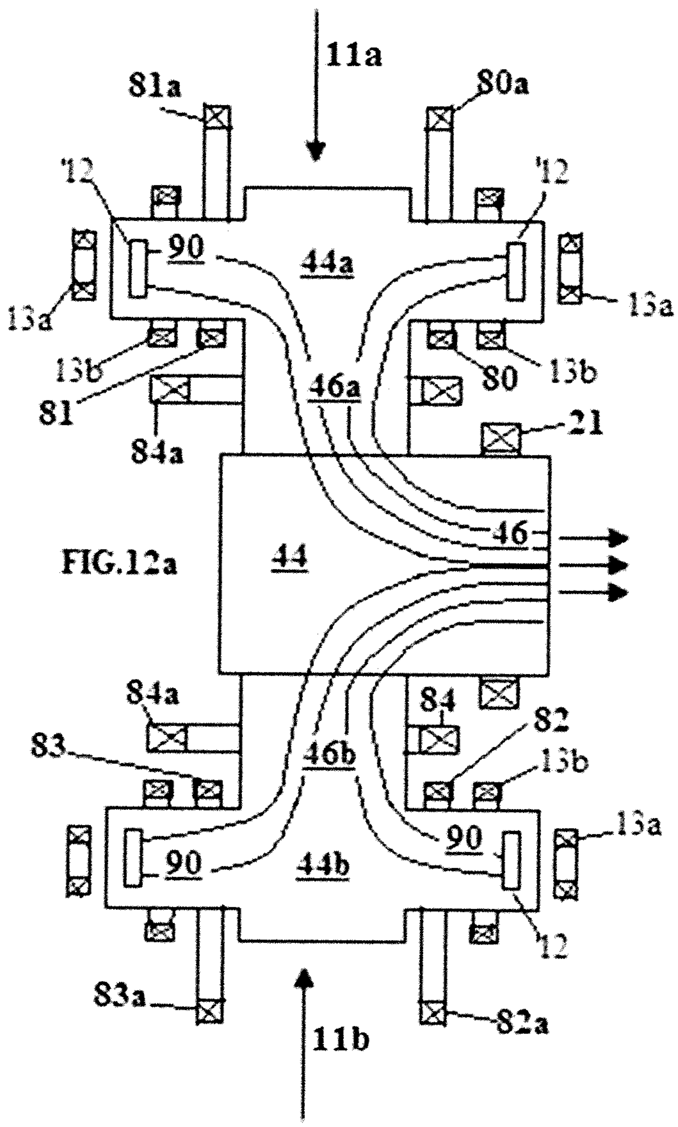
FIGS. 12*a* and 12*b* are schematic plan views of embodiments of a filtered cathodic arc coating apparatus utilizing filtered cathodic arc sources with an additional filtration stage.

FIG. 12*a* shows an embodiment of a filtered cathodic arc deposition method and apparatus of present invention, which utilizes a filtered cathodic arc source with an additional filtration stage. In this embodiment, two unidirectional dual filtered sources 11*a* and 11*b* are connected to the side walls of the plasma duct 44 of a third, a common plasma duct chamber. The cathodes 12 are disposed in cathode chambers 90 in communication with filtered plasma ducts 44*a* and 44*b* which are oriented substantially perpendicularly to the optical axes of the cathodes 12, and which in turn are oriented substantially perpendicularly to the main plasma duct 44. The dual filtered cathodic arc sources 11*a* and 11*b* serve the same role as cathode chambers 90 in a dual filtered cathodic arc source having one filtration stage, as was previously shown in FIGS. 3 and 4. The tunnel exit portions 46*a* and 46*b* are attached to the opposite side walls of the plasma duct portion 44 of the common plasma duct chamber. The offset deflecting coils 84 surrounds the exit portions of the exit tunnels 46*a* and 46*b* before they meet the walls of the plasma duct 44, which allows the filtered cathodic arc plasma to start deflecting before entering into the common plasma duct 44 resulting in substantial increase in vapor plasma transport efficiency in this dual filtration multi-target vapor plasma source design. This embodiment, by orienting the main plasma duct 44 off of the axes of tunnel exit portions 46*a* and 46*b*, provides the advantage of an additional filtration stage which can be useful in semiconductor and optical applications, where particularly clean plasma is required.

Figure 12B:
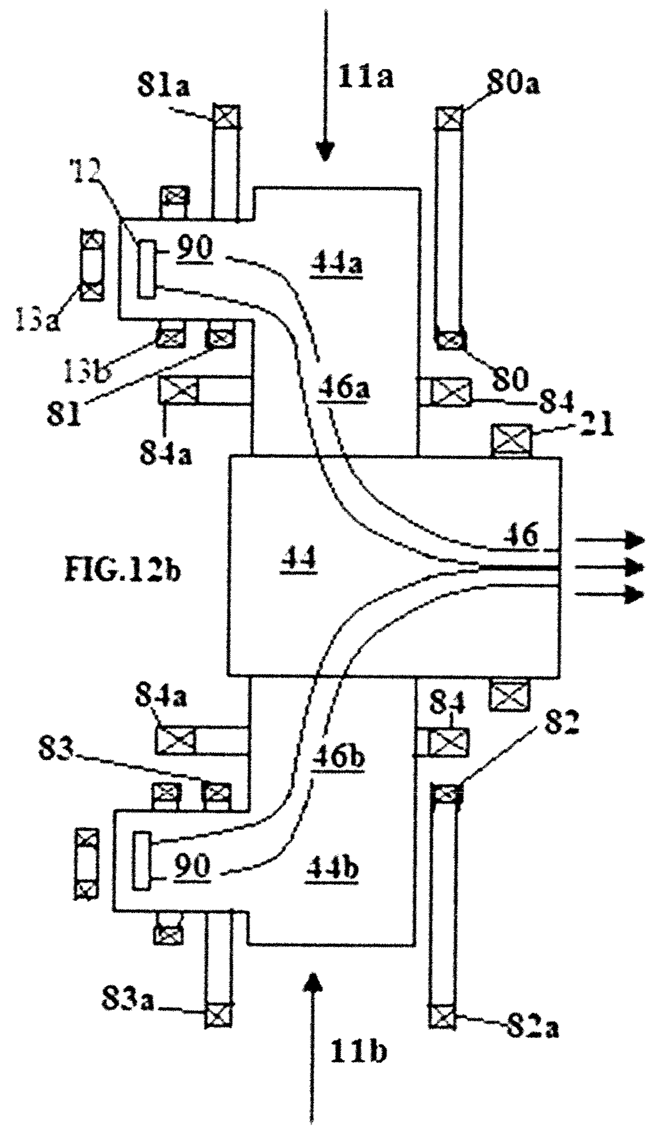

It will be appreciated that the plasma ducts 44*a* and 44*b* of the first filtration stage may have only one cathode chamber 90, attached to side wall of the deflection portion of the plasma ducts 44*a* and 44*b* as shown in a variation in FIG. 12*b*. In this case the pairs of offset deflecting cools 80, 81 of the primary filtered cathodic arc source 11*a* and pair of offset deflection coils 82, 83 of the primary filtered cathodic arc source 11*b* must have the same offset position in relation to the plasma duct 44 and the cathode chamber 90 as if their both cathode chambers were installed into the opposite side walls of the plasma ducts 11*a* and 11*b* as that of FIG. 12*a*. It can be seen that dual filtration source shown in FIG. 12*b* thus has a distribution of the magnetic deflecting and focusing fields similar to that of FIG. 12*a*. Therefore, the plasma stream generated by the cathode targets 12 of the primary cathodic arc sources 11*a*, 11*b* installed at the top of cathode chambers 90 will follow the same trajectories as that shown in FIG. 12*a*.

Figure 13A:
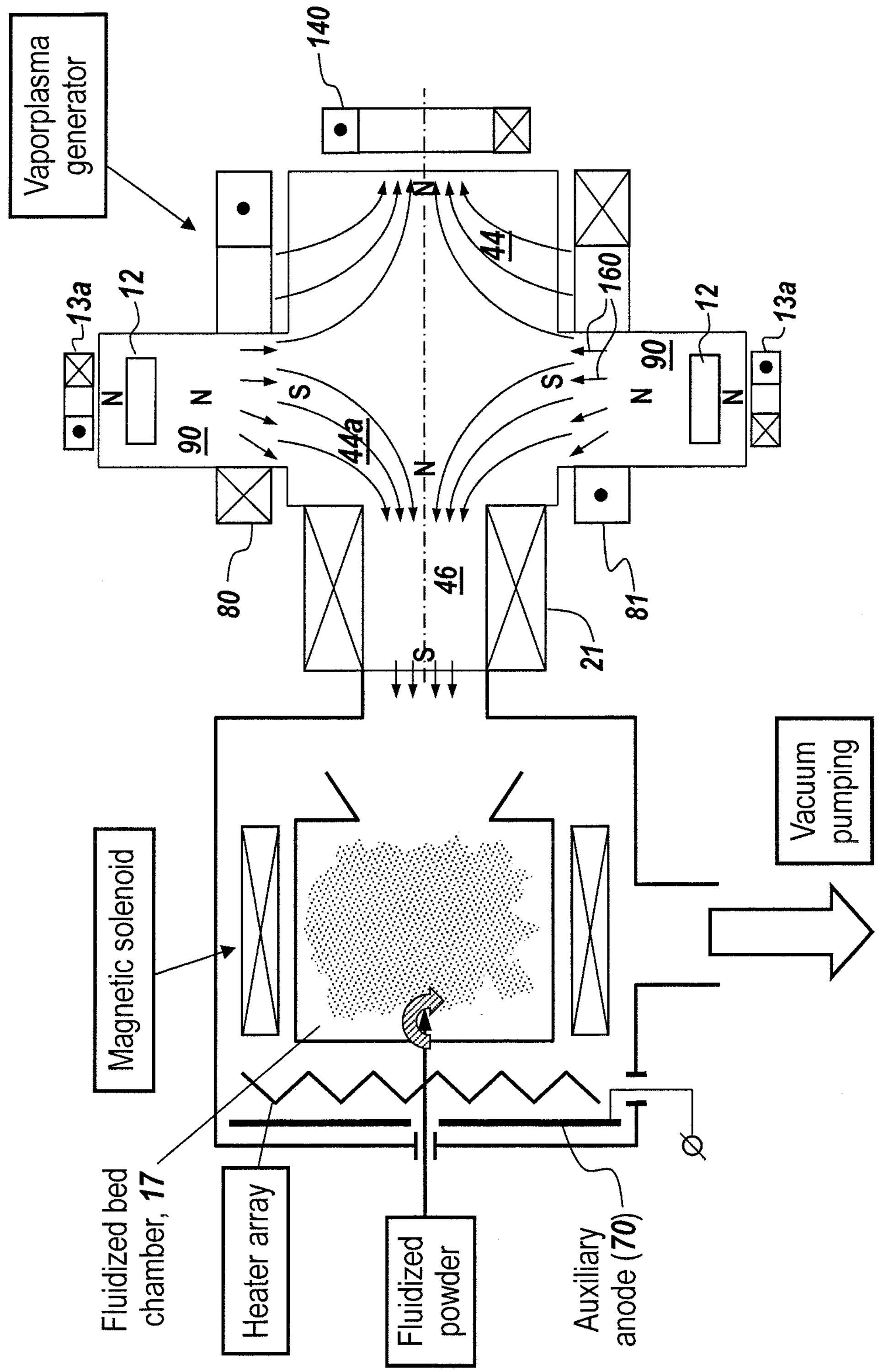
FIGS. 13*a* and 13*b* are schematic views of embodiments of a filtered cathodic arc apparatus providing substrate holders configured for coating a fluidized powder.
Figure 13B:
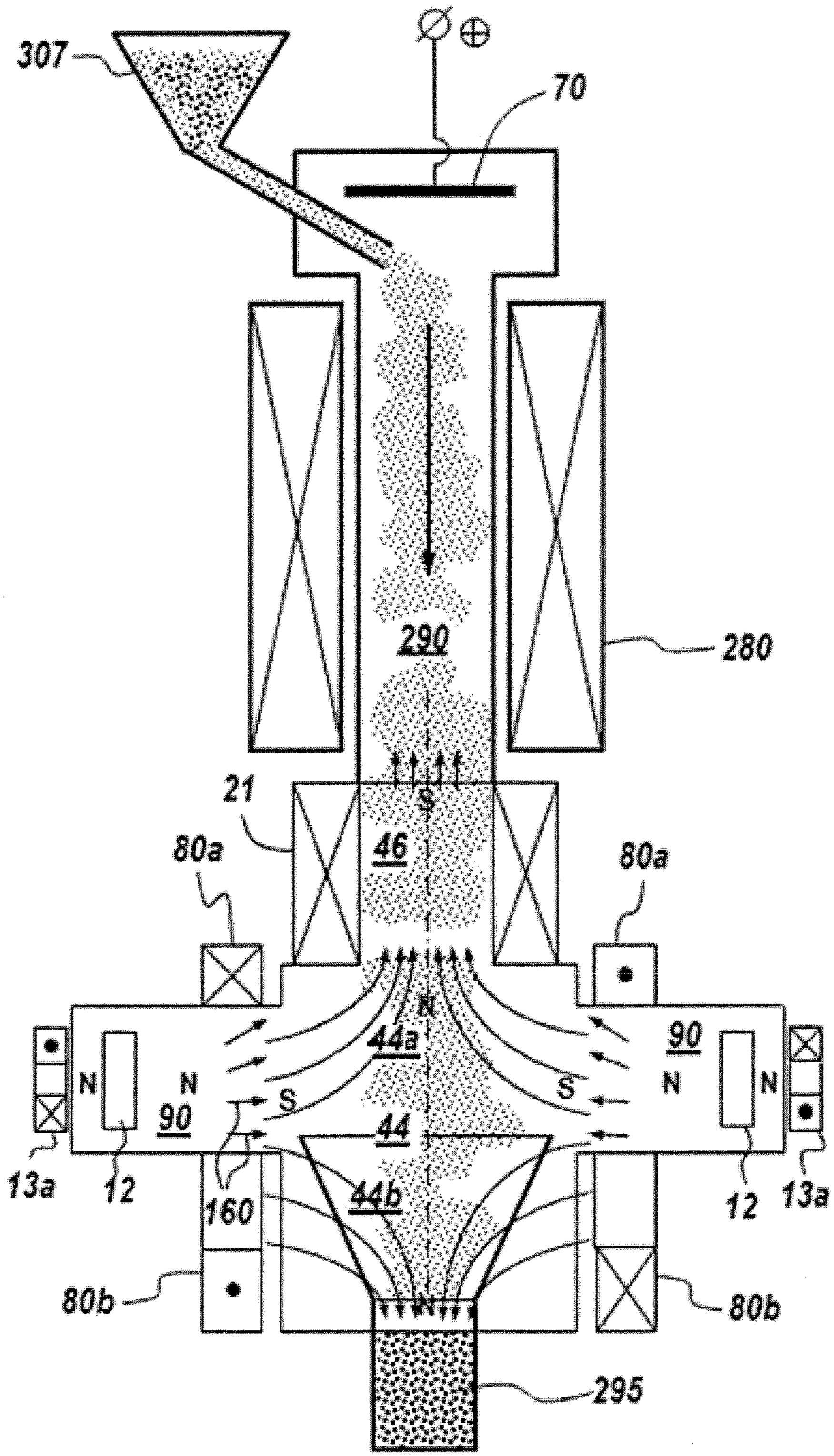
Figure 13C:
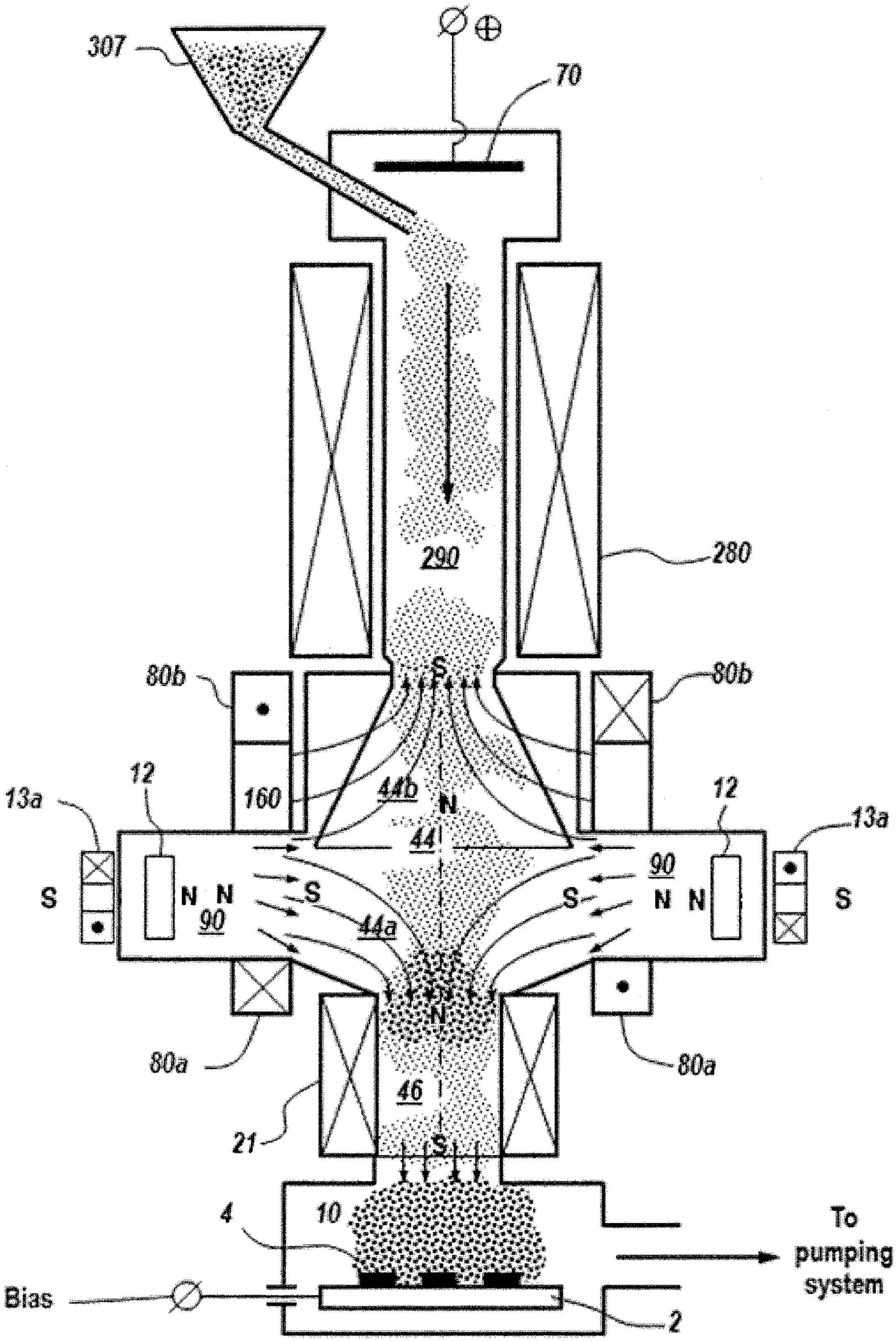
FIG. 13*c* is schematic view of the apparatus shown in FIG. 13*b* for producing concurrent composite powder/metal vapor plasma coatings, in an embodiment.

FIGS. 13*a* and 13*b* illustrate variations of the embodiments of filtered cathodic arc method and apparatus of present invention dedicated for plasma treatment, coating and functionalization of powder in a process called fluidized bed vapor plasma condensation (FBVPC). In FIG. 13*a* the unidirectional multi-cathode filtered arc vapor plasma source having design similar to that of the previously shown in FIG. 7*a* generates vapor plasma flow toward a cloud of the powder prepared in a fluidized bed chamber 17 installed in a main chamber 10. The fluidized powder can be prepared by using a rotational fluid bed chamber 17 as shown in FIG. 13*a*, by subjecting of powder to vibration, using moving ribs or other means to agitate the powder. Alternatively the powder can be exposed in filtered metal vapor plasma during a free fall as shown in FIG. 13*b*. In this arrangement the powder feeder injects the powder at the top of the cylindrical tube surrounded by solenoid 280. The powder falls down throughout the column of highly ionized and magnetized plasma generated by a multi-cathode filtered arc source similar to that shown in FIG. 7*a*. The coated powder is collected in a powder collector 295 attached to the back flange of the filtered cathodic arc source. In the preferred embodiment the powder handling and treatment area is integrated into the filtered cathodic arc source plasma duct chamber 44. FIG. 13*c* illustrates a further preferred embodiment of the apparatus shown in FIG. 13*b* for producing concurrent composite powder/metal vapor plasma coatings. In this apparatus the substrates to be coated 4 such as cutting tool carbide inserts are disposed on the substrate holder 4 at the bottom of the substrate chamber 10. The powder is flowing along the tubular plasma duct 44 and continues its free fall toward the bottom of the substrate chamber 10. During the time when solid particles are passing the plasma duct 44 they are getting partially coated by metal vapor plasma. Some of these particles are falling on the surface of the substrates 4 and the coating deposition process continues until a composite powder/metal vapor deposit is formed on the surface of substrates 4.

Following are examples of the treatment of substrates in the embodiments described above:

Example 1. Filtered Cathodic Arc Plasma Immersed Ion Cleaning

The arc coating apparatus shown in FIG. 4*f* was used in this process. The apparatus was equipped with two dual-filtered cathodic arc sources, having round conical cathode targets 12 measuring 3" in diameter and 2" in height, one filtered cathodic arc source having titanium targets and the other one having chromium targets. The exit openings of the filtered cathodic arc sources were equipped with load lock shutters 83*a*, 83*b*, electron-permeable to provide a free passage of electron current from the cathode targets 12 to distal auxiliary anodes 70 to thereby establish an auxiliary arc discharge. Augmented by the auxiliary arc discharge the ionization and activation of the gaseous component of the plasma environment in the coating chamber 42 was significantly increased (up to 3 to 4% in comparison with approximately 0.1% gas ionization rate in glow discharge without the auxiliary arc discharge) resulting in ion bombardment flux at the surface of the substrates exceeding 10 $mA/cm^2$.

HSS disc coupons as substrates 4, 2" diameter, ¼" thick, were washed in a water solution containing detergent and dried by isopropyl alcohol, and placed in a dry cabinet for 2 hours at 200° C. The substrates 4 were then loaded into the coating chamber 10 and attached to the rotary satellites of the substrate platform 2, for double rotation at a rotational speed of 12 rpm. The vacuum chamber was evacuated to $4\times10^{-6}$ Torr and then a gas mixture containing 80% argon, 18% hydrogen and 2% oxygen as an ion cleaning gas, was injected to create a total pressure ranging from $4\times10^{-4}$ to $8\times10^{-4}$ Torr. Both load lock shutters 83*a*, 83*b* were locked and cathodic arc sources 12 were activated in at least one filtered cathodic arc source, preferably that with the titanium targets. The deflecting magnetic system was not activated. The auxiliary arc discharge was activated between the cathodes 12 of the active filtered cathodic arc source and the distal auxiliary anodes 70 installed in the coating chamber 42. The total auxiliary discharge current was established at 80 amps. The RF bias power supply was activated and a self-bias potential was established at 600 volts. The ion cleaning stage was performed for 10 minutes.

Example 2. Plasma Immersed Ionitriding and Ion Implantation in the Auxiliary Arc Discharge The apparatus and substrate coupons 4 of Example 1 were used in this process. After the ion cleaning stage the gas mixture was changed to nitrogen as an ionitriding gas, injected to create a total pressure ranging from $2\times10^{-4}$ to $8\times10^{-4}$ Torr. For ionitriding the substrates 4 were preliminary heated to 300° C. to 450° C. using conventional heaters (not shown) installed in front of the distal auxiliary anodes 70 in the coating chamber 42. A self-bias voltage was established at a range from 100 to 400 volts. The current applied to distal auxiliary anodes 70 was set at 100 amps and the ionitriding stage was performed for 1 hour.

For low-energy ion implantation the substrate temperature was set to a lower level, about 150 to 300° C., and the bias voltage ranged from 200 to 3000 volts. The ion implantation stage was performed for 1 hour.

The ionitriding and ion implanted layers were characterized by structure, thickness, microhardness depth profile, and surface roughness. It was found that ionitriding in this process provided a greater roughness of the substrate surface in comparison to ion implantation, while the rate of ionitriding was up to one order of magnitude greater than the rate of ion implantation. The rate of ionitriding for HSS steel had reached up to 1 μm/hr in comparison with 0.08 to 0.12 μm/hr for low energy ion implantation with the same 600 volt self-bias on the substrates 4.

Example 3. Auxiliary Arc Plasma Immersed Deposition of Chromium Nitride Filtered Cathodic Arc PVD Coating The apparatus of FIG. 4*f* was equipped with the same cathode targets 12 as in Example 1. The same substrate coupons 4 as in Example 1 were installed on the rotary satellites of substrate holder 2 with single rotation and preheated to 400° C. by conventional heaters installed in the coating chamber 10. After ion cleaning as described in Example 1 the load lock shutter 83*b* of the filtered cathodic arc source 1*b* with the chromium cathode targets 12 was opened and the gas was changed to pure nitrogen with total pressure of $2\times10^{-4}$ to $3\times10^{-4}$ Torr. The focusing and deflecting magnetic coils 13, 80 and 21 of the filtered cathodic arc source magnetic systems were activated to deflect the chromium plasma stream toward substrates. The deflecting anode 50 was electrically isolated and set at floating potential vs. surrounding plasma flow. The current between each of the chromium cathodes 12 and distal auxiliary anodes 70 was established at 50 amps. The currents between Cr cathode targets and the nearby primary ground anode was established at 150 amps to make a total arc current per one chromium target 200 amps. The load lock shutters 83*a* corresponding to the filtered cathodic arc source 1*a*, with the titanium cathode targets 12, remained locked and the corresponding offset deflecting coils 80 and deflecting anode 50 were inactive while both cathodic arc sources with titanium targets 12 were activated. Without the deflecting electromagnetic fields the plasma stream remained substantially confined to the cathode chamber 90, and the titanium cathode targets served as electron emitters, providing additional current to the distal auxiliary anodes 70 up to 80 amps. Coating deposition was performed for 3 hours. The deposition rate of filtered cathodic arc CrN coating deposited by unidirectional dual filtered cathodic arc source 1*b* with offset deflecting coils was 3.8 μm/hr.

Example 4. Large Area TiN Filtered Cathodic Arc Coatings

The apparatus of FIG. 4*f* was equipped with the same cathode targets 12 as in Example 1. In this example the substrate coupons 4 were made from stainless steel as bars with a 1" width, ½" thickness and 14" length. The substrates 4 were installed on the rotary satellite positions of substrate platform 2, with double rotation. The substrates 4 were preheated to 400° C. before the deposition stage commenced.

After ion cleaning as described in Example 1 the load lock shutter 83*b* of the filtered cathodic arc source 1*a* with the titanium cathode targets 12 was opened while the source 1*b* with chromium targets was inactive. The gas was changed to pure nitrogen with total pressure of $2\times10^{-4}$ to $3\times10^{-4}$ Torr. The deflecting and focusing magnetic coils 20, 80 and 21 of the filtered cathodic arc source magnetic systems were activated to deflect the titanium plasma stream toward substrates. The deflecting anode 50 was electrically isolated and set at floating potential vs. surrounding plasma flow. The currents between each of the titanium cathodes 12 and distal auxiliary anodes 70 were established at 50 amps. The currents between Ti cathode targets and the nearby primary ground anode were established at 150 amps to make a total arc current per one titanium target 200 amps. The load lock shutters 83*a* corresponding to the filtered cathodic arc source 1*b*, with the chromium cathode targets 12, remained locked and both cathodic arc sources with chromium targets 12 were remained inactive. Coating deposition was performed for 3 hours.

In this trial the alternative vertical magnetic field with a frequency of 60 Hz and amplitude (maximum value) of 70 Gs created by a pair of vertical scanning coils, one of them positioned on the top side of the plasma duct and another one positioned under the bottom of the plasma duct (not shown in FIG. 4*f*) was applied to raster the vapor plasma flow in a vertical direction transversal to the plane of rotation of the plasma stream. Scanning by the vertically rastering magnetic coils in this fashion allowed to reach up to 90% uniformity of coating thickness over the large area coating zone (14" in this example). By way of contrast, in a conventional direct cathodic arc deposition process it is not possible to scan the plasma flow with electromagnetic fields due to the neutral phase (atoms, clusters and macroparticles) which constitute up to 60% of the total erosion mass of the vacuum arc jet.

The deposition rate of the TiN coating deposited by unidirectional dual filtered cathodic arc source 1*a* with offset deflecting coils was approximately 5 μm/hr.

In a refinement, this technology is applied for deposition of erosion and corrosion resistant coatings on airfoils of turbine engine. For example, the coating system shown schematically in FIG. 10*e* is used for this coating deposition process. The airfoils are installed at the turntable 2 either at the 60° to the radius as shown in airfoil samples 4*a*, or with double rotation as shown in airfoil sample 4*b* in FIG. 10*e*, wherein airfoil sample 4*b* further undergoes rotation about a longitudinal axis of airfoil sample 4*b*, which is parallel to the rotation axis of turntable 2. Both primary cathodic arc sources of the filtered cathodic arc source 1 are equipped with cathode targets 12 made of titanium. Both targets of the magnetron sputtering sources 215 are also made of titanium. The shielded cathodic arc source 2 in a cathode chamber 321 is also equipped with titanium target 12*a*.

At the first stage, the remote arc discharge is ignited in argon at 2 mtorr between the cathode target 12*a* and the remote anode 70, powered by the power supplies 26*a* and 26*c*, while the primary arc discharge in chamber 321 is powered by power supply 26 between the cathode target 12*a* and grounded anode. The argon arc plasma is filling the substrate chamber 10 effectively immersing the substrate table 2 with substrates to be coated in dense strongly ionized plasma. The bias voltage of 250 V is applied to the substrate table 2 for 30 min for ion cleaning the substrates to be coated 4. The rotation speed of substrate table 2 is set at 4 rpm. At the second stage both cathodic arc sources of the filtered cathodic arc source 1 are activated, both the deflection and focusing magnetic coils of the plasma duct 44 are also activated to direct metal vapor plasma generated by the cathodic arc sources of the filtered cathodic arc source 1 toward substrates to be coated 4 in coating chamber 10. The substrate table 2 bias is increased to 1000 V for metal ion implantation of the substrates to be coated 4. The metal ion implantation stage is lasting for 3 min followed by filtered cathodic arc coating deposition stage. At this stage the substrate bias is reduced to 30 V and titanium adhesive sublayer is deposited during 10 min in argon at 2 mtorr. At the third stage nitrogen is added to the chamber to maintain $Ar:N_2$ ratio of 1:10 at 4 mtorr and TiN second sublayer is depositing during 15 min. At the fourth stage the pressure is increased to 2 mtorr and $Ar:N_2$ ratio is changed to 1:3. Both magnetron sputtering sources are activated without interruption of the filtered cathodic arc source at 5 $W/cm^2$ sputtering power and a hybrid filtered cathodic arc-magnetron coating deposition process continues for 3 to 5 hrs to deposit TiN coatings on airfoils. The coating thickness is typically ranging from 10 to 40 μm.

This technology is capable of producing a wide variety of coating architectures and structures. For example, by periodically turning OFF and ON the nitrogen supply line it is possible to deposit multilayer coatings with a sequence of ceramic (TiN) and metallic sublayers having thicknesses ranging from 50 nm to 1000 nm. Alternatively, by turning ON and OFF a magnetic deflecting coil with repetition frequencies typically ranging from 0.1-1000 Hz (magnetic shutter mode) the filtered cathodic arc vapor plasma flow generating by the filtered cathodic arc source can be periodically SHUT OFF and SHUT ON which can provide a periodical change in ion bombardment rate by metal ions (Ti) of growing magnetron sputtering TiN films. This generates a periodic multilayer structure of the TiN based coatings with sublayer thicknesses at nanometric scale, which is beneficial for the coating toughness, erosion and corrosion protection properties.

Example 5. Large Area Filtered Cathodic Arc Deposition of Diamond-Like Coatings (DLC)

The arc coating apparatus shown in FIG. 4*f* equipped with two dual unidirectional filtered cathodic arc sources used in this process which featured the design shown in FIG. 8*d* comprised of stream baffles 185 made of the pure iron strips installed at the entrance 44*a* into the tunnel portion 46 of the plasma duct 44 electrically isolated from the coating chamber. The primary cathodic arc sources installed in cathode chambers 90 of the filtered cathodic arc source 1*a* were equipped with targets 12 made of pyrolytic graphite and provided with pulse operation mode using pulse electrical ignition. The primary cathodic arc sources installed in cathode chambers 90 of the filtered cathodic arc source 1*b* were equipped with targets 12 made of titanium. The stream baffles 185 in addition to the regular wall baffles were used to further reduce the macroparticle content in the coating. Indexable carbide inserts as substrate coupons 4 were installed on the satellites of substrate platform 2 with single rotation at a rotational speed of 12 r.p.m. The apparatus was evacuated to 5×10-6 Torr and 13.56 MHz RF bias voltage was setup to establish a self-biasing potential of the turntable 2 with substrates 4 during coating deposition process. After the ion cleaning stage similar to that described in Example 1, the high voltage metal ion etching was performed using the filtered cathodic arc source 1*b* equipped with titanium primary cathode targets 12. The load lock shutter of the source 1*b* was opened, while the load lock shutter of the source 1*a* equipped with graphite primary cathode targets was closed. The source 1*b* was turned ON. The steering coils 13*a*, offset deflection coils 80 and focusing coils 21 of the filtered cathodic arc source 1*b* were activated. The autopolarized bias of the substrate holding turntable was set at 1000 volts. The metal ion etching stage lasted 2 minutes followed by deposition of TiC bondcoat interfacial layer. The TiC bondcoat was deposited by source 1*b* follow the procedure similar to that of Example 4, but with the mixture of argon and methane as a reactive gas at the pressure of 1 mtorr. The thickness of TiC bondcoat was 0.5 m. In some processes the ultra-thin titanium layer having thickness ranging from 5 to 20 nm was deposited between substrate surface and TiC bondcoat layer. After this stage the gas supply line was closed to stop injecting both reactive (methane) and buffer (argon) gases in the coating chamber, titanium source 1*b* was turned off and filtered cathodic arc source 1*a* with graphite targets was turned ON to commence the DLC deposition process which lasted 5 hrs. The load lock shutter 83*a* of the source 1*b* with titanium targets was shut off, while the load lock shutter 83*a* of the source 1*a* was opened. The cathodic arcs on side surface of the conical graphite targets were ignited using the pulse electrical ignition. Pulse cathodic arc sources 12 with graphite targets were activated with a pulse arc discharge repetition frequency of 10 Hz. During the first minute of the process, the self-bias potential of the substrates 4 was established at to 1000 volts to provide a sublayer between the TiC bondcoat interlayer and DLC film, while during deposition of DLC coating the self-bias potential of the substrates was reduced to 100 volts. The microhardness of DLC deposited in this process has reached 65 Gpa. Using the stream baffles 185 allowed to reduce the density of defects in DLC film by two orders of magnitude. The rate of deposition of DLC over a 12" high and 20" diameter coating zone have reached 0.6 μm/hr.

Example 6. Large Area Filtered Cathodic Arc Deposition of TiN Coating on Diamond Powder In this example the apparatus of FIG. 13*a* was equipped with the same targets as in Example 4. The drum was loaded with 200 mesh diamond powder. In this case the inside surface of the drum 2 was provided with the ribs coaxial to the drum 17. The rotating speed of the drum 17 was set at 6 RPM to create a fluidized diamond powder inside of the drum 17. The coating process was performed identical to that of the Example 4 resulting in a deposition of TiN bondcoat on the surface of the diamond powder. The strength of the coated polycrystalline diamond particles has increased by 50% in comparison with uncoated powder.

Example 7. Deposition of Diffusion Barrier Coating on Drug Powders

In this example the Si-based inorganic diffusion barrier topcoat-shell is deposited on fine paclitaxel prepared by mechanical attrition. The coating deposition process, called the fluidized bed vapor plasma condensation (FBVPC) process, is conducted in a vacuum chamber equipped with a fluidized bed arrangement schematically shown in FIG. 13*a* which is capable of making a powder cloud in a vacuum against a RF-magnetron equipped with Si-target (not shown). The RF-magnetron coupled with filtered cathodic arc source can be installed within deflection section 44*a* of the plasma duct 44 similar to the arrangement shown in FIG. 10*a*. The plasma assisted CVD PACVD) source can be also used instead of magnetron to ionize and activate the Si-contained plasma environment for deposition of Si-based coating on powder. The PACVD plasma source can be attached to the back wall of the plasma duct 44 in the arrangement similar to that shown in FIG. 7*d*. The gas compositions during different coating deposition processes vary as according to the Table 1. The FBVPC process is capable of depositing a uniform continuous topcoat on a fluidized drug nanopowder, as opposed to the partially coated drug particles from multi-cycled magnetron sputtering. In the FBVPC process, a vapor, sputtering plasma, and/or a high-energy ion beam will interact with the cloud of fluidized drug nanopowder in the vacuum processing chamber as schematically illustrated in FIG. 13*a*. For coating deposition on fluidized powder substrates, the rotating drum-like fluidized powder container with seed bulk powder will be installed on the substrate holder platform. Our experimental work on the coating of sugar particles using the FBVPC process also indicated no structural or thermally-inspired degradation of the drug particles during the coating process thanks to low heating of powder exposed in FBVPC process. The FBVPC process is capable of forming a uniform continuous inorganic topcoat over drug-containing particles.

In one embodiment of the present invention, in order to prepare the drug-eluting nanocomposites, the coated drug particles will be deposited on a metal surface by conventional or ultrasonically enhanced electrophoretic deposition (EPD) process from a suspension of the organic-inorganic core-shell drug-containing nanoparticles mixed with a silica colloidal dispersion. The dimensions of the drug nanoparticles produced by mechanical attrition will range from 50 to 500 nm while the colloidal silica nanoparticles of 5 to 20 nm will fill the gaps between the core-shell drug particles, and will provide an interfacial toughening and will block the drug's outward boundary diffusion and inward diffusion from the surrounding media of the compacted nanocomposite material.

TABLE 1

Examples of Si-based topcoats deposited by RF-magnetron sputtering.

| Item # | Coating description | Thickness (nm) | % Porosity | Crystallinity | Gas Composition |
|---|---|---|---|---|---|
| 1 | a-Si | 10-100 | Porous (30%, 60%) | amorphous | Ar |
| 2 | a-Si | 10-100 | non-porous | amorphous | Ar |
| 3 | nc-Si | 10-100 | Porous (30%, 60%) | nano-crystalline | Ar |
| 4 | nc-Si | 10-100 | non-porous | nano-crystalline | Ar |
| 5 | a-Si—H | 10-100 | non-porous | amorphous | Ar + 10% H2 |
| 6 | a-Si—H | 10-100 | non-porous | amorphous | Ar + 20% H2 |
| 7 | a-Si—H | 10-100 | non-porous | amorphous | Ar + 30% H2 |
| 8 | a-Si—H | 10-100 | non-porous | amorphous | Ar + 40% H2 |
| 9 | a-Si—H | 10-100 | non-porous | amorphous | Ar + 50% H2 |
| 10 | $SiO_2$ | 10-100 | Porous (30%, 60%) | nanocrystalline | Ar + 30% O2 |
| 11 | $SiO_2$ | 10-100 | non-porous | nanocrystalline | Ar + 30% O2 |
| 12 | a-SiCH | 10-100 | non-porous | amorphous | Ar + 10% H2 |
| 13 | a-SiCH | 10-100 | non-porous | amorphous | Ar + 20% H2 |
| 14 | a-SiCH | 10-100 | non-porous | amorphous | Ar + 30% H2 |
| 15 | a-SiCH | 10-100 | non-porous | amorphous | Ar + 10% SiH4 + 30% H2 |
| 16 | nc-SiCH | 10-100 | non-porous | nanocrystalline | Ar + 10% H2 |
| 17 | nc-SiCH | 10-100 | non-porous | nanocrystalline | Ar + 20% H2 |
| 18 | nc-SiCH | 10-100 | non-porous | nanocrystalline | Ar + 30% H2 |
| 19 | nc-SiCH | 10-100 | non-porous | nanocrystalline | Ar + 10% SiH4 + 30% H2 |

In an embodiment of the filtered cathodic arc deposition method and apparatus of present invention shown in FIG. 13*a*, the inorganic topcoat-shell deposited on the drug-containing powder must be chosen to provide the same charge of the core-shell drug-containing particles as that of the colloidal silica nanoparticles in colloidal dispersion. Both inorganic coating and colloidal particles must have low conductivity which secure large electrical field between cathode and anode within the EPD setup. Appropriate surfactants can be also optionally added to the colloidal dispersion to prevent agglomeration of the drug-containing core-shell powder in dispersion. In this case the surfactant will be chosen to have the same charge in dispersion as colloidal silica and drug-containing core-shell powder. As both drug-containing particles and colloidal silica nanoparticles have the same charge they will move toward the same electrode (anode in anodic deposition or cathode in cathodic deposition) in EPD process forming a nanocomposite drug-containing organic-inorganic coating on metal substrate connected to appropriate electrode (anode or cathode). It is found in our experimental work that using different Si-based coatings, including pure silicon, silica, hydrogenated silicon carbide, or silicon nitride as a topcoat-shell deposited over the core-drug-containing particles results in fabrication of core-shell particles which have the same charge as silica in a colloidal dispersion. Without wishing to be bound by theory, this may be explained by the formation of an ultra-thin oxide scale forming a nm-thin silica layer on the surface of the Si-based compounds which secure the same charge of the coated core-shell powder as silica nanoparticles in a colloidal dispersion during the EPD of the drug-containing organic-inorganic nanocomposite coating.

Features described above as well as those claimed below may be combined in various ways without departing from the scope hereof. For example, it will be appreciated that aspects of one filtered cathodic arc deposition method or apparatus described herein may incorporate or swap features of another filtered cathodic arc deposition method or apparatus described herein. The following examples illustrate possible, non-limiting embodiments and combinations of embodiments described above. It should be clear that many other changes and modifications may be made to the methods and apparatuses herein without departing from the spirit and scope of this invention:

(A1) A filtered cathodic arc deposition apparatus may include (i) at least one cathodic arc source having at least one respective cathode located in at least one respective cathode chamber, (ii) a substrate chamber for holding, non-coincidentally with an optical axis of each of the at least one cathode, at least one substrate to be coated, (iii) a plasma duct in communication with the cathode chamber and the substrate chamber, and (iv) at least one offset deflecting coil, disposed adjacent to a side of the at least one cathode chamber, respectively, and spaced from the plasma duct, that generates a deflecting magnetic field within the at least one cathode chamber, respectively, for filtering output of the at least one cathodic arc source, respectively, by deflecting a plasma flow from therefrom into the plasma duct.

(A2) In the filtered cathodic arc deposition apparatus denoted as (A1), the at least one cathodic arc source may further include at least one respective stabilizing coil, disposed behind a respective one of the at least one cathode or surrounding a respective one of the at least one cathode, for controlling position of an arc discharge generated by the at least one cathodic arc source.

(A3) In the filtered cathodic arc deposition apparatuses denoted as (A1) and (A2), the at least one cathodic arc source may further include at least one anode associated with the at least one cathode for generating arc discharge.

(A4) The filtered cathodic arc deposition apparatuses denoted as (A1) through (A3) may include at least one focusing conductor adjacent to a focusing tunnel section of the plasma duct for generating a focusing magnetic field, wherein the focusing tunnel section is in communication with the substrate chamber.

(A5) In the filtered cathodic arc deposition apparatus denoted (A4), the deflecting magnetic field may couple with the focusing magnetic field to direct plasma toward a substrate holder in the substrate chamber.

(A6) The filtered cathodic arc deposition apparatuses denoted as (A1) through (A5) may include at least one deflecting coil adjacent to the plasma duct and the at least one cathode chamber.

(A7) In the filtered cathodic arc deposition apparatuses denoted as (A1) through (A6), the at least one offset deflecting coil may include at least one respective proximate offset conductor disposed adjacent to a side of the cathode chamber facing the substrate chamber, generating a saddle-shaped concave deflecting magnetic field in a part of the at least one cathode chamber closer to the substrate chamber for deflecting a plasma flow from the cathodic arc source into the plasma duct toward the substrate chamber.

(A8) In the filtered cathodic arc deposition apparatus denoted as (A7), the at least one offset deflecting coil may include at least one respective distal offset conductor disposed adjacent to a side of the cathode chamber that faces away from the substrate chamber, generating a saddle-shaped concave deflecting magnetic field in a part of the at least one cathode chamber further from the substrate chamber for deflecting a plasma flow from the at least one cathodic arc source into the plasma duct.

(A9) In the filtered cathodic arc deposition apparatus denoted as (A8), midpoint between corresponding ones of the at least one proximate offset conductor and at least one distal offset conductor may be located within a corresponding one of the at least one cathode chamber.

(A10) In the filtered cathodic arc deposition apparatus denoted as (A8), distance between corresponding ones of the at least one distal offset conductor and center of the at least one cathode may be 1.2 to 10 times distance between the center of the at least one cathode and back wall of a corresponding one of the at least one cathode chamber, wherein the back wall is a wall of the corresponding one of the at least one cathode chamber that is away from the substrate chamber.

(A11) In the filtered cathodic arc deposition apparatuses denoted as (A1) through (A6), the at least one offset deflecting coil may include at least one pair of distal offset conductors, disposed adjacent to a side of the at least one cathode chamber facing away from the substrate chamber on opposite sides of the plasma duct, generating a saddle-shaped concave deflecting magnetic field in a part of the at least one cathode chamber further from the substrate chamber for deflecting a plasma flow from the cathodic arc source into the plasma duct.

(A12) The filtered cathodic arc deposition apparatuses denoted as (A1) through (A11), may include a gaseous plasma source disposed at an end of the plasma duct opposite the substrate chamber.

(A13) In the filtered cathodic arc deposition apparatus denoted as (A12), the gaseous plasma source may include an electron-permeable shield permitting electrons to flow toward the substrate chamber.

(A14) The filtered cathodic arc deposition apparatuses denoted as (A12) and (A13) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(A15) In the filtered cathodic arc deposition apparatuses denoted as (A1) through (A14), the substrate chamber may include a substrate holder for holding the at least one substrate.

(A16) The filtered cathodic arc deposition apparatuses denoted as (A1) through (A15) may include baffles to trap the macroparticles, said baffles disposed at the walls of the plasma duct and/or cathode chamber.

(A17) The filtered cathodic arc deposition apparatuses denoted as (A1) through (A16) may include additional baffles to trap the macroparticles, said baffles disposed in the cathode camber in front of the cathode spaced from the cathode at 1 to 10 cm and having generally positive potential in reference to the cathode or be insulated and have a floating potential or be electrically grounded.

(A18) In the filtered cathodic arc deposition apparatus denoted as (A1) through (A16), the at least one cathode chamber may include a plurality of cathode chambers, each cathode chamber provided with an offset deflecting coil and a rastering coil with at least one rastering conductor parallel to the plane of rotation of metal plasma flow and disposed near the end of the cathode chamber adjacent to the plasma duct.

(A19) The filtered cathodic arc deposition apparatuses denoted as (A1) through (A18), may include electron beam evaporator disposed in the plasma duct near the stagnation area of the magnetic cusp created by the deflecting magnetic coils while at least one electron beam gun is positioned at the wall of the plasma duct adjacent to the wall occupied by the cathode chamber.

(B1) A filtered cathodic arc deposition apparatus may include (i) at least one cathodic arc source having at least one respective cathode located in at least one respective cathode chamber, (ii) a substrate chamber for holding, non-coincidentally with an optical axis of each of the at least one cathode, at least one substrate to be coated, (iii) a plasma duct in communication with the cathode chamber and the substrate chamber, (iv) at least one coil generating a deflecting magnetic field for deflecting the plasma toward the substrate chamber; and (v) a plurality of stream baffles having a positive potential relative to the plasma, installed in the plasma duct generally at an angle to a plane parallel to a direction of plasma flow, at position of the plurality of stream baffles, to enhance filtration of macroparticles.

(B2) In the filtered cathodic arc deposition apparatus denoted as (B1), the at least one cathodic arc source may further include at least one respective stabilizing coil, disposed behind a respective one of the at least one cathode or surrounding a respective one of the at least one cathode, for controlling position of an arc discharge generated by the at least one cathodic arc source.

(B3) In the filtered cathodic arc deposition apparatuses denoted as (B1) and (B2), the at least one cathodic arc source may further include at least one anode associated with the at least one cathode for generating arc discharge.

(B4) In the filtered cathodic arc deposition apparatuses denoted as (B1) through (B3), each of the plurality of stream baffles may be generally oriented to lie between a plane tangential to magnetic field lines at position of the plurality of stream baffles and a plane tangential to plasma stream lines at the position of the plurality of stream baffles.

(B5) In the filtered cathodic arc deposition apparatuses denoted as (B1) through (B3), the plurality of stream baffles may include adjustable stream baffles having adjustable orientation and an optimal orientation that is generally tangential to the plasma flow at the position of the plurality of stream baffles.

(B6) The filtered cathodic arc deposition apparatus denoted as (B5) may further include at least one probe, selected from the group of a Langmuir ion collecting probe and a mass flux collecting probe, for determining the optimal orientation, wherein the at least one probe (i) is disposed in the deflecting magnetic field or in a focusing magnetic field, (ii) has an ion collecting area with adjustable orientation, and (iii) measures a maximum ion current when the ion collecting area is perpendicular to the plasma flow.

(B7) In the filtered cathodic arc deposition apparatuses denoted as (B1) through (B5), the plurality of stream baffles may include a magnetic material for substantially tangential alignment of the stream baffles with field lines of the deflecting magnetic field, or field lines of a focusing magnetic field, under magnetic influence of the deflecting magnetic field.

(B8) The filtered cathodic arc deposition apparatuses denoted as (B1) through (B7) may include at least one focusing conductor adjacent to a focusing tunnel section of the plasma duct for generating a focusing magnetic field, wherein the deflecting magnetic field couples with the focusing magnetic field to direct plasma toward the at least one substrate.

(B9) The filtered cathodic arc deposition apparatuses denoted as (B1) through (B8) may include at least one offset deflecting coil, disposed adjacent to a side of the at least one cathode chamber facing the substrate chamber, which generates a deflecting magnetic field within the cathode chamber that deflects a plasma flow from the cathodic arc source into the plasma duct toward the substrate chamber.

(B10) The filtered cathodic arc deposition apparatuses denoted as (B1) through (B9) may include a gaseous plasma source disposed at an end of the plasma duct opposite the substrate chamber.

(B11) In the filtered cathodic arc deposition apparatus denoted as (B10), the gaseous plasma source may include an electron-permeable shield permitting electrons to flow toward the substrate chamber.

(B12) The filtered cathodic arc deposition apparatuses denoted as (B10) and (B11) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(C1 A filtered cathodic arc deposition apparatus may include (i) at least one cathodic arc source having at least one respective cathode located in at least one respective cathode chamber, (ii) a substrate chamber for holding, non-coincidentally with an optical axis of each of the at least one cathode, at least one substrate to be coated, (iii) a plasma duct in communication with the cathode chamber and the substrate chamber, (iv) at least one focusing coil surrounding a focusing tunnel section of the plasma duct for generating a focusing magnetic field, (v) at least one deflecting coil generating a deflecting magnetic field for deflecting the plasma along a path toward the substrate chamber, and (vi) at least one magnetron facing the at least one substrate, the magnetron being positioned such that at least a portion of magnetic force lines of the focusing magnetic field overlap and are substantially parallel with at least a portion of magnetic force lines generated by the magnetron, wherein each arc source couples with a magnetron source, and any combination thereof, to increase an ionization rate of a magnetron sputtering flow.

(C2) In the filtered cathodic arc deposition apparatus denoted as (C1), the at least one cathodic arc source may further include at least one respective stabilizing coil, disposed behind a respective one of the at least one cathode or surrounding a respective one of the at least one cathode, for controlling position of an arc discharge generated by the at least one cathodic arc source.

(C3) In the filtered cathodic arc deposition apparatuses denoted as (C1) and (C2), the at least one cathodic arc source may further include at least one anode associated with the at least one cathode for generating arc discharge.

(C4) The filtered cathodic arc deposition apparatuses denoted as (C1) through (C3) may include a gaseous plasma source disposed at an end of the plasma duct opposite the substrate chamber to improve ionization of gaseous plasma component within filtered arc metal vapor plasma flow.

(C5) In the filtered cathodic arc deposition apparatus denoted as (C4), the gaseous plasma source may include an electron-permeable shield permitting electrons to flow toward the substrate chamber.

(C6) The filtered cathodic arc deposition apparatuses denoted as (C4) and (C5) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(C7) The filtered cathodic arc deposition apparatuses denoted as (C1) through (C6) may include at least one metal vapor source and a plurality of deflecting conductors, each of the plurality of deflecting conductors respectively associated with the at least one cathodic arc source and the metal vapor source, wherein at least some of the plurality of deflecting conductors can be independently activated to alternate between deposition of vapor associated with the at least one filtered arc source and metal vapor from the at least one metal vapor source.

(C8) The filtered cathodic arc deposition apparatuses denoted as (C1) through (C7) may include at least one offset deflecting coil, disposed adjacent to a side of the at least one cathode chamber facing the substrate chamber, which generates a deflecting magnetic field within the cathode chamber for deflecting a plasma flow from the arc source into the plasma duct toward substrate chamber.

(C9) The filtered cathodic arc deposition apparatuses denoted as (C1) through (C8) may further include at least one deflecting coil adjacent to the plasma duct and the at least one cathode chamber.

(C10) The filtered cathodic arc deposition apparatuses denoted as (C1) through (C9) may include a plurality of stream baffles, having a positive potential relative to the plasma, installed in the plasma duct generally at an angle to a plane parallel to a direction of plasma flow, to enhance filtration of macroparticles.

(C11) In the filtered cathodic arc deposition apparatuses denoted as (C1) through (C10), each of the plurality of stream baffles may be generally oriented to lie between a plane tangential to magnetic field lines at position of the stream baffles and a plane tangential to plasma stream lines at the position of the stream baffles.

(C12) In the filtered cathodic arc deposition apparatuses denoted as (C1) through (C11), the plurality of stream baffles may include a magnetic material for substantially tangential alignment of the stream baffles with field lines of the deflecting magnetic field under magnetic influence of the deflecting magnetic field.

(C13) The filtered cathodic arc deposition apparatuses denoted as (C1) through (C12) may include at least one focusing conductor adjacent to the focusing tunnel section for generating at least a portion of the focusing magnetic field.

(C14) In the filtered cathodic arc deposition apparatus denoted as (C13), the deflecting magnetic field may couple with the focusing magnetic field to direct plasma toward the at least one substrate.

(D1) A method of coating a substrate located in a substrate chamber that is in indirect communication with a cathode chamber via a plasma duct includes (i) generating an arc discharge using a cathode located in the cathode chamber and having an optical axis non-coincidental with the substrate, and (ii) deflecting plasma flow, from the cathode toward the plasma duct, before the plasma exits the cathode chamber.

(D2) The method denoted as (D1) may include generating a magnetic field for performing the step of deflecting.

(D3) A method of coating a substrate located in a substrate chamber includes (i) generating an arc discharge in a cathode chamber using a cathode having an optical axis non-coincidental with the substrate, and (ii) applying a potential voltage to a plurality of stream baffles, located in a plasma duct in communication with the cathode chamber and the substrate chamber in a potential range from −150V to +150V relative to the cathode.

(D4) The method denoted as (D3) may include (iii) orienting at least some of the plurality of stream baffles in an orientation generally transverse to a plane parallel to a direction of plasma flow in a section of the plasma duct, in which the plasma flow is deflected towards the substrate chamber.

(D5) In the methods denoted as (D3) and (D4), target ions may pass through spaces between the stream baffles while macroparticles and/or ions having a different weight or charge than the target ions follow a trajectory into faces of the baffles, such that at least some ions having different weight, different charge, or different weight and charge, as compared to the target ions, are blocked from reaching the substrates.

(D6) The methods denoted as (D4) and (D5) may include generating a magnetic field to deflect the plasma flow towards the substrate chamber.

(D7) The methods denoted as (D3) through (D6) may include orienting the plane of at least some of the plurality of stream baffles in an orientation that is generally parallel to magnetic force lines in the section of the plasma duct in which the plasma flow is deflected towards the substrate chamber.

(D8) The methods denoted as (D3) through (D7) may include orienting the plane of at least some of the plurality of stream baffles in an orientation that is generally parallel to streamlines of plasma flow in the section of the plasma duct in which the plasma flow is deflected towards the substrate chamber.

(D9) In the methods denoted as (D7) and (D8), the at least some of the plurality of stream baffles may be located in a section of the plasma duct, in which the plasma flow is deflected towards the substrate chamber.

(D10) In the methods denoted as (D7) through (D9), the at least some of the plurality of stream baffles may be located in front of the cathode in cathode chamber.

(D11) The methods denoted as (D3) through (D10) may include deflecting plasma flow, from the cathode toward the plasma duct, before the plasma exits the cathode chamber.

(E1) In the filtered cathodic arc deposition apparatus denoted as (A1), the at least one cathode chamber may include a plurality of cathode chambers, each provided with an offset deflecting coil and a rastering coil with at least one rastering conductor parallel to the plane of rotation of metal plasma flow and disposed near the end of the cathode chamber adjacent to the plasma duct.

(E2) In the filtered cathodic arc deposition apparatus denoted as (E1), the deflection section of the plasma duct may be a section of the plasma duct, in which the plasma flow is deflected toward the substrate chamber.

(E3) In the filtered cathodic arc apparatuses denoted as (E1) and (E2), each of the at least one cathode chamber may be generally tubular.

(E4) In the filtered cathodic arc apparatuses denoted as (E1) through (E3), the plasma duct may be generally tubular and the cathode chambers are positioned coaxially around the deflecting section of the plasma duct.

(E5) The filtered cathodic arc apparatuses denoted as (E1) through (E4) may include at least one gaseous plasma source located in the plasma duct generally concentric with the plasma duct.

(E6) In the filtered cathodic arc apparatus denoted as (E5), the gaseous plasma source may include a discharge chamber having a thermionic cathode, hollow cathode or vacuum arc cathode, wherein the discharge chamber has at least one opening facing the substrate chamber to permit plasma to flow from the discharge chamber into the plasma duct.

(E7) In the filtered cathodic arc apparatus denoted as (E6), the at least one substrate may be a tubular substrate in communication with an exit of the plasma duct.

(E8) The filtered cathodic arc apparatus denoted as (E7) may include at least one distal anode in an anode chamber in communication with the side of the tubular substrate opposite the plasma duct.

(E9) In the filtered cathodic arc apparatus denoted as (E8), the tubular substrate may be electrically insulated from the at least one cathode chamber and anodes associated therewith, and be connected to a negative pole of a high voltage power supply.

(E10) In the filtered cathodic arc apparatuses denoted as (E5) through (E9), the at least one substrate may include a flowable medium and the substrate chamber may include a mechanism for agitation of the medium.

(E11) In the filtered cathodic arc apparatus denoted as (E10), the flowable medium may be a powder.

(E12) The filtered cathodic arc apparatuses denoted as (E10) and (E11) may be used to coat or surface treat the flowable medium.

(E13) In the filtered cathodic arc apparatuses denoted as (E10) through (E12), the substrate chamber may be disposed vertically allowing the flowable medium to fall through the plasma.

(E14) The filtered cathodic arc apparatuses denoted as (E1) through (E13) may further include an additional anode disposed in the plasma duct for repelling ions, macroparticles, or a combination thereof.

(E15) In the filtered cathodic arc apparatus denoted as (E14), the additional anode may include baffles for capturing macroparticles.

(E16) In the filtered cathodic arc apparatuses denoted as (E14) and (E15), the additional anode may include at least one focusing coil for focusing the plasma vapor, rastering the plasma vapor, or a combination thereof.

(E17) In the filtered cathodic arc apparatuses denoted as (E14) through (E16), the additional anode may include a vapor source and an evaporation opening in optical alignment with the substrate chamber.

(E18) The filtered cathodic arc apparatus denoted as (E17) may include a crucible disposed in the plasma duct and an electron beam gun disposed on the opposite side of the substrate holder coaxially with the plasma duct.

(E19) The filtered cathodic arc apparatuses denoted as (E1) through (E18) may include baffles disposed in front of a cathode target at a distance from the evaporating surface of the cathode target ranging from 10 to 100 mm.

(E20) In the filtered cathodic arc apparatus denoted as (E19), the baffles may be insulated and have a floating potential or be electrically grounded.

(E21) In the filtered cathodic arc apparatus denoted as (E19), the baffles may be connected to a positive pole of a power supply and serve as an additional proximate anode improving arc stability.

(E22) The filtered cathodic arc apparatuses denoted as (E1) through (E21) may include a solenoid, disposed about a focusing tunnel section of the plasma duct, to create a magnetic field cusp in the plasma guide having a plane of symmetry transversal to an axis of the plasma guide.

(E23) The filtered cathodic arc apparatus denoted as (E22) may include a positively charged repelling solenoid disposed adjacent to a back wall of the plasma duct in alignment with the solenoid disposed about the focusing tunnel, the back wall of the plasma duct being a wall that is located on the side of the plasma duct that is away from the substrate chamber.

(E24) The filtered cathodic arc apparatuses denoted as (E1) through (E23) may include at least one set of baffles located in the plasma duct parallel to the plane of rotation of a filtered arc flow.

(E25) In the filtered cathodic arc apparatus denoted as (E24), the at least one set of baffles may be surrounded by a magnetic field.

(E26) The filtered cathodic arc apparatuses denoted as (E1) through (E25) may include two cathode chambers disposed in opposition and one or more solenoids disposed in a saddle configuration including conductors aligned along the intersections of the plasma duct with the cathode chambers and conductors extending obliquely toward a back wall of the plasma guide, generating a poloidal magnetic field confining the filtered arc vapor plasma flow and toroidal magnetic field directing the filtered arc vapor plasma flow toward the coating chamber, the back wall of the plasma duct being a wall that is located on the side of the plasma duct that is away from the substrate chamber.

(E27) The filtered cathodic arc apparatus denoted as (E26), may include focusing solenoids disposed around the front and back of the plasma duct to create a magnetic cusp configuration in the plasma duct, wherein the back of the plasma duct is further from the substrate chamber, as compared to the front of the plasma duct.

(E28) The filtered cathodic arc deposition apparatuses denoted as (E1) and (E14) through (E18), may include electron beam evaporator disposed in the plasma duct, near the stagnation area of the magnetic cusp created by the deflecting magnetic coils, while at least one electron beam gun is positioned at the wall of the plasma duct adjacent to the wall occupied by the cathode chamber.

(F1) A filtered cathodic arc apparatus for generating energetic particles may include (i) a shielded cathodic arc source for generating and delivering electrons to one end of a plasma duct in communication with a cathode chamber, (ii) a magnetic solenoid surrounding at least a portion of the plasma duct for radially confining plasma in the plasma duct, (iii) at least one distal anode associated with the cathode of the cathodic arc source for generating a remote arc discharge along the plasma duct, and (iv) an output port for outputting energetic particles generated within the plasma duct.

(F2) The filtered cathodic arc apparatus denoted as (F1) may include a gas handling system for providing discharge gas.

(F3) The filtered cathodic arc apparatuses denoted as (F1) and (F2) may include a power supply for providing positive voltage to the plasma duct to accelerate ions generated by the remote arc discharge and generate the energetic particles through collisions between the ions.

(F4) In the filtered cathodic arc apparatus denoted as (F3), the ions may be accelerated in a direction that is substantially perpendicular to a longitudinal axis of the plasma duct.

(F5) In the filtered cathodic arc apparatuses denoted as (F1) through (F4), the energetic particles may be generated from collisions between ions accelerating towards a longitudinal axis of the plasma duct.

(F6) In the filtered cathodic arc apparatuses denoted as (F1) through (F5), the energetic particles may be neutrons.

(F6) In the filtered cathodic arc apparatuses denoted as (F1) through (F5), the cathodic arc source may include an electron-permeable shield permitting electrons to flow toward the plasma duct.

(F7) In the filtered cathodic arc apparatuses denoted as (F1) through (F6), the plasma duct may include at least one intermediate anode to extend the remote arc discharge along the plasma duct.

(F8) In the filtered cathodic arc apparatus denoted as (F7), the at least one intermediate anode may include an array of wire electrodes disposed coaxially with plasma duct for generating a plasma sheath around each of the wire electrodes.

(F9) In the filtered cathodic arc apparatus denoted as (F8), the array of wire electrodes may be electrically connected to the plasma duct.

(F10) The filtered cathodic arc apparatus denoted as (F9), may include a direct current (DC) power supply having positive output connected to the plasma duct and negative output connected to the cathode for generating a remote arc discharge plasma within the array of wire electrodes.

(F11) The filtered cathodic arc apparatus denoted as (F9), may include an unipolar pulse power supply, having positive output connected to the plasma duct and negative output connected to the cathode, for generating a high voltage potential within the array of wire electrodes.

(F12) In the filtered cathodic arc apparatus denoted as (F10), the DC power supply may be configured to generate the remote arc discharge plasma with discharge current in the range from 50 Amperes to 10,000 Amperes and discharge voltage in the range from 30 Volts 500 Volts.

(F13) In the filtered cathodic arc apparatus denoted as (F11), the unipolar pulse power supply may be configured to generate the positive potential in the range from 0.1 kV to 10,000 kilovolt.

(F14) In the filtered cathodic arc apparatuses denoted as (F10) through (F13), the array of wire electrodes may have density such that the plasma sheaths respectively associated with the wire electrodes overlap and provide a positive plasma potential throughout the array of wire electrodes.

(F15) In the filtered cathodic arc apparatus denoted as (F14), the positive plasma potential may be uniform within the array of wire electrodes.

(F16) In the cathodic arc apparatuses denoted as (F14) and (F15), the diameter of each of the wire electrodes may range from 0.01 mm to 1 mm, and the distance between neighboring wire electrodes may range from 0.1 mm to 5 cm.

(F17) In the filtered cathodic arc apparatuses denoted as (F10) through (F16), the array of wire electrodes may radially surround a region that is coaxial with the plasma duct.

(F18) In the filtered cathodic arc apparatus denoted as (F17), the region may be substantially centered about the longitudinal axis of the magnetic solenoid.

(F19) In the filtered cathodic arc apparatuses denoted as (F1) through (F18), the plasma duct may be tubular.

(F20) A filtered cathodic arc method for generating energetic particles may include (i) injecting gas into an anode chamber, (ii) generating primary arc discharge in gas in a cathode chamber, (iii) generating remote arc discharge in the gas at a plasma duct of the cathode chamber, (iv) applying positive pulse voltage to the plasma duct to accelerate ions and generate energetic particles from collisions between the ions, and (v) generating a magnetic field in the plasma duct, substantially along a longitudinal direction of the plasma duct, for at least partial radial confinement of a plasma created by the remote arc discharge and the ions.

(F21) In the method denoted as (F20), the step of generating the primary arc discharge may include generating the primary arc discharge between a cathode and an anode, both located in the cathode chamber.

(F22) In the method denoted as (F21), the step of generating the primary arc discharge may include generating the primary arc discharge with a current in the range from 50 Amperes to 500 Amperes and a voltage in the range from 20 Volts to 50 Volts.

(F23) In the methods denoted as (F20) through (F22), the step of generating the remote arc discharge may include generating the remote arc discharge between a cathode, located in the cathode chamber, and a distal anode located in the distal anode chamber.

(F24) In the methods denoted as (F20) through (F23), the step of generating the magnetic field may include generating a magnetic field of strength between 0.01 Tesla and 20 Tesla.

(F25) In the methods denoted as (F20) through (F24), the step of applying the positive pulse voltage may include applying a voltage in the range from 0.1 kilovolt to 10,000 kilovolt.

(F26) The methods denoted as (F20) through (F25) may include generating an intermediate arc discharge, between a cathode, in the cathode chamber, and an array of wire electrodes in the plasma duct, wherein the wire electrodes are oriented substantially parallel to the longitudinal direction.

(F27) In the method denoted as (F26), the step of generating the intermediate arc discharge may include generating the intermediate arc discharge with current in the range from 50 Amperes to 10,000 Amperes and voltage in the range from 30 Volts to 500 Volts.

(F28) In the methods denoted as (F20) through (F27), the step of injecting gas may include injecting gas into the apparatus to generate a gas pressure in the range from 1 microTorr to 100 Torr.

(F29) In the methods denoted as (F20) through (F28), the step of injecting gas may include injecting a deuterium-tritium mixture.

(F30) In the method denoted as (F29), the energetic particles may be neutrons that are generated in fusion reactions between accelerated deuterium and tritium ions within the plasma duct.

(F31) In the method denoted as (F30), the neutrons may have energy of 14.1 Megaelectronvolt (MeV).

(F32) A filtered cathodic arc apparatus for generating energetic particles may include (i) a shielded cathodic arc source for generating and delivering electrons to one end of a plasma duct in communication with a cathode chamber, (ii) at least one distal anode associated with the cathode of the cathodic arc source for generating a remote arc discharge along the plasma duct, (iii) at least one intermediate anode associated with the cathode of the cathodic arc source for generating energetic particles within the plasma duct, and (iv) substrate holder with substrates to be coated within plasma duct, substrate holder is either grounded or insulated and have floating potential.

(F33) The filtered cathodic arc deposition apparatus denoted as (F32) may include a gas handling system for providing discharge gas.

(F34) The filtered cathodic arc deposition apparatuses denoted as (F32) and (F33) may include a power supply for providing positive voltage to the plasma duct to accelerate ions generated by the remote arc discharge and generate the energetic particles through collisions between the ions.

(F35) In the filtered cathodic arc deposition apparatus denoted as (F32) through (F34), the ions may be accelerated toward substrates to be coated on substrate holder within the plasma duct.

(F36) In the filtered cathodic arc deposition apparatuses denoted as (F32) through (F35), the plasma duct may be rectangular.

(F37) In the filtered cathodic arc deposition apparatus denoted as (F32) through (F36), the at least one intermediate anode may include an array of wire electrodes disposed along the plasma duct for generating a plasma sheath around each of the wire electrodes.

(F38) In the filtered cathodic arc deposition apparatuses denoted as (F32) through (F37), the substrate holder may have a heater to heat the substrates to be coated.

(F39) In the filtered cathodic arc deposition apparatus denoted as (F32) through (F38), the gas composition in the plasma duct may consist of argon, methane and hydrogen for deposition of polycrystalline diamond coatings.

(G1) A filtered cathodic arc deposition apparatus, may include (a) at least one cathodic arc source having (i) at least one cathode and at least one igniter contained within at least one cathode chamber, (ii) at least one anode associated with the cathode for generating arc discharge, and (iii) at least one stabilizing coil, disposed behind or surrounding a respective cathode for controlling position of arc discharge; (b) a substrate chamber containing a substrate holder for mounting at least one substrate to be coated, the substrate holder being non-coincidental with an optical axis of each cathode; (c) a plasma duct with a deflection section in communication with the cathode chamber and a focusing tunnel section in communication with the substrate chamber; and (d) at least one offset deflecting coil disposed adjacent to a side of the cathode chamber, and spaced from the plasma duct, generating a deflecting magnetic field within the cathode chamber for filtering output of the cathodic arc source by deflecting plasma flow therefrom into the plasma duct.

(G2) The filtered cathodic arc apparatus denoted as (G1) may include at least one focusing conductor adjacent to the focusing tunnel section for generating a focusing magnetic field.

(G3) The filtered cathodic arc apparatuses denoted as (G1) and (G2) may further include at least one deflecting coil adjacent to the plasma duct and the at least one cathode chamber.

(G4) In the filtered cathodic arc apparatus denoted as (G2), the deflecting magnetic field may couple with the focusing magnetic field to direct plasma toward the substrate holder.

(G5) In the filtered cathodic arc apparatuses denoted as (G1) through (G4), the at least one offset deflecting coil may include at least one respective proximate conductor disposed adjacent to a side of the at least one cathode chamber facing the substrate chamber, generating a saddle-shaped concave deflecting magnetic field in a part of the cathode chamber closer to the substrate chamber for deflecting a plasma flow from the at least one cathodic arc source into the plasma duct toward the substrate chamber.

(G6) In the filtered cathodic arc apparatus denoted as (G5), the at least one offset deflecting coil may include at least one respective distal offset conductor disposed adjacent to a side of the at least one cathode chamber facing away from the substrate chamber, generating a saddle-shaped concave deflecting magnetic field in a part of the at least one cathode chamber further from the substrate chamber for deflecting a plasma flow from the at least one cathodic arc source into the plasma duct.

(G7) In the filtered cathodic arc apparatuses denoted as (G1) through (G6), at least one proximate deflecting coil may include at least one respective pair of proximate offset conductors, disposed adjacent to a side of the at least one cathode chamber facing the substrate chamber on opposite sides of the plasma duct, generating a saddle-shaped concave deflecting magnetic field in a part of the at least one cathode chamber closer to the substrate chamber for deflecting a plasma flow from the at least one cathodic arc source into the plasma duct toward the substrate chamber.

(G8) In the filtered cathodic arc apparatuses denoted as (G1) through (G7), at least one distal deflecting coil may include at least one respective pair of distal offset conductors, disposed adjacent to a side of the at least one cathode chamber facing away from the substrate chamber on opposite sides of the plasma duct, generating a saddle-shaped concave deflecting magnetic field in a part of the at least one cathode chamber further from the substrate chamber for deflecting a plasma flow from the at least one cathodic arc source into the plasma duct.

(G9) In the filtered cathodic arc apparatus denoted as (G6), midpoint between corresponding ones of the at least one proximate offset conductor and the at least one distal offset conductor may be located within a corresponding one of the cathode chamber.

(G10) In the filtered cathodic arc apparatuses denoted as (G6) and (G9), distance between corresponding ones of the at least one distal offset conductor and center of the at least one cathode may be 1.2 to 10 times distance between the center of the at least one cathode and back wall of a corresponding one of the at least one cathode chamber, the back wall being a wall of the corresponding one of the at least one cathode chamber that is away from the plasma duct.

(G11) The filtered cathodic arc apparatuses denoted as (G1) through (G8) may include a gaseous plasma source disposed at an end of the plasma duct opposite the substrate chamber.

(G12) In the filtered cathodic arc apparatus denoted as (G11), the gaseous plasma source may include an electron-permeable shield permitting electrons to flow toward the substrate chamber.

(G13) The filtered cathodic arc apparatuses denoted as (G11) and (G12) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(G14) A filtered cathodic arc apparatus includes (a) at least one cathodic arc source including (i) at least one cathode and at least one igniter contained within at least one cathode chamber, (ii) at least one anode associated with the at least one cathode for generating arc discharge, and (iii) at least one stabilizing coil, disposed behind or surrounding a respective cathode for controlling position of the arc discharge; (b) a substrate chamber containing a substrate holder for mounting at least one substrate to be coated, the substrate holder being positioned non-coincidental with an optical axis of the at least one cathode; (c) a plasma duct in communication with the cathode chamber and the substrate chamber; (d) at least one coil generating a deflecting magnetic field for deflecting the plasma toward the substrate chamber; and (e) a plurality of stream baffles having positive potential relative to the plasma to enhance filtration of macroparticles when in the plasma duct generally at an angle to a plane parallel to direction of plasma flow.

(G15) In the filtered cathodic arc apparatus denoted as (G14), each of the plurality of stream baffles may be generally oriented to lie between a plane tangential to magnetic field lines at position of the plurality of stream baffles and a plane tangential to plasma stream lines at the position of the plurality of stream baffles.

(G16) In the filtered cathodic arc apparatuses denoted as (G14) and (G15), the plurality of stream baffles may include adjustable stream baffles having adjustable orientation and an optimal orientation that is generally tangential to the plasma flow at the position of the plurality of stream baffles.

(G17) The filtered cathodic arc apparatus denoted as (G16) may further include at least one probe, selected from the group of a Langmuir ion collecting probe and a mass flux collecting probe, for determining the optimal orientation, the at least one probe (i) being disposed in the deflecting magnetic field, (ii) having an ion collecting area with adjustable orientation, and (iii) measuring a maximum ion current when the ion collecting area is perpendicular to the plasma flow.

(G18) In the filtered cathodic arc apparatuses denoted as (G14) through (G16), the stream baffles may include a magnetic material for substantially tangential alignment of the stream baffles with field lines of the deflecting magnetic field lines under magnetic influence of the deflecting magnetic field.

(G19) The filtered cathodic arc apparatuses denoted as (G14) though (G18) may include at least one focusing conductor adjacent to a focusing tunnel section of the plasma duct for generating a focusing magnetic field, wherein the deflecting magnetic field couples with the focusing magnetic field to direct plasma toward the substrate holder.

(G20) The filtered cathodic arc apparatuses denoted as (G14) through (G19) may include at least one offset deflecting coil disposed adjacent to a side of the at least one cathode chamber facing the substrate chamber, generating a deflecting magnetic field within the cathode chamber for deflecting a plasma flow from the cathodic arc source into the plasma duct.

(G21) The filtered cathodic arc apparatuses denoted as (G14) through (G20) may include a gaseous plasma source disposed at an end of the plasma duct opposite from the substrate chamber.

(G22) In the filtered cathodic arc apparatus denoted as (G21), the gaseous plasma source may include an electron-permeable shield permitting electrons to flow toward the substrate chamber.

(G23) The filtered cathodic arc apparatuses denoted as (G21) and (G22) may include an arc plasma enhanced magnetron sputtering source in combination with one or more low pressure arc sources, selected from the group consisting of filtered arc, hollow cathode arc, thermionic arc, or any combination thereof, wherein each arc source couples with a magnetron source to increase an ionization rate of a magnetron sputtering flow.

(G24) A filtered cathodic arc apparatus may include (a) a cathodic arc source including (i) at least one cathode and at least one igniter contained within at least one cathode chamber, respectively, (ii) at least one anode associated with the cathode for generating arc discharge, and (iii) at least one stabilizing coil, disposed behind or surrounding a respective cathode, for controlling position of the arc discharge; (b) a substrate chamber containing a substrate holder for mounting at least one substrate to be coated, the substrate holder being positioned non-coincidental with an optical axis of the at least one cathode; (c) a plasma duct, in communication with each cathode chamber and the substrate chamber and comprising (i) at least one focusing coil surrounding a focusing tunnel section of the plasma duct for generating a focusing magnetic field and (ii) at least one deflecting coil generating a deflecting magnetic field for deflecting the plasma along a path toward the substrate chamber; and (d) at least one magnetron facing the substrate holder, the magnetron being positioned such that at least a portion of magnetic force lines of the focusing magnetic field overlap and are substantially parallel with at least a portion of magnetic force lines generated by the magnetron, wherein each arc source couples with a magnetron source, and any combination thereof, to increase an ionization rate of a magnetron sputtering flow.

(G25) The filtered cathodic arc apparatus denoted as (G24) may include a gaseous plasma source disposed at an end of the plasma duct opposite the substrate chamber.

(G26) In the filtered cathodic arc apparatus denoted as (G25), the gaseous plasma source may include an electron-permeable shield permitting electrons to flow toward the substrate chamber.

(G27) The filtered cathodic arc apparatuses denoted as (G24) through (G26) may include an arc plasma enhanced magnetron sputtering source in combination with one or more low pressure arc sources, selected from the group consisting of filtered arc, hollow cathode arc, thermionic arc, and any combination thereof, wherein each arc source couples with a magnetron source to increase an ionization rate of a magnetron sputtering flow.

(G28) The filtered cathodic arc apparatuses denoted as (G24) through (G27) may include at least one metal vapor source and a plurality of deflecting conductors, each of the plurality of deflecting conductors respectively associated with each cathodic arc source and the metal vapor source, wherein at least some of the plurality of deflecting conductors can be independently activated to alternate between deposition of vapor associated with the at least one filtered arc source and metal vapor from the at least one metal vapor source.

(G29) The filtered cathodic arc apparatuses denoted as (G24) through (G28) may include at least one offset deflecting coil respectively disposed adjacent to a side of each cathode chamber facing the substrate chamber, generating a deflecting magnetic field within the cathode chamber for deflecting a plasma flow from the arc source into the plasma duct.

(G30) The filtered cathodic arc apparatuses denoted as (G24) through (G29) may further include at least one deflecting coil adjacent to the plasma duct and each cathode chamber, respectively.

(G31) The filtered cathodic arc apparatuses denoted as (G24) through (G30) may include a plurality of stream baffles, having a positive potential relative to the plasma, installed in the plasma duct generally at an angle to a plane parallel to a direction of plasma flow, to enhance filtration of macroparticles.

(G32) In the filtered cathodic arc apparatus denoted as (G31), each of the plurality of stream baffles may be generally oriented to lie between a plane tangential to magnetic field lines at position of the stream baffles and a plane tangential to plasma stream lines at the position of the stream baffles.

(G33) In the filtered cathodic arc apparatuses denoted as (G31) and (G32), the plurality of stream baffles may include a magnetic material for substantially tangential alignment of the stream baffles with field lines of the deflecting magnetic field under magnetic influence of the deflecting magnetic field.

(G34) The filtered cathodic arc apparatuses denoted as (G24) through (G33) may include at least one focusing conductor adjacent to the focusing tunnel section for generating at least a portion of the focusing magnetic field, wherein the deflecting magnetic field couples with the focusing magnetic field to direct plasma toward the substrate holder.

I claim:

1. An apparatus for the application of coatings in a vacuum comprising at least one filtered cathodic arc source, the apparatus comprising at least one cathode and at least one igniter contained within at least one cathode chamber, at least one stabilizing coil, disposed behind the cathode or surrounding the cathode, at least one anode associated with the cathode for generating an arc discharge, a substrate chamber containing a substrate holder for mounting at least one substrate to be coated, the substrate holder being positioned off of an optical axis of the at least one cathode, a plasma duct comprising a deflection section in communication with the at least one cathode chamber and a focusing tunnel section in communication with the substrate chamber, at least one coil generating a deflecting magnetic field, at least in the deflection section, for deflecting plasma along a path toward the substrate chamber, and a plurality of stream baffles, having a positive potential relative to the plasma, installed in the deflection section in respective positions that, during operation of the apparatus, coincide with plasma flow propagating from the at least one cathode chamber toward the substrate chamber, to enhance filtration of macroparticles at least in part by capture of macroparticles attracted to the positive potential of the stream baffles, each of the stream baffles configured to be generally oriented to lie between a plane tangential to magnetic field lines at position of the stream baffles and a plane tangential to plasma stream lines at the position of the stream baffles.

2. The apparatus of claim 1, the stream baffles having adjustable orientation, the apparatus further comprising a Langmuir ion collecting probe and/or mass flux collecting probe disposed in path of the deflecting magnetic field, an orientation of the probe being adjustable such that when ion collecting area of the probe is perpendicular to the path of the plasma flow, along the deflecting magnetic field, at least one of maximum ion saturated current and maximum mass flux of metal ions will be collected, whereby the stream baffles can be adjusted to be generally perpendicular to the ion collecting area of the probe.

3. The apparatus of claim 1, the stream baffles having adjustable orientation and at least a portion of the stream baffles being composed of a magnetic material, to tangentially align the stream baffles, under magnetic influence of the deflecting magnetic field, along magnetic field lines of the deflecting magnetic field.

4. The apparatus of claim 1, further comprising at least one focusing conductor adjacent to the focusing tunnel section for generating a focusing magnetic field, wherein the deflecting magnetic field couples with the focusing magnetic field generated in the focusing tunnel section of the plasma duct 10 direct plasma toward the substrate holder.

5. The apparatus of claim 1, further comprising at least one offset deflecting coil disposed adjacent a side of the at least one cathode chamber facing the substrate chamber, for generating a deflecting magnetic field within the cathode chamber to deflect the plasma flow into the plasma duct.

6. The apparatus of claim 1, further comprising a gaseous plasma source disposed at a rear end of the plasma duct.

7. The apparatus of claim 6, the gaseous plasma source comprising an electron-permeable shield permitting electrons to flow toward the substrate chamber.

8. The apparatus of claim 6, adapted for arc plasma-enhanced magnetron sputtering, comprising a magnetron sputtering source in combination with one or more low pressure arc sources selected from the group consisting of filtered arc, hollow cathode arc, thermionic coupling, and any combination thereof, wherein each low pressure arc source couples with the magnetron sputtering source to increase an ionization rate of a magnetron sputtering flow from the magnetron sputtering source.

9. The apparatus of claim 1, further comprising at least one focusing conductor adjacent to the focusing tunnel section for generating a focusing magnetic field.

10. The apparatus of claim 1, each of the at least one coil comprising a deflecting coil adjacent to the plasma duct and a respective one of the at least one cathode chamber.

11. The apparatus of claim 5, each of the at least one offset deflecting coil comprising a proximate conductor disposed adjacent a side of a respective one of the at least one cathode chamber facing the substrate chamber, for generating a saddle-shaped concave deflecting magnetic field in a part of the respective cathode chamber facing the substrate chamber to deflect the plasma flow into the plasma duct toward the substrate chamber.

12. The apparatus of claim 11, each of the at least one offset deflecting coil further comprising a distal conductor disposed adjacent a side of a respective one of the at least one cathode chamber facing away from the substrate chamber, for generating a saddle-shaped concave deflecting magnetic field in a part of the respective cathode chamber facing away the substrate chamber to deflect the plasma flow into the plasma duct.

13. The apparatus of claim 12, midpoint between each proximate conductor and associated distal conductor being located within the respective cathode chamber.

14. The apparatus of claim 12, distance between each distal conductor and center of a target of the respective cathode being 1.2 to 10 times distance between the center of the target and a back wall of the respective cathode chamber.

15. The apparatus of claim 1, the at least one cathode chamber comprising two cathode chambers on opposite sides of the plasma duct, the at least one coil comprising a proximate deflecting coil including two proximate offset conductors respectively disposed adjacent sides of the two cathode chambers facing the substrate chamber, for generating a saddle-shaped concave deflecting magnetic field in a part of the two cathode chambers to deflect the plasma flow into the plasma duct toward the substrate chamber.

16. The apparatus of claim 1, the at least one cathode chamber comprising two cathode chambers on opposite sides of the plasma duct, the at least one coil comprising a distal deflecting coil including two distal offset conductors respectively disposed adjacent sides of the two cathode chambers facing away from the substrate chamber, for generating a saddle-shaped concave deflecting magnetic field in a part of the two cathode chambers to deflect the plasma flow into the plasma duct toward the substrate chamber.

17. The apparatus of claim 1, further comprising at least one magnetron facing the substrate holder, the magnetron being positioned such that magnetic force lines of a focusing magnetic field of the focusing tunnel section overlap magnetic force lines generated by each of the at least one magnetron, wherein a direction of the magnetic force lines generated by the magnetron coincide with a direction of the magnetic force lines of the focusing magnetic field, and wherein the plasma flow couples with magnetron sputtering flow from the at least one magnetron source to increase ionization rate of the magnetron sputtering flow.

18. The apparatus of claim 17, the at least one magnetron being positioned in the plasma duct.

19. The apparatus of claim 17, the at least one magnetron being positioned in the substrate chamber.

20. The apparatus of claim 19, the at least one magnetron being positioned adjacent the plasma duct such that magnetron sputtering flow coincides with the plasma flow toward the at least one substrate to be coated.

21. The apparatus of claim 1, further comprising at least one metal vapor source and a plurality of deflecting conductors, each of the deflecting conductors being (a) respectively associated with one of the at least one filtered cathodic arc source and the at least one metal vapor source and (b) configured to alternate between deposition of vapor from the at least one filtered cathodic arc source and deposition of metal vapor from the at least one metal vapor source.

22. The apparatus of claim 1, the plurality of stream baffles being positioned at a respective plurality of positions coinciding with different respective field lines to capture the macroparticles from different portions of the plasma flow.

23. The apparatus of claim 1, the plurality of stream baffles being positioned at a respective plurality of positions substantially in a plane transverse to direction of the plasma flow.

24. The apparatus of claim 1, the plurality of stream baffles being configured to (a) capture components of the plasma differing, by at least one of mass and charge, from target ions intended for deposition onto the substrate while (b) allowing for passage of the target ions in spaces between the stream baffles.

25. The apparatus of claim 1, the plasma flow including a plasma flow component from each of the at least one cathode chamber, the plurality of stream baffles being positioned inside each plasma flow component.

26. The apparatus of claim 25, for each plasma flow component, a respective set of the stream baffles being located along a path that crosses the plasma flow component.

27. The apparatus of claim 26, each respective set of stream baffles including at least one stream baffle on each of two opposite sides of center of the plasma flow component.

28. The apparatus of claim 1, the plurality of stream baffles being positioned in the plasma duct.

29. The apparatus of claim 1, the plasma flow including a plasma flow component from each of the at least one cathode chamber, the stream baffles being positioned such that, for each plasma flow component, a respective set of the stream baffles that is (a) located along a path that crosses the plasma flow component and (b) includes at least one stream baffle on each of two opposite sides of center of the plasma flow component.

30. The apparatus of claim 1, the plurality of stream baffles being positioned at exit of each cathode chamber.

* * * * *